US012010836B2

(12) United States Patent
Daycock et al.

(10) Patent No.: US 12,010,836 B2
(45) Date of Patent: Jun. 11, 2024

(54) MEMORY ARRAYS AND METHODS USED IN FORMING A MEMORY ARRAY COMPRISING STRINGS OF MEMORY CELLS AND OPERATIVE THROUGH-ARRAY-VIAS

(71) Applicant: Micron Technology, Inc., Boise, ID (US)

(72) Inventors: David Daycock, Singapore (SG); Prakash Rau Mokhna Rau, Boise, ID (US)

( * ) Notice: Subject to any disclaimer, the term of this patent is extended or adjusted under 35 U.S.C. 154(b) by 453 days.

(21) Appl. No.: 17/319,246

(22) Filed: May 13, 2021

(65) Prior Publication Data

US 2021/0305267 A1 Sep. 30, 2021

Related U.S. Application Data

(62) Division of application No. 16/507,456, filed on Jul. 10, 2019, now Pat. No. 11,037,944.

(51) Int. Cl.

| | |
|---|---|
| ***H10B 41/27*** | (2023.01) |
| ***H01L 21/28*** | (2006.01) |
| ***H01L 21/311*** | (2006.01) |
| ***H01L 21/3213*** | (2006.01) |
| ***H10B 41/10*** | (2023.01) |

(Continued)

(52) U.S. Cl.

CPC ........ *H10B 41/27* (2023.02); *H01L 21/31111* (2013.01); *H01L 21/32133* (2013.01); *H01L 29/40114* (2019.08); *H01L 29/40117* (2019.08); *H10B 41/10* (2023.02); *H10B 43/10* (2023.02); *H10B 43/27* (2023.02)

(58) Field of Classification Search

CPC ................................................ H01L 21/32133

See application file for complete search history.

(56) References Cited

U.S. PATENT DOCUMENTS

| | | | | |
|---|---|---|---|---|
| 2014/0284688 A1* | 9/2014 | Hirai | H10B 43/40 257/532 |
| 2016/0133671 A1* | 5/2016 | Fantini | H01L 21/76837 257/4 |
| 2018/0040553 A1 | 2/2018 | Tak et al. | |

(Continued)

FOREIGN PATENT DOCUMENTS

| | | |
|---|---|---|
| CN | 109920792 | 6/2019 |
| TW | 201834207 | 9/2018 |
| TW | 201941369 | 10/2019 |

*Primary Examiner* — Farun Lu
*Assistant Examiner* — Sandra Milena Rodriguez Villanu
(74) *Attorney, Agent, or Firm* — Brooks, Cameron & Huebsch, PLLC

(57) ABSTRACT

A method used in forming a memory array comprising strings of memory cells and operative through-array-vias (TAVs) comprises forming a stack comprising vertically-alternating insulative tiers and conductive tiers. The stack comprises a TAV region and an operative memory-cell-string region. Operative channel-material strings are formed in the stack in the operative memory-cell-string region and dummy channel-material strings are formed in the stack in the TAV region. At least a majority of channel material of the dummy channel-material strings is replaced in the TAV region with insulator material and operative TAVs are formed in the TAV region. Other methods and structures independent of method are disclosed.

18 Claims, 121 Drawing Sheets

(51) Int. Cl.
*H10B 43/10* (2023.01)
*H10B 43/27* (2023.01)

(56) References Cited

U.S. PATENT DOCUMENTS

| | | | | |
|---|---|---|---|---|
| 2018/0047739 | A1 | 2/2018 | Dorhout et al. | |
| 2018/0204799 | A1 | 7/2018 | Tessariol et al. | |
| 2018/0315771 | A1 | 11/2018 | Sandhu et al. | |
| 2018/0342528 | A1 | 11/2018 | Lee | |
| 2019/0027490 | A1 | 1/2019 | Shin et al. | |
| 2019/0043879 | A1 | 2/2019 | Lu et al. | |
| 2019/0067314 | A1 | 2/2019 | Lu et al. | |
| 2019/0067321 | A1 | 2/2019 | Song et al. | |
| 2019/0088671 | A1 | 3/2019 | Greenlee et al. | |
| 2019/0096901 | A1 | 3/2019 | Dai et al. | |
| 2019/0296034 | A1 | 9/2019 | Nagashima | |
| 2020/0066752 | A1 | 2/2020 | Lee | |
| 2020/0168622 | A1 | 5/2020 | Fukuzumi et al. | |
| 2020/0312864 | A1* | 10/2020 | Iwai | H10B 41/27 |
| 2020/0402890 | A1 | 12/2020 | Chary et al. | |
| 2021/0043644 | A1 | 2/2021 | Hu et al. | |
| 2021/0057441 | A1 | 2/2021 | Xu et al. | |

* cited by examiner 10
23
21
23
25,53
24
25,53
44
46
55
67
27
55
44
46
76
74
72

MEMORY ARRAYS AND METHODS USED IN FORMING A MEMORY ARRAY COMPRISING STRINGS OF MEMORY CELLS AND OPERATIVE THROUGH-ARRAY-VIAS

RELATED PATENT DATA

This patent resulted from a divisional application of U.S. patent application Ser. No. 16/507,546, filed Jul. 10, 2019, entitled "Memory Arrays And Methods Used In Forming A Memory Array Comprising Strings Of Memory Cells And Operative Through-Array-Vias", naming David Daycock and Prakash Rau Mokhna Rau as inventors, the disclosure of which is incorporated by reference.

TECHNICAL FIELD

Embodiments disclosed herein pertain to memory arrays and to methods used in forming a memory array comprising strings of memory cells and operative through-array-vias.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells individually comprising a reversibly programmable vertical transistor. Control or other circuitry may be formed below the vertically-stacked memory cells. Other volatile or non-volatile memory array architectures may also comprise vertically-stacked memory cells that individually comprise a transistor.

Memory arrays may be arranged in memory pages, memory blocks and partial blocks (e.g., sub-blocks), and memory planes, for example as shown and described in any of U.S. Patent Application Publication Nos. 2015/0228659, 2016/0267984, and 2017/0140833, and which are hereby and herein fully incorporated by reference and aspects of which may be used in some embodiments of the inventions disclosed herein.

One proposed way of increasing integrated circuitry density is to form a three-dimensional (3D) array comprising tiers of electronic components, for example tiers of non-programmable transistors and/or programmable transistors that may be part of memory circuitry. The gates of such transistors may be patterned into gate lines (and which may be plate-like) in the individual tiers. Connections to these gate lines may occur in a so-called "stair-step structure" at an end or edge of the tiers of transistors or other electronic components. The stair-step structure includes individual "stairs" (alternately termed "steps" or "stair-steps") that define contact regions of the individual gate lines upon which elevationally-extending conductive vias contact to provide electrical access to the gate lines or other conductive structures.

DETAILED DESCRIPTION OF EXAMPLE EMBODIMENTS

Figure 164:
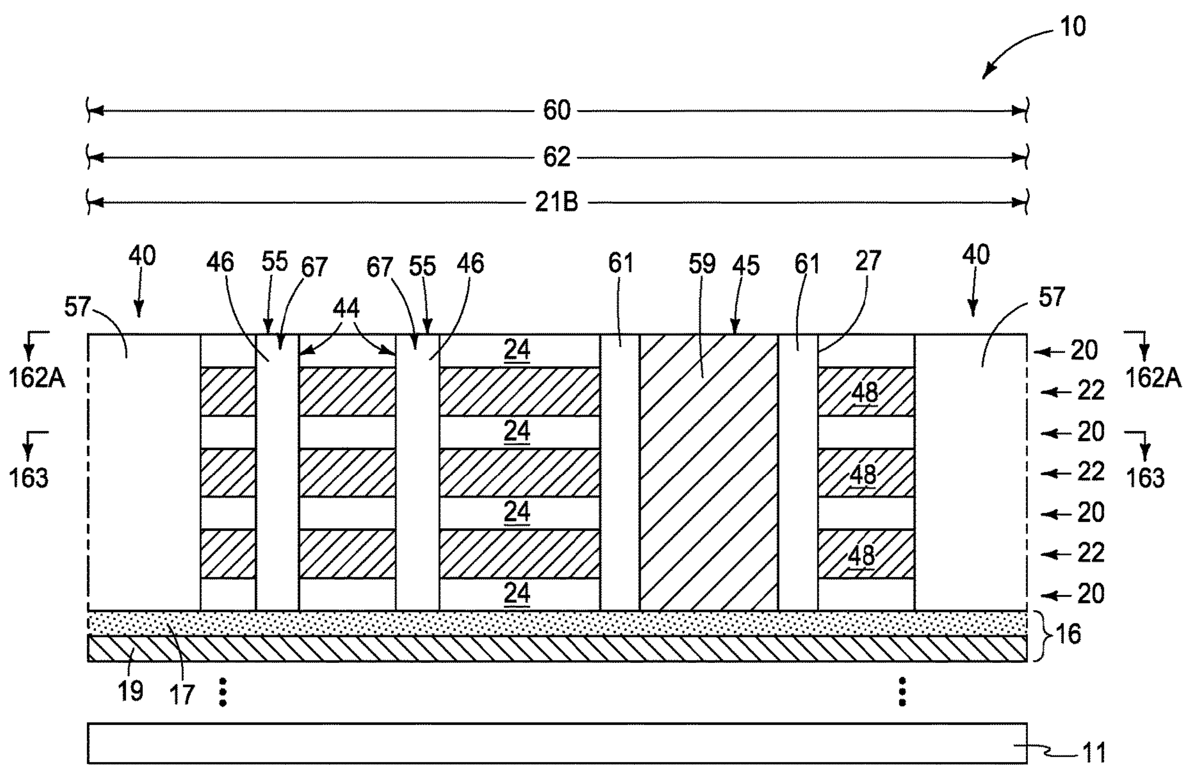

Embodiments of the invention encompass methods used in forming a memory array comprising strings of memory cells and operative through-array-vias (TAVs; i.e., that contain conductive material and that are circuit-operative in a finished-circuitry construction). An example memory array is an array of NAND or other memory cells having peripheral control circuitry under the array (e.g., CMOS-under-array). Embodiments of the invention encompass so-called "gate-last" or "replacement-gate" processing, so-called "gate-first" processing, and other processing whether existing or future-developed independent of when transistor gates are formed. Embodiments of the invention also encompass a memory array (e.g., NAND architecture) independent of method of manufacture. First example method embodiments are described with reference to FIGS. 1-164 which may be considered as a "gate-last" or "replacement-gate" process. Further, and regardless, the following sequence of processing steps is but one example and other sequences of the example processing steps (with or without other processing steps) may be used regardless of whether using "gate-last/replacement-gate" processing.

Figure 1:
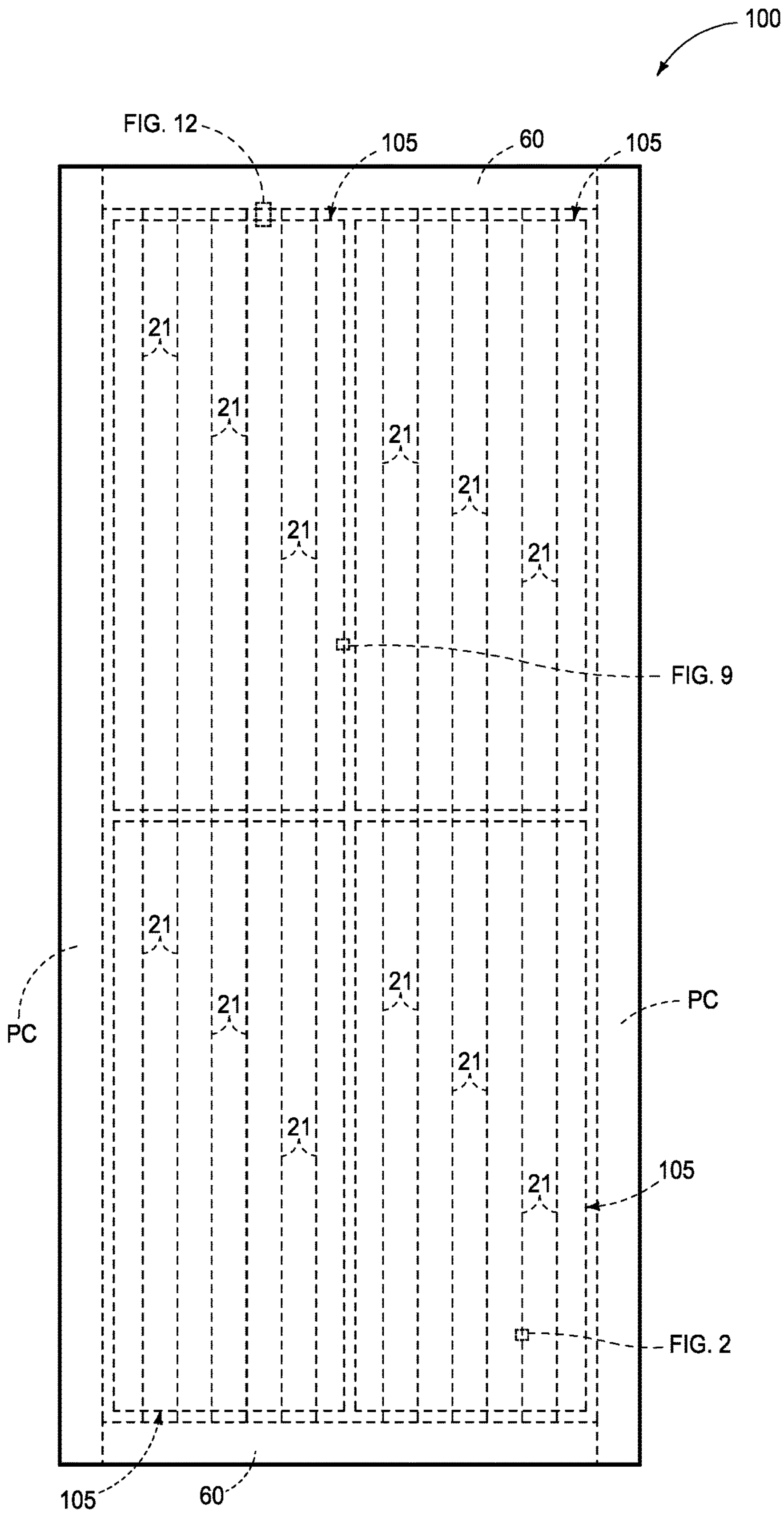
FIG. 1 is a diagrammatic top plan view of a die or die area that may be part of a larger substrate (not shown; e.g., a semiconductor wafer).
Figure 2:
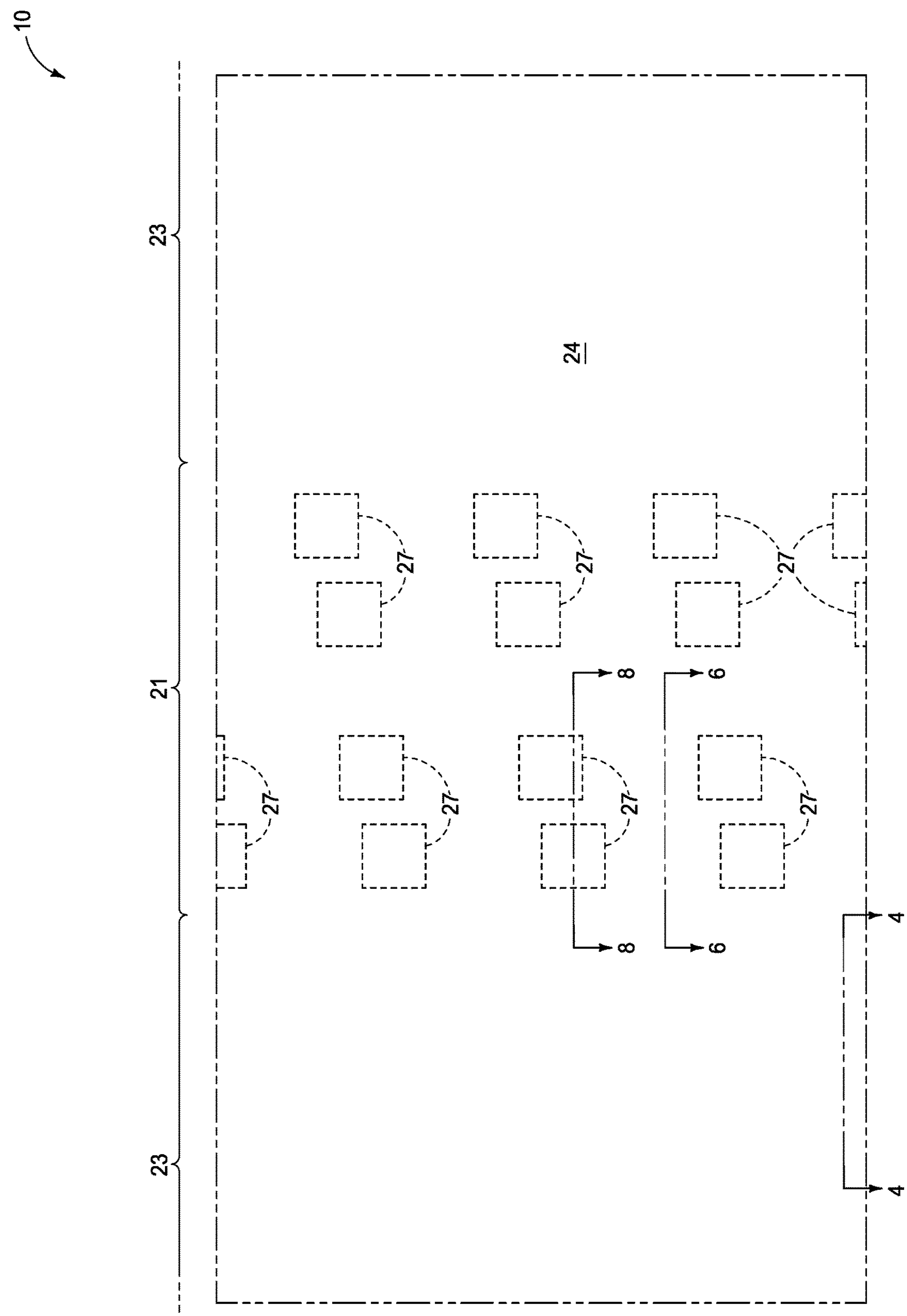
FIG. 2 is an enlarged diagrammatic top view of a portion of FIG. 1 of a portion of a substrate in process in accordance with an embodiment of the invention and is taken through line 2-2 in FIG. 1.
Figure 3:
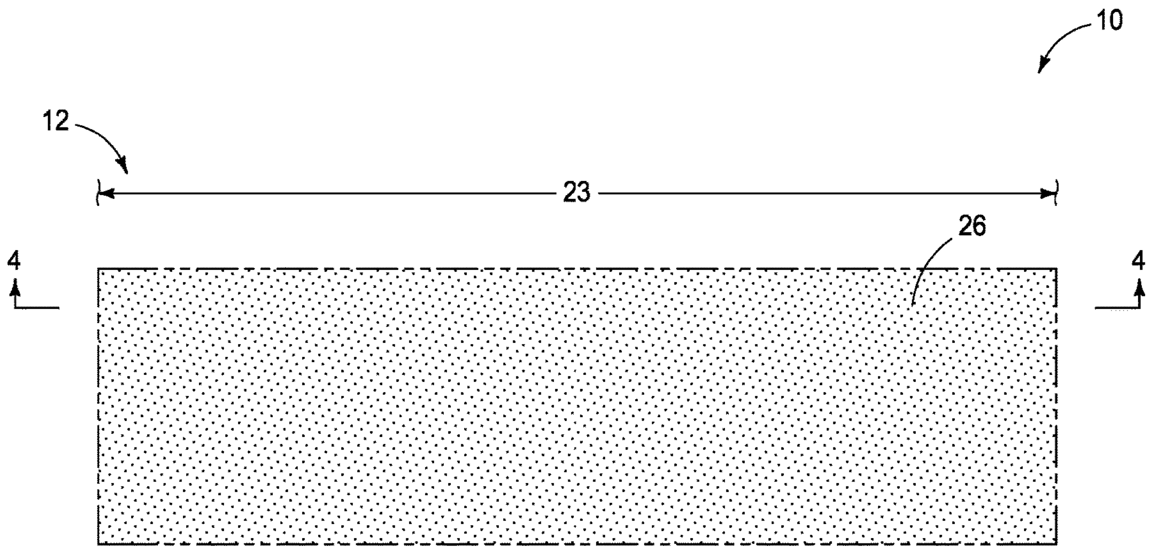
FIGS. 3-13, 13A, 14-25, 25A, 26-39, 39A, 40-53, 53A, 54-67, 67A, 68-81, 81A, 82-94, 94A, 95-105, 105A, 106-119, 119A, 120-133, 133A, 134-138, 138A, 139-147, 147A, 148-162, 162A, 163-164 are diagrammatic sequential sectional and/or enlarged views of the construction of FIG. 1 in process in accordance with some embodiments of the invention.
Figure 4:
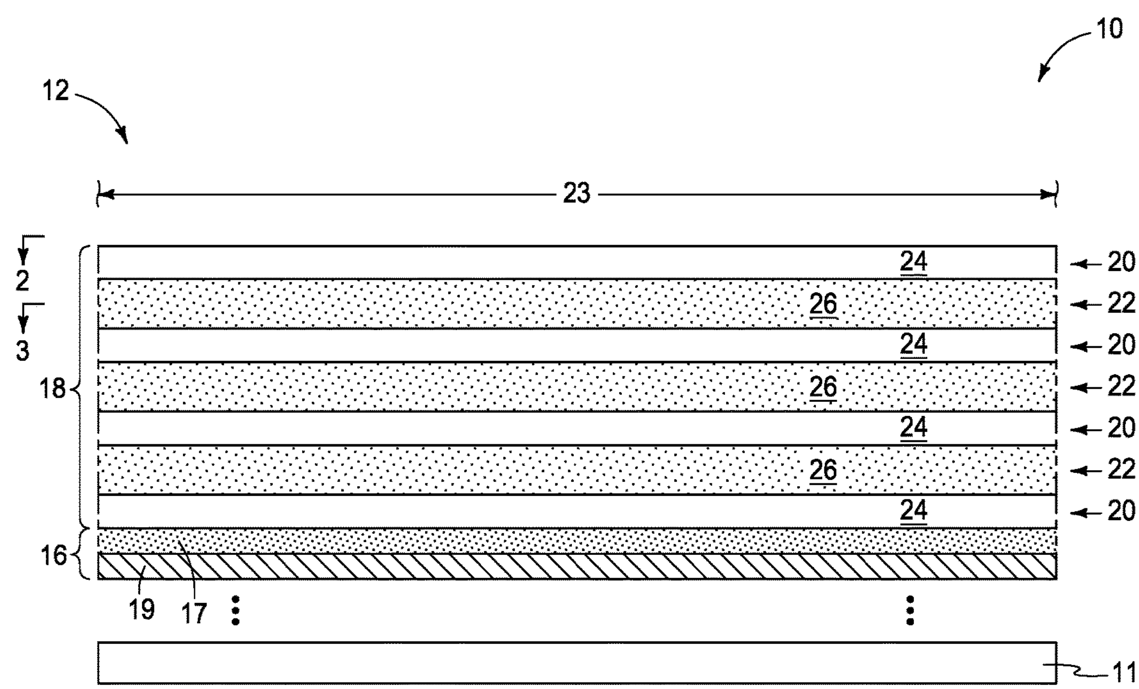
Figure 5:
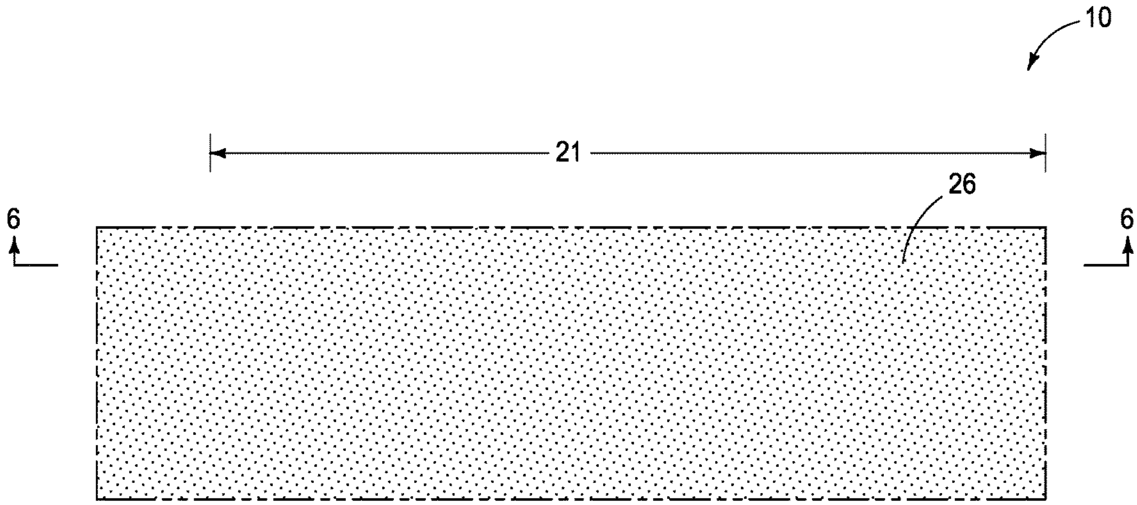
Figure 6:
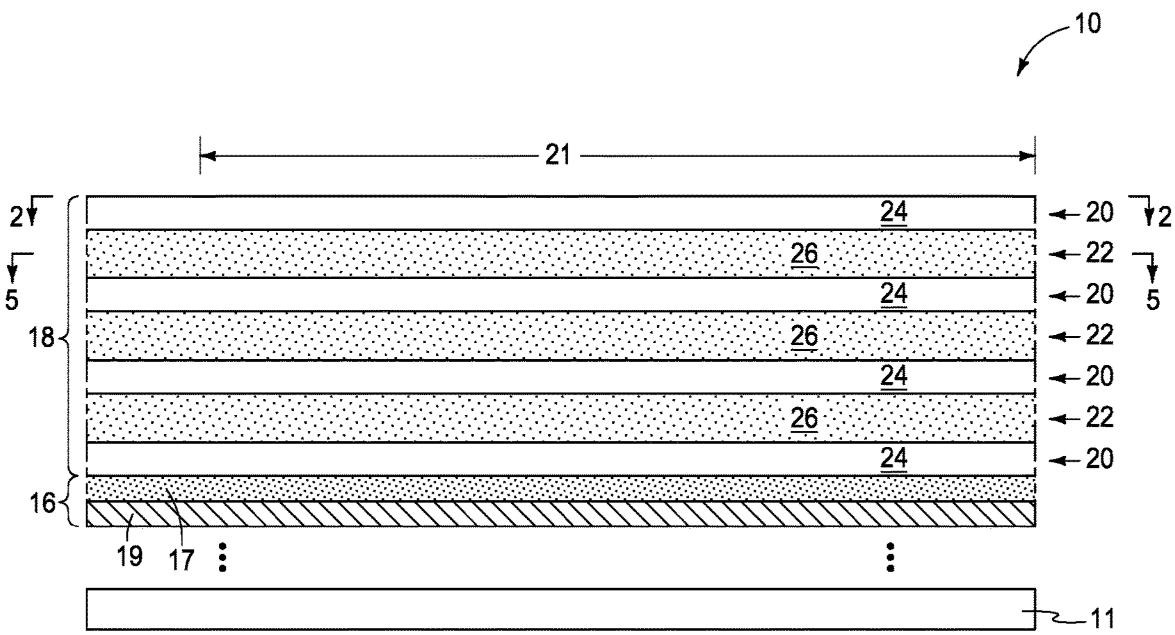
Figure 7:
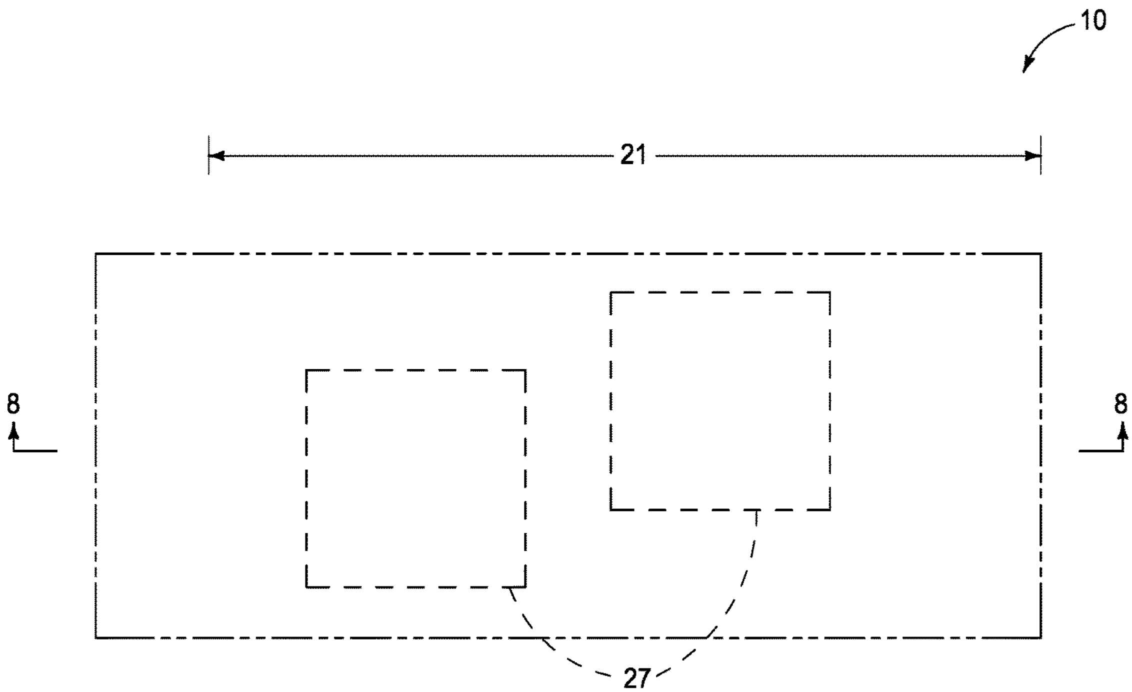
Figure 8:
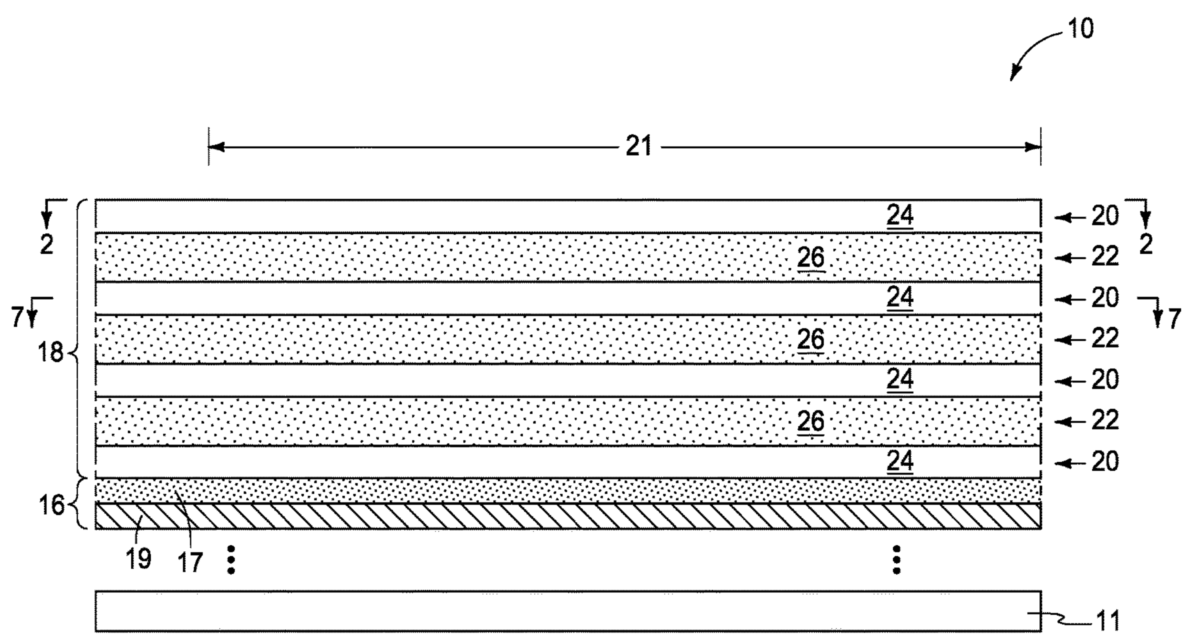
Figure 9:
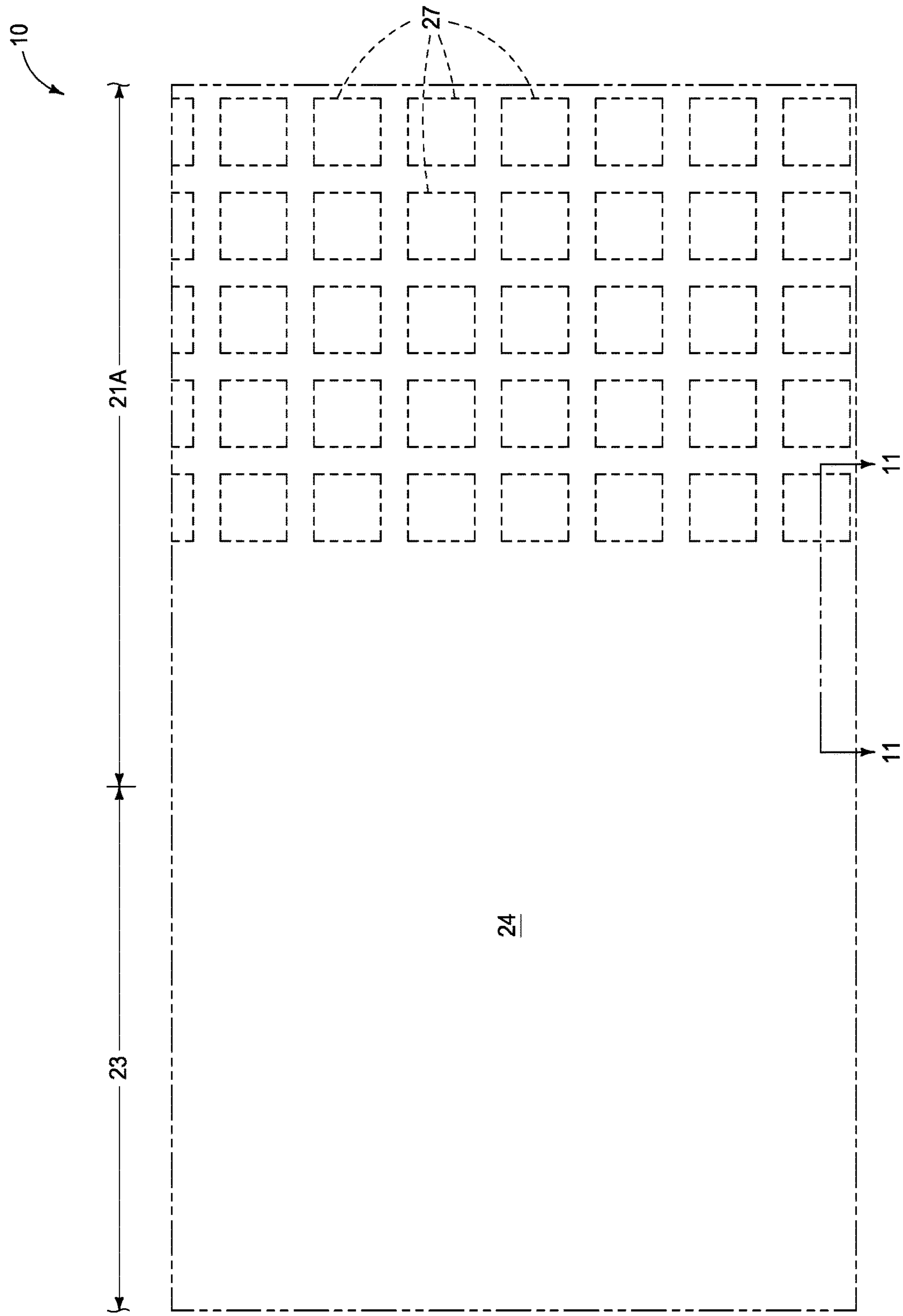
Figure 10:
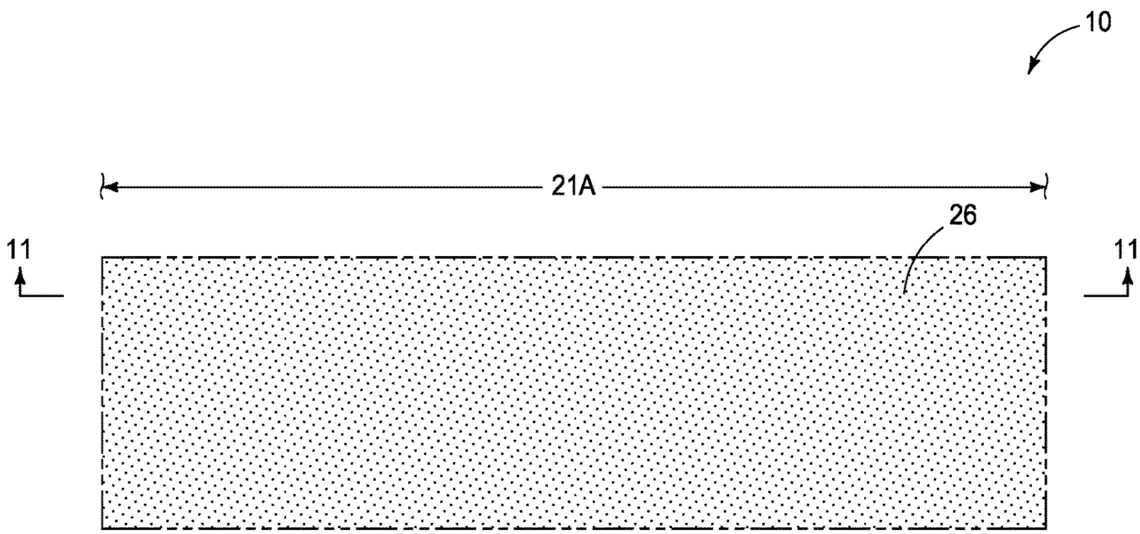
Figure 11:
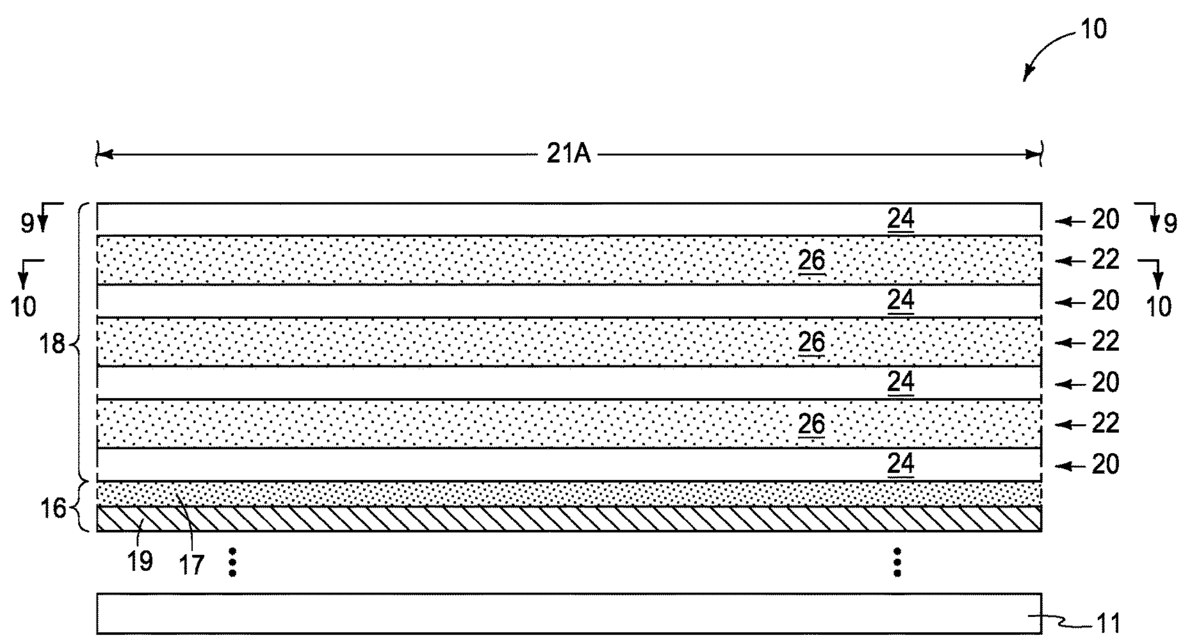
Figure 12:
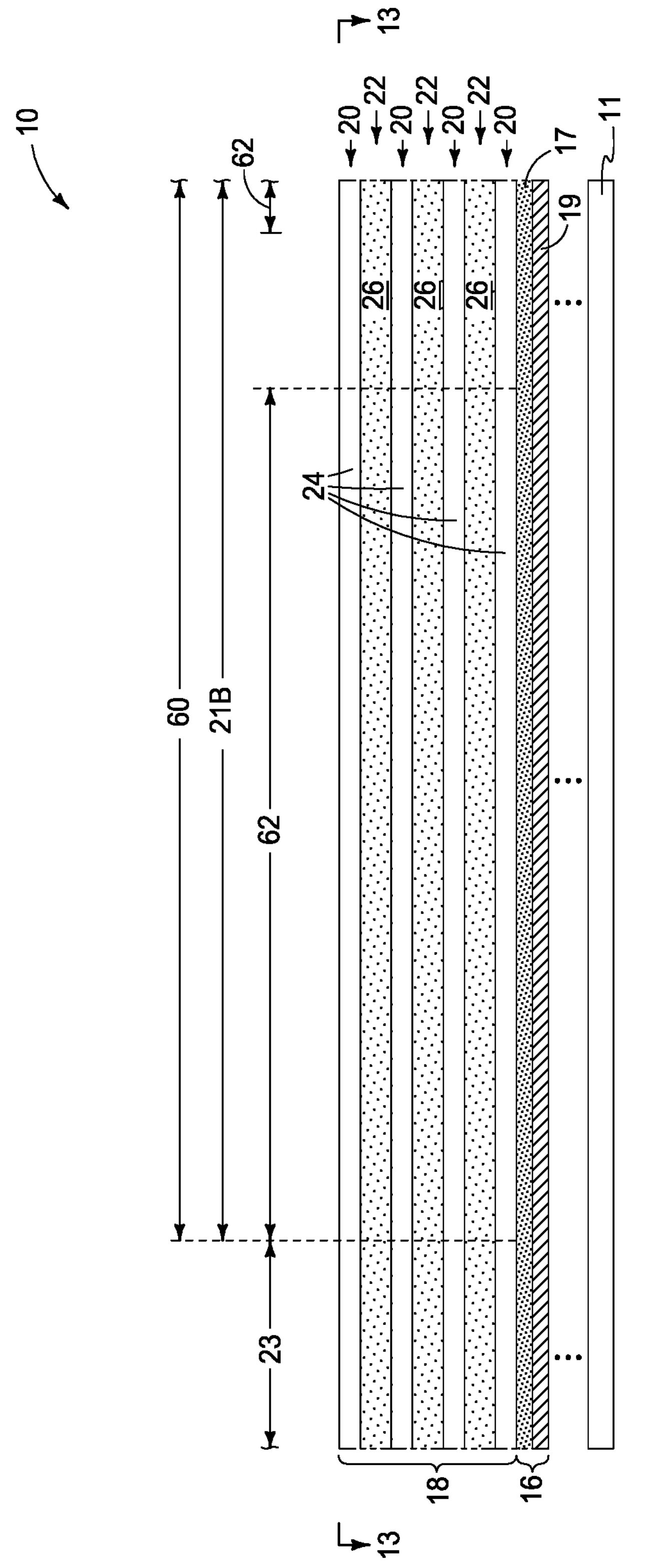
Figure 13:
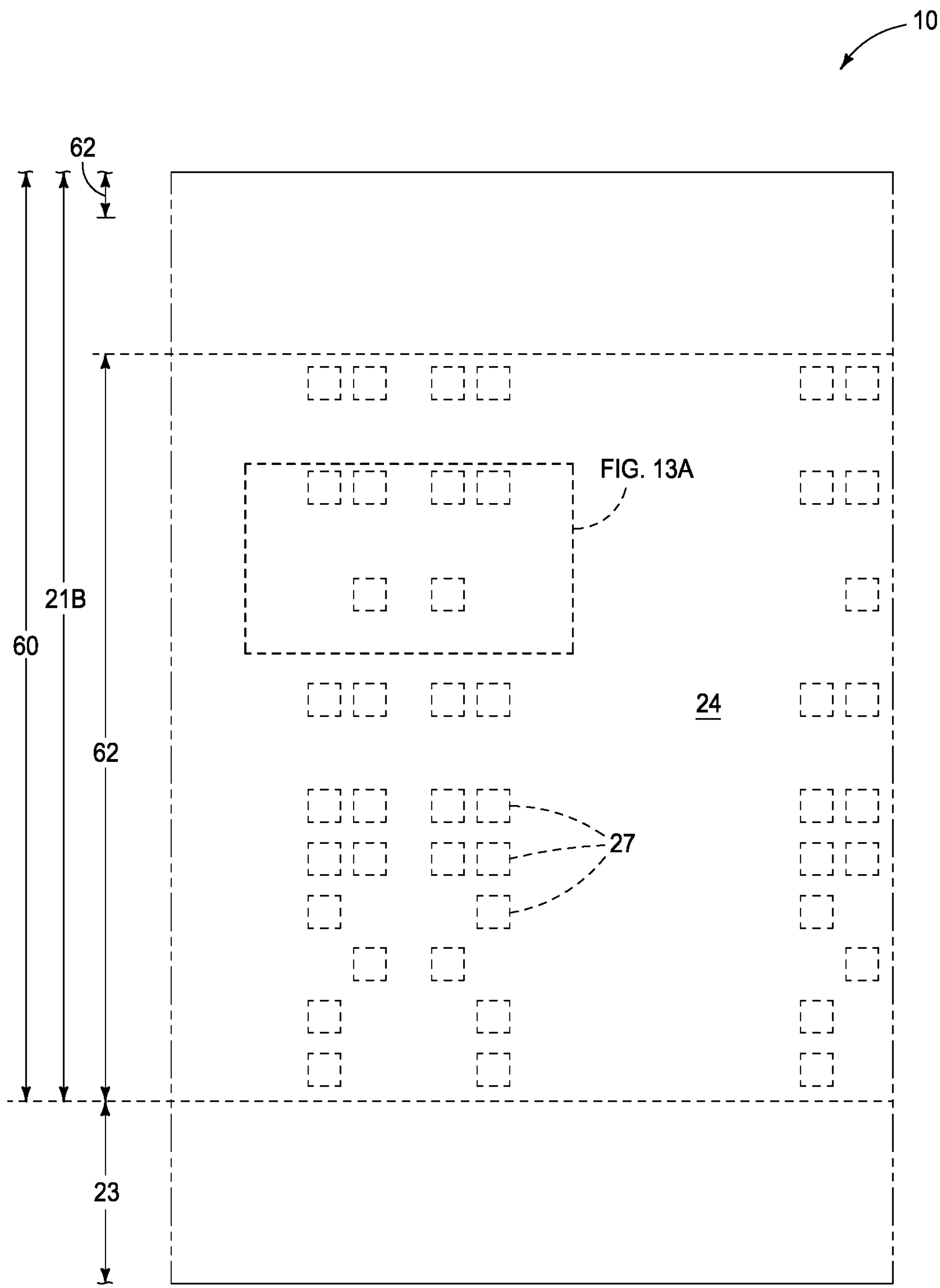
Figure 13A:
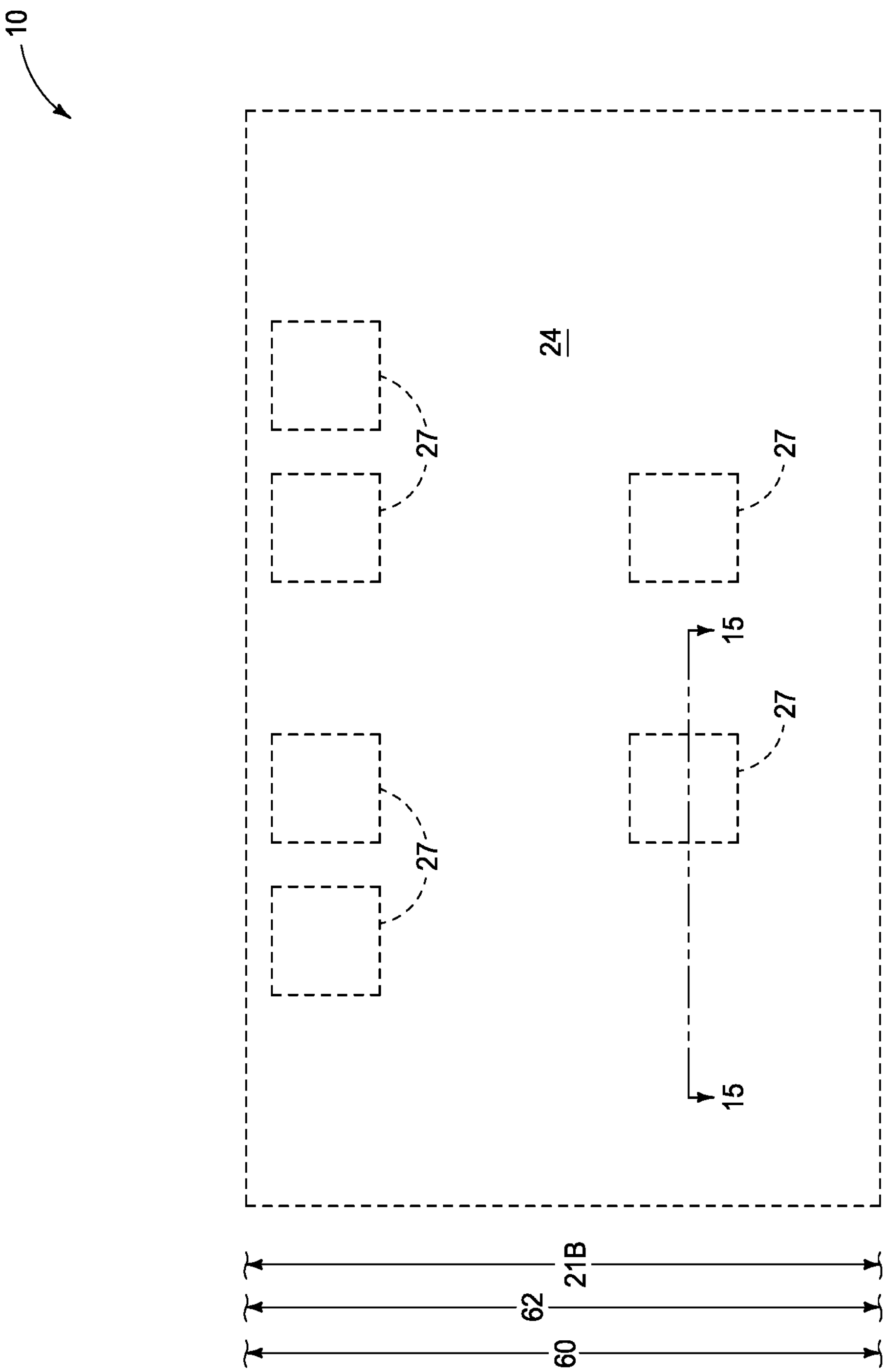
Figure 14:
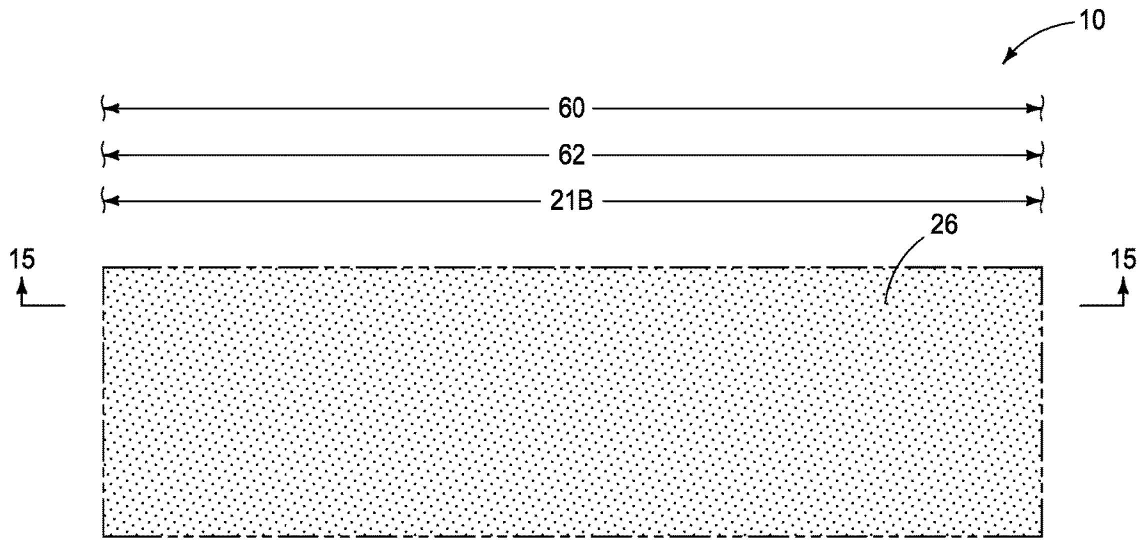
Figure 15:
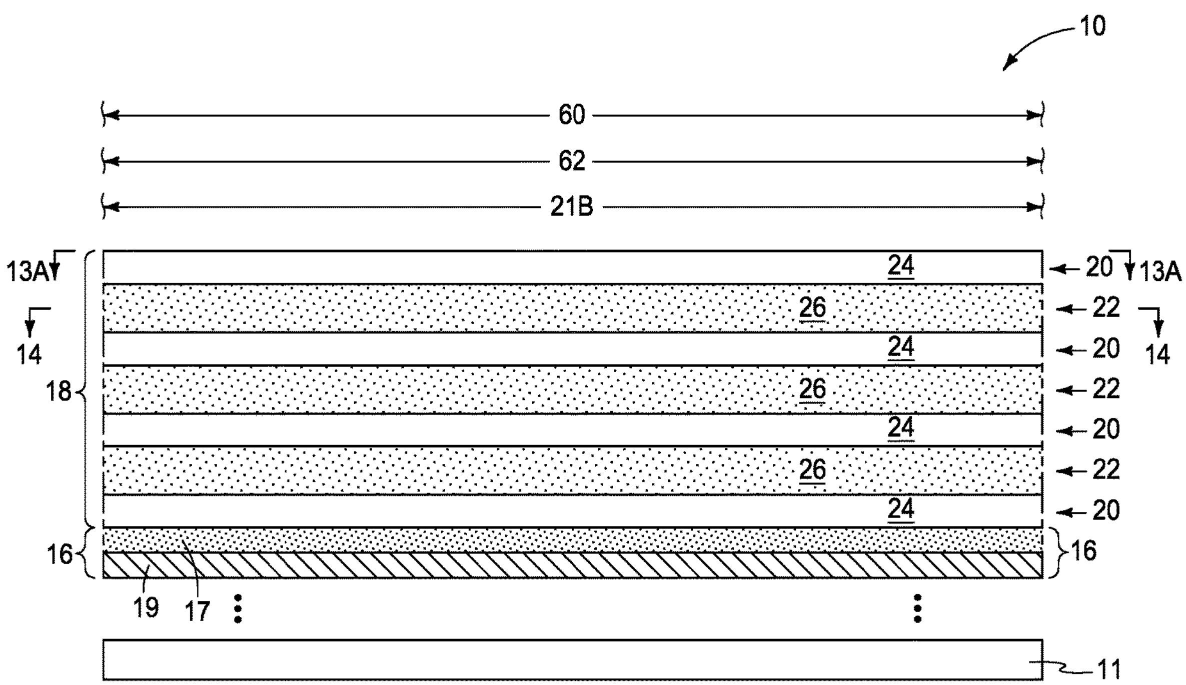
Figure 16:
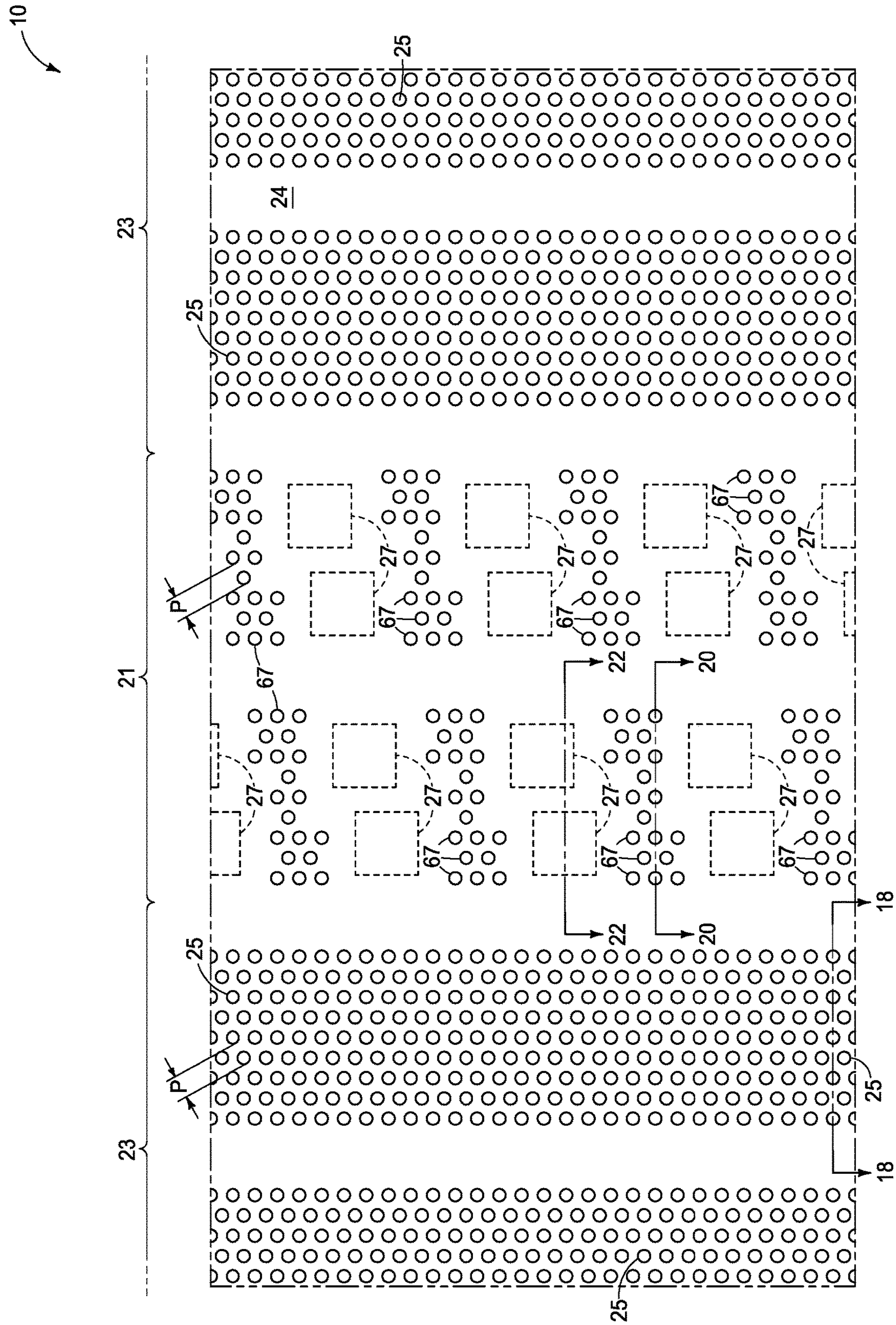
Figure 17:
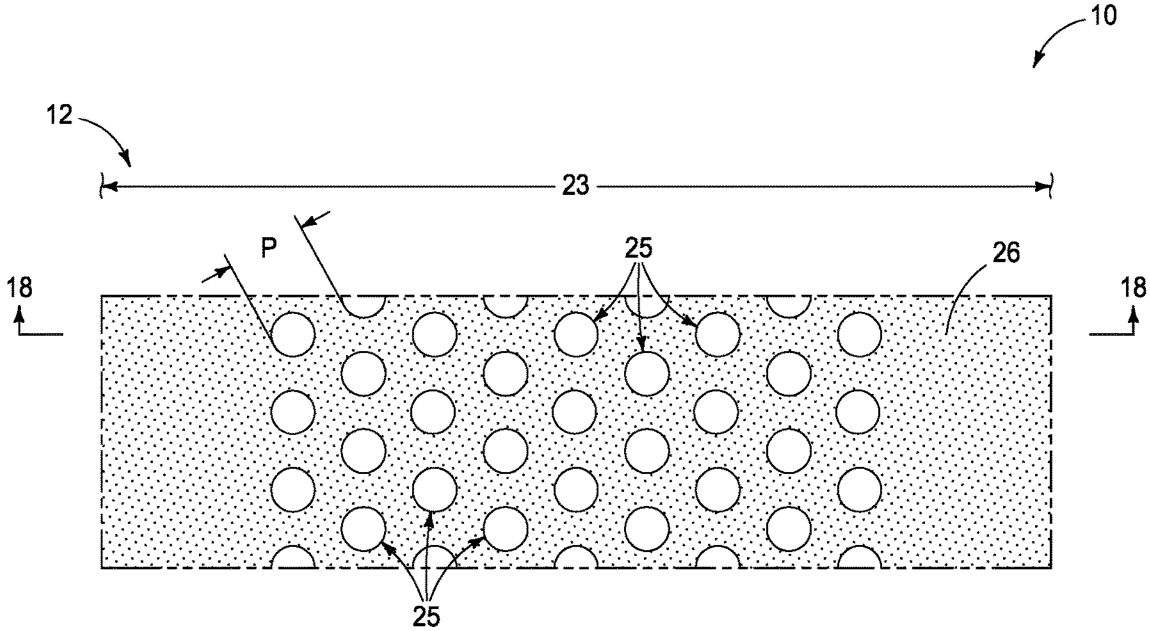
Figure 18:
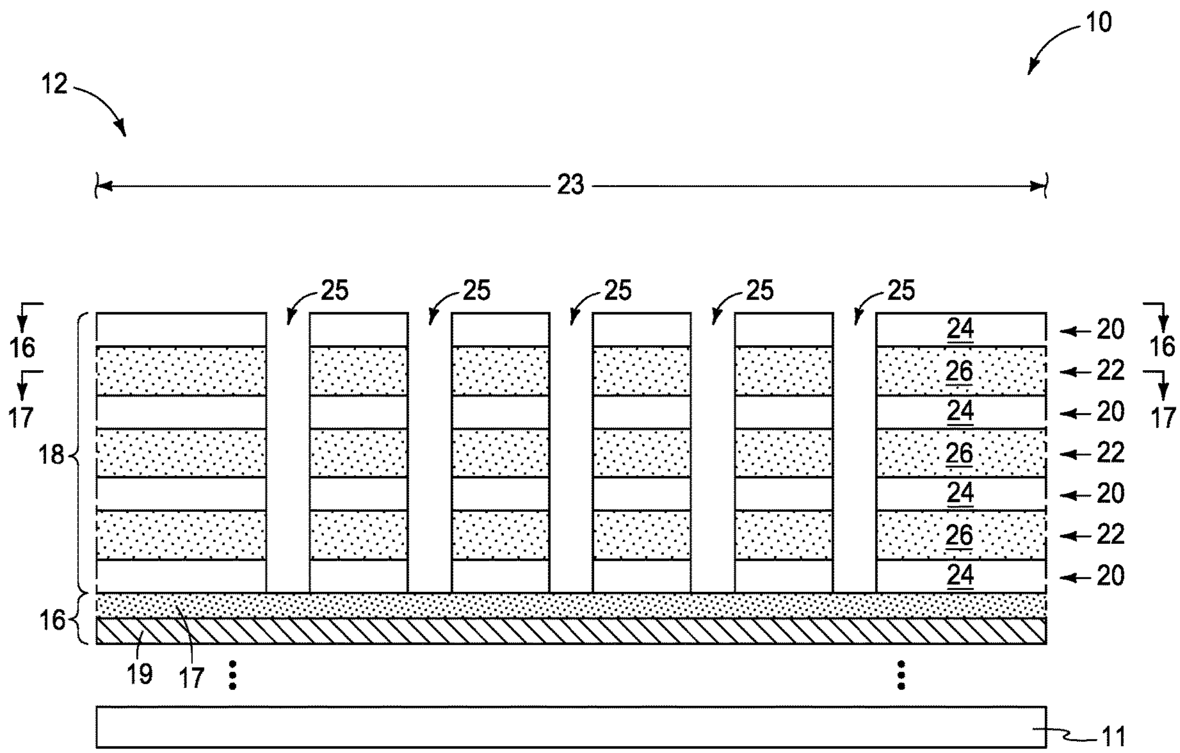
Figure 19:
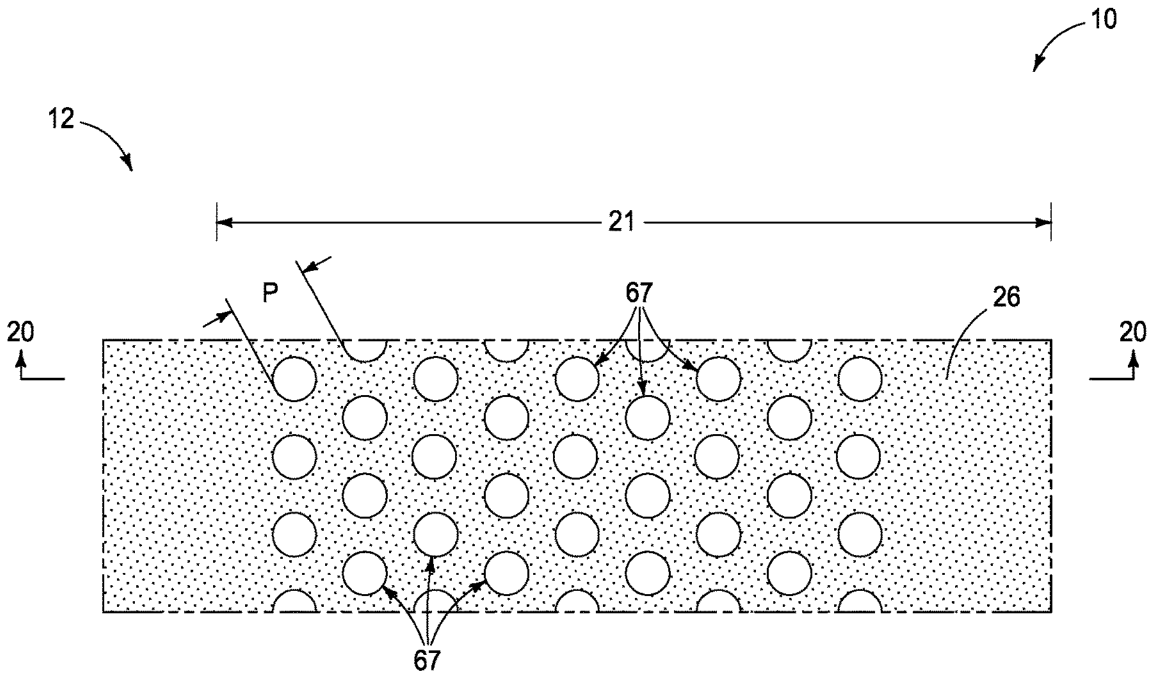
Figure 20:
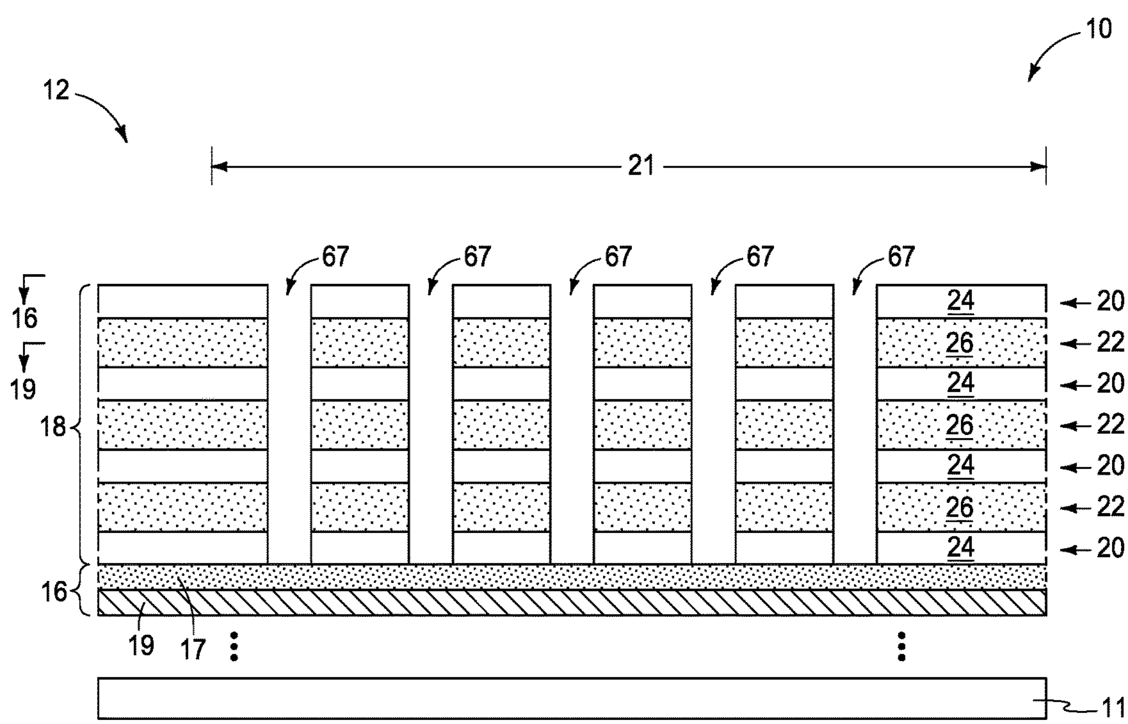
Figure 21:
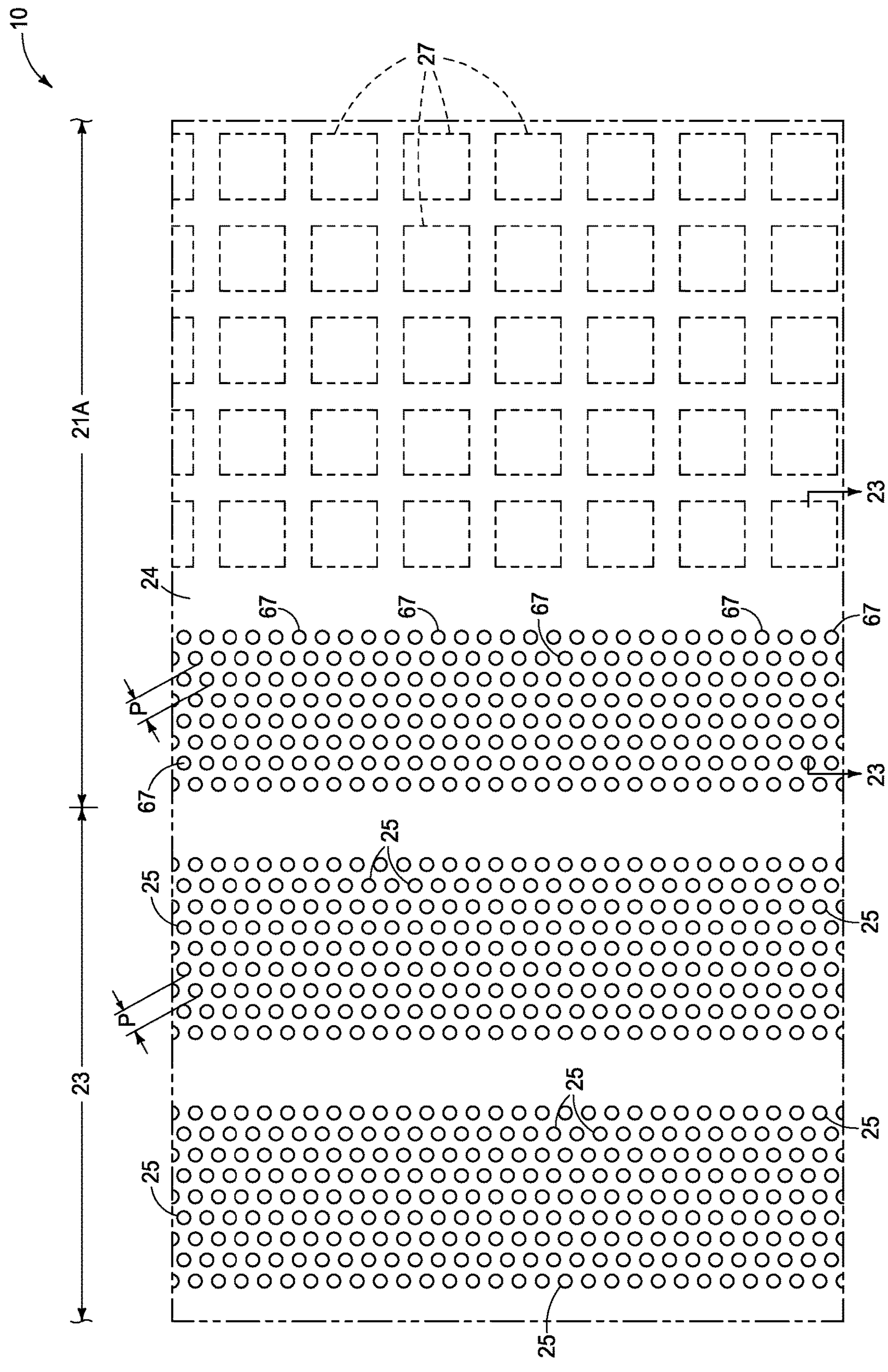
Figure 22:
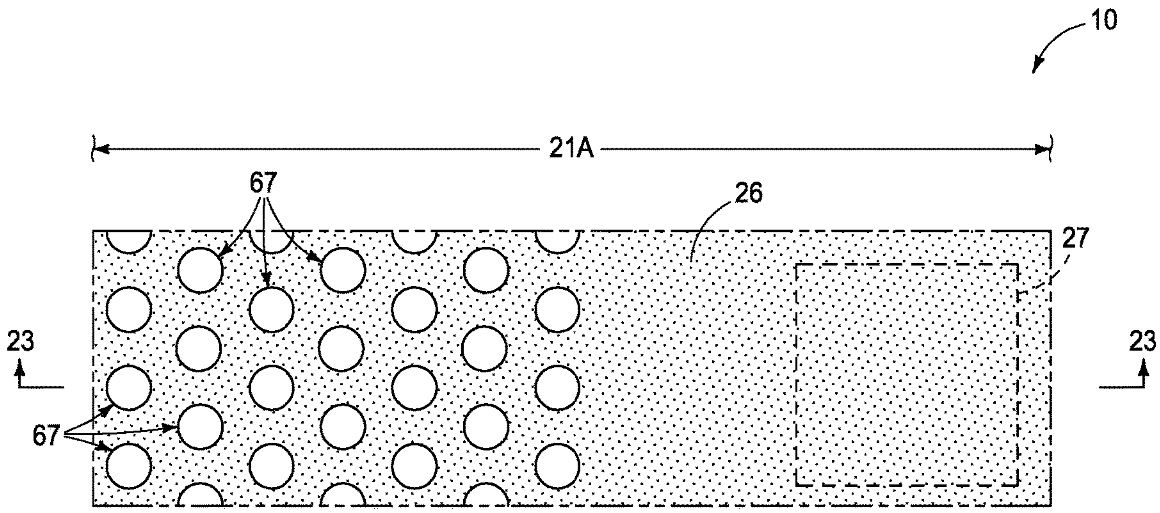
Figure 23:
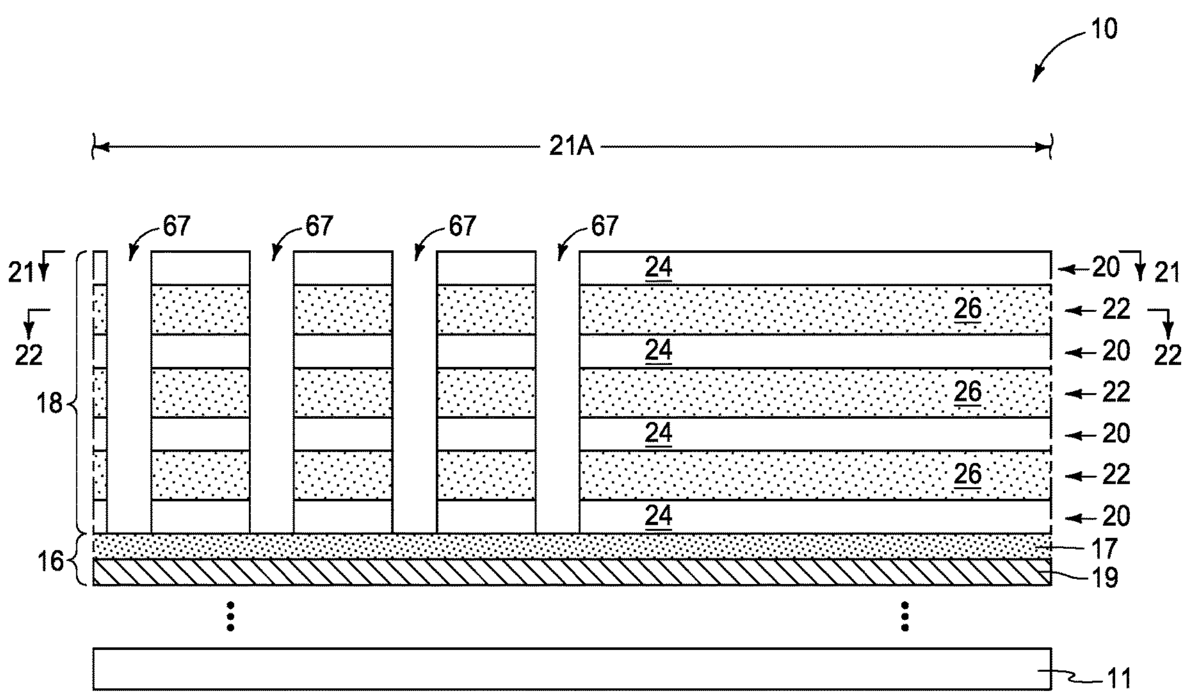
Figure 24:
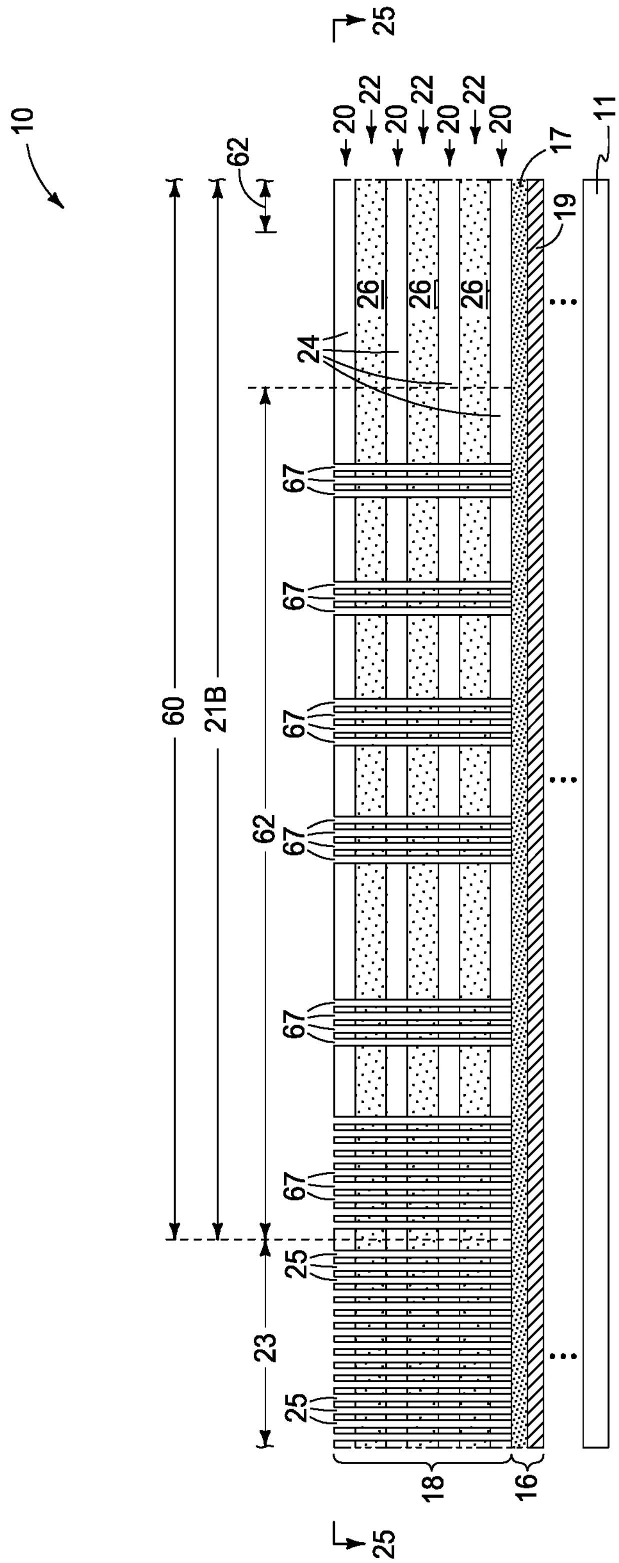
Figure 25:
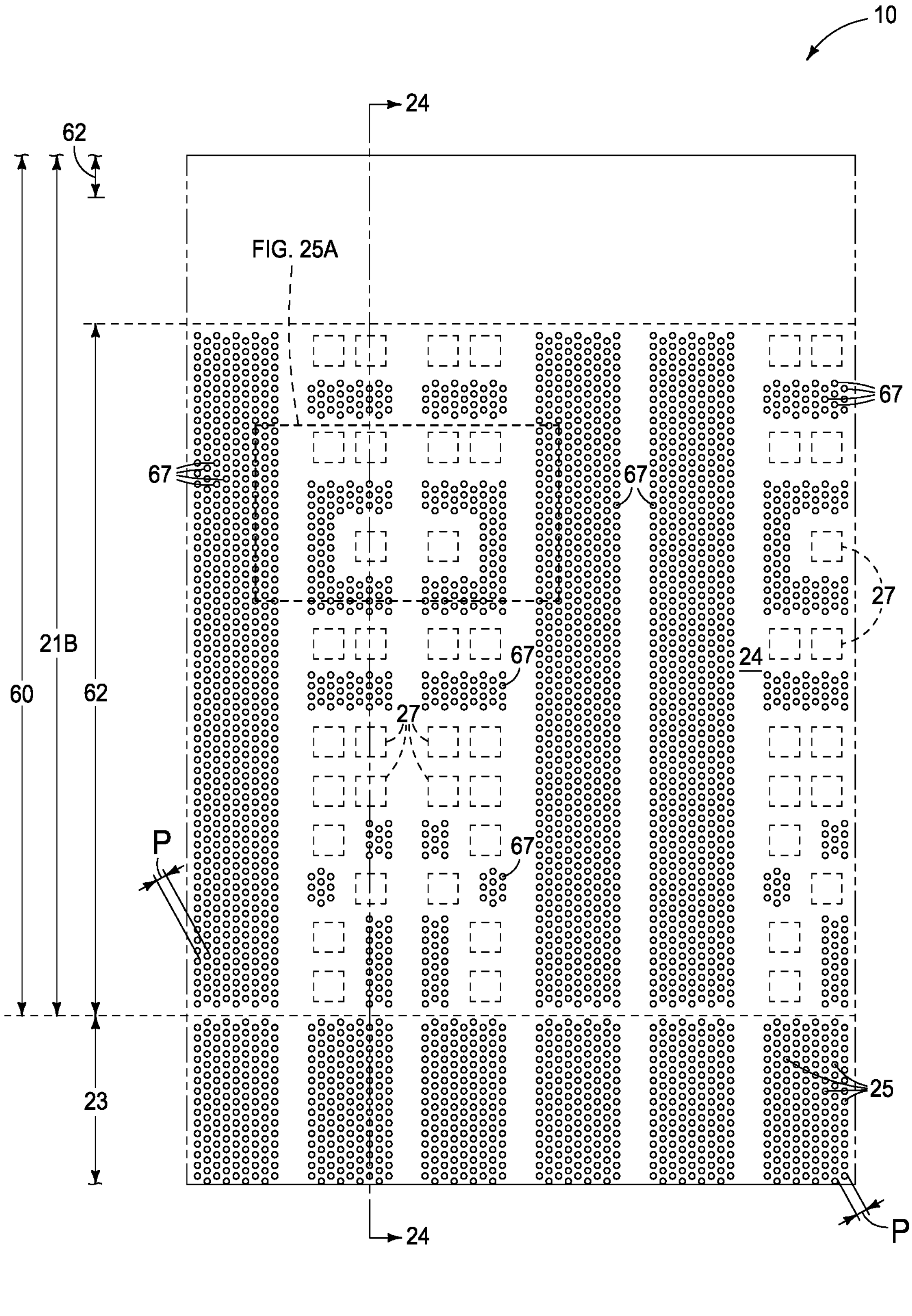
Figure 25A:
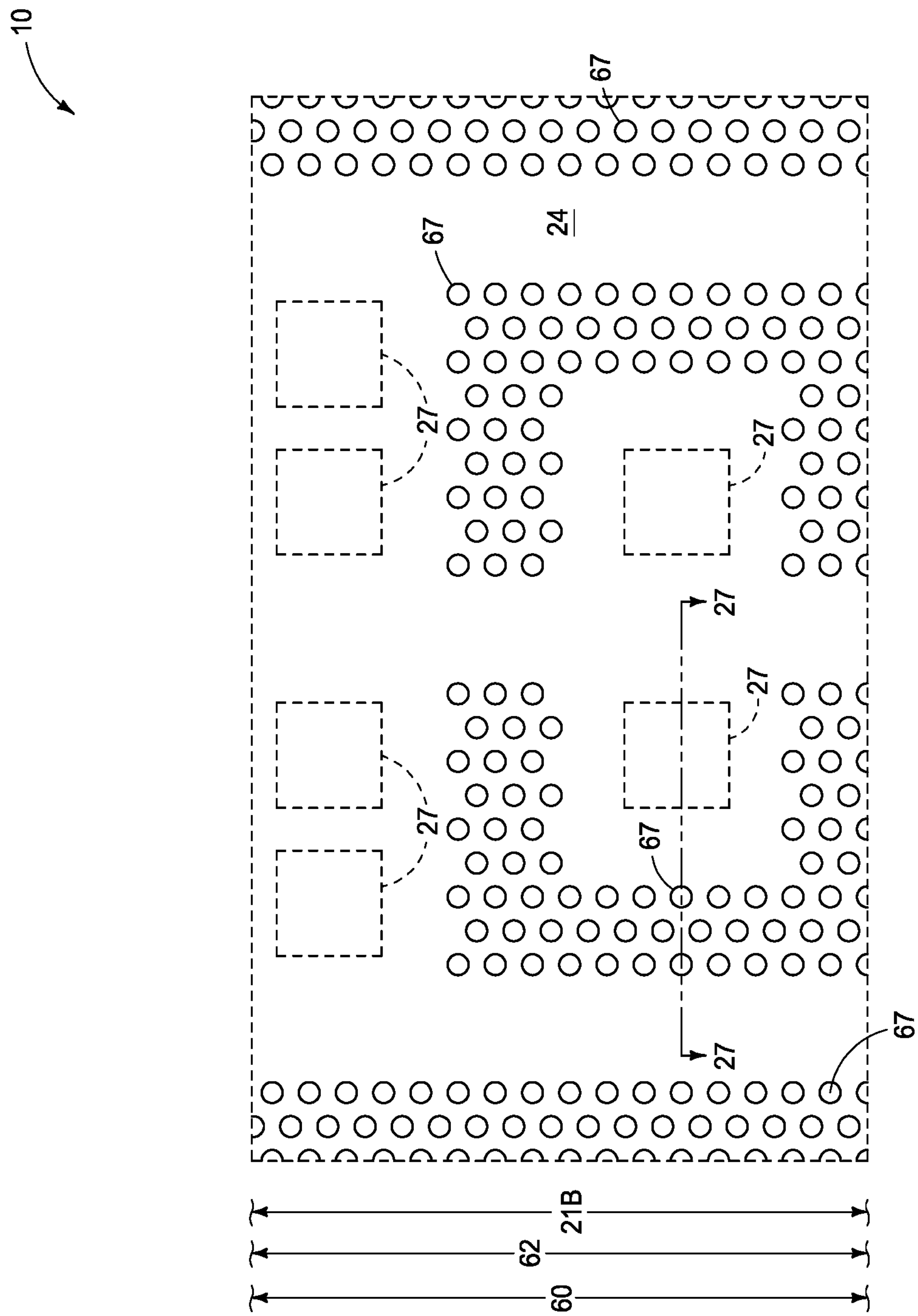
Figure 26:
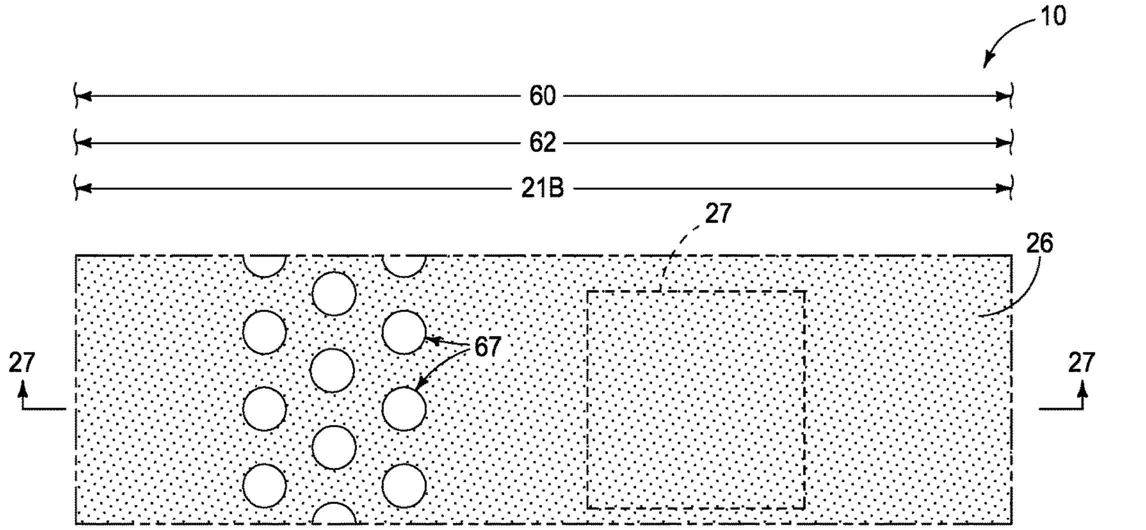
Figure 27:
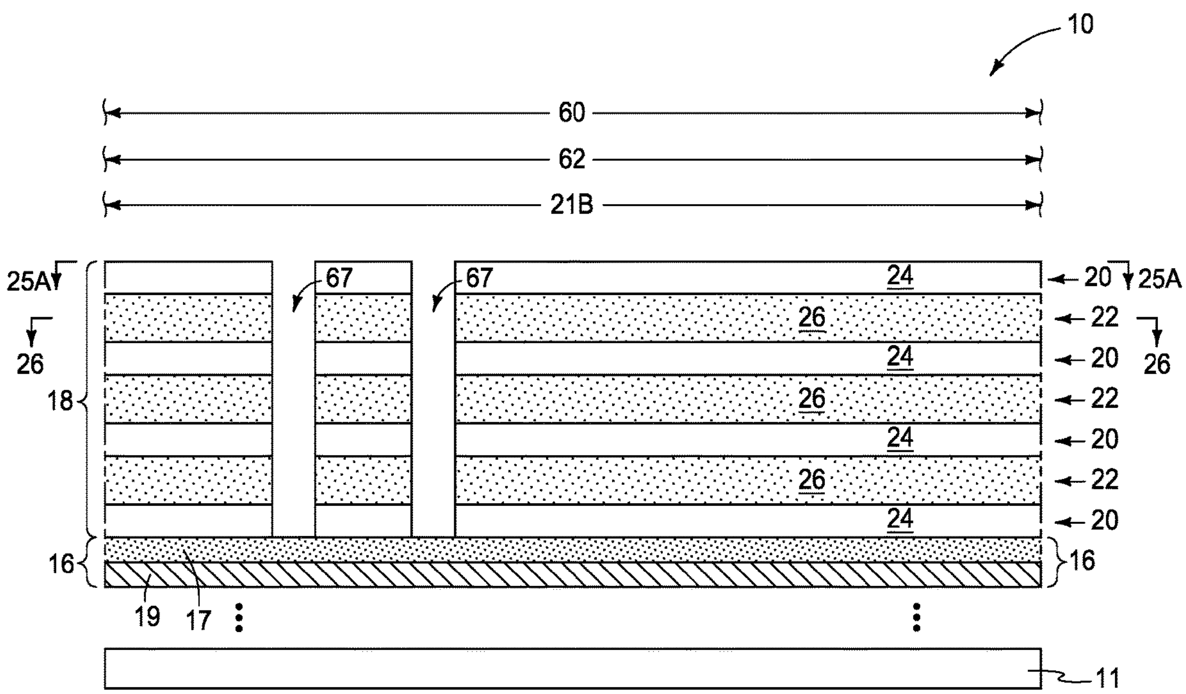
Figure 28:
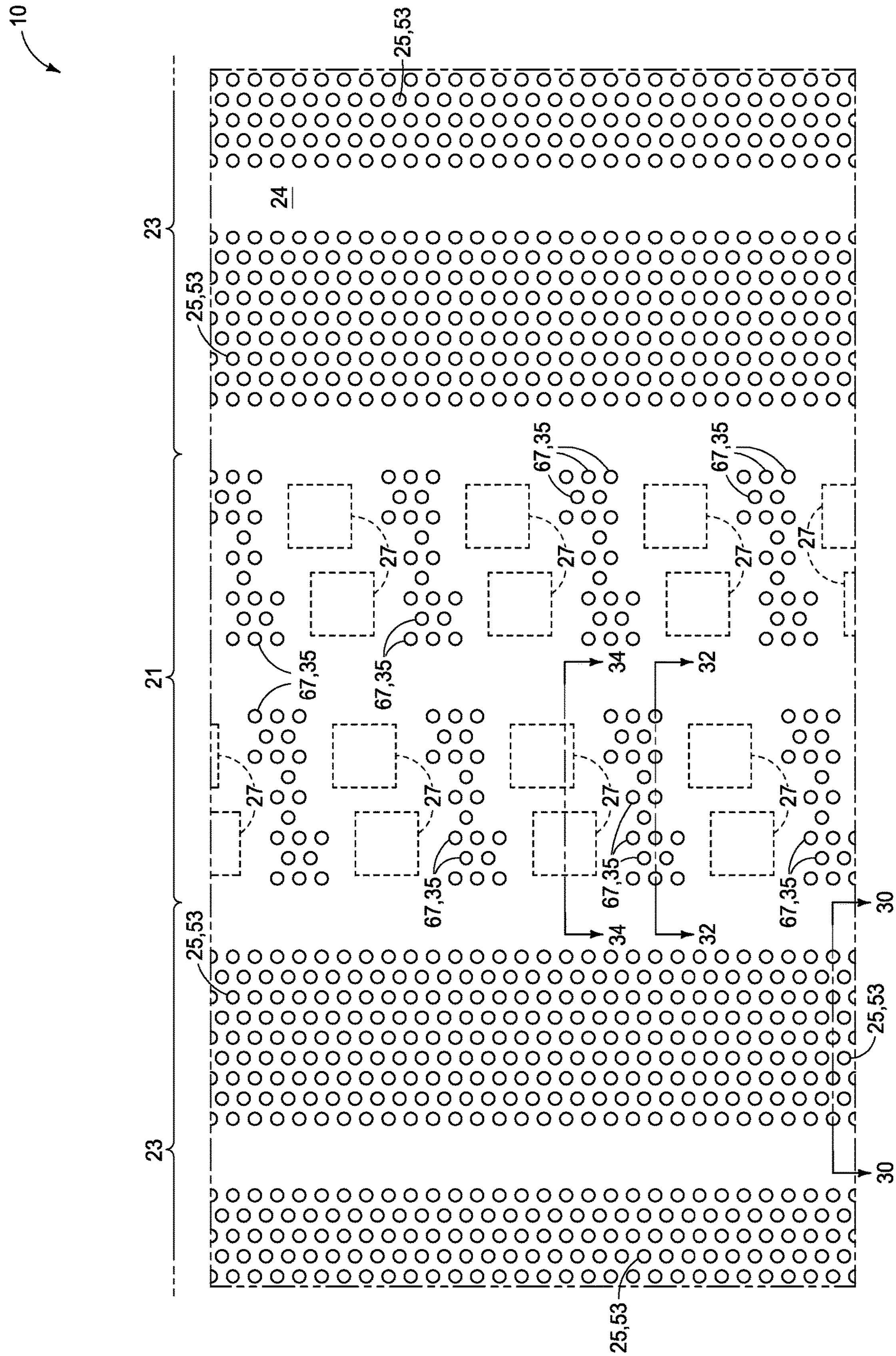
Figure 29:
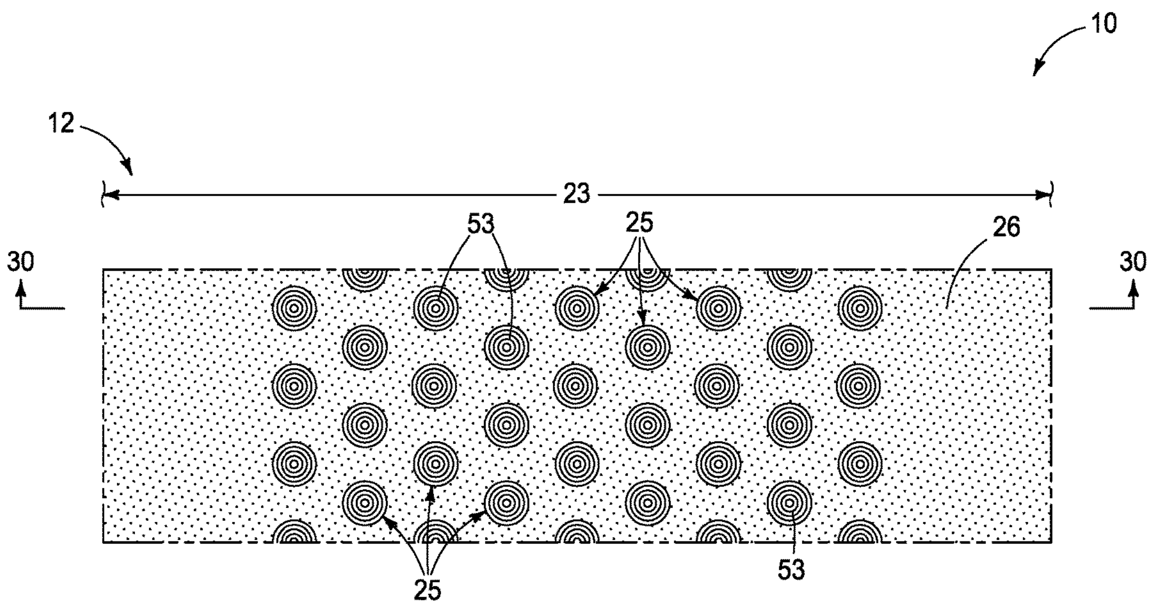
Figure 30:
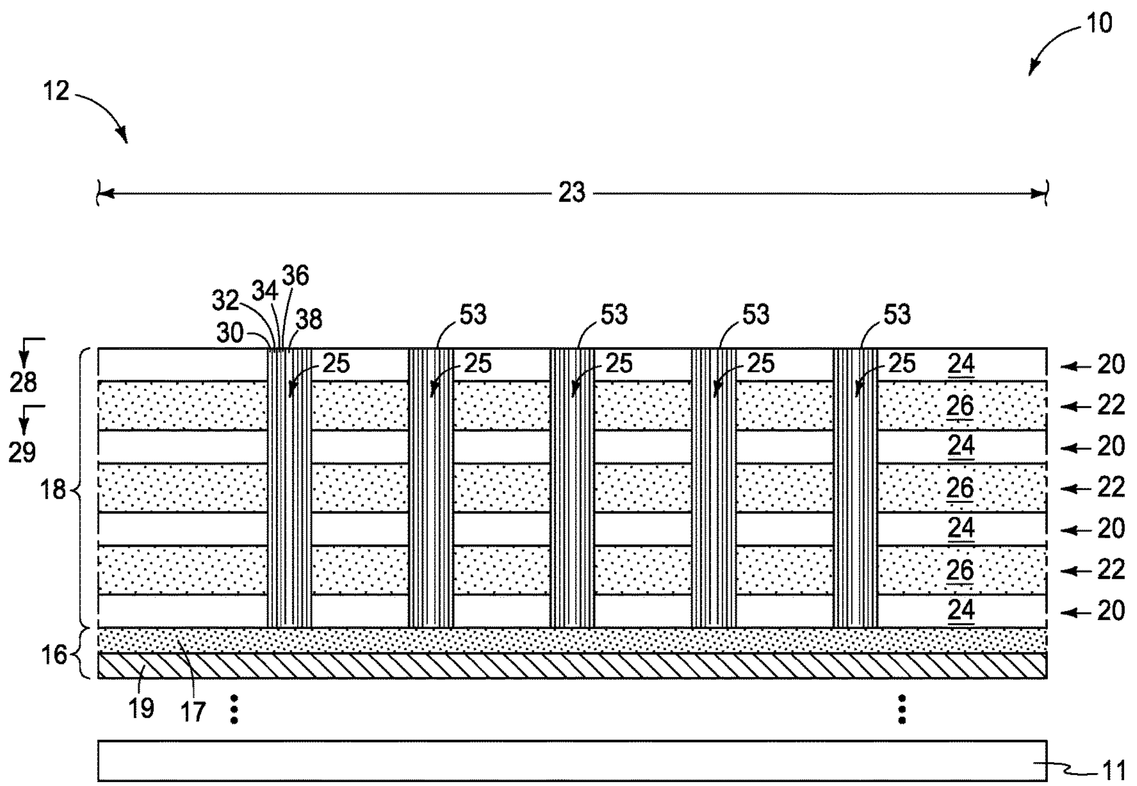
Figure 31:
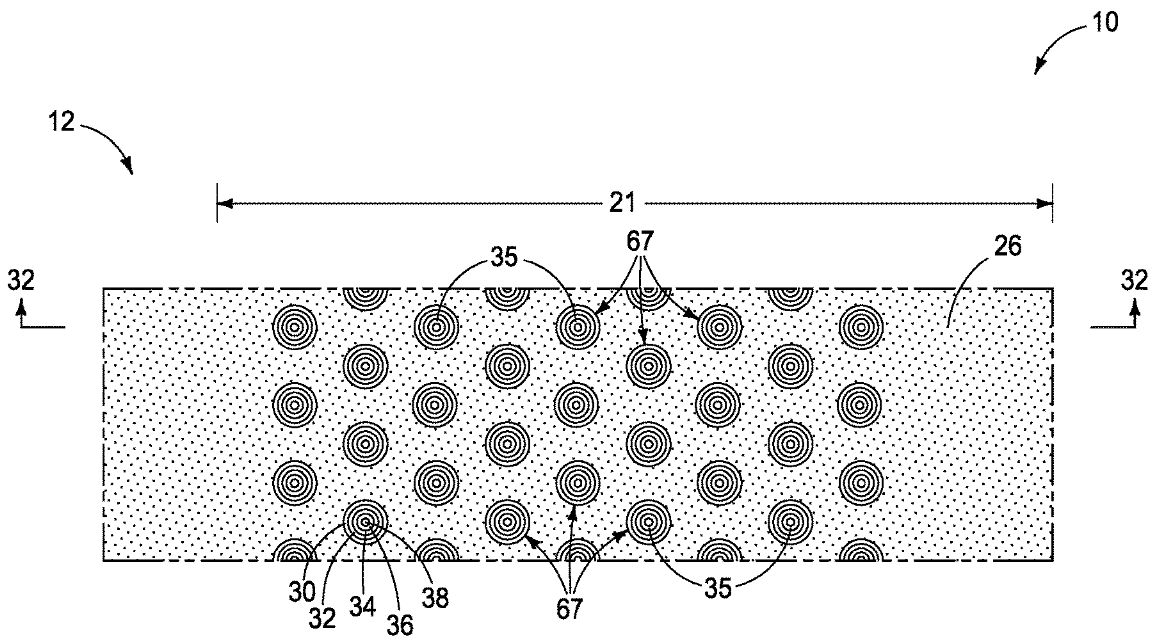
Figure 32:
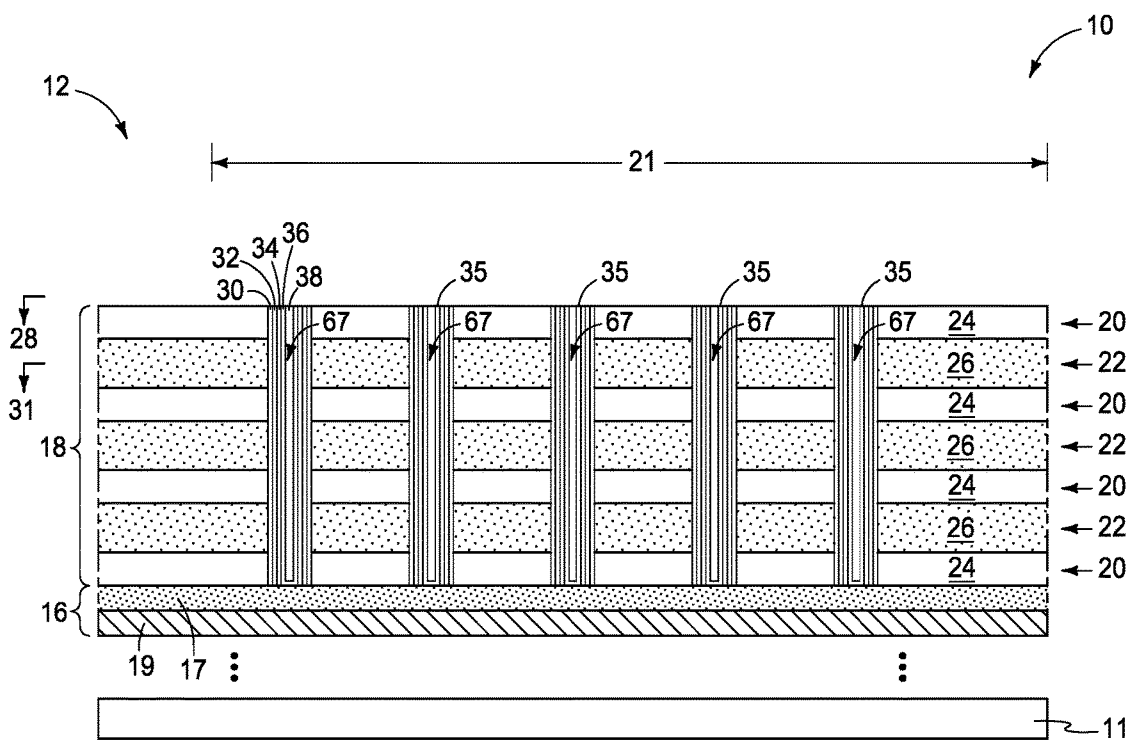
Figure 33:
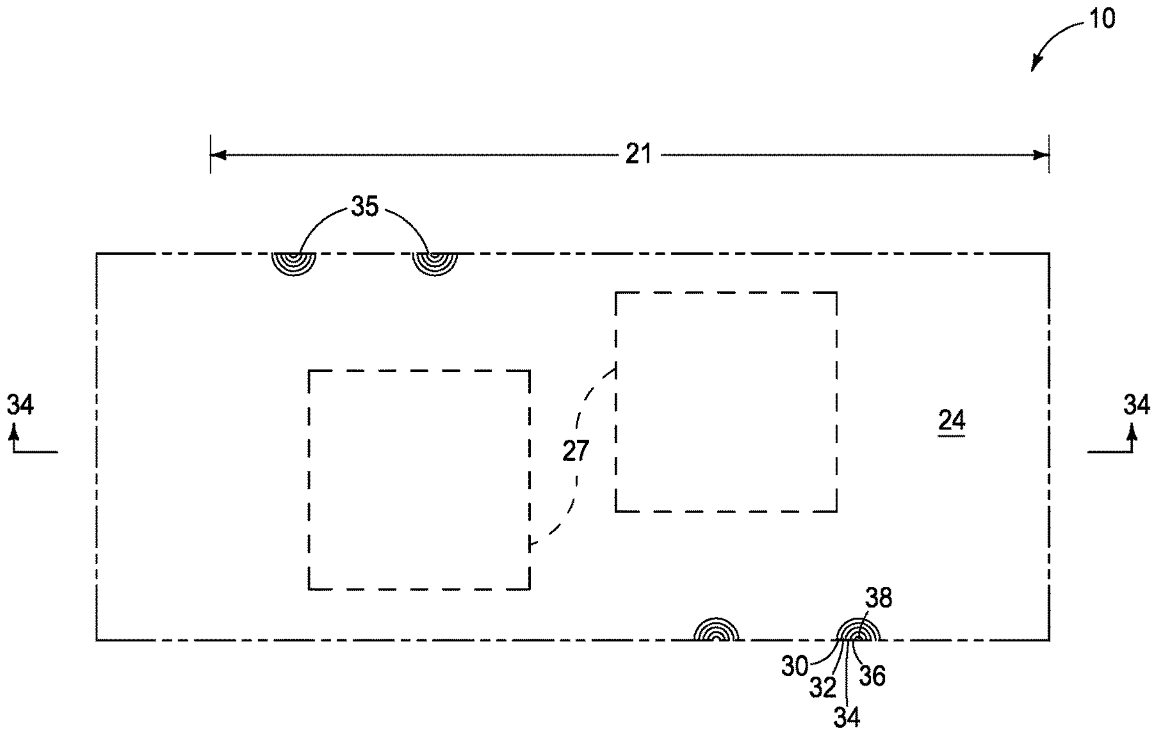
Figure 34:
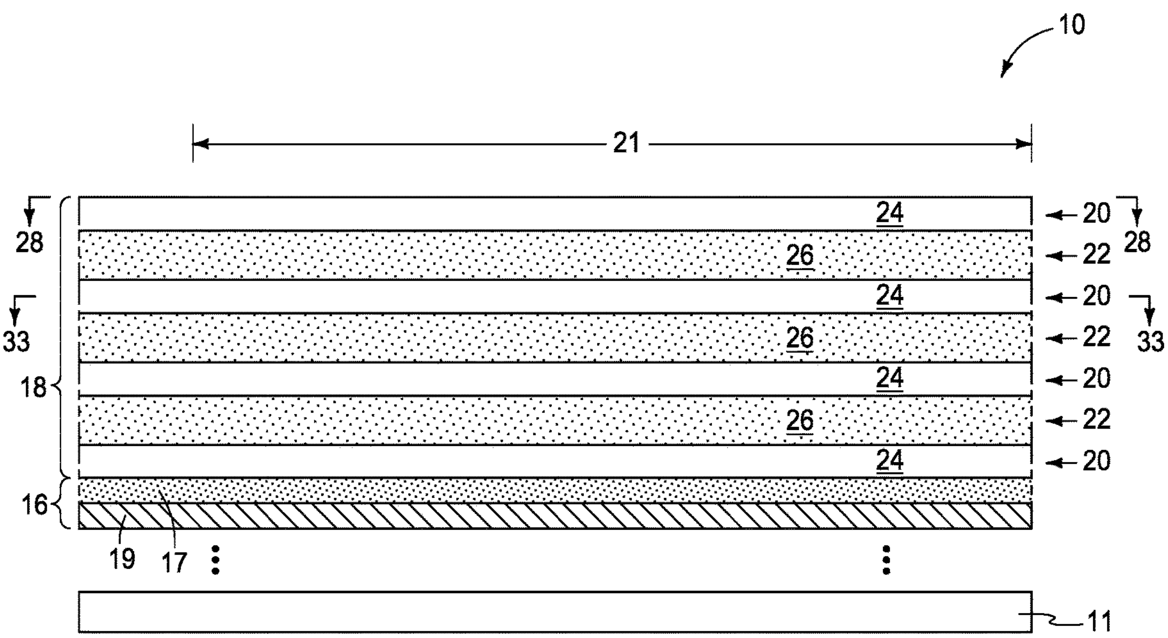
Figure 35:
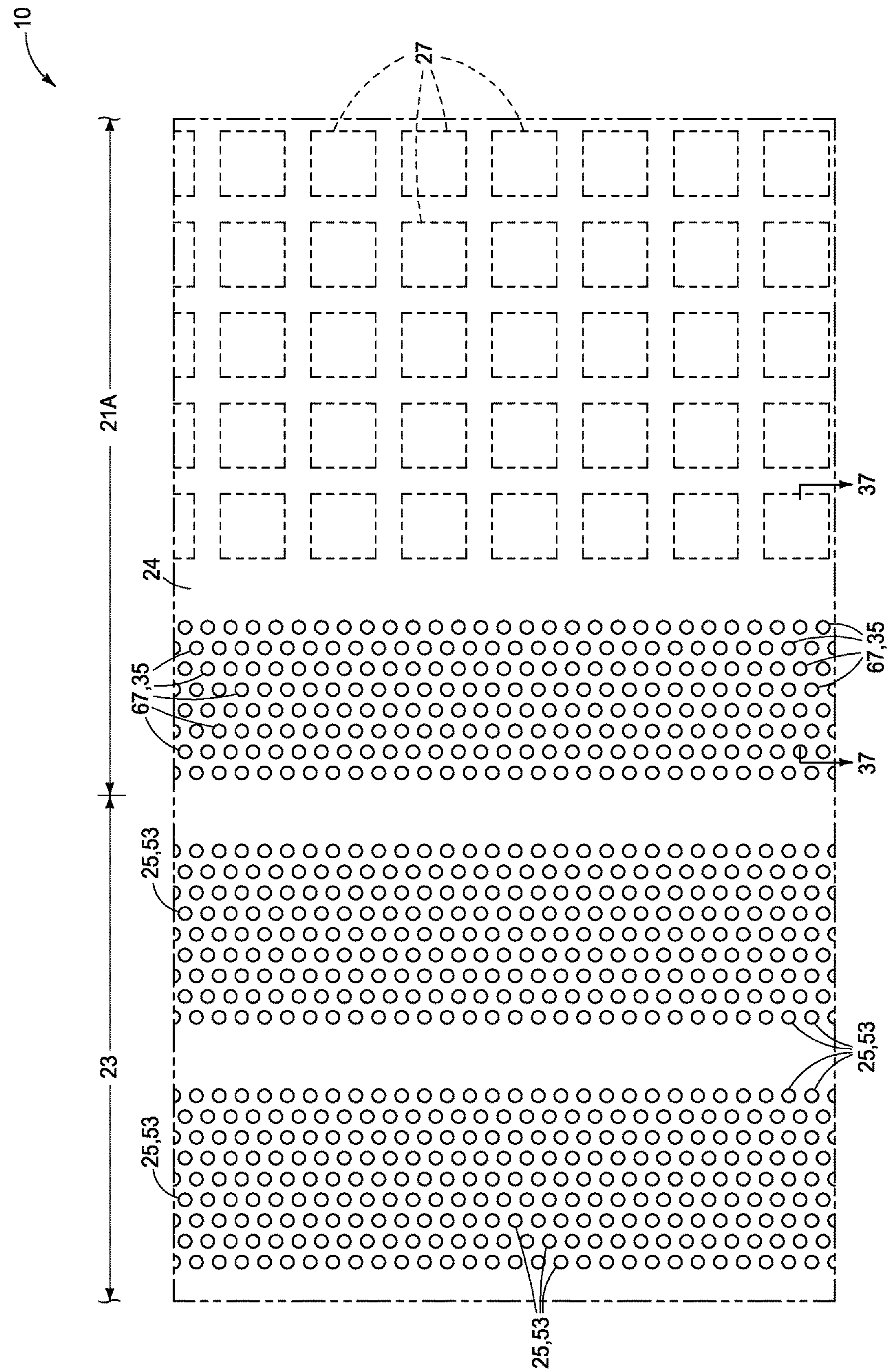
Figure 36:
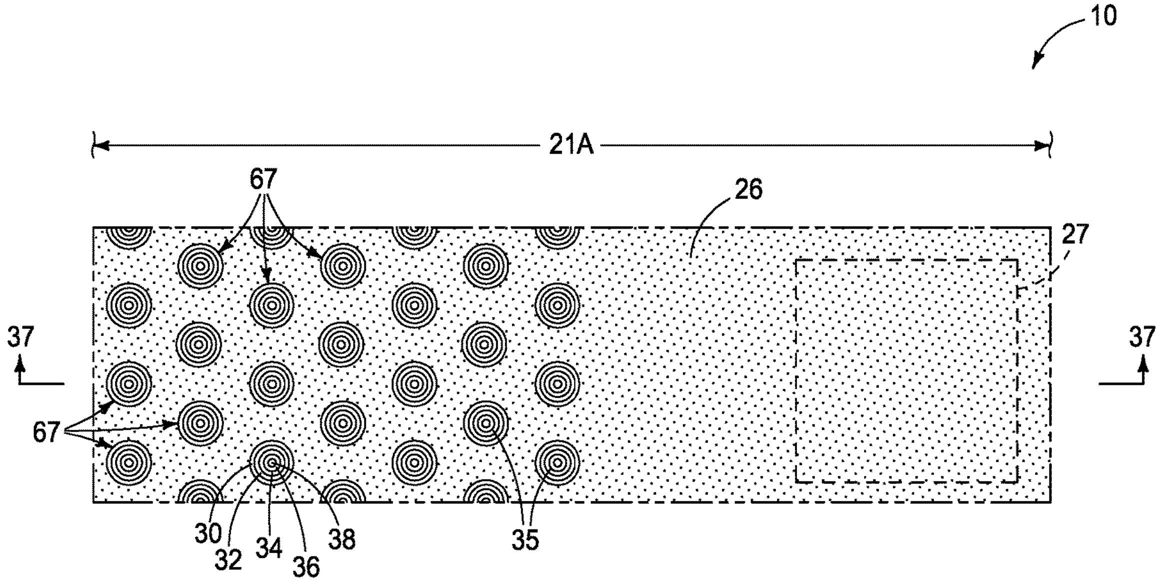
Figure 37:
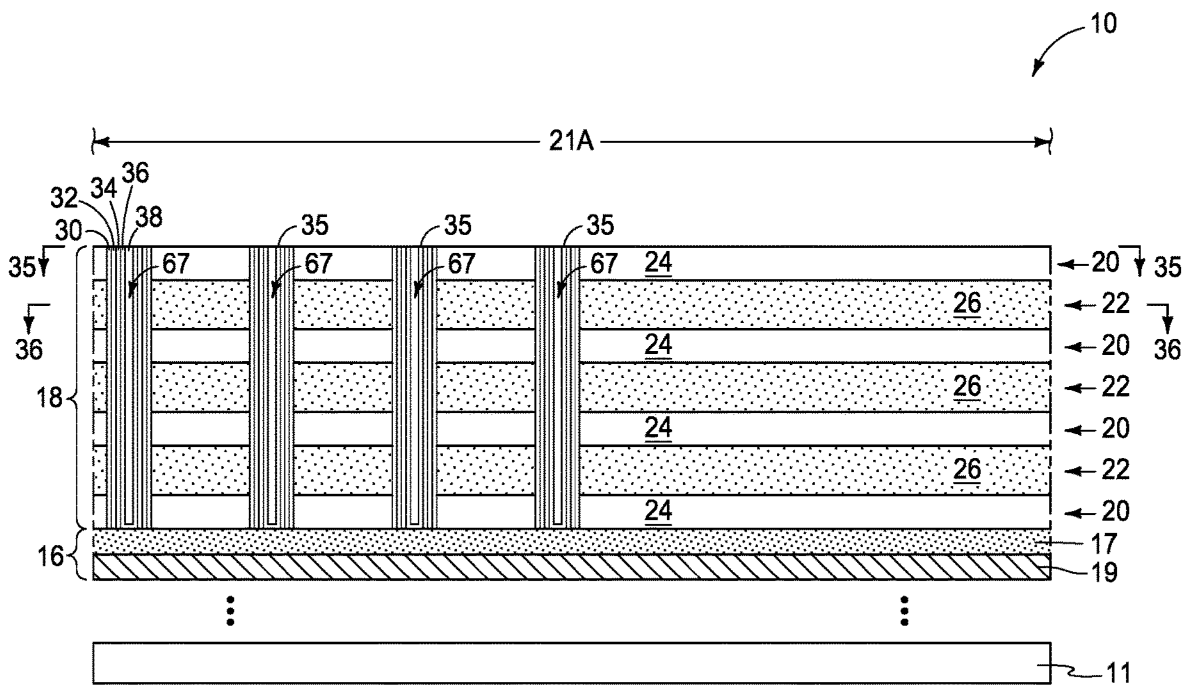
Figure 38:
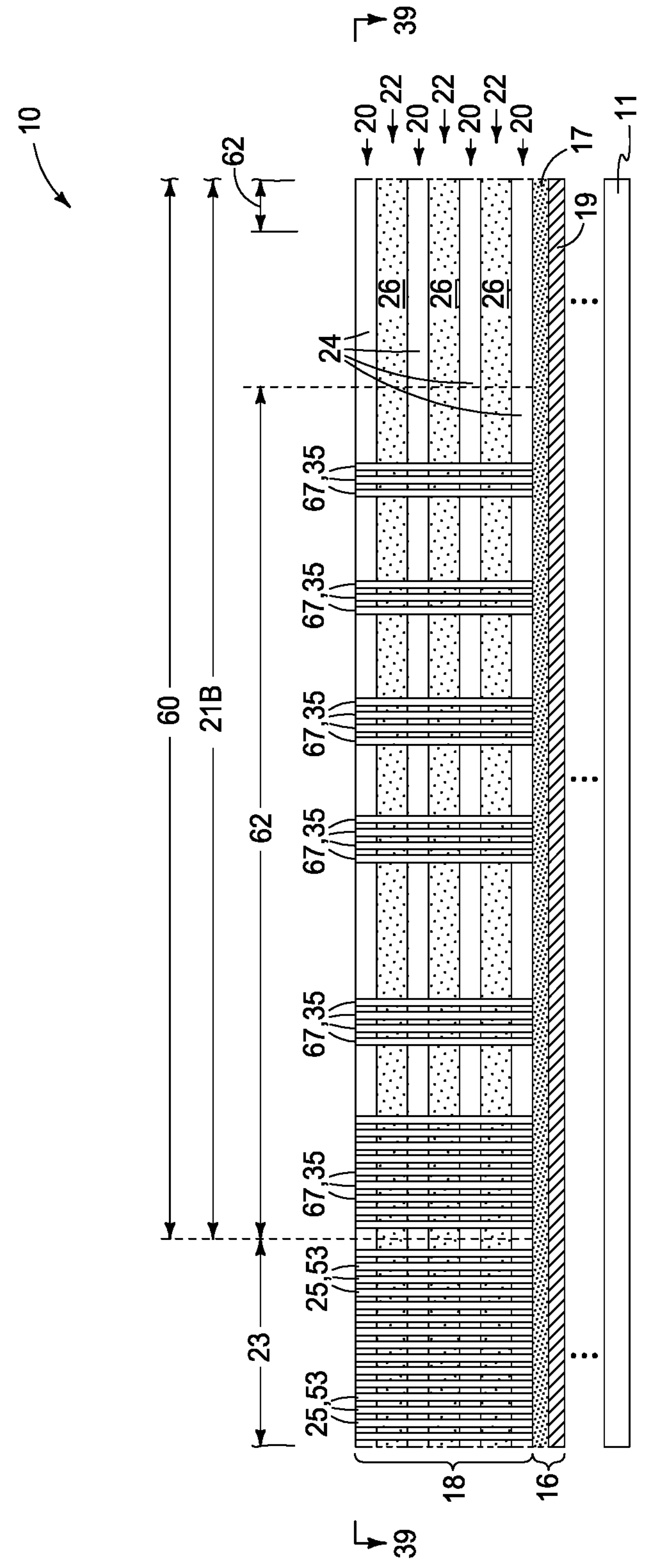
Figure 39:
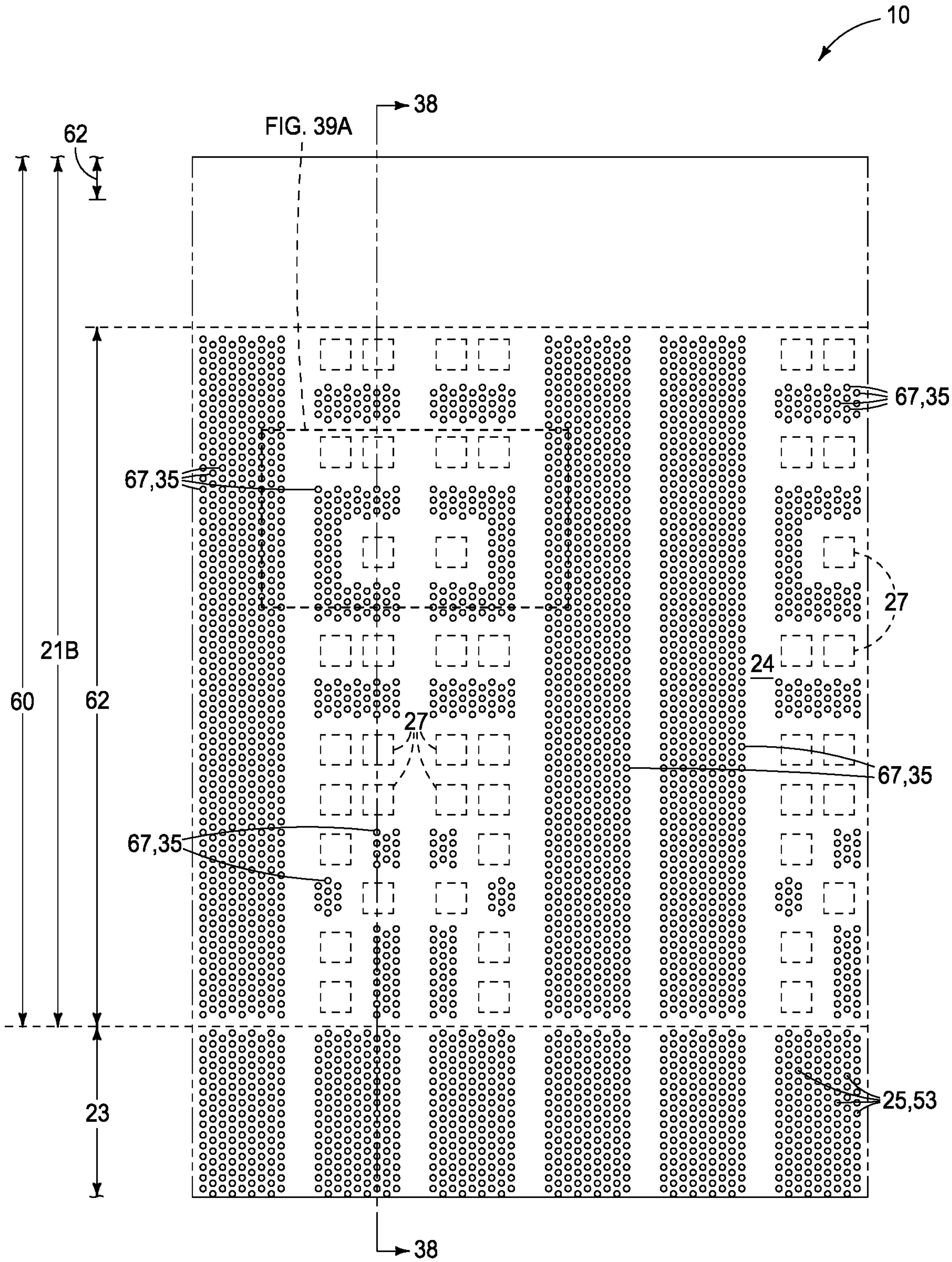
Figure 39A:
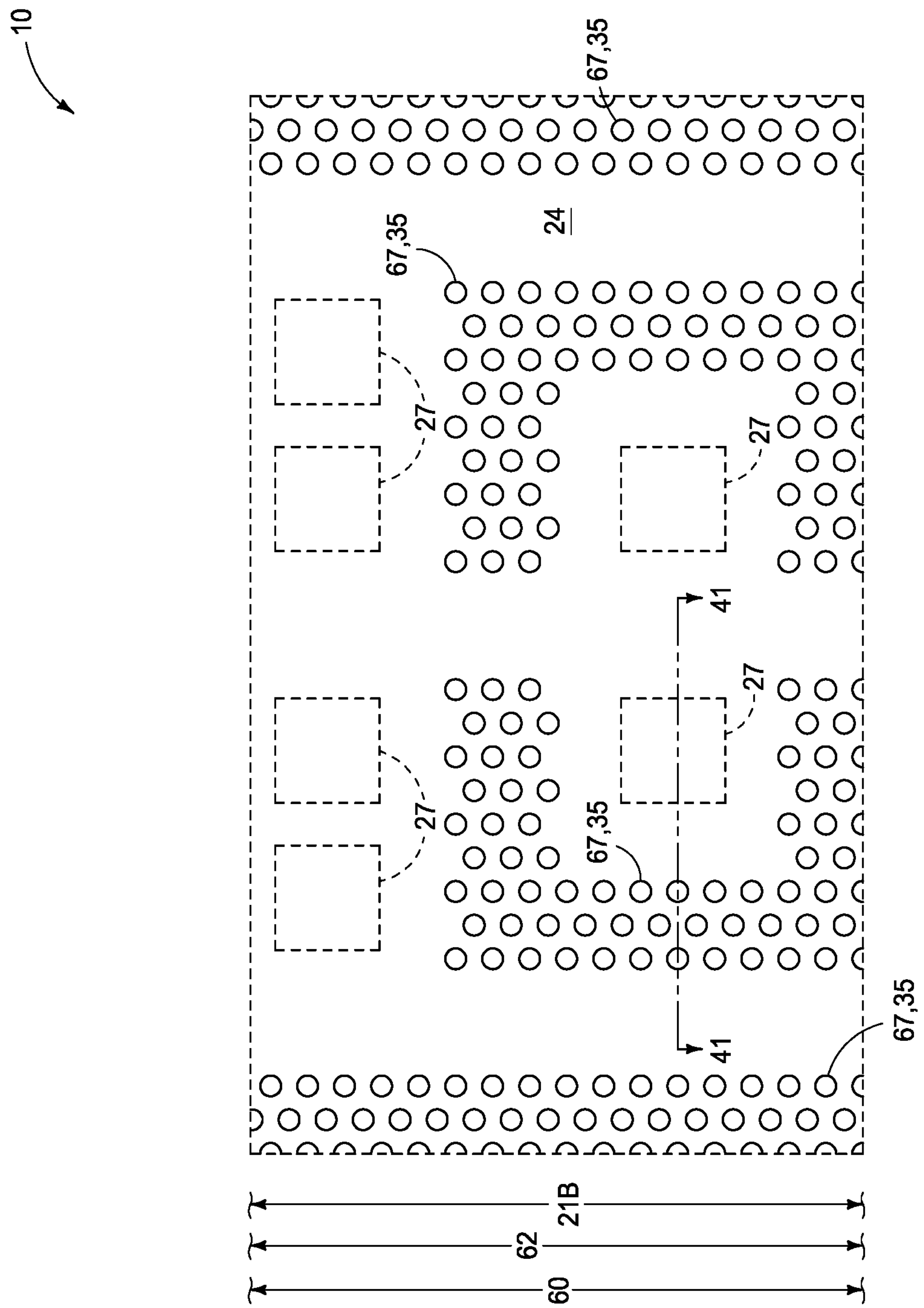
Figure 40:
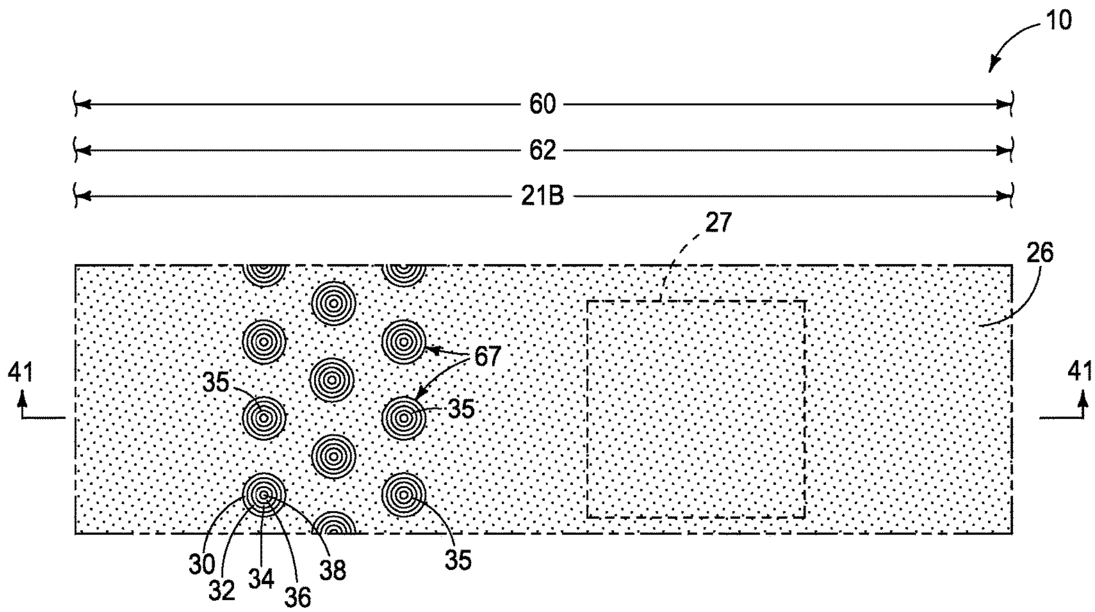
Figure 41:
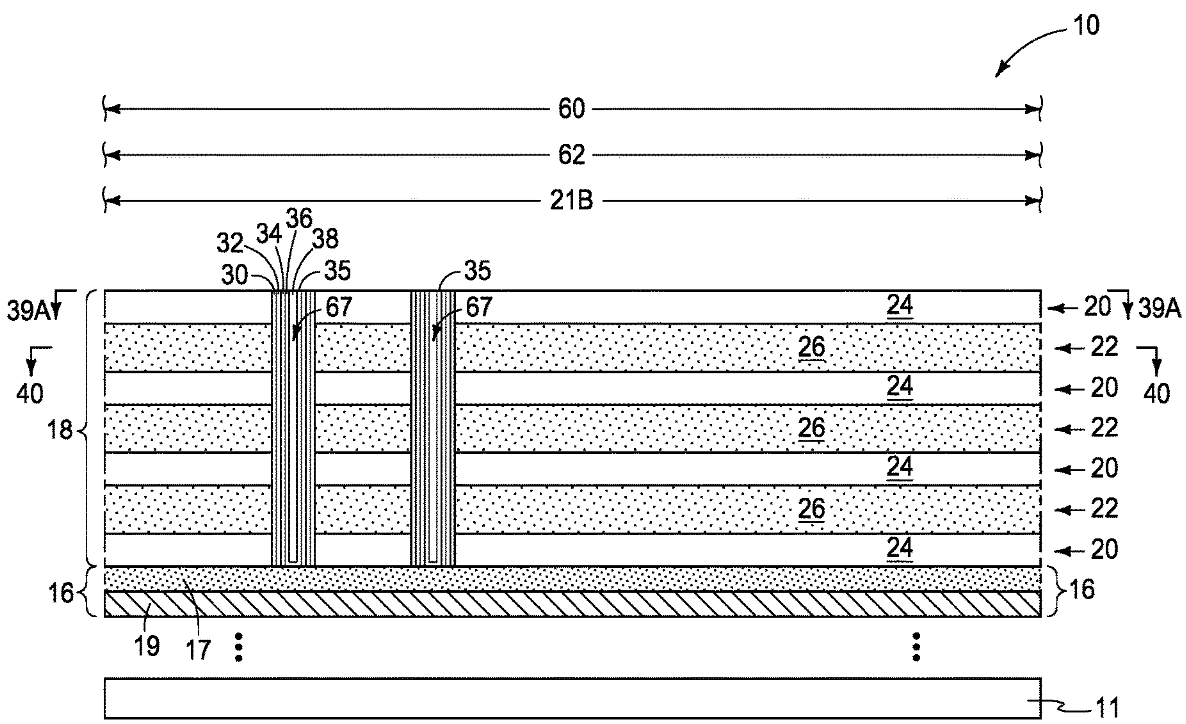
Figure 42:
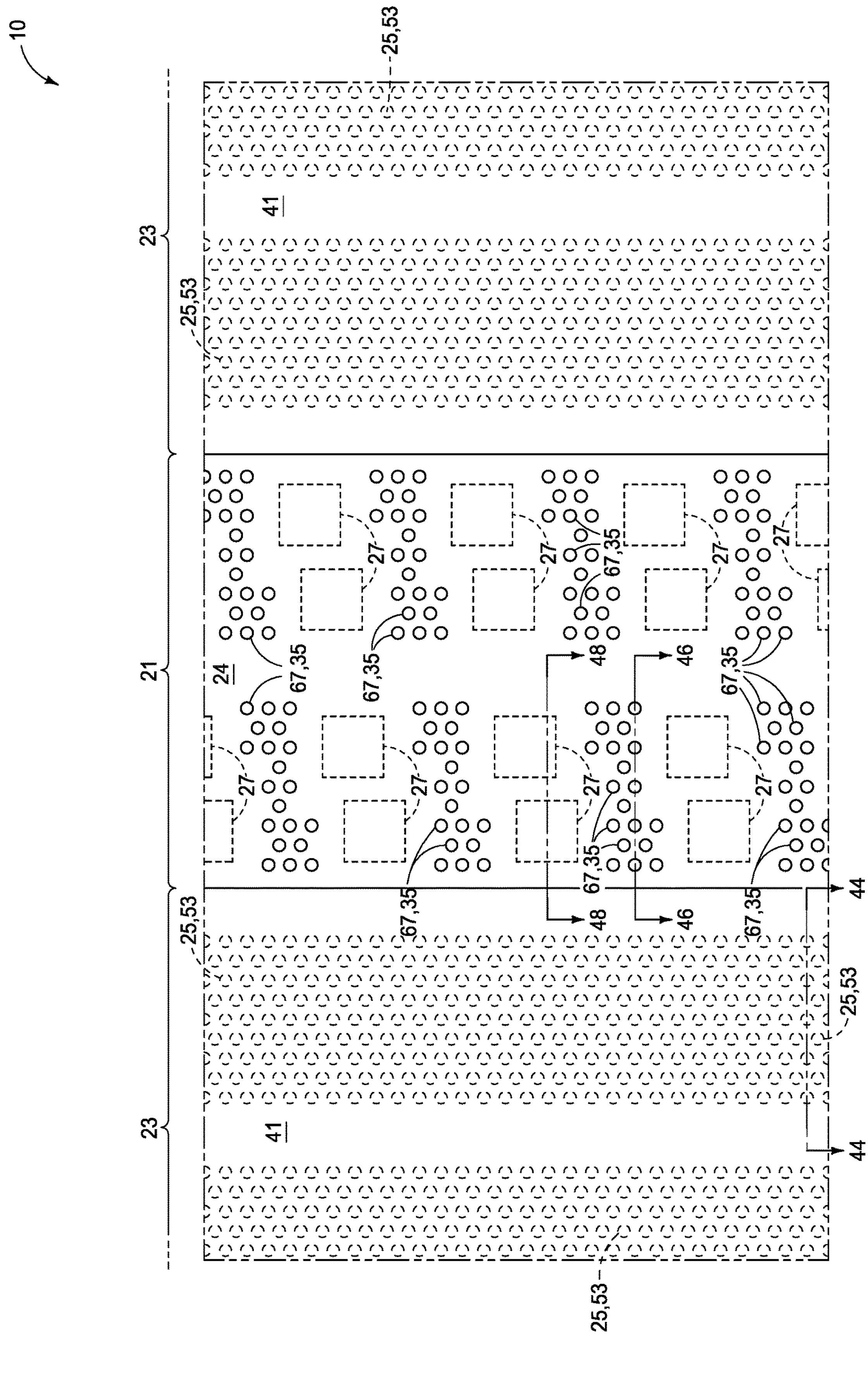
Figure 43:
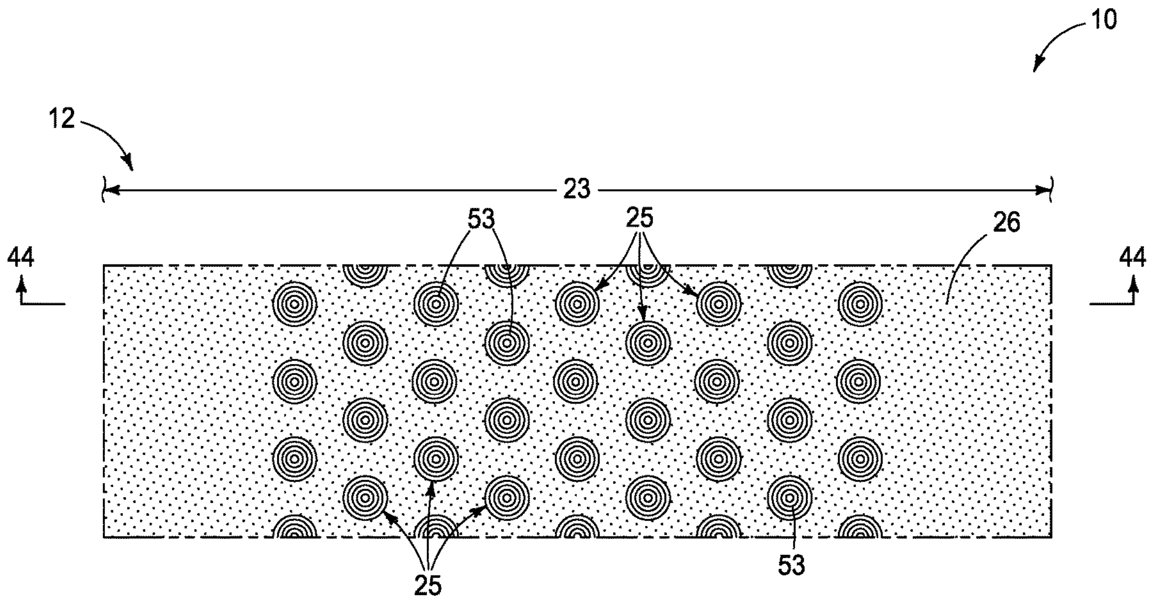
Figure 44:
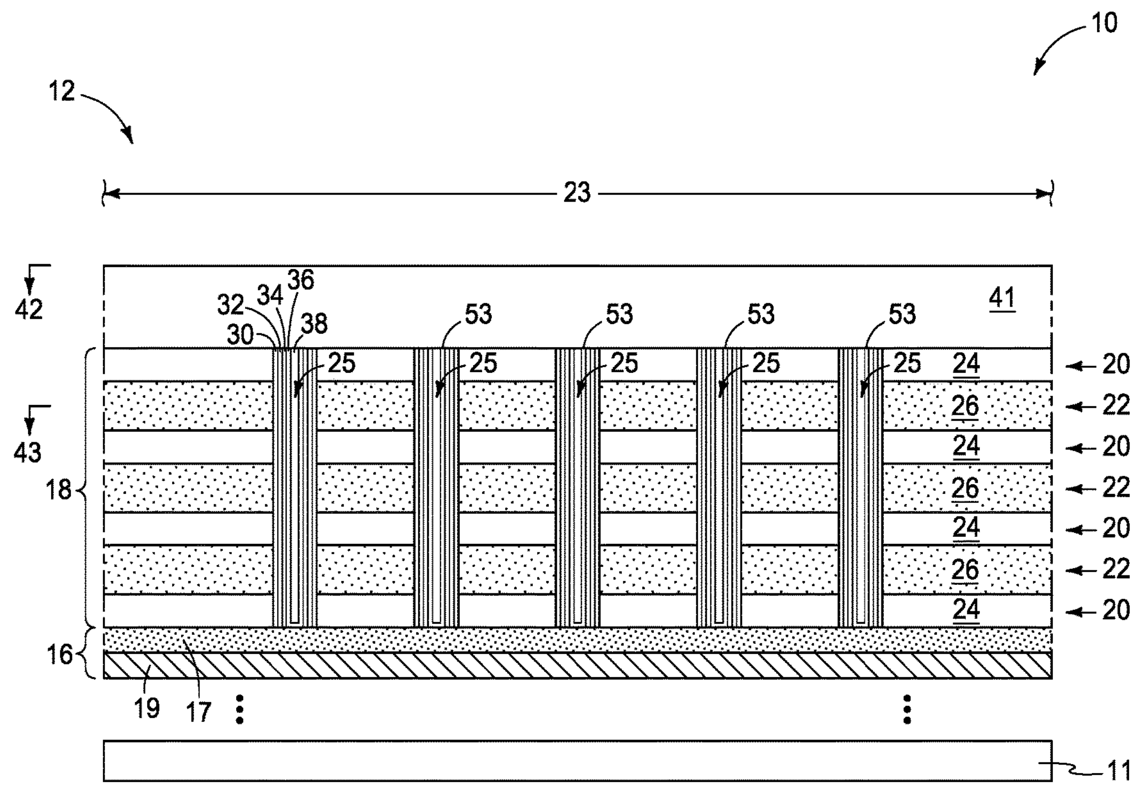
Figure 45:
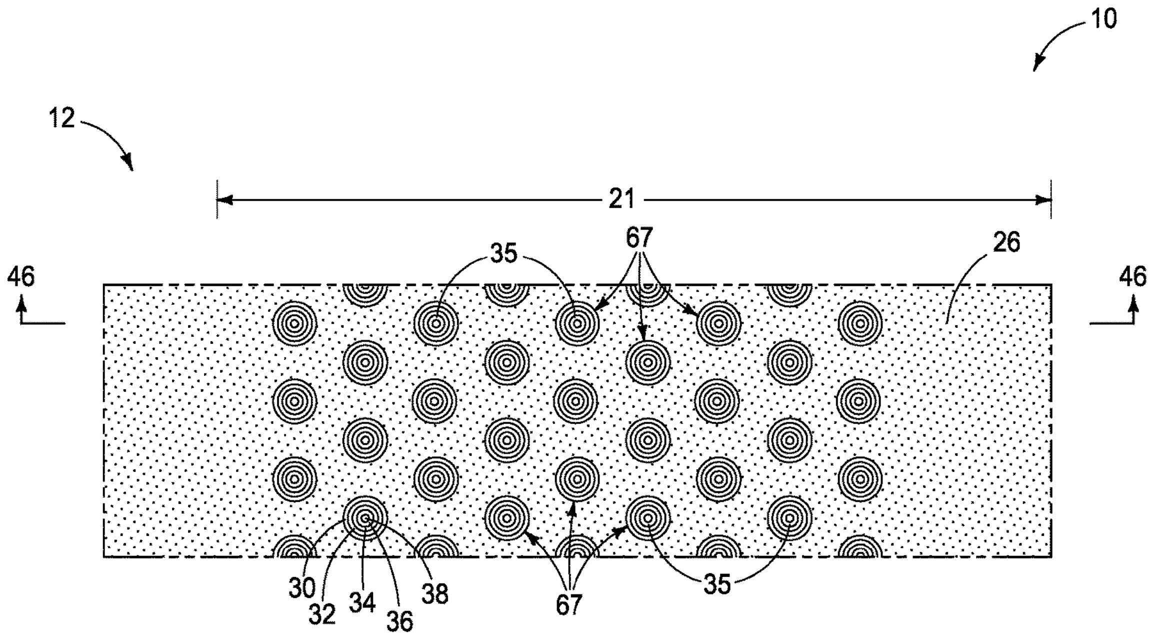
Figure 46:
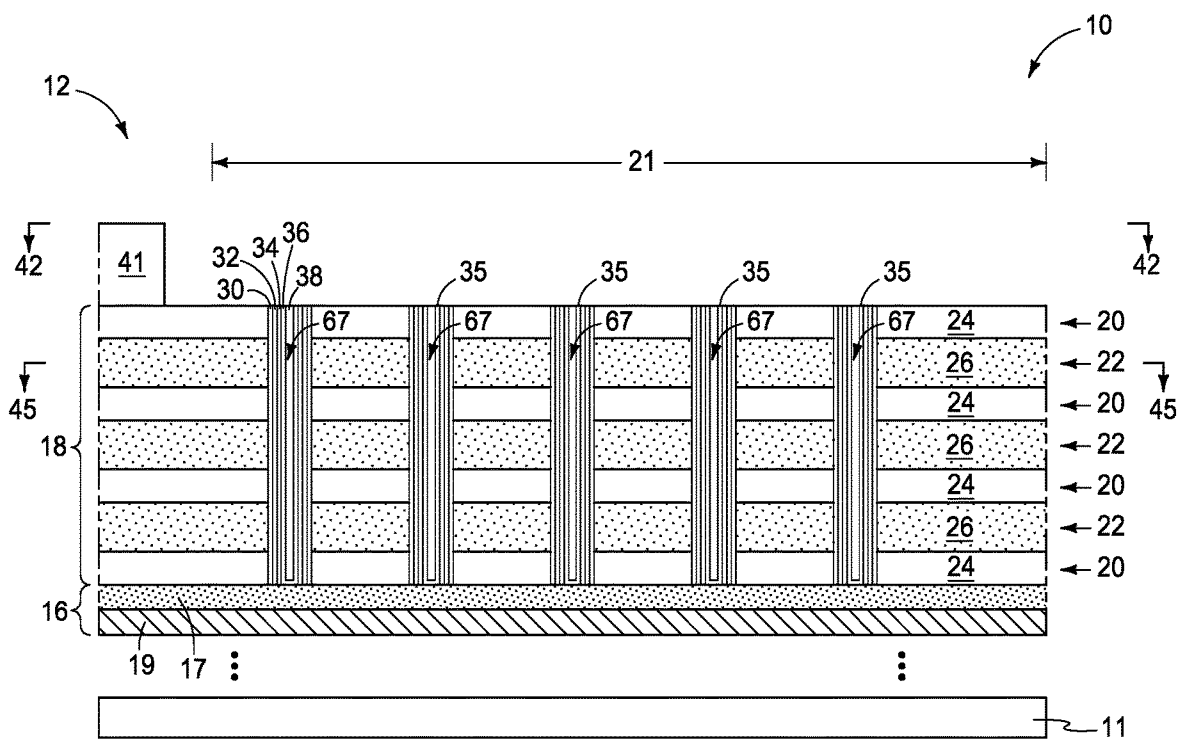
Figure 47:
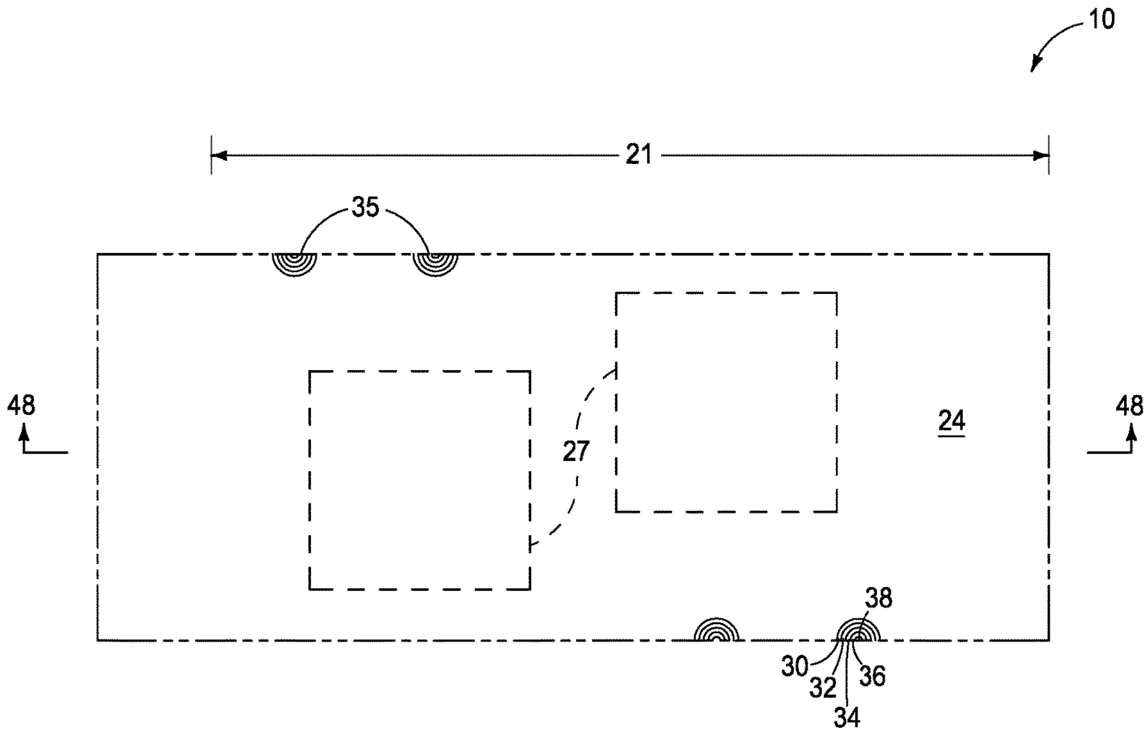
Figure 48:
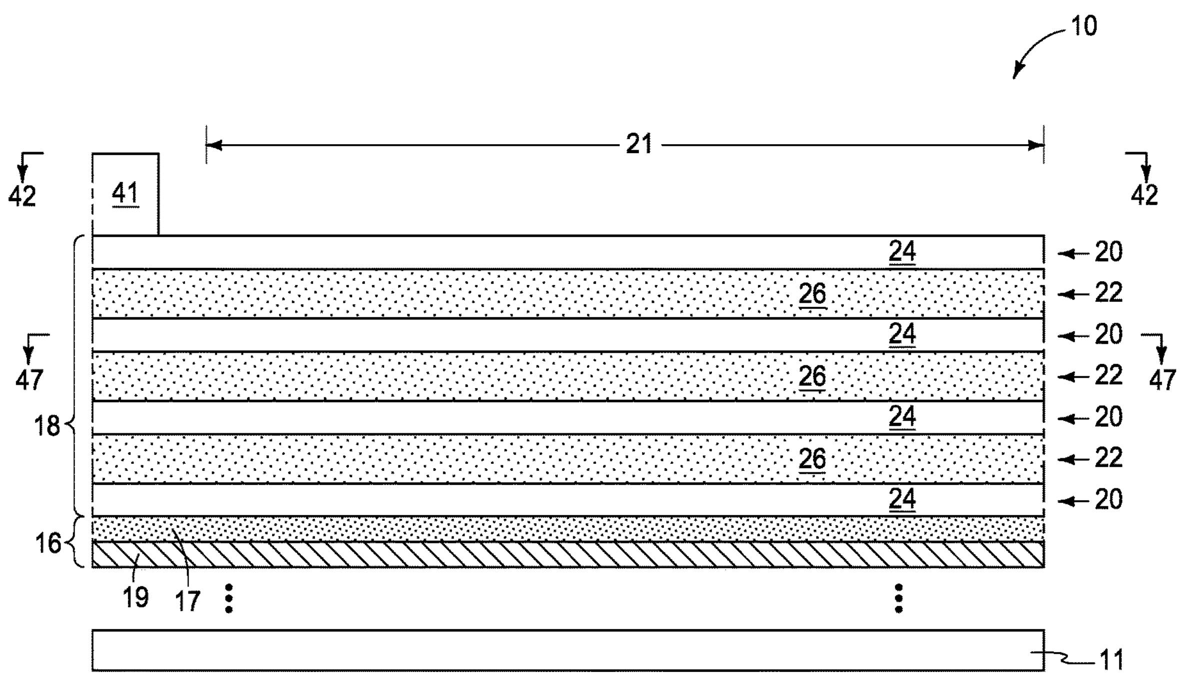
Figure 49:
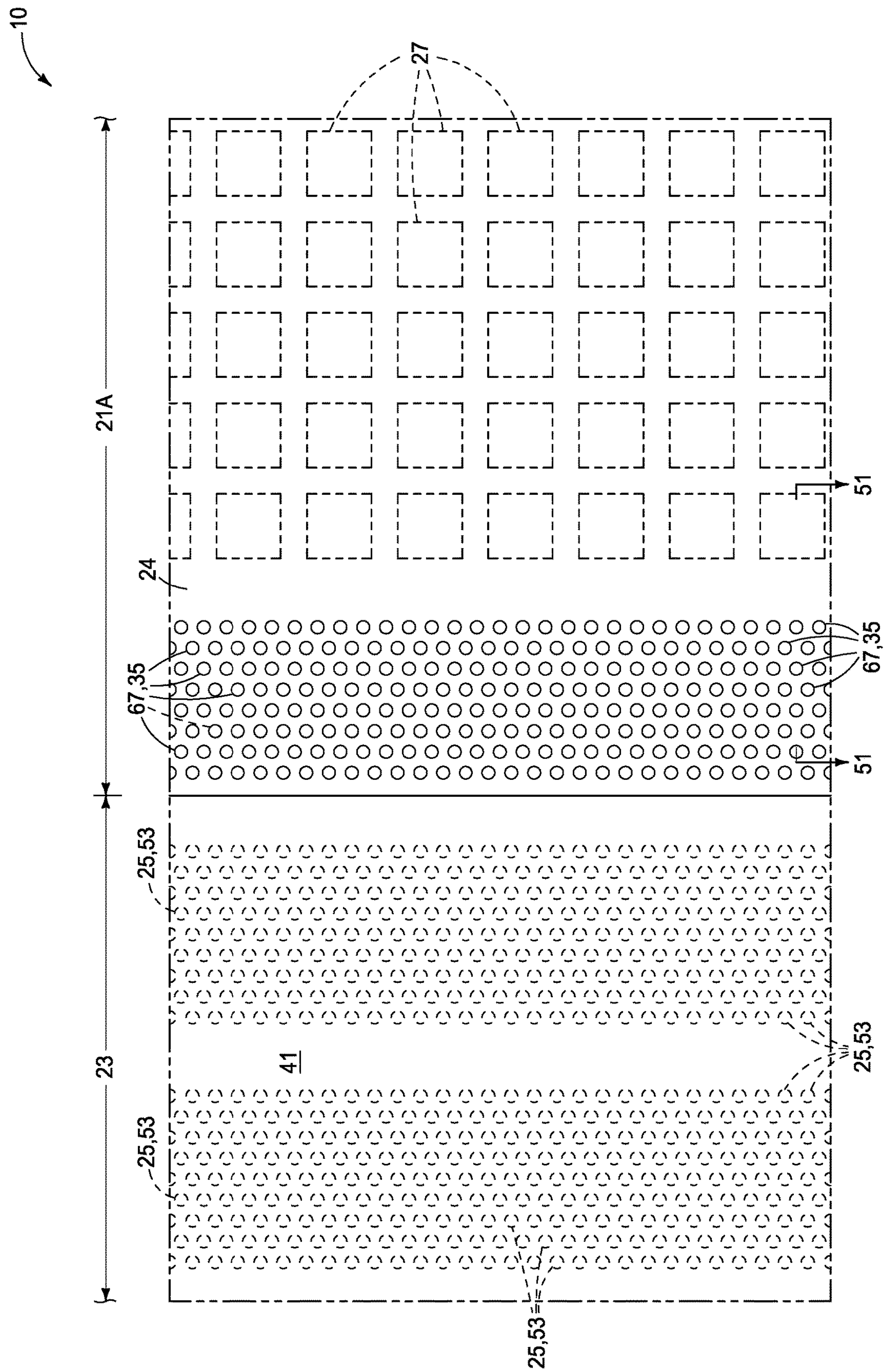
Figure 50:
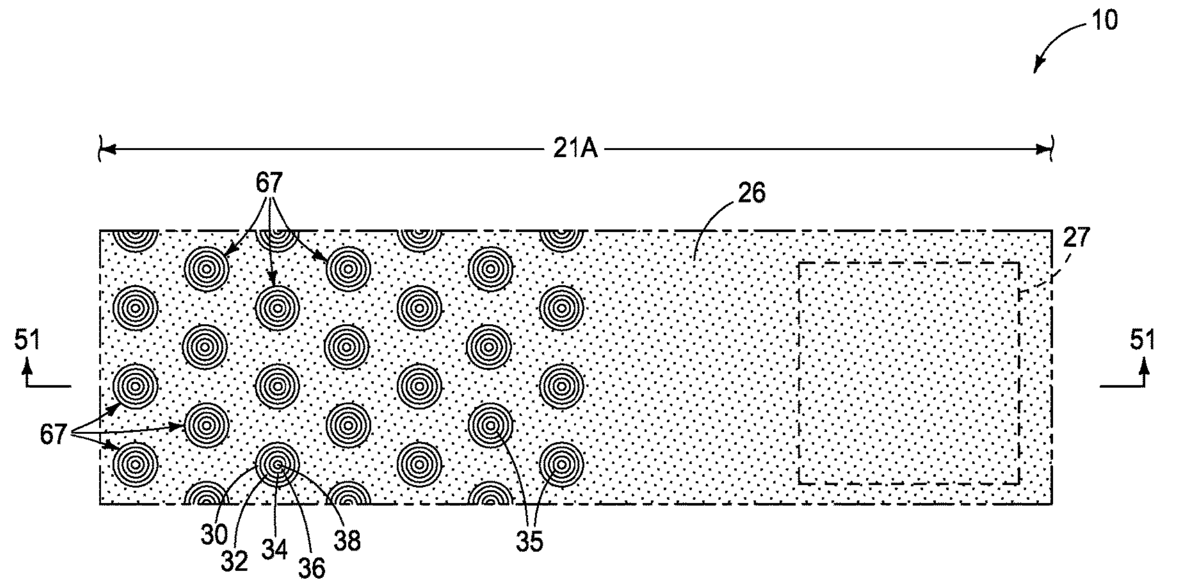
Figure 51:
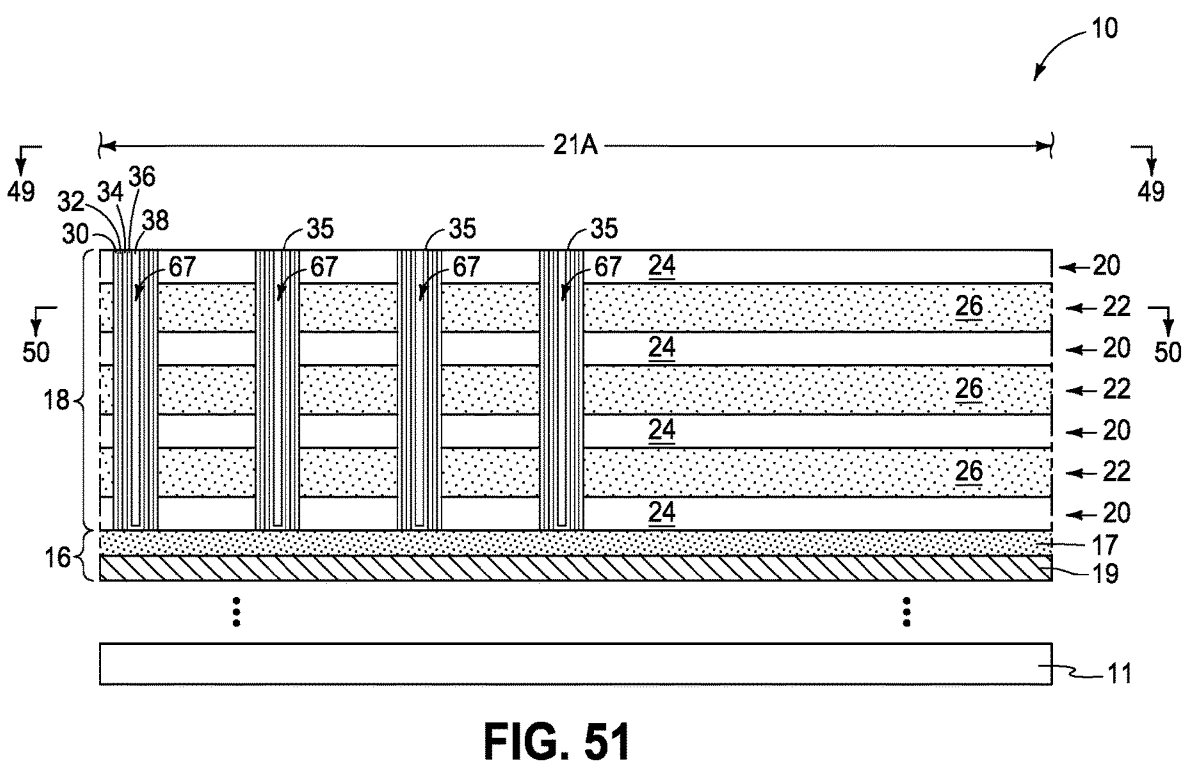
Figure 52:
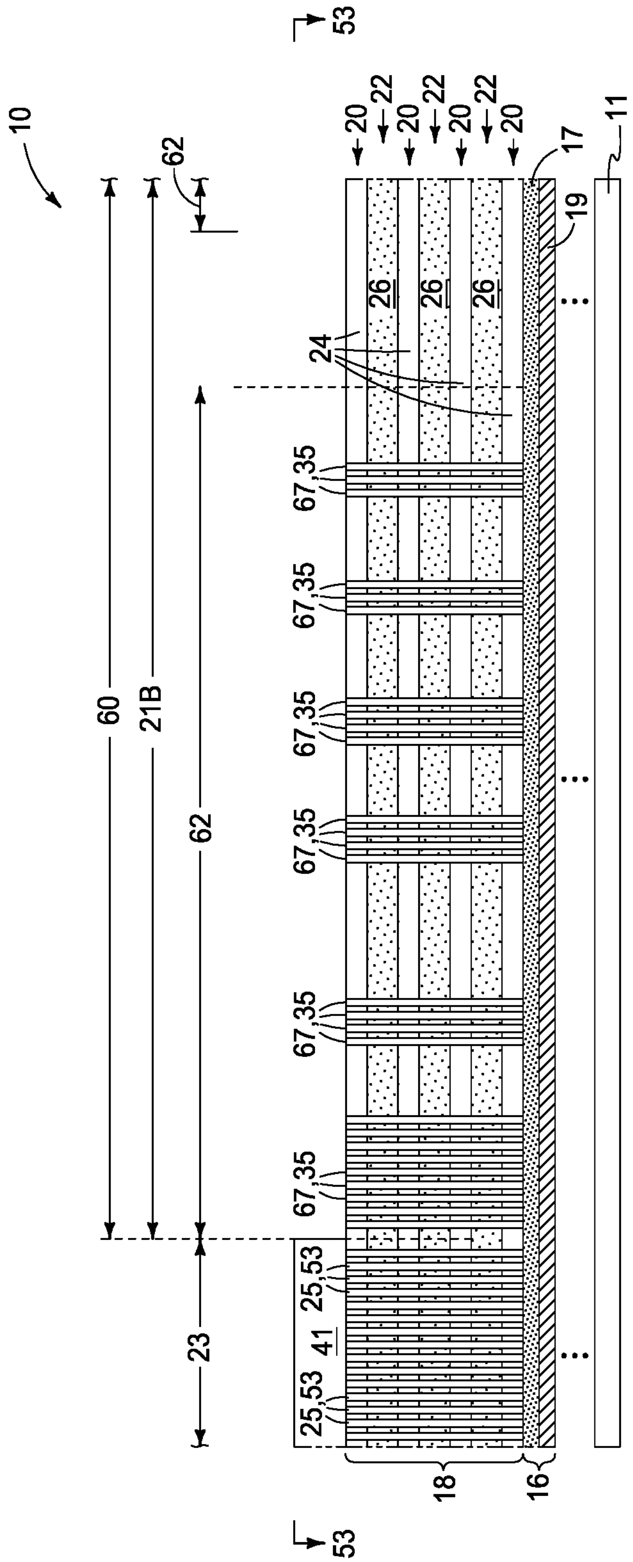
Figure 53:
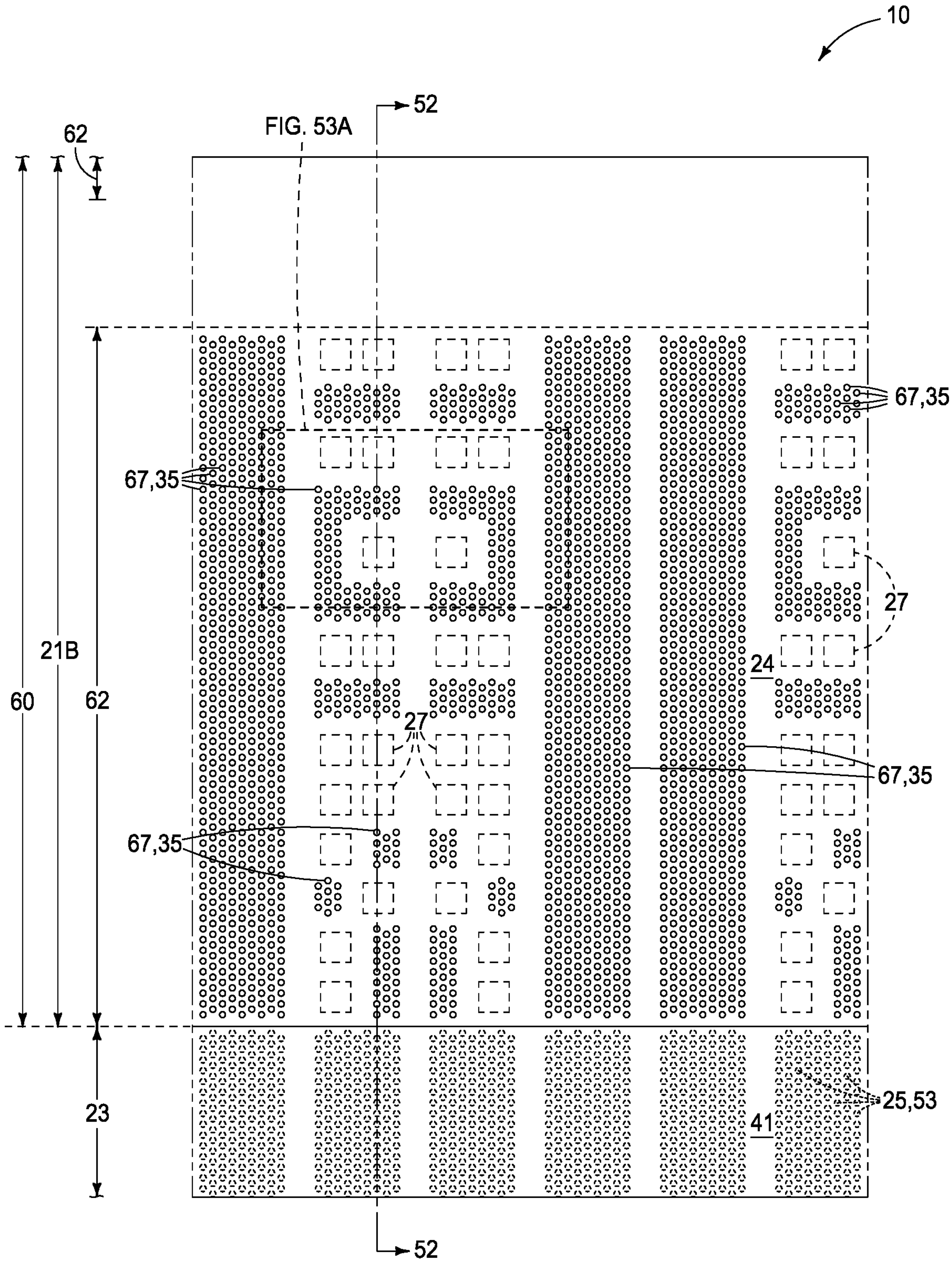
Figure 53A:
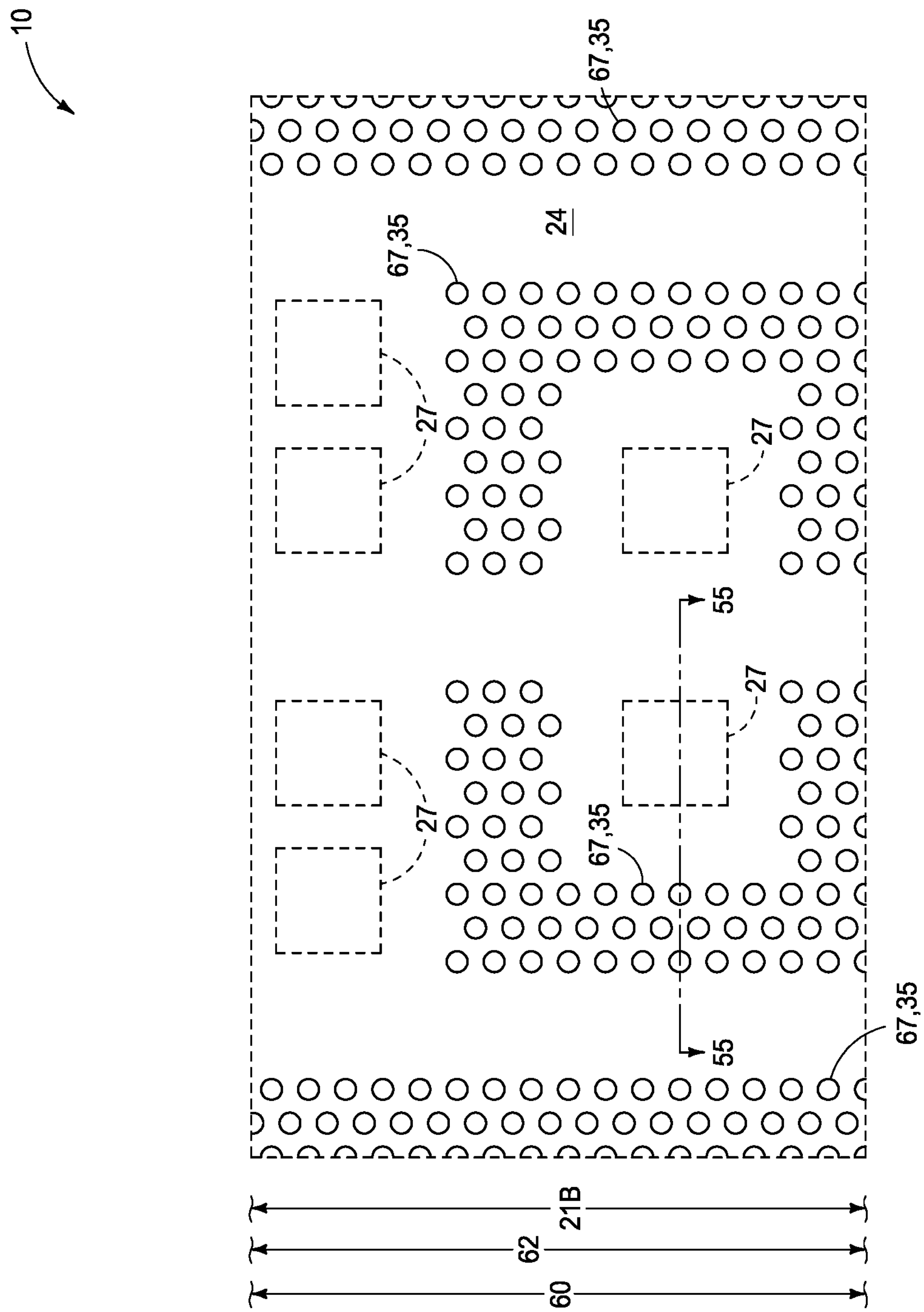
Figure 54:
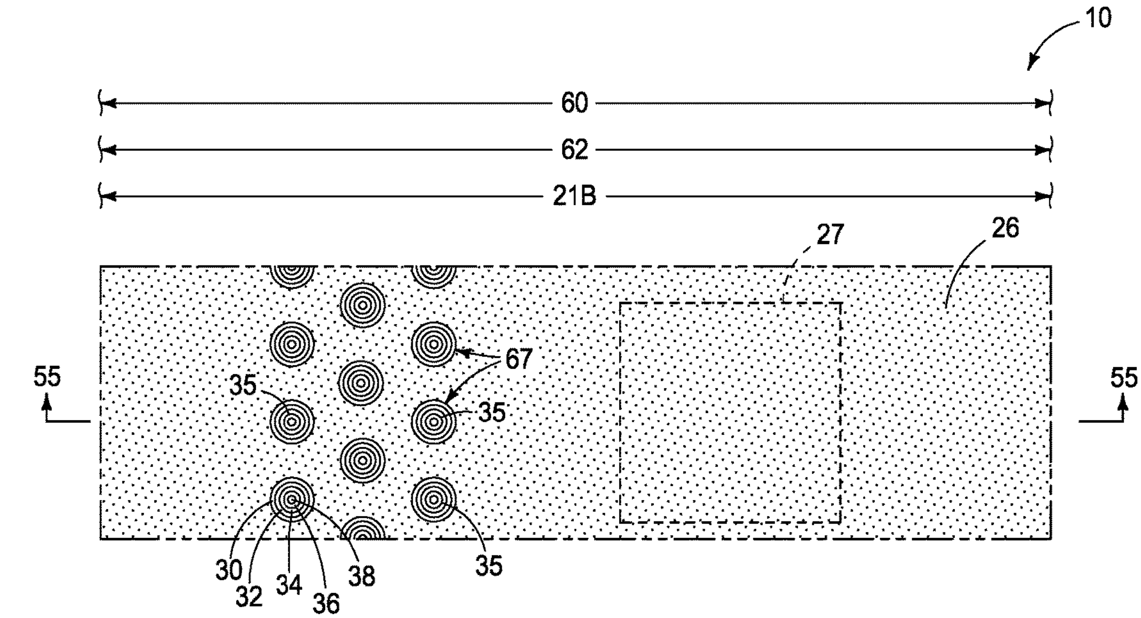
Figure 55:
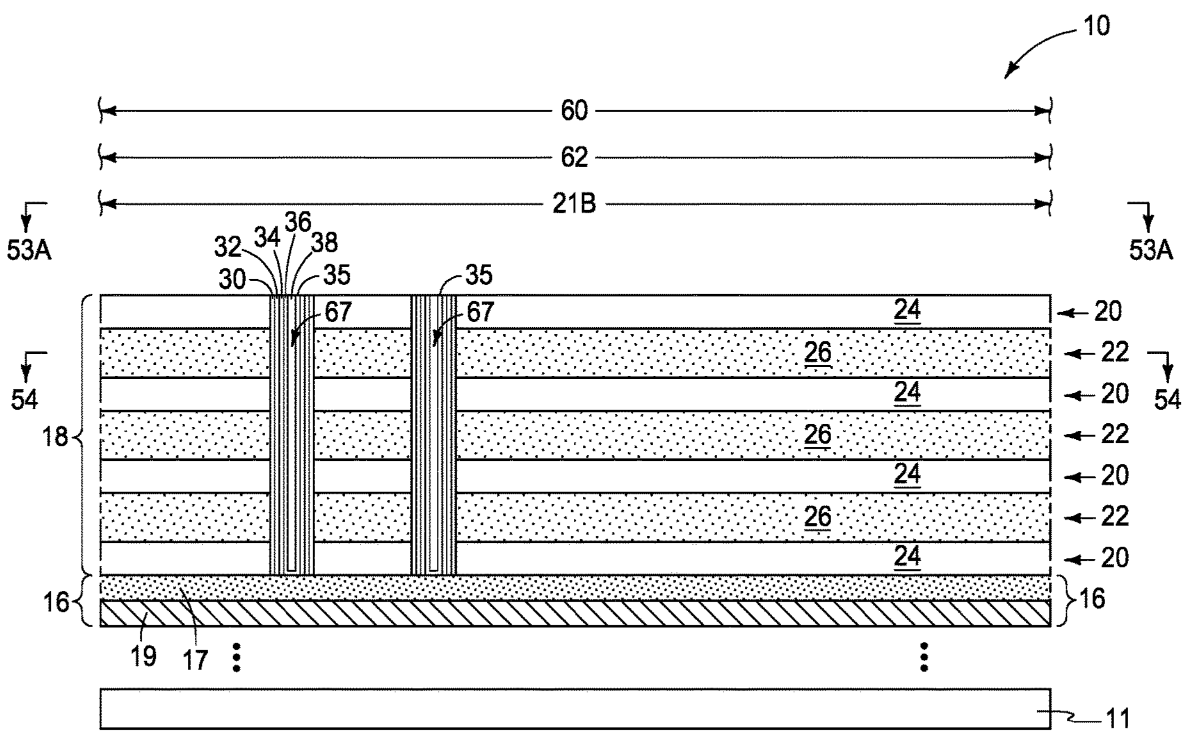
Figure 56:
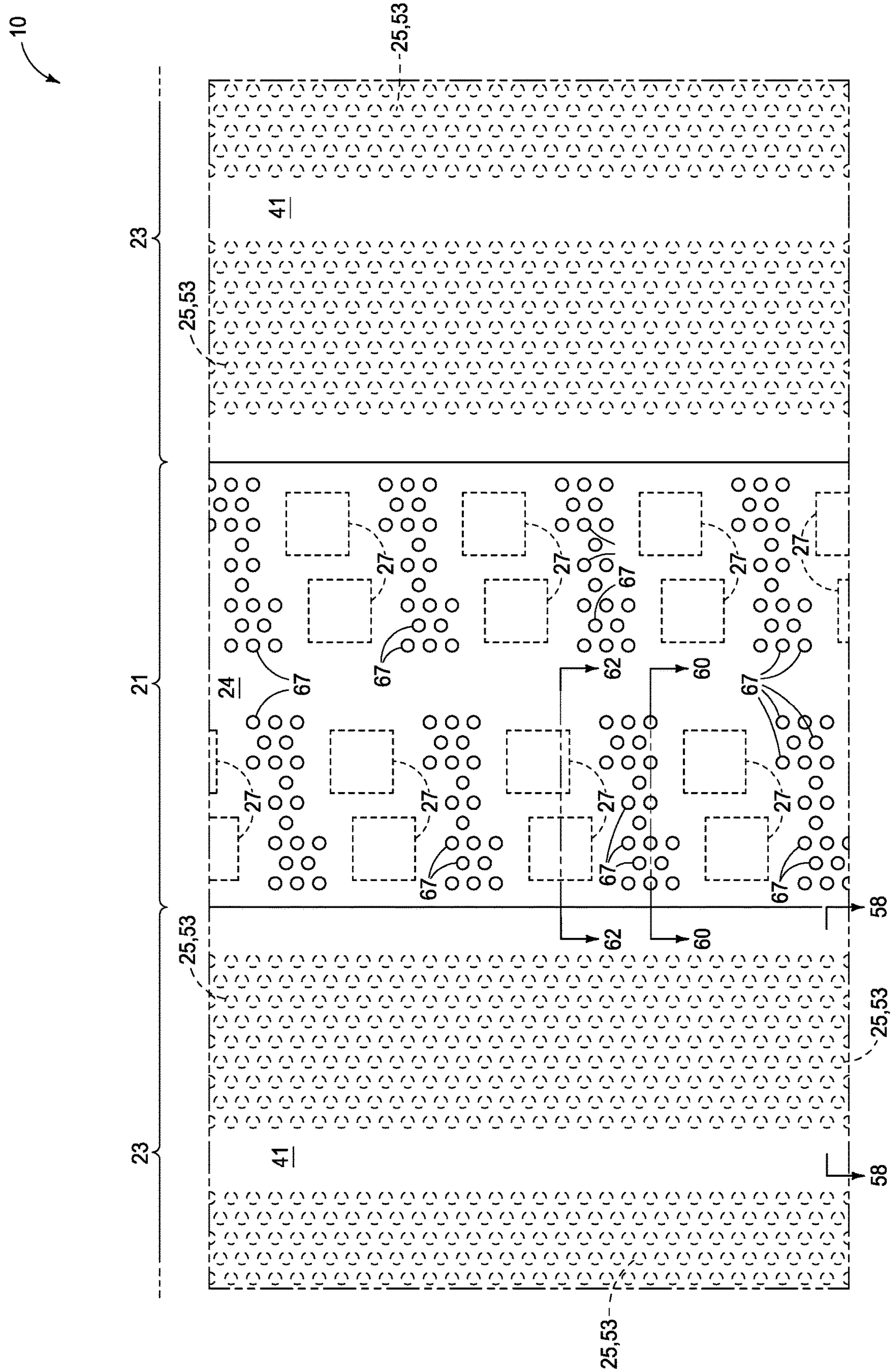
Figure 57:
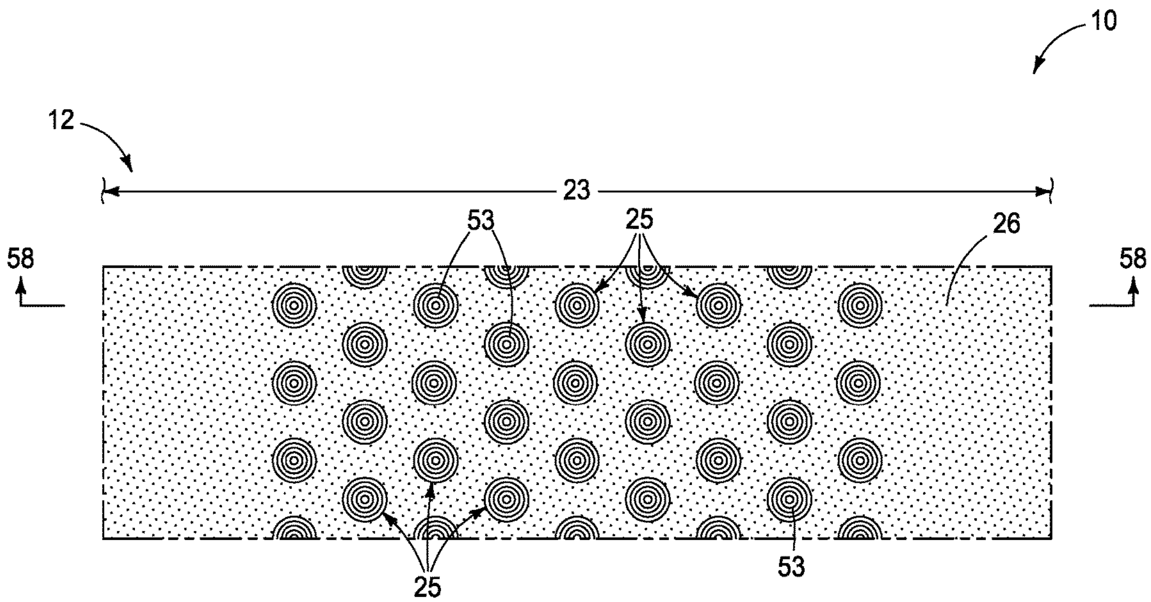
Figure 58:
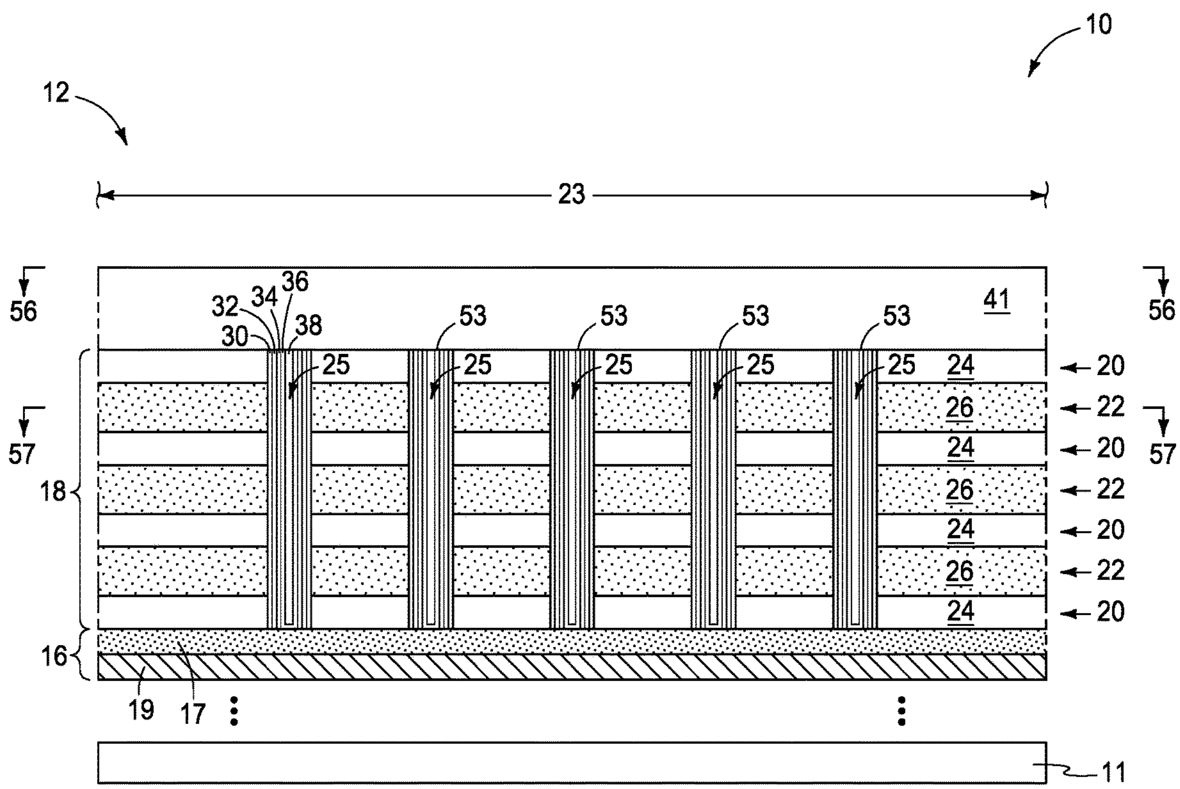
Figure 59:
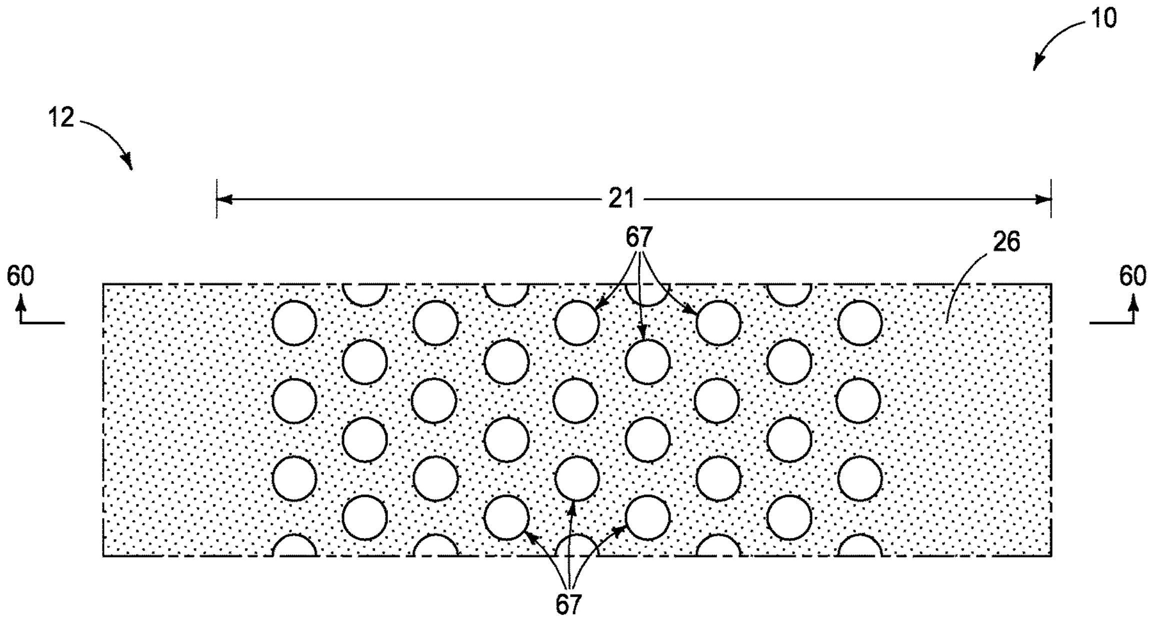
Figure 60:
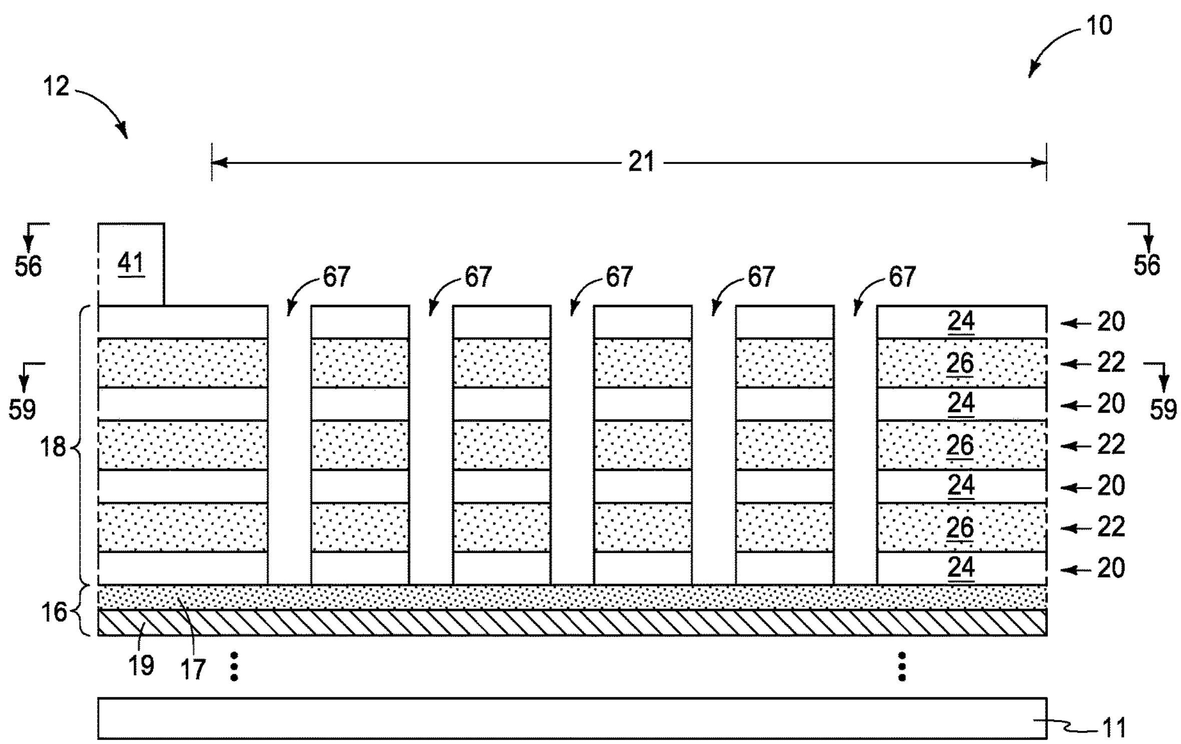
Figure 61:
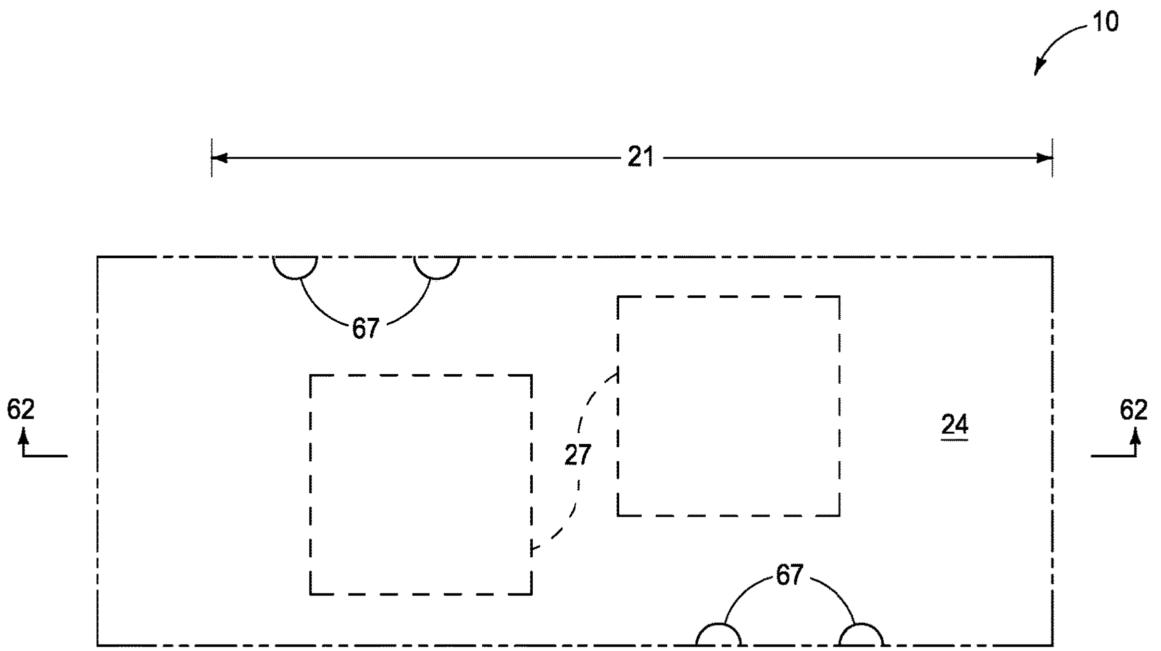
Figure 62:
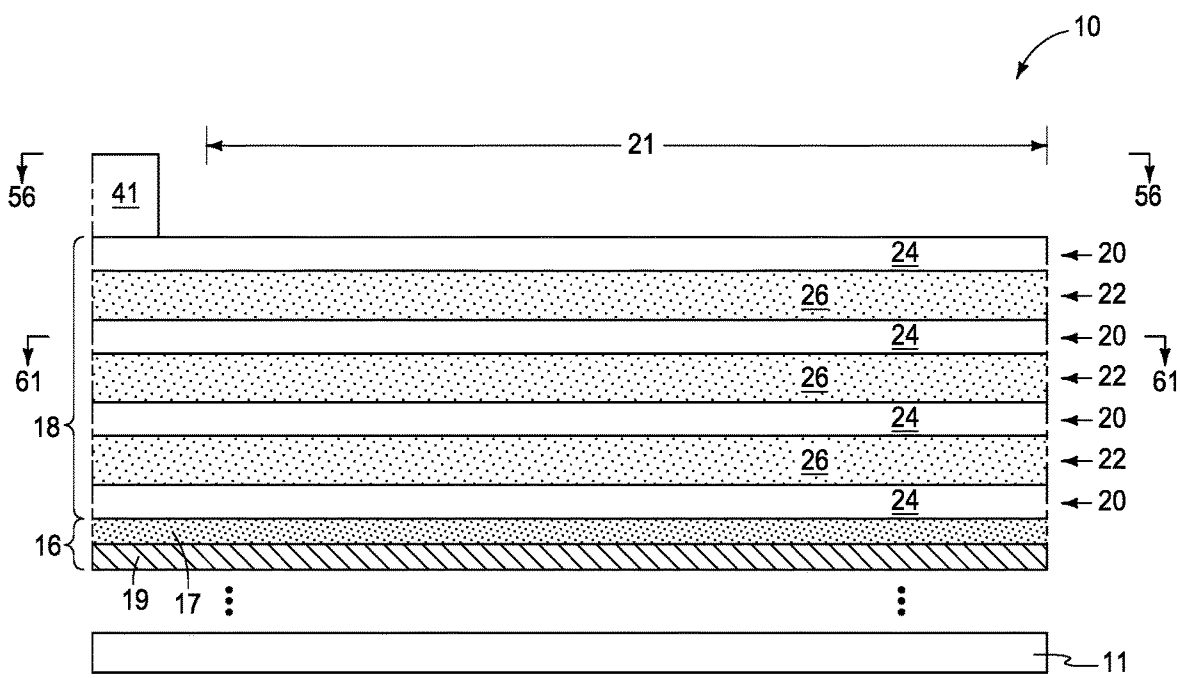
Figure 63:
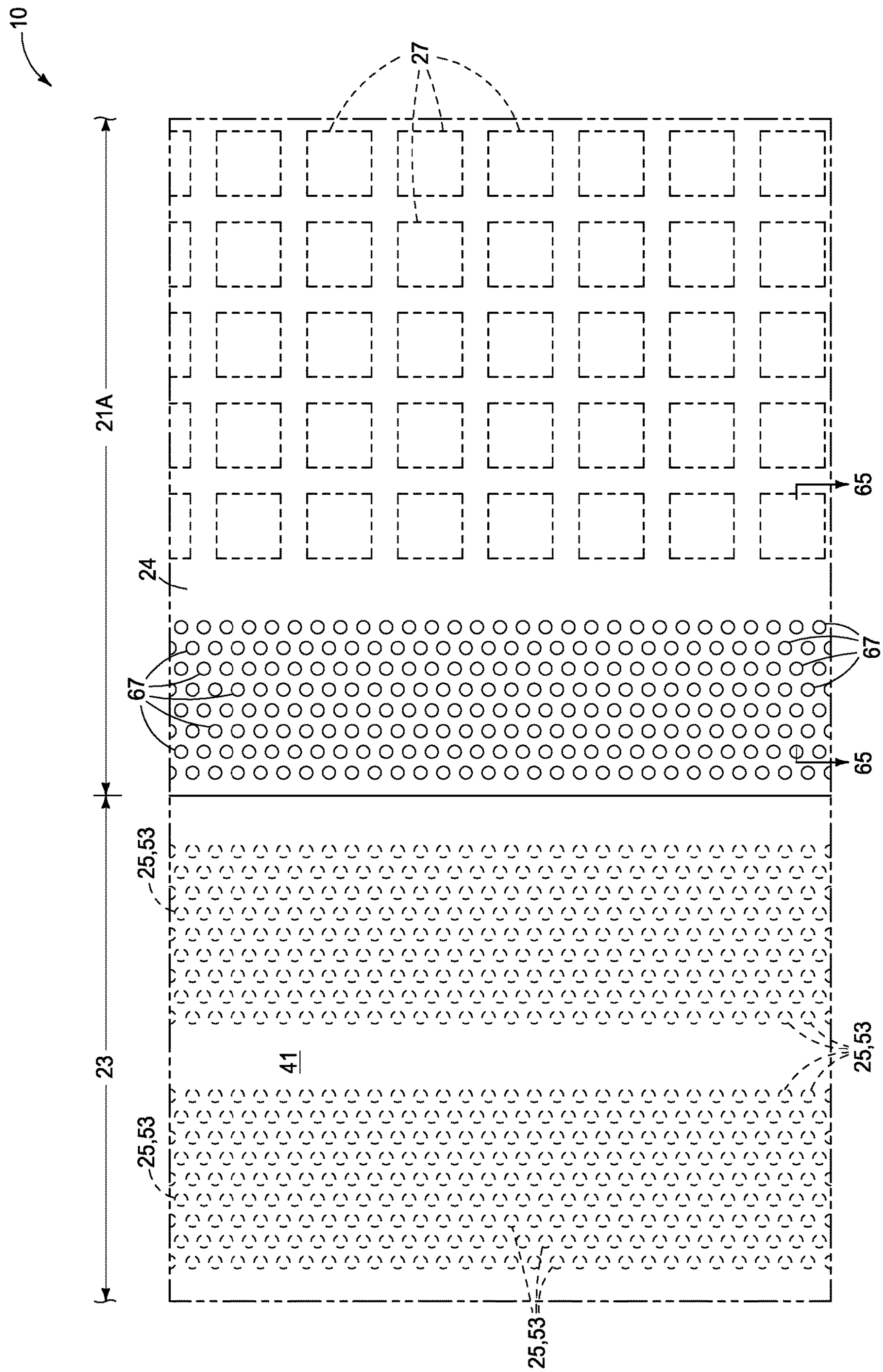
Figure 64:
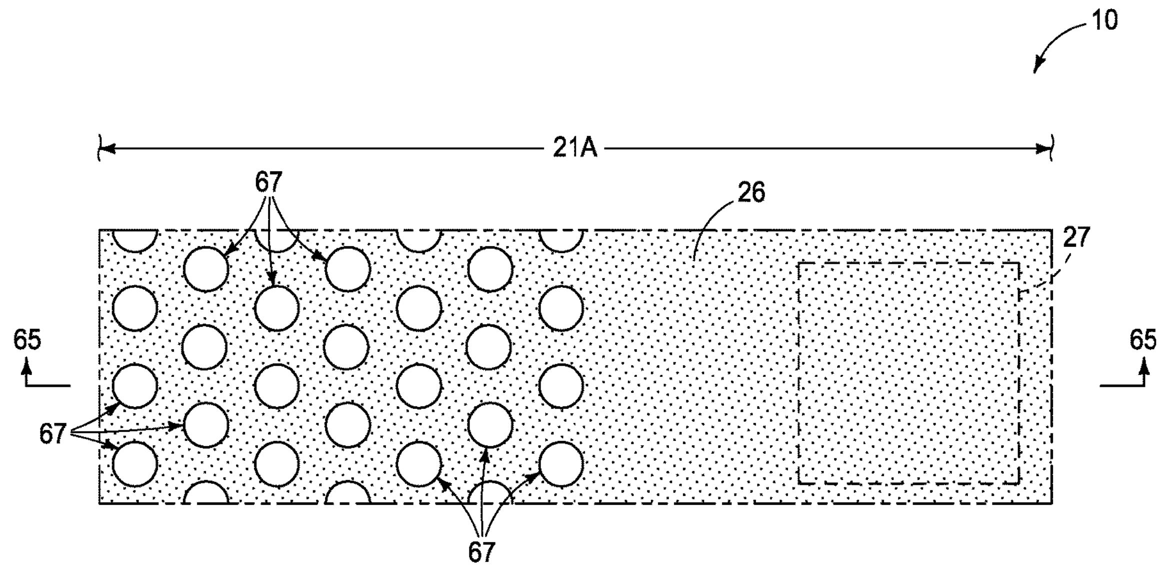
Figure 65:
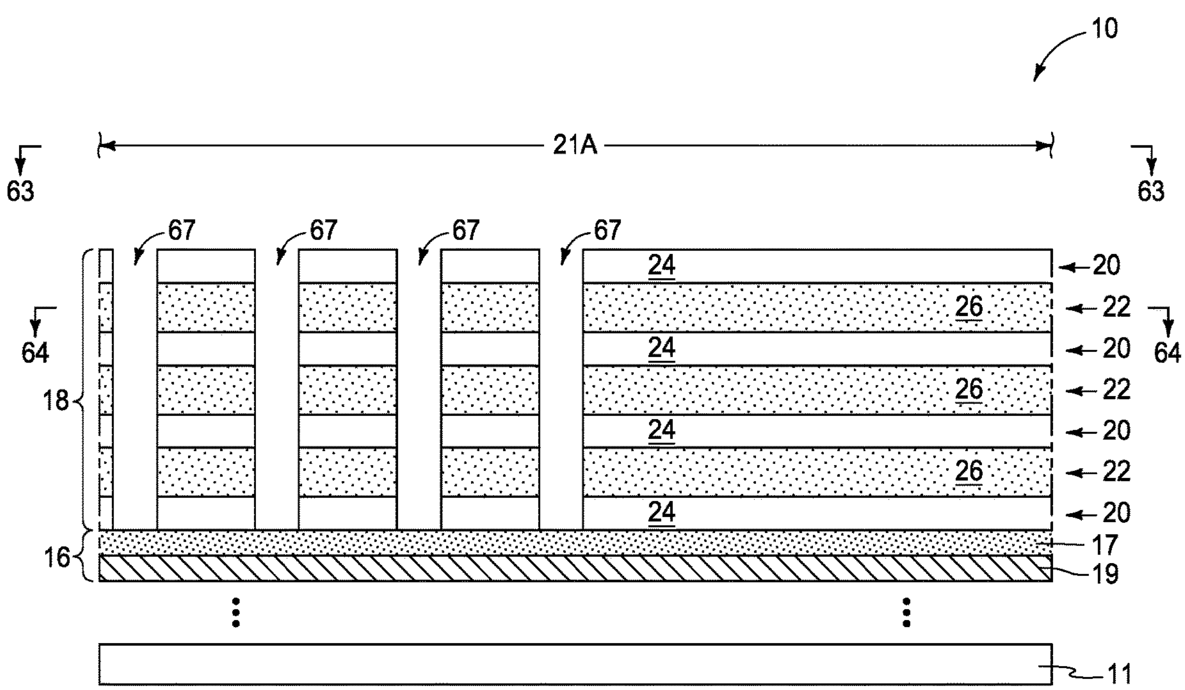
Figure 66:
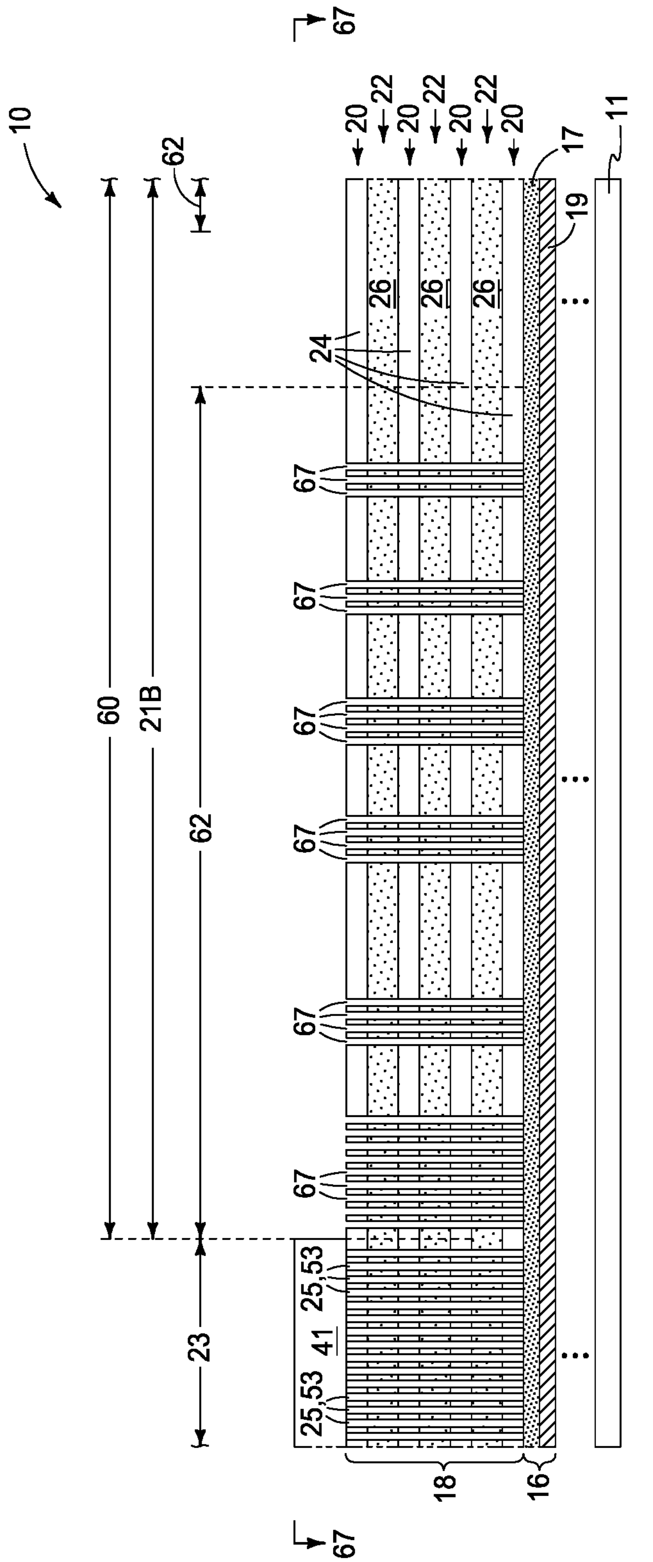
Figure 67:
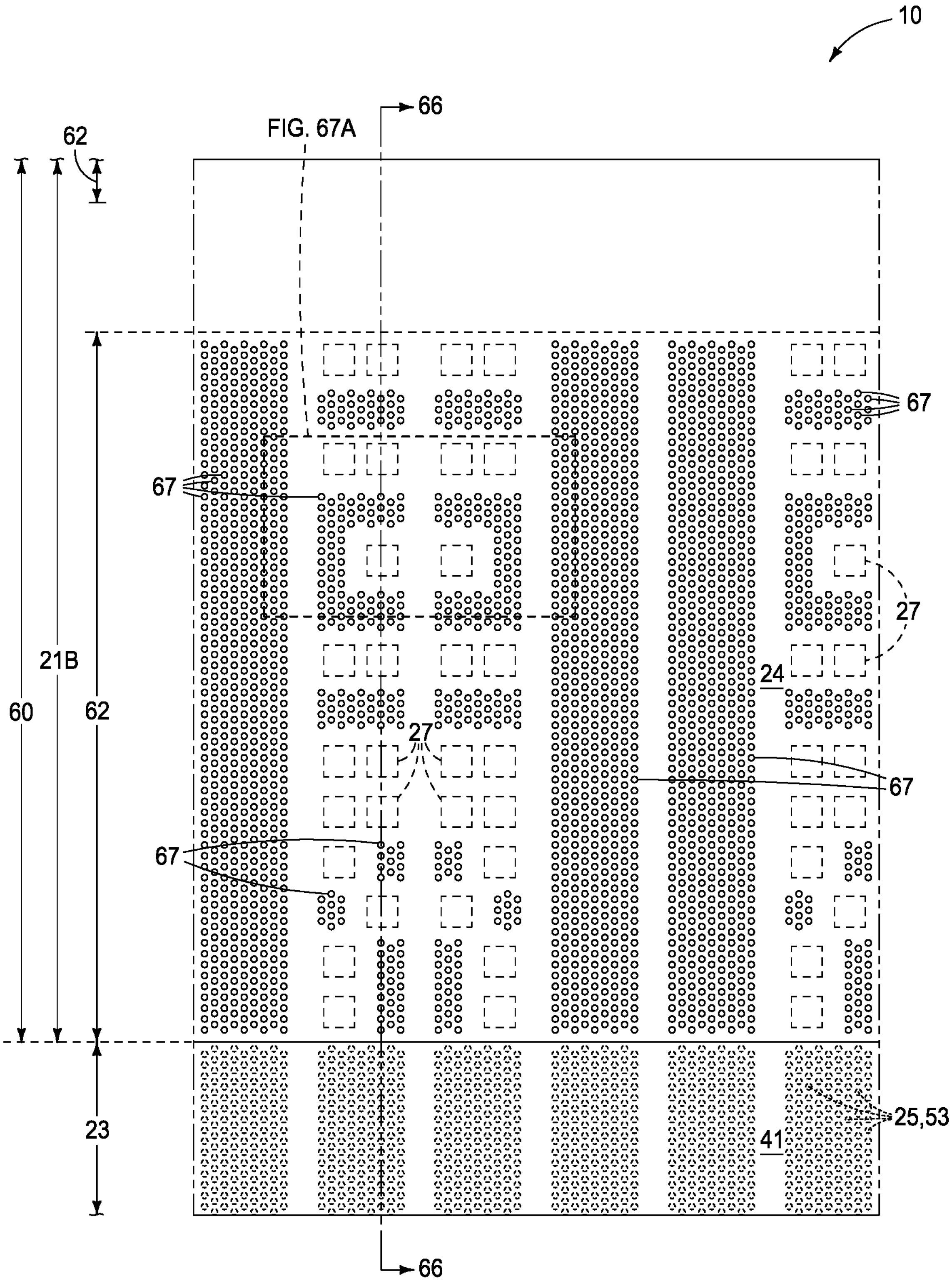
Figure 67A:
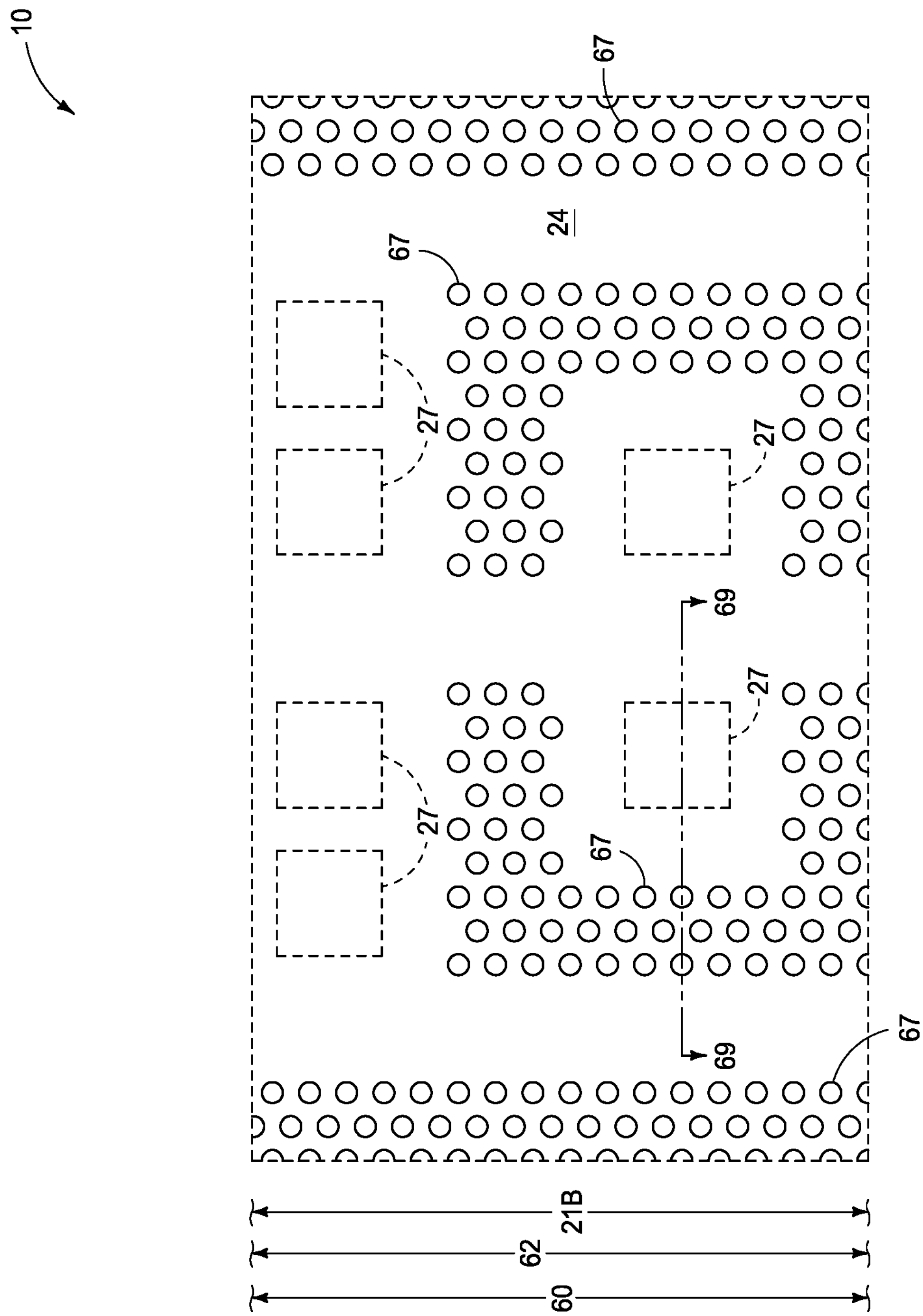
Figure 68:
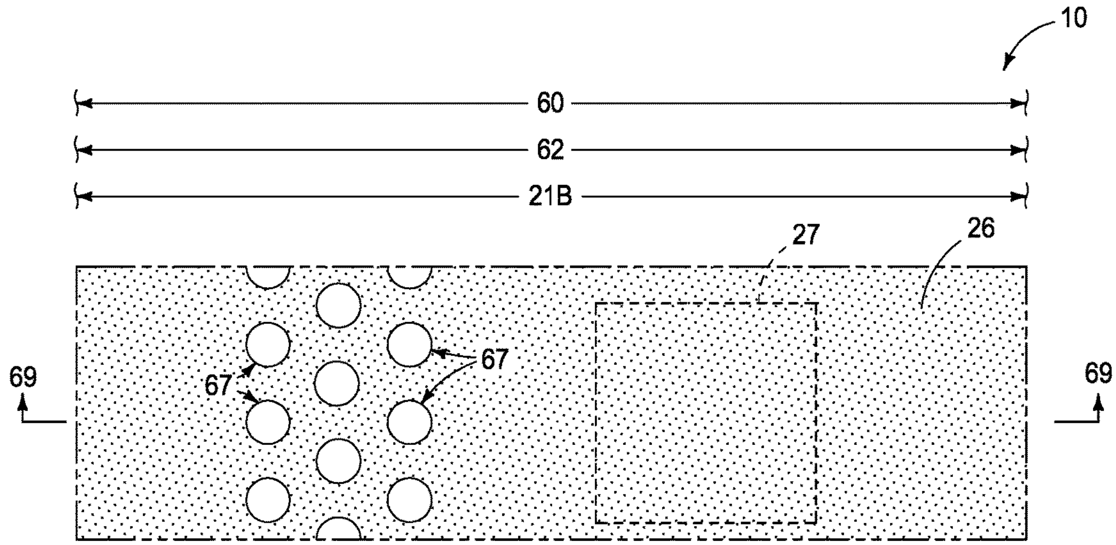
Figure 69:
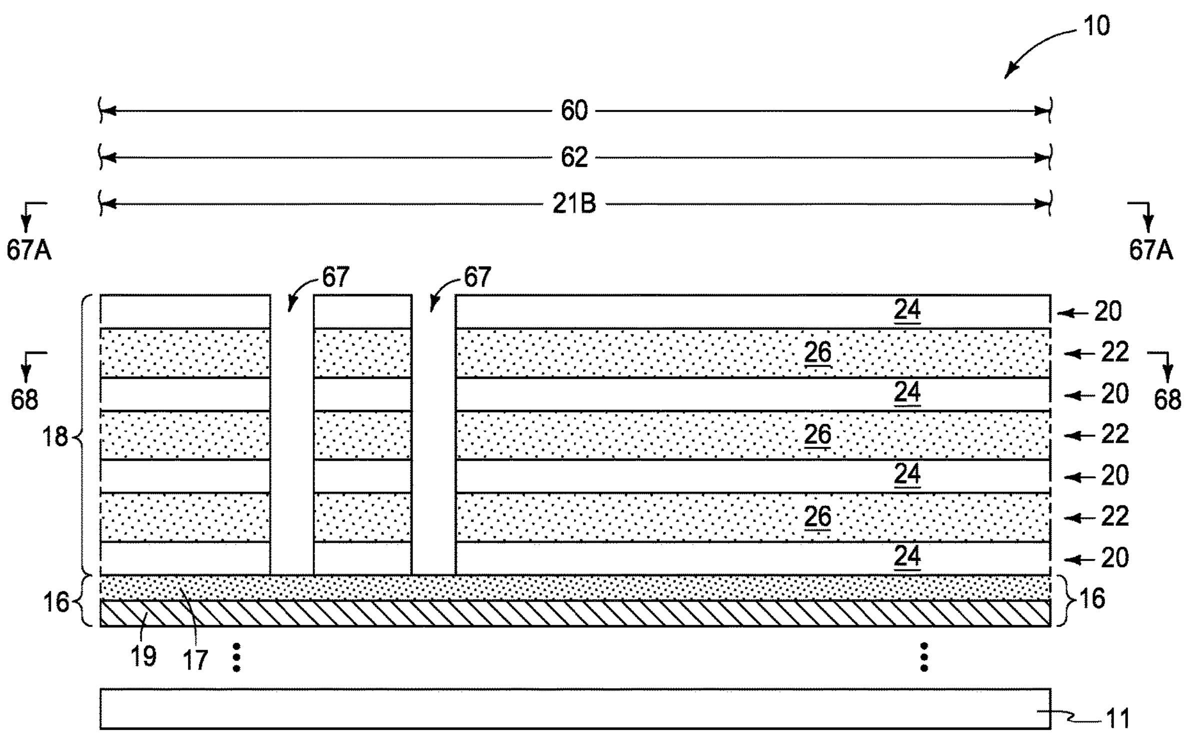
Figure 70:
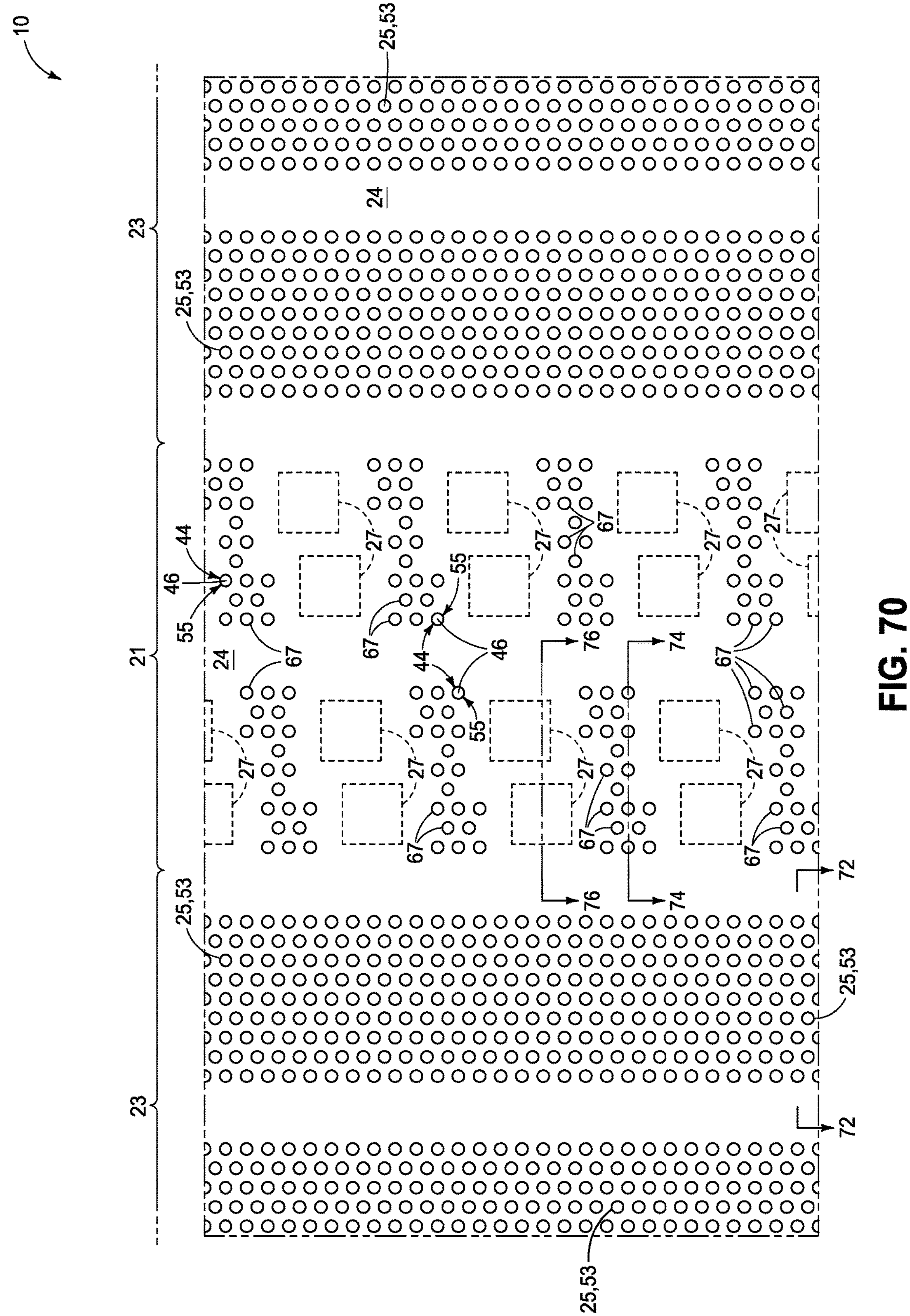
Figure 71:
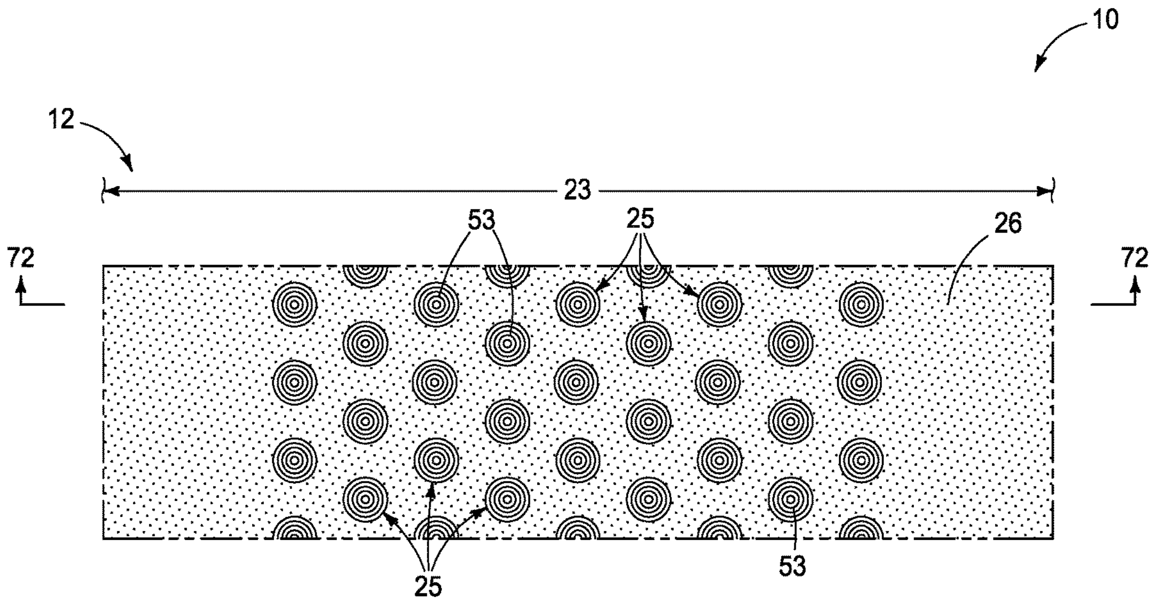
Figure 72:
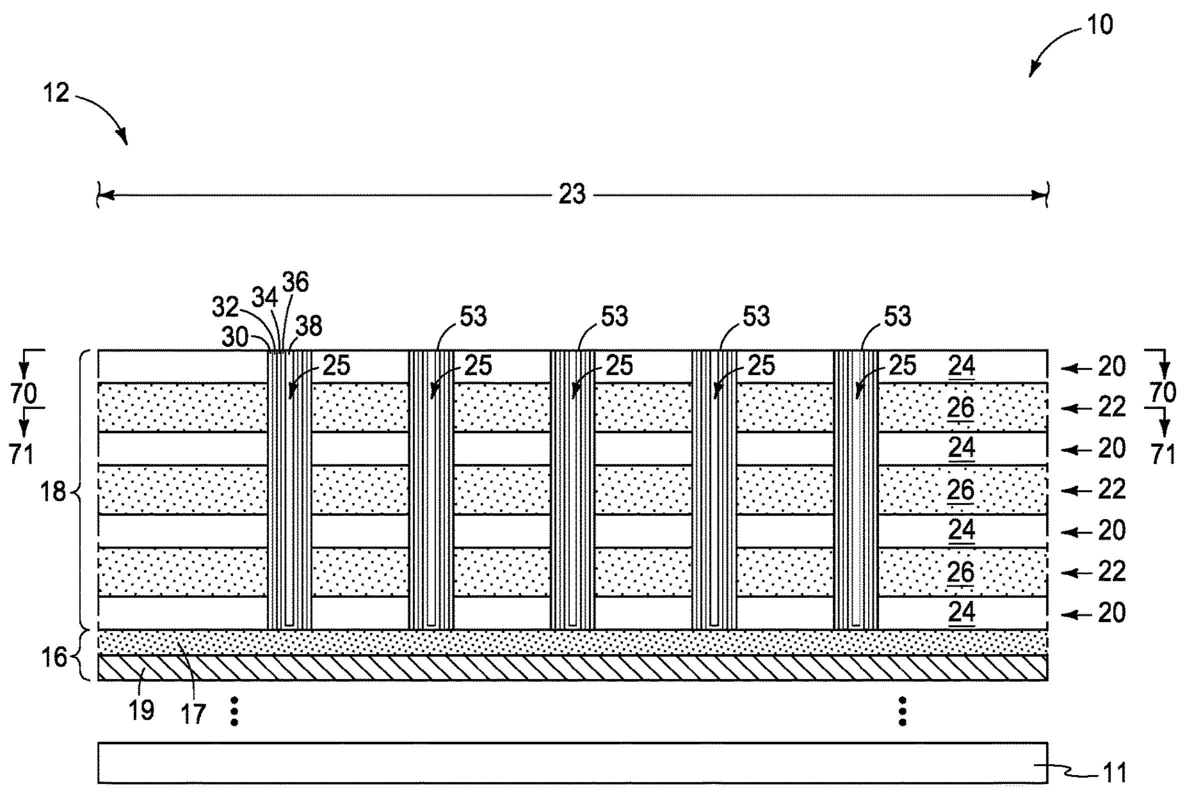
Figure 73:
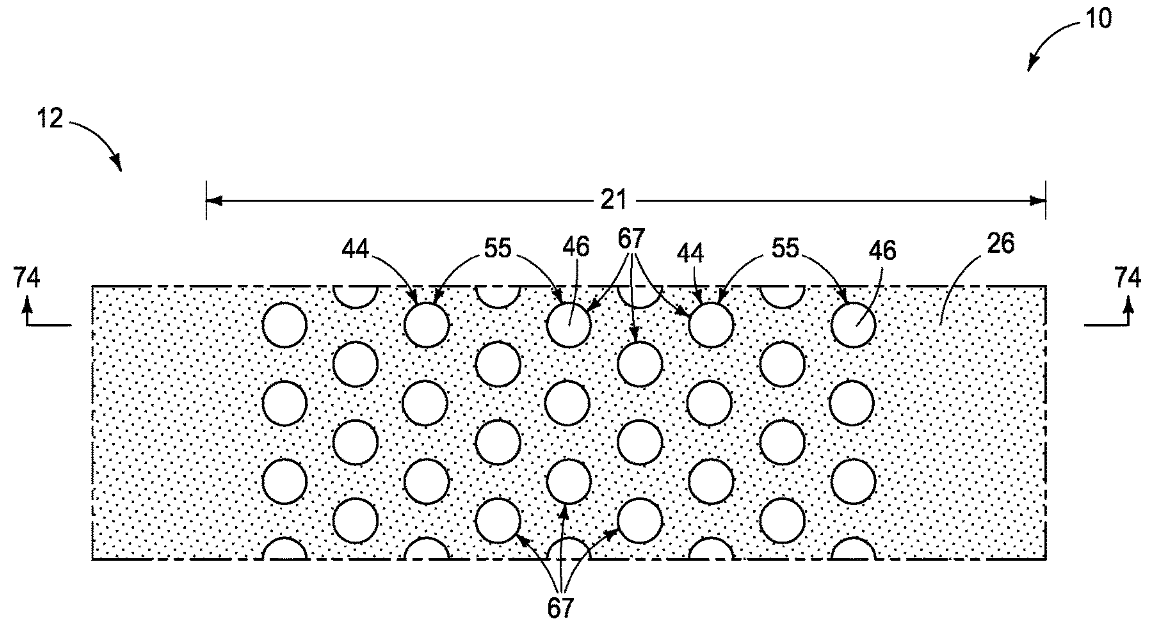
Figure 74:
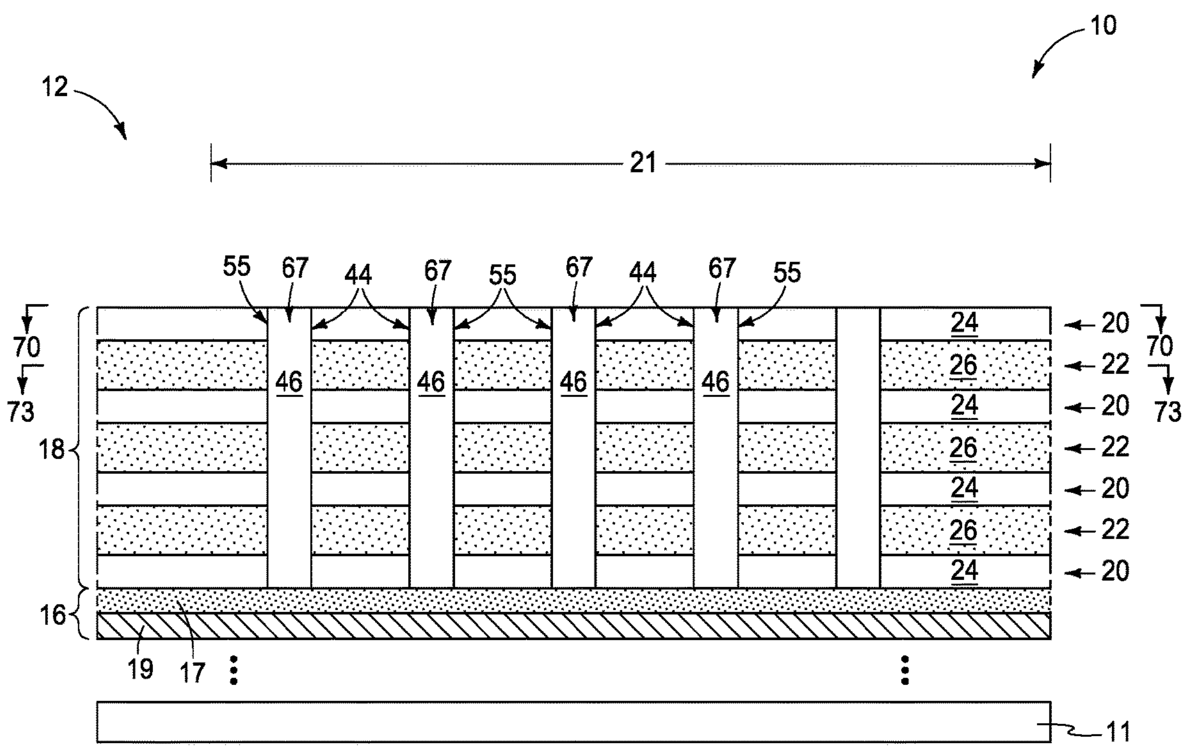
Figure 75:
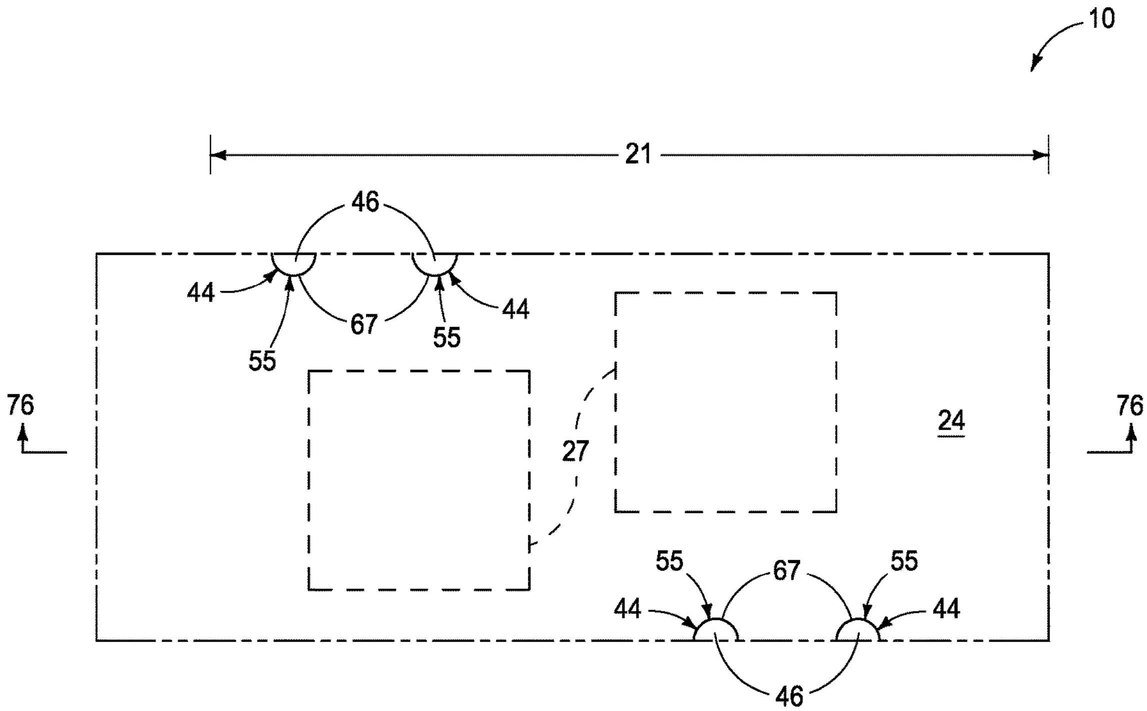
Figure 76:
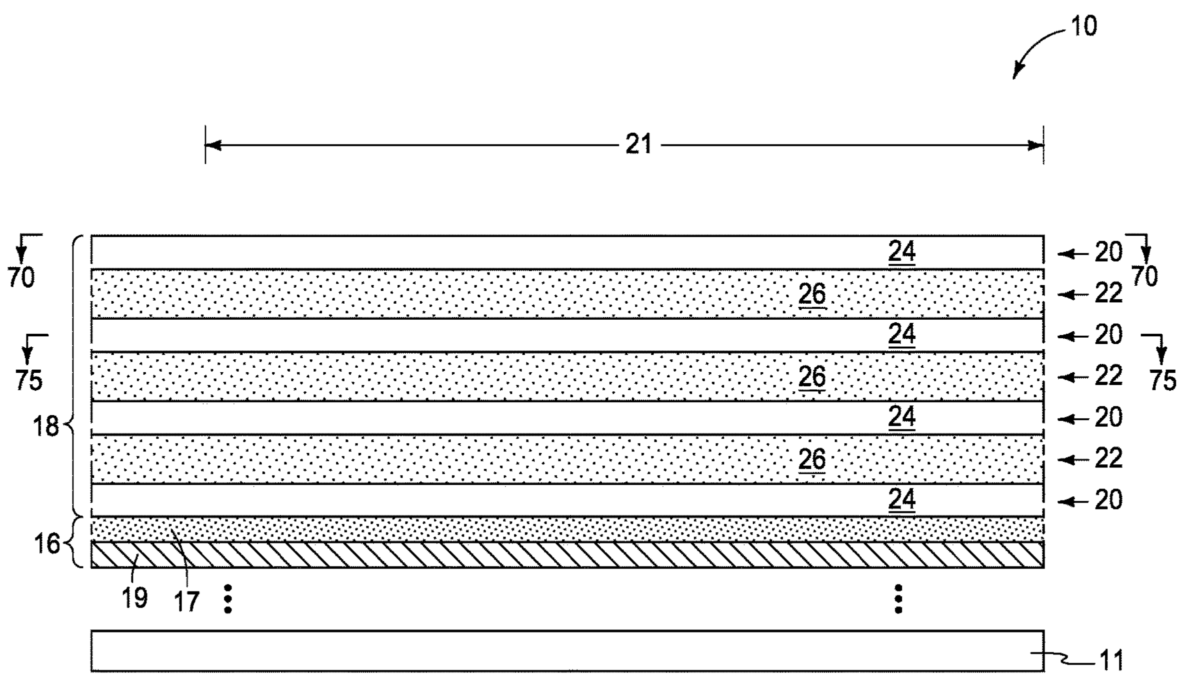
Figure 77:
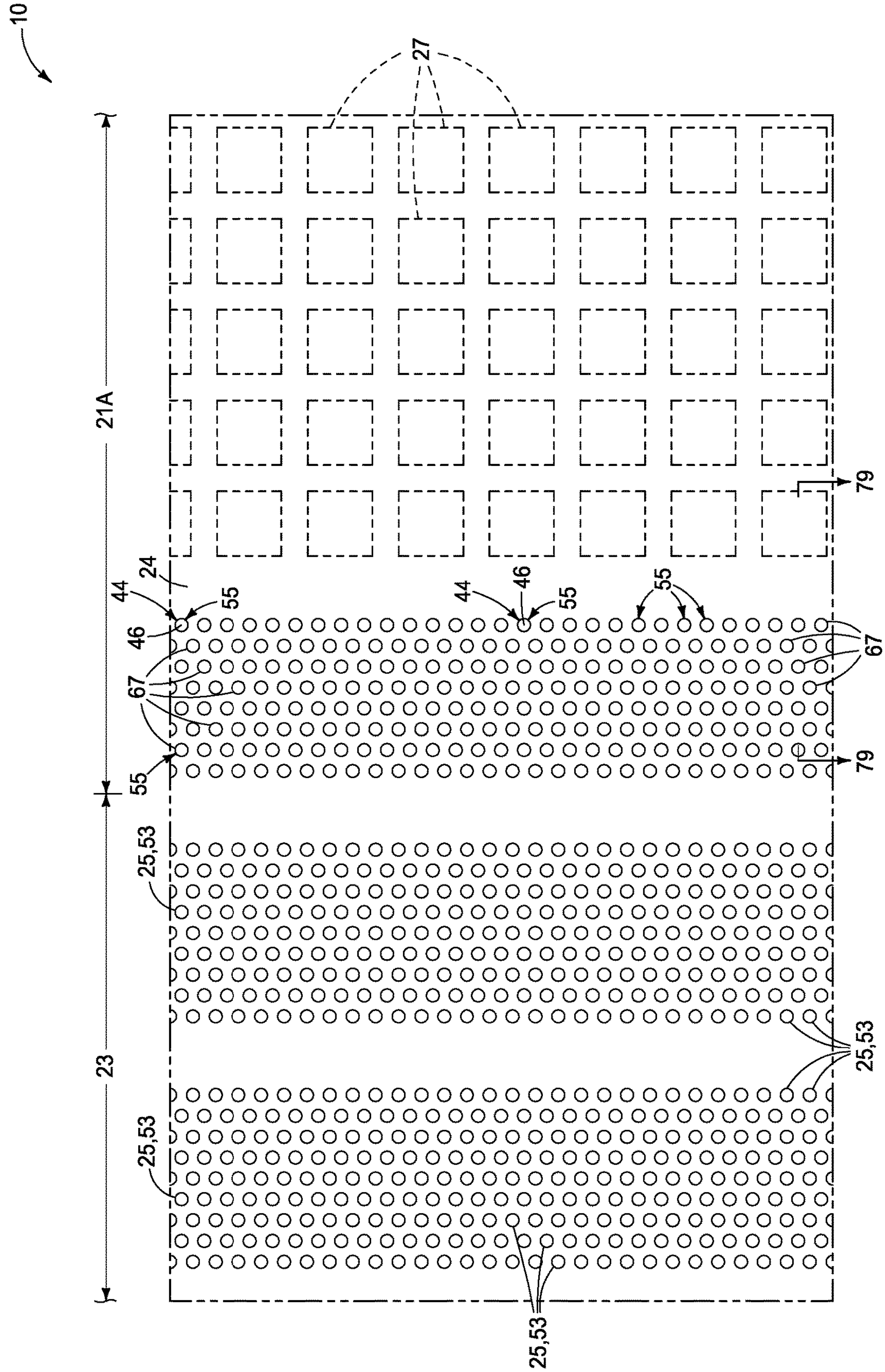
Figure 78:
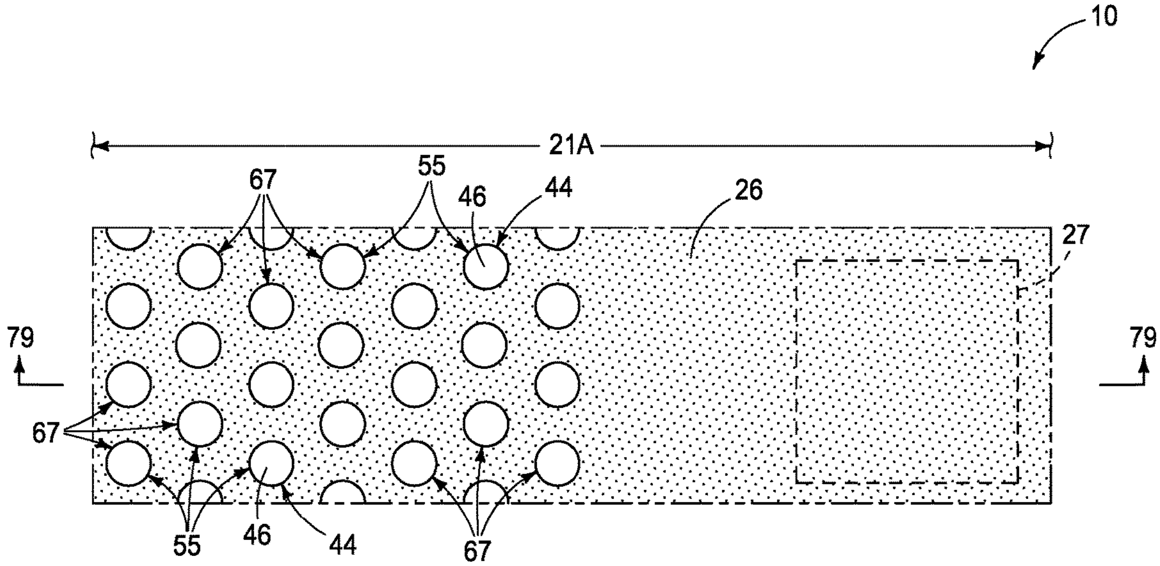
Figure 79:
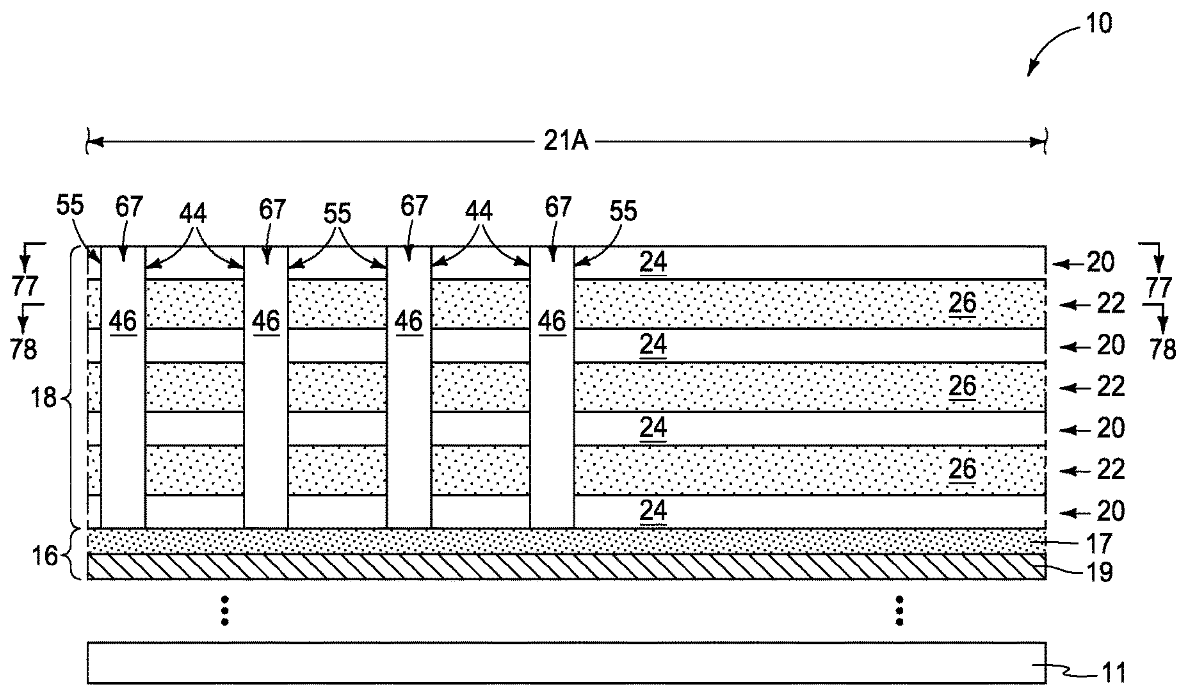
Figure 80:
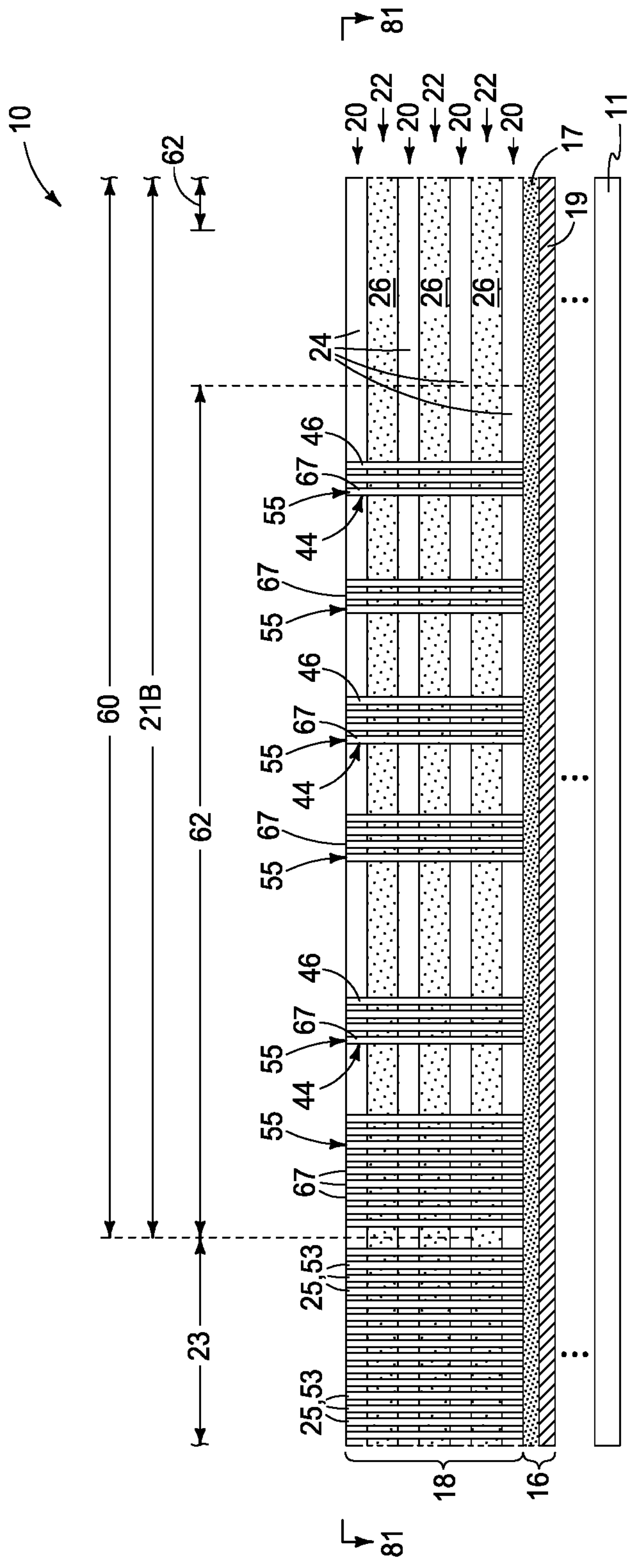
Figure 81:
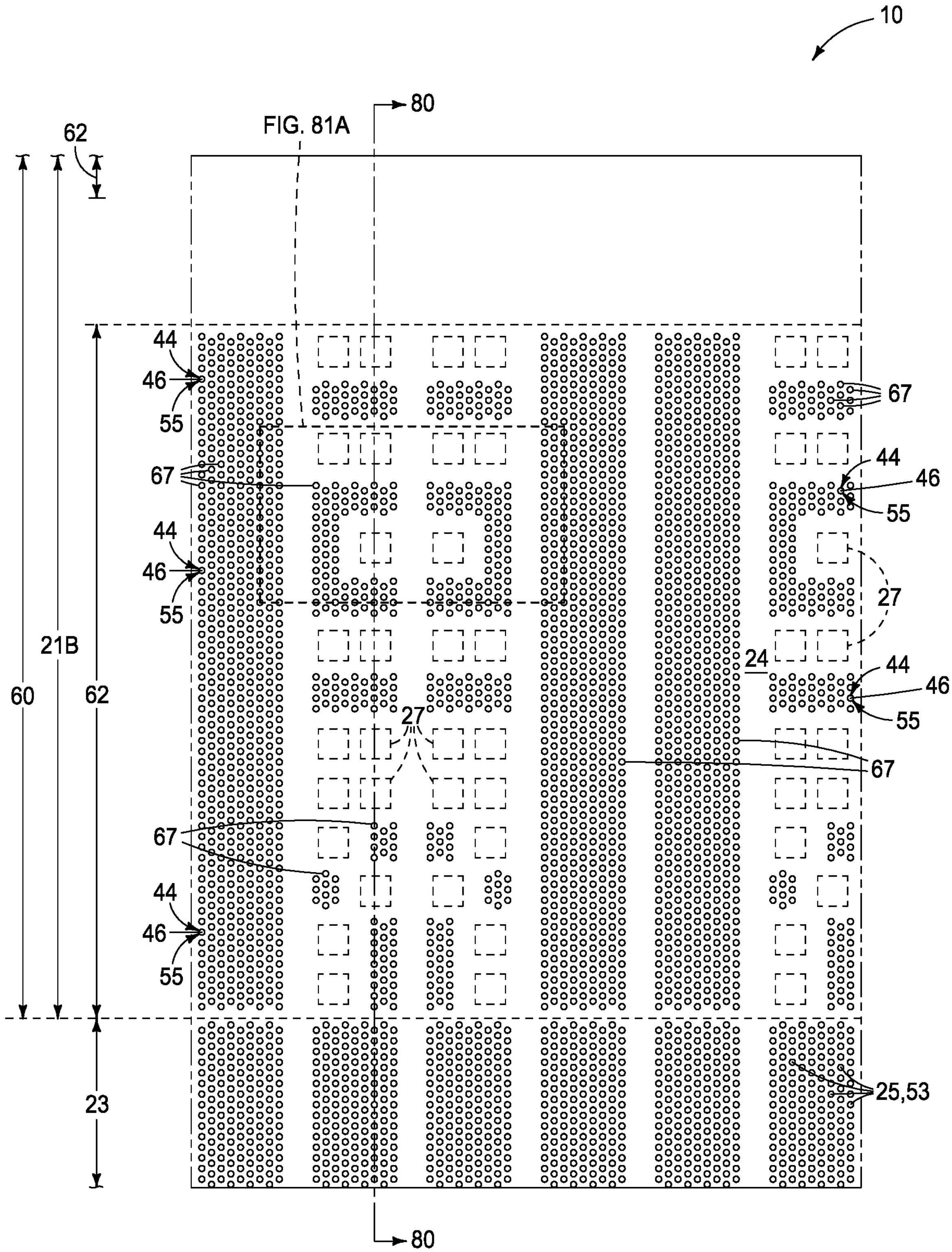
Figure 81A:
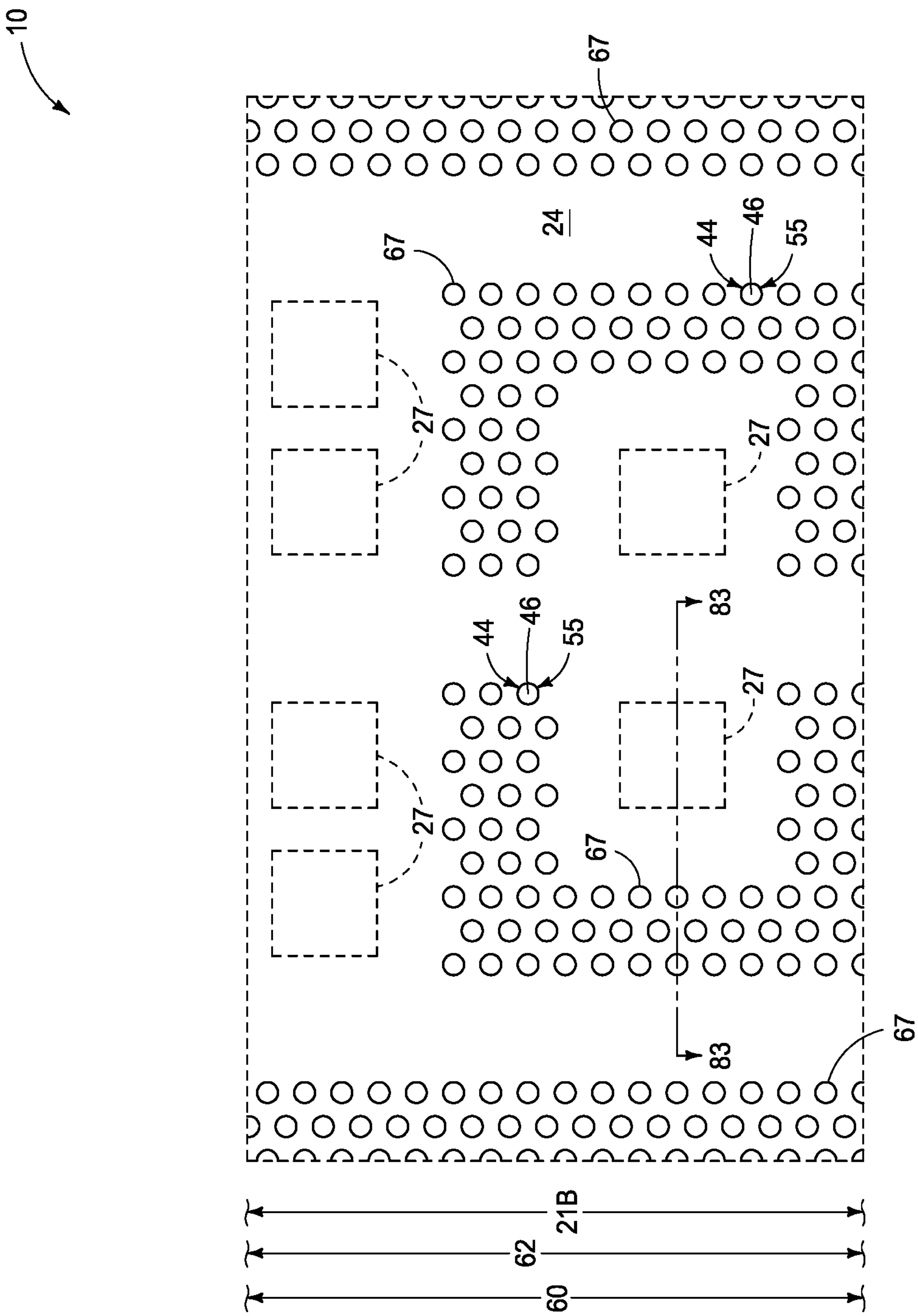
Figure 82:
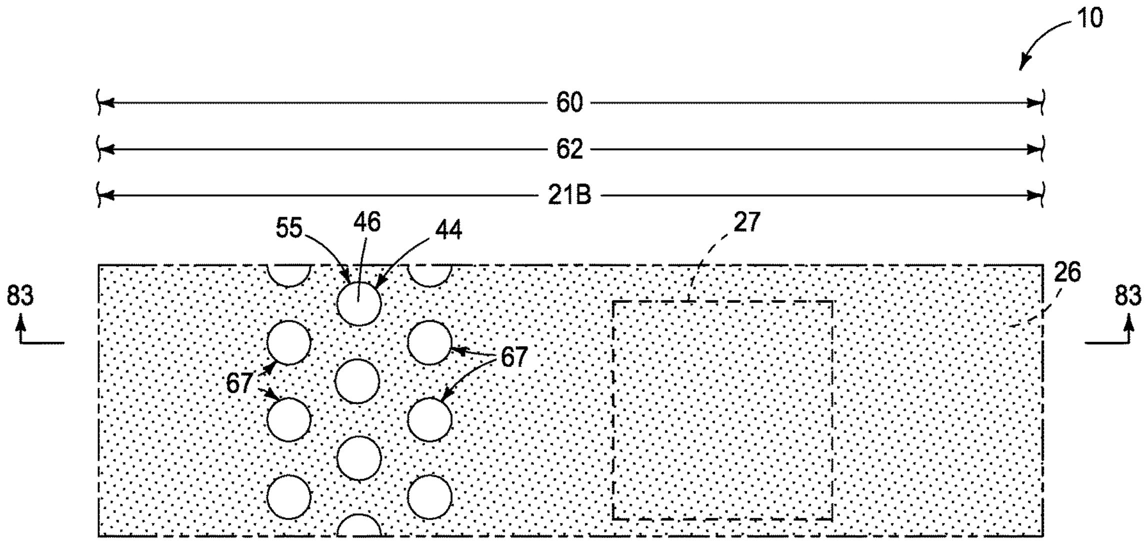
Figure 83:
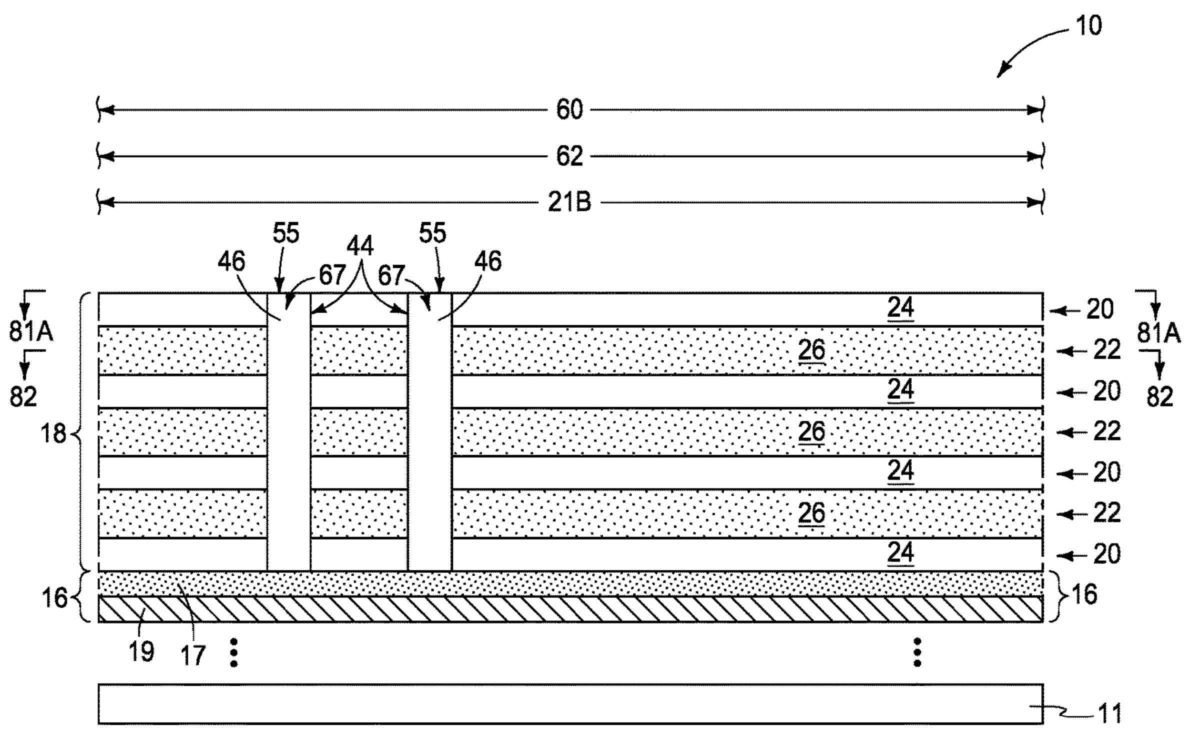

FIG. 1 shows an example diagrammatic embodiment comprising a die or die area 100 that may be part of a larger substrate (e.g., a semiconductor wafer, and not shown) and within which a memory array will be fabricated. Example die area 100 comprises at least one memory plane region 105 (four being shown), a stair-step region 60 (two being shown), and a peripheral circuitry region PC (two being shown). Regions 105, 60, and/or PC may not be discernable at this point of processing. FIGS. 2-15 are diagrammatic larger and varied scale views of portions of die area 100.

FIGS. 2-15 show a construction 10 in a method of forming an array 12 of elevationally-extending strings of transistors and/or memory cells (not yet shown). Construction 10 comprises a base substrate 11 having any one or more of conductive/conductor/conducting, semiconductive/semiconductor/semiconducting, or insulative/insulator/insulating (i.e., electrically herein) materials. Various materials have been formed elevationally over base substrate 11. Materials may be aside, elevationally inward, or elevationally outward of the FIGS. 2-15-depicted materials. For example, other partially or wholly fabricated components of integrated circuitry may be provided somewhere above, about, or within base substrate 11. Control and/or other peripheral circuitry for operating components within an array (e.g., array 12) of elevationally-extending strings of memory cells may also be fabricated and may or may not be wholly or partially within an array or sub-array. Further, multiple sub-arrays may also be fabricated and operated independently, in tandem, or otherwise relative one another. In this document, a "sub-array" may also be considered as an array.

Example construction 10 comprises a conductor tier 16 that has been formed above substrate 11. Example conductor tier 16 is shown as comprising conductive material 17 (e.g., conductively-doped semiconductive material such as conductively-doped polysilicon) above metal material 19 (e.g., $WSi_x$). Conductor tier 16 may comprise part of control circuitry (e.g., peripheral-under-array/CMOS-under-array circuitry) used to control read and write access to the transistors and/or memory cells that will be formed within array 12.

Construction 10 comprises a stack 18 above conductor tier 16. Stack 18 comprises vertically-alternating insulative tiers 20 and conductive tiers 22. Example thickness for each of tiers 20 and 22 is 22 to 60 nanometers. Only a small number of tiers 20 and 22 is shown, with more likely stack 18 comprising dozens, a hundred or more, etc. of tiers 20 and 22. Other circuitry that may or may not be part of peripheral and/or control circuitry may be between conductor tier 16 and stack 18. For example, multiple vertically-alternating tiers of conductive material and insulative material of such circuitry may be below a lowest of the conductive tiers 22 and/or above an uppermost of the conductive tiers 22. For example, one or more select gate tiers (not shown) may be between conductor tier 16 and the lowest conductive tier 22 and one or more select gate tiers may be above an uppermost of conductive tiers 22. Regardless, conductive tiers 22 may not comprise conductive material and insulative tiers 20 may not comprise insulative material or be insulative at this point in processing. Example conductive tiers 22 comprise first material 26 (e.g., silicon nitride) which may be wholly or partially sacrificial. Example insulative tiers 20 comprise second material 24 (e.g., silicon dioxide) that is of different composition from that of first material 26 and which may be wholly or partially sacrificial.

Stack 18 comprises a through-array-via (TAV) region (e.g., any one of TAV regions 21, 21A, 21B) and an operative memory-cell-string region 23. An "operative memory-cell string region" contains circuit-operative memory-cell strings in the finished construction of integrated circuitry that has been or is being fabricated. Dummy memory-cell strings (i.e., circuit-inoperative memory-cell strings, and not shown) may be between the TAV region and operative memory-cell-string region 23. TAV regions 21, 21A, 21B comprise spaced operative TAV areas 27. A "TAV region" is a region containing multiple operative TAV areas. An "operative TAV area" is an area in which an operative TAV is present or will be formed. An "operative TAV" is a circuit-operative conductive interconnect extending through stack 18 and between electronic components at different elevations in a finished construction of integrated circuitry that has been or is being fabricated. Regions 23 and 21/21A/21B and areas 27 may essentially be undefined or indistinguishable relative one another in construction 10 at this point in processing. Example TAV regions 21 are shown as being within individual memory planes 105 (FIG. 1). TAV region 21A is shown as being outside of individual memory planes 105 with, in one example, being shown as being edge-of-plane (i.e., outside of a memory plane and adjacent a lateral edge of the subject memory plane).

In one example and for ease of depiction in the drawings, TAV region 21B is shown as being within a landing region 62 of an individual stair-step region 60. One landing region 62 is shown as being immediately-adjacent operative memory-cell-string region 23 and having operative TAV areas 27 therein. Alternately, a landing region 62 that is immediately adjacent or part of operative memory-cell-string region 23 may have no operative TAV areas 27 therein (not shown), and/or have operative TAV areas 27 that are in part of another landing region 62 that is spaced from operative memory-cell-string region 23 (not shown, and further described below).

Referring to FIGS. 16-27, and in one embodiment, operative channel openings 25 and dummy channel openings 67 have been etched through insulative tiers 20 and conductive tiers 22 to material 17 of conductor tier 16, with in one example dummy channel openings being in each of TAV regions 21, 21A, and 21B. An "operative channel opening" is an opening in which circuit-operative channel material of a transistor and/or memory cell is or will be received. A "dummy channel opening" is an opening in which circuit-inoperative channel material is or will be received, with such circuit-inoperative channel material if in a finished-circuitry construction being circuit-inoperative, meaning no current flow there-through and which may be a circuit-inoperable dead-end that is not part of a current flow path of a circuit even if extending to or from an electronic component. In one embodiment, dummy channel openings 67 may be formed within operative TAV areas 27 (not shown) and in another embodiment no dummy channel openings 67 are formed within operative TAV areas 27 (as shown). In embodiments where dummy channel openings are formed in TAV region 21B having a stair-step region 60, such may not necessarily be formed in the one landing region 62 that is immediately-adjacent operative memory-cell-string region 23. For example, a landing region 62 that is immediately adjacent or part of operative memory-cell-string region 23 may have no dummy channel openings therein (not shown), and/or have dummy channel openings that are in part of another landing region 62 that is spaced from operative memory-cell-string region 23 (not shown, and further described below).

Operative channel openings 25 and/or dummy channel openings 67 may go partially into material 17 (not shown), may stop there-atop as shown, or go completely there-through (not shown) either stopping on material 19 or going at least partially there-into. Alternately, as an example, operative channel openings 25 and/or dummy channel openings 67 may stop atop or within lowest insulative tier 20. A reason for extending operative channel openings 25 at least to material 17 is to assure direct electrical coupling of subsequently-formed channel material (not yet shown) to conductor tier 16 without using alternate processing and structure to do so when such a connection is desired. Etch-stop material (not shown) may be within conductive material 17 to facilitate stopping of the etching of openings 25 and 67 to be atop conductor tier 16 when such is desired. Such etch-stop material may be sacrificial or non-sacrificial. By way of example only, operative channel openings 25 and dummy channel openings 67 are arranged in groups or columns of staggered horizontal rows or diagonal rows (e.g., in a hexagonal close-pack unit cell of a 2D lattice as shown). Any alternate existing or future-developed arrangement and construction may be used. In one embodiment and as shown, operative channel openings 25 and dummy channel openings 67 are formed to collectively have a common horizontal pitch (e.g., P in FIGS. 16, 18, 20, 21, and 25) along parallel horizontally-straight lines. Formation of dummy channel openings 67 "on-pitch" P with operative channel openings 25 may facilitate more uniform patterning of all channel openings 25 and 67 than would otherwise occur if dummy channel openings 67 collectively had a pitch different than P.

Transistor channel material may be formed in the individual operative channel openings elevationally along the insulative tiers and the conductive tiers, thus comprising individual operative channel-material strings, which is directly electrically coupled with conductive material in the conductor tier. Transistor channel material may also be formed in the individual dummy channel openings elevationally along the insulative tiers and the conductive tiers, thus comprising individual dummy channel-material strings (i.e., which if in a finished-circuitry construction being circuit-inoperative, meaning no current flow there-through and which may be a circuit-inoperable dead-end that is not part of a current flow path of a circuit even if extending to or from an electronic component). Individual memory cells (i.e., circuit-operative memory cells) of the example memory array being formed may comprise a gate region (e.g., a control-gate region) and a memory structure laterally between the gate region and the channel material. In one such embodiment, the memory structure is formed to comprise a charge-blocking region, storage material (e.g., charge-storage material), and an insulative charge-passage material. The storage material (e.g., floating gate material such as doped or undoped silicon or charge-trapping material such as silicon nitride, metal dots, etc.) of the individual memory cells is elevationally along individual of the charge-blocking regions. The insulative charge-passage material (e.g., a band gap-engineered structure having nitrogen-containing material [e.g., silicon nitride] sandwiched between two insulator oxides [e.g., silicon dioxide]) is laterally between the channel material and the storage material.

FIGS. 28-41 show one embodiment wherein charge-blocking material 30, storage material 32, and charge-passage material 34 have been formed in individual operative channel openings 25 and in individual dummy channel openings 67 elevationally along insulative tiers 20 and conductive tiers 22. Transistor materials 30, 32, and 34 (e.g., memory cell materials) may be formed by, for example, deposition of respective thin layers thereof over stack 18 and within individual operative channel openings 25 followed by planarizing such back at least to an uppermost surface of stack 18. Channel material 36 has been formed in operative channel openings 25 and in dummy channel openings 67 elevationally along insulative tiers 20 and conductive tiers 22, thus comprising individual operative channel-material strings 53 in operative memory-cell-string region 23 and dummy channel-material strings 35 in the TAV region (e.g., in any one or more of regions 21, 21A, 21B, and laterally outside of and not within operative TAV areas 27 in some embodiments). Example channel materials 36 include appropriately-doped crystalline semiconductor material, such as one or more silicon, germanium, and so-called III/V semiconductor materials (e.g., GaAs, InP, GaP, and GaN). Example thickness for each of materials 30, 32, 34, and 36 is 25 to 100 Angstroms. Punch etching may be conducted as shown to remove materials 30, 32, and 34 from the bases of operative channel openings 25 to expose conductor tier 16 such that channel material 36 is directly against conductive material 17 of conductor tier 16. Alternately, and by way of example only, no punch etching may be conducted and channel material 36 in operative channel openings 25 may be directly electrically coupled to material 17/19 by a separate conductive interconnect (not shown). Operative channel openings 25 and dummy channel openings 67 are shown as comprising a radially-central solid dielectric material 38 (e.g., spin-on-dielectric, silicon dioxide, and/or silicon nitride). Alternately, and by way of example only, the radially-central portion within operative channel openings 25 and dummy channel openings 67 may include void space(s) (not shown) and/or be devoid of solid material (not shown).

At least a majority of the channel material of the dummy channel-material strings in the TAV region (e.g., any one or more of TAV regions 21, 21A, 21B) is replaced with insulator material. In one embodiment, such act of replacing removes all of the channel material of the dummy channel-material strings.

FIGS. 42-55 show one example embodiment wherein operative channel-material strings 53 in operative memory-cell-string region 23 have been masked (e.g., with a masking material 41) while leaving dummy channel-material strings 35 in the TAV region (e.g., any one or more of TAV regions 21, 21A, 21B) unmasked. Example masking material 41 may comprise one or more masking materials, such as photoresist, carbon hard-masking material, and an antireflective coating (DARC).

Referring to FIGS. 56-69, channel material 36 (not shown) of unmasked dummy channel-material strings 35 in TAV regions 21, 21A, and 21B has been etched away while operative channel-material strings 53 in operative memory-cell-string region 23 are masked. In one embodiment and as shown, all material other than channel material 36 has also been etched away from dummy channel openings 67. Alternately, at least some of such other material may remain. Further and regardless, such example etching of unmasked dummy channel-material strings 35 may occur immediately after deposition of channel material 36 (e.g., before deposition of dielectric fill material 38).

Referring to FIGS. 70-83, insulator material 44 has been deposited into dummy channel openings 67, thus forming dummy TAVs 55 (that are circuit-inoperative in the final construction). Masking material 41 (not shown) may be removed before or after forming insulator material 44. In one embodiment, all of insulator material 44 that replaces the channel material consists essentially of, in one embodiment consists of, solid material 46 (e.g., silicon dioxide and/or silicon nitride and regardless of whether such is initially formed as liquid or solid).

Figure 84:
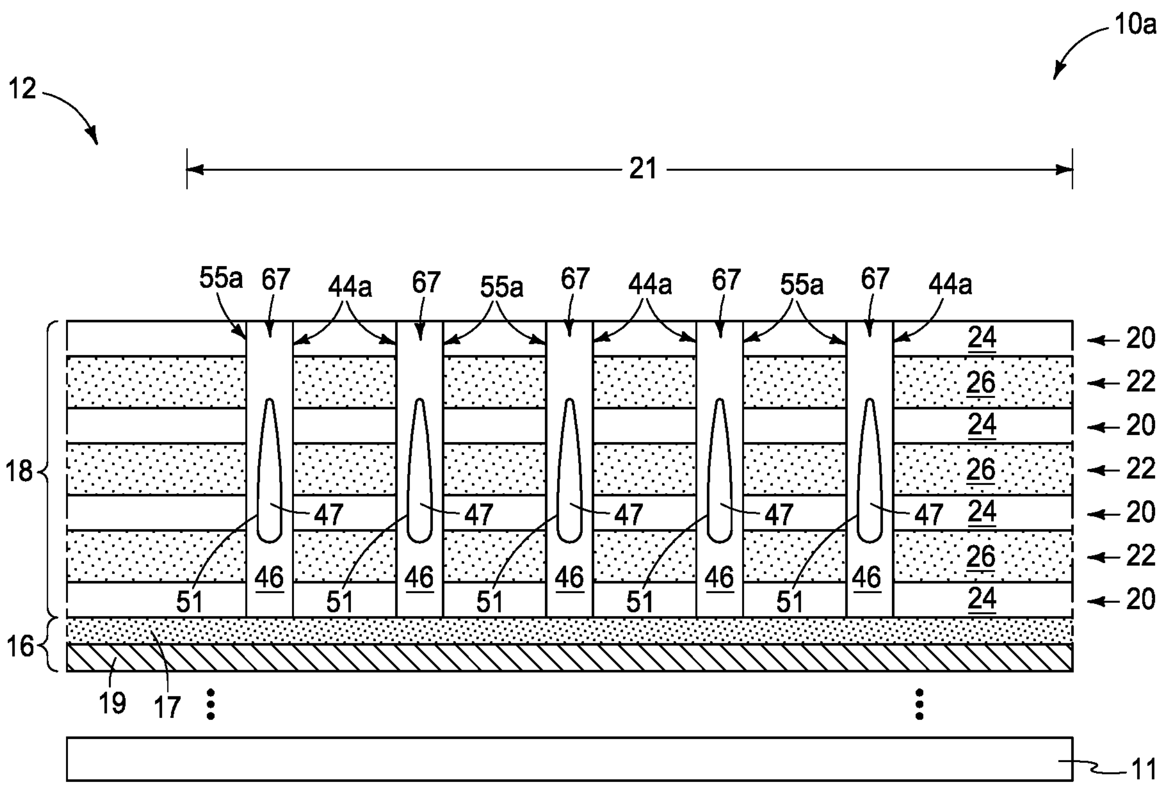

In one embodiment, the insulator material that replaces the channel material comprises solid material and gaseous material, for example as shown with respect to an alternate embodiment construction 10*a* in FIG. 84. Like numerals from the above-described embodiments have been used where appropriate, with some construction differences being indicated with the suffix "a" or with different numerals. FIG. 84 corresponds to FIG. 74 of the first-described embodiments. Construction 10*a* shows dummy TAVs 55*a* as comprising insulator material 44*a* comprising solid material 46 and gaseous material 47 (e.g., formed from and comprising room-ambient air, $N_2$, an inert gas such as a noble gas, etc.). In one embodiment and as shown, insulator material 44*a* comprises one and only one void space 51 and in which gaseous material 47 is received.

Figure 85:
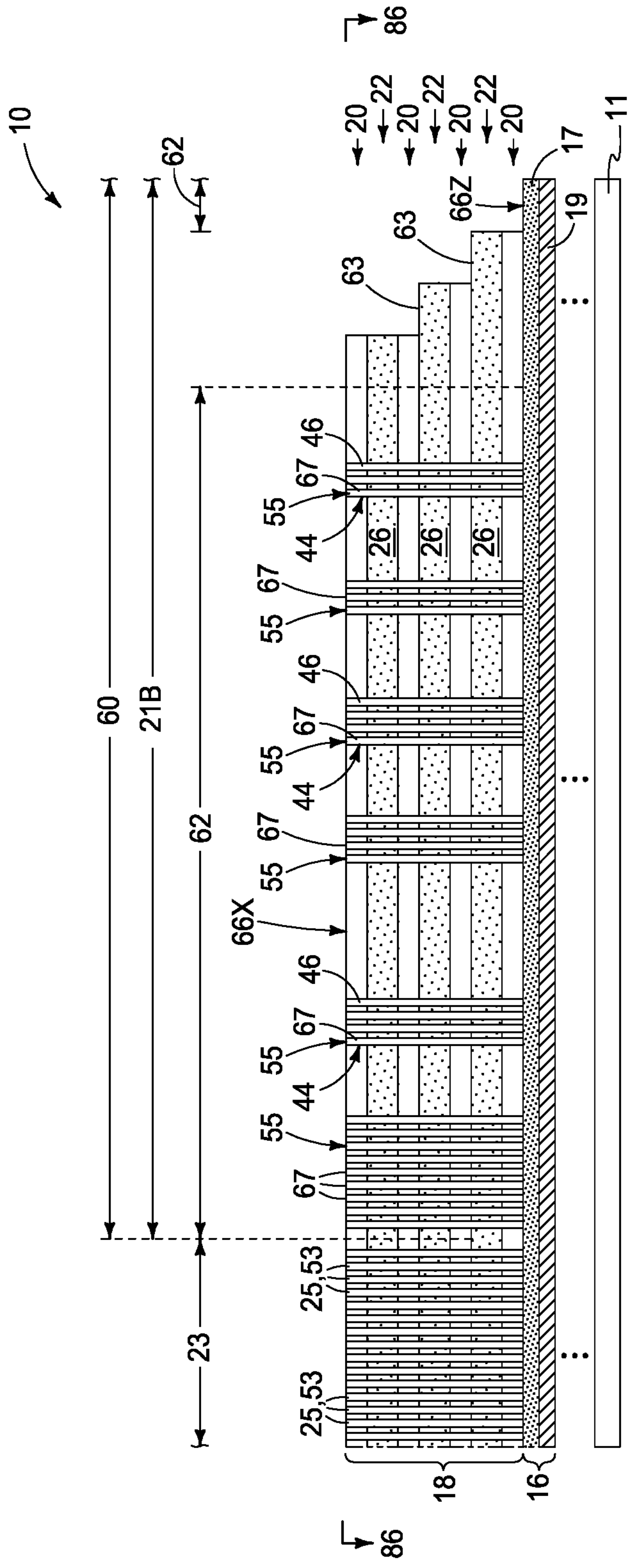
Figure 86:
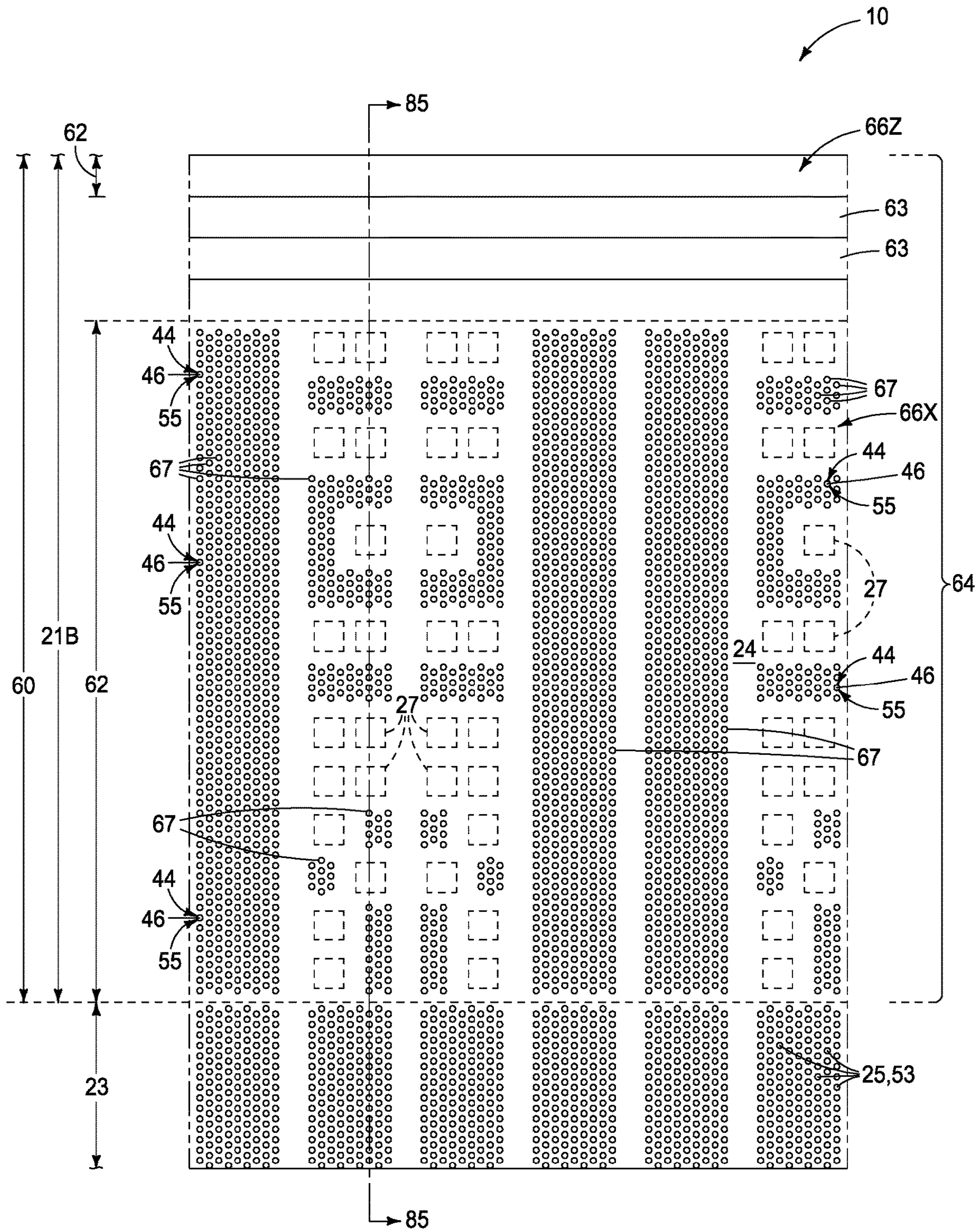

Referring to FIGS. 85 and 86, and in one embodiment, a stair-step structure 64 (e.g., having steps 63) has been formed into stack 18 in stair-step region 60 and a landing (e.g., 66X and/or 66Z, with 66X being a landing crest and 66Z being a landing foot) has been formed in landing region 62 of stair-step region 60. Alternately, no landing 66X may be immediately-adjacent memory-cell-string region 23 (not shown), with for example an uppermost step 63 (not shown) being immediately there-adjacent. Stair-step structure 64 in the example "gate-last" method is circuit-inoperative but will comprise an operative stair-step structure in a finished-circuitry construction. An "operative stair-step structure" is circuit-operative having at least some conductive step thereof that electrically couples with and between a) an electronic component in operative memory-cell-string region 23, such as a transistor and/or memory cell, and b) an electronic component outside of operative memory-cell-string region 23. Such an operative stair-step structure may be formed by any existing or later-developed method(s). As one such example, a masking material (e.g., a photo-imageable material such as photoresist) may be formed atop stack 18 and an opening formed there-through. Then, the masking material may be used as a mask while etching (e.g., anisotropically) through the opening to extend such opening into the outermost two tiers 20, 22. The resultant construction may then be subjected to a successive alternating series of lateral-trimming etches of the masking material followed by etching deeper into stack 18 two-tiers 20, 22 at a time using the trimmed masking material having a successively widened opening as a mask. Such an example may result in the forming of stair-step structure 64 into stack 18 that comprises vertically alternating tiers 20, 22 of different composition materials 24, 26, and in the forming of another stair-step structure (not shown) opposite and facing stair-step structure 64 (e.g., in mirror image). Such opposite stair-step structure (not shown) may be a dummy stair-step structure. A "dummy stair-step structure" is circuit-inoperative having steps thereof in which no current flows in conductive material of the steps and which may be a circuit-inoperable dead end that is not part of a current flow path of a circuit even if extending to or from an electronic component. Multiple operative stair-step structures (not shown) and multiple dummy stair-step structures (not shown) may be formed, for example longitudinally end-to-end in different portions of stair-step region 60 and to different depths within stack 18 (not shown). Pairs of opposing mirror-image operative and dummy stair-step structures may be considered as defining a stadium (e.g., a vertically recessed portion having opposing flights of stairs, and not shown).

Referring to FIGS. 87-96, operative TAVs 45 have been formed in individual spaced operative TAV areas 27 in one or more of TAV regions 21, 21A, and 21B. If any dummy channel-material strings were formed in operative TAV areas 27 (not shown) and replaced with insulator material 44/44A to form dummy TAVs 55/55*a* in operative TAV areas 27 (not shown), such may inherently be replaced by operative TAVs 45. In one embodiment and as indicated above, operative channel openings 25 and dummy channel openings 67 may be formed to collectively have a common horizontal pitch P, and whereby operative and dummy channel-material strings 53 and 35, respectively, and operative channel-material strings 53 and dummy TAVs 55/55*a* will have the same horizontal pitch P. Alternately, and by way of example only, the dummy channel openings, the dummy channel material strings, and the dummy TAVs may be made of the same horizontal size and shape as and/or on pitch with operative TAVs 45 (not shown).

One or more circuit-operative conductive vias 39 have been formed to each step 63. Insulative material 37 (e.g., silicon dioxide) may be formed atop stair-step structure 64 prior to forming operative TAVs 45 and vias 39. Example operative TAVs 45 and vias 39 are shown as comprising a conductive material core 59 surrounded by dielectric material 61 (e.g., silicon dioxide and/or silicon nitride). Regardless, in one embodiment and as shown, the landing below and/or through which dummy channel-material strings 35 and operative TAVs 45 are received in a crest of what-will-be operative stair-step structure 64 (e.g., landing crest 66X). Additionally, or alternately, the landing below and/or through which the dummy channel-material strings and the operative TAVs may be received is a landing foot of what-will-be operative stair-step structure 64 (e.g., landing foot 66Z and not shown).

Dummy TAVs and operative TAVs may additionally or alternately be in other landing crests and/or in other landing foots and, if so, not necessarily be in all landing crests or in all landing foots. Also as referred to above, the dummy channel material openings (now having dummy TAVs 55 therein) need not and may not be in the one landing region 62 that is immediately-adjacent operative memory-cell-string region 23. For example, a landing region 62 that is immediately adjacent or part of operative memory-cell-string region 23 may have no dummy TAVs therein (not shown), and/or have dummy TAVs that are in part of another landing region 62 (a crest and/or a foot) that is spaced from operative memory-cell-string region 23 (not shown). Thereby, operative channel-material strings 53 may be in crest 66X in the absence of any operative TAVs and/or dummy channel material strings therein (not shown).

Figure 87:
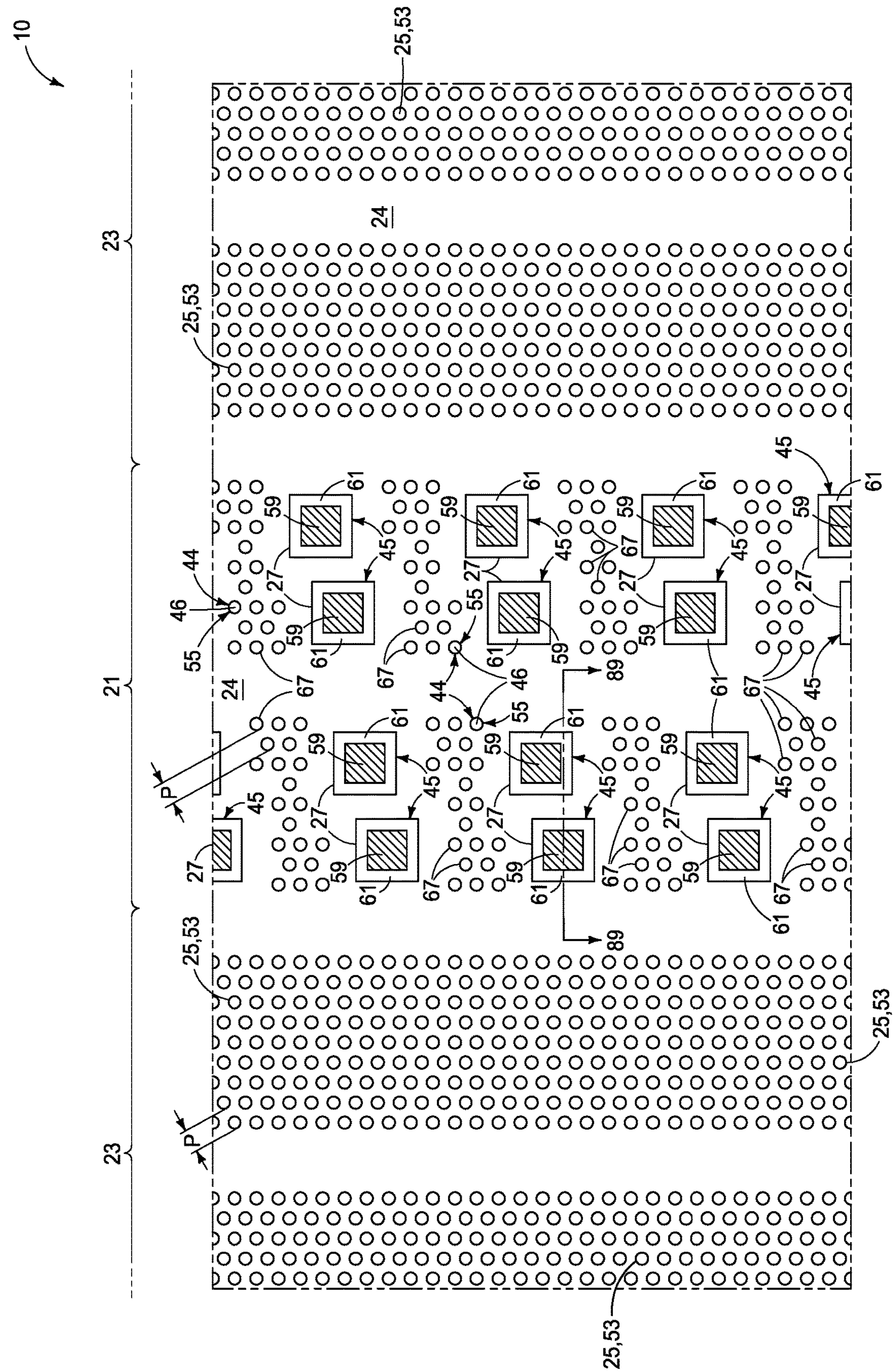
Figure 88:
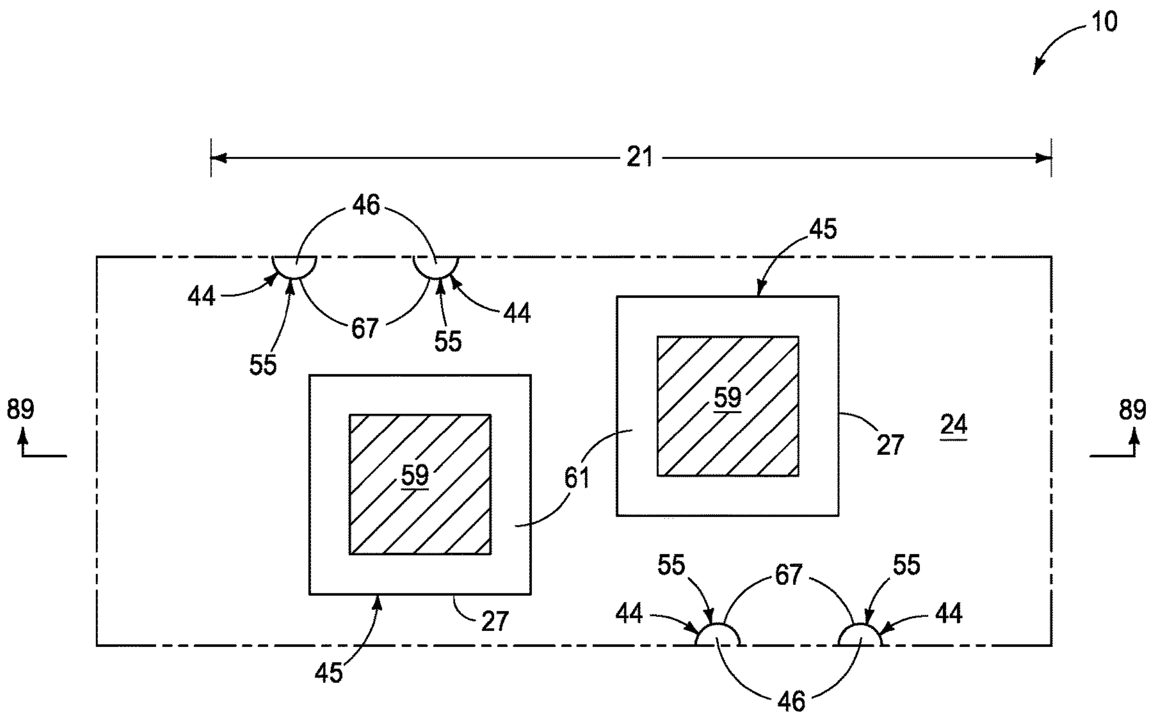
Figure 89:
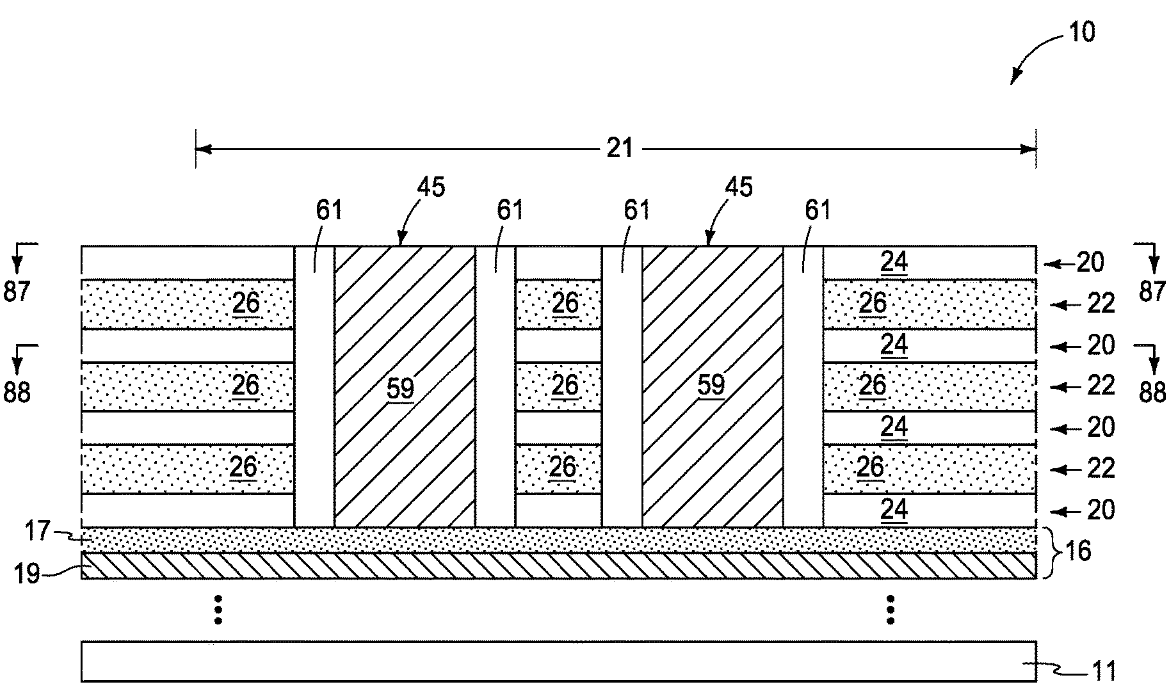
Figure 90:
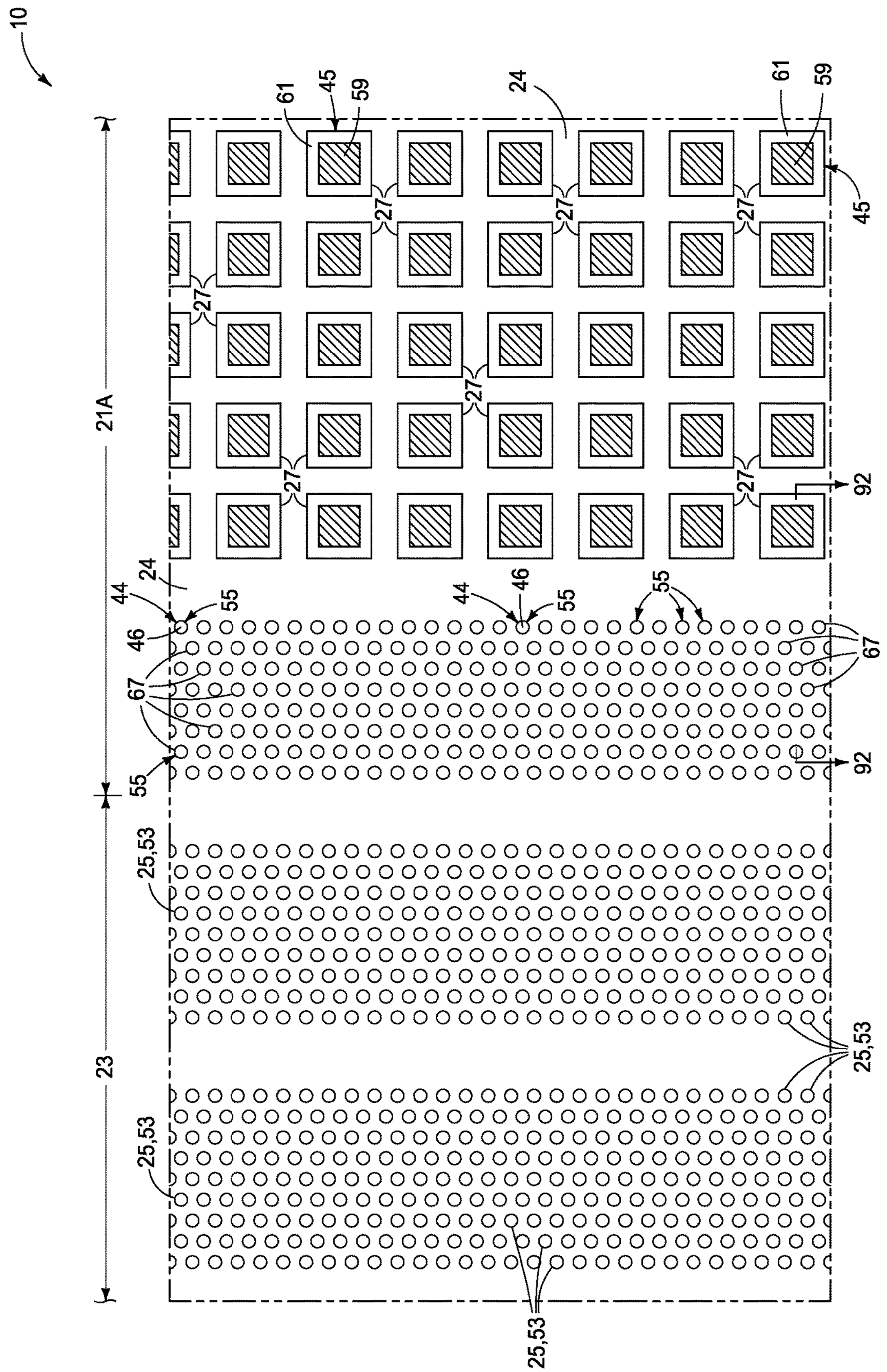
Figure 91:
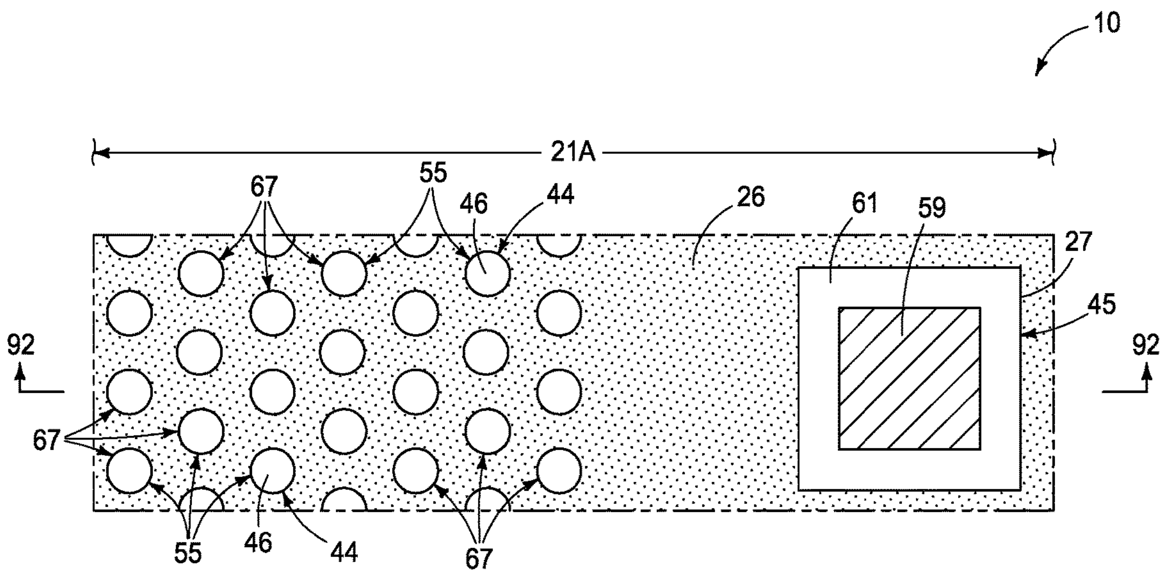
Figure 92:
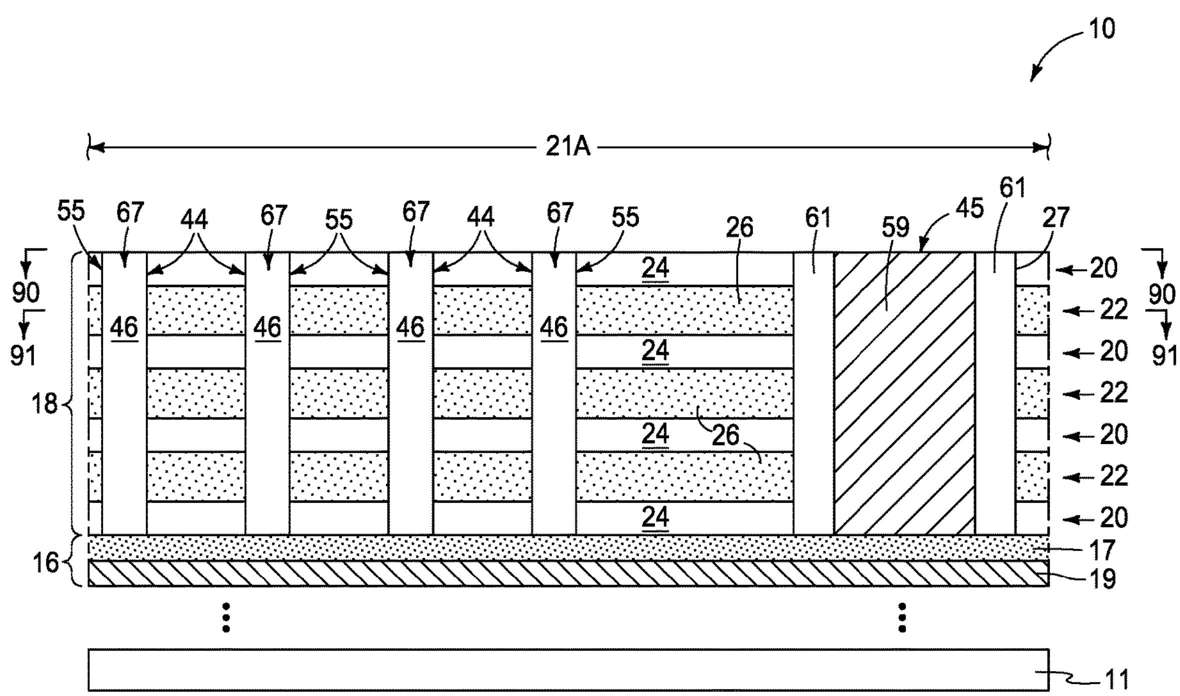
Figure 93:
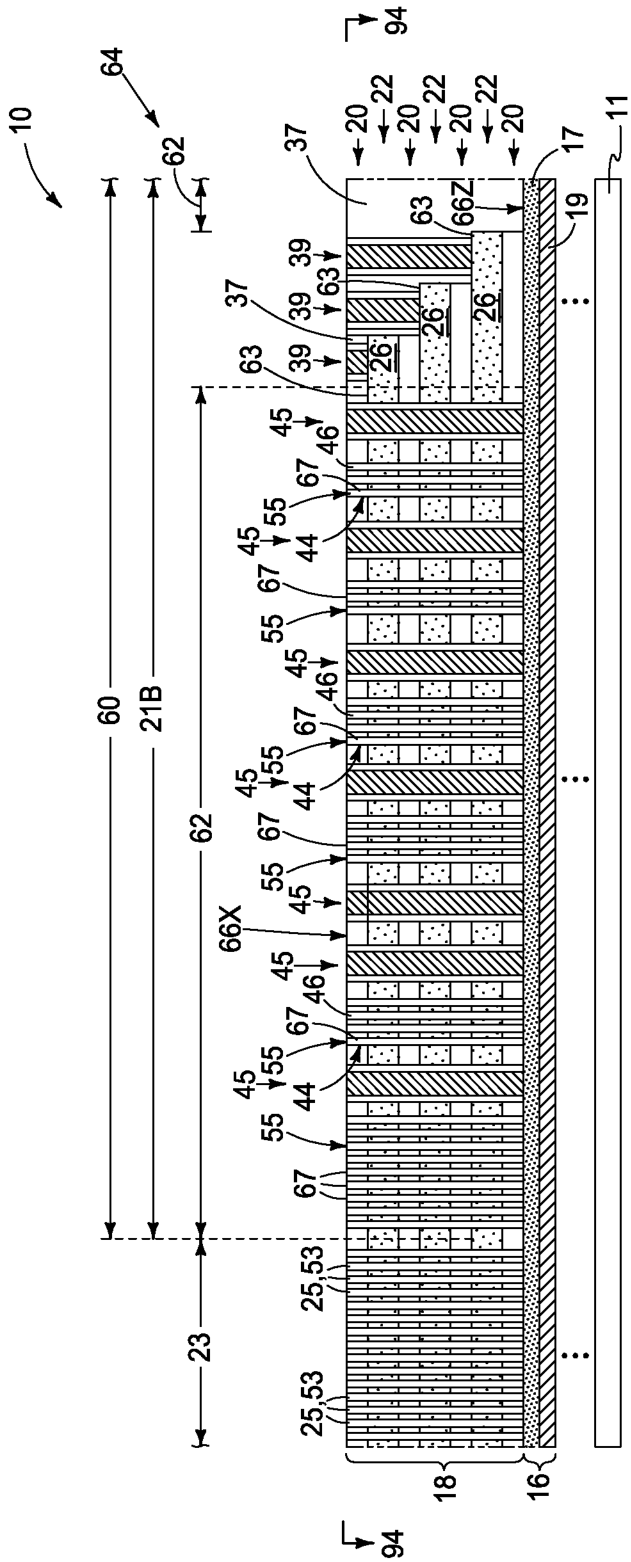
Figure 94:
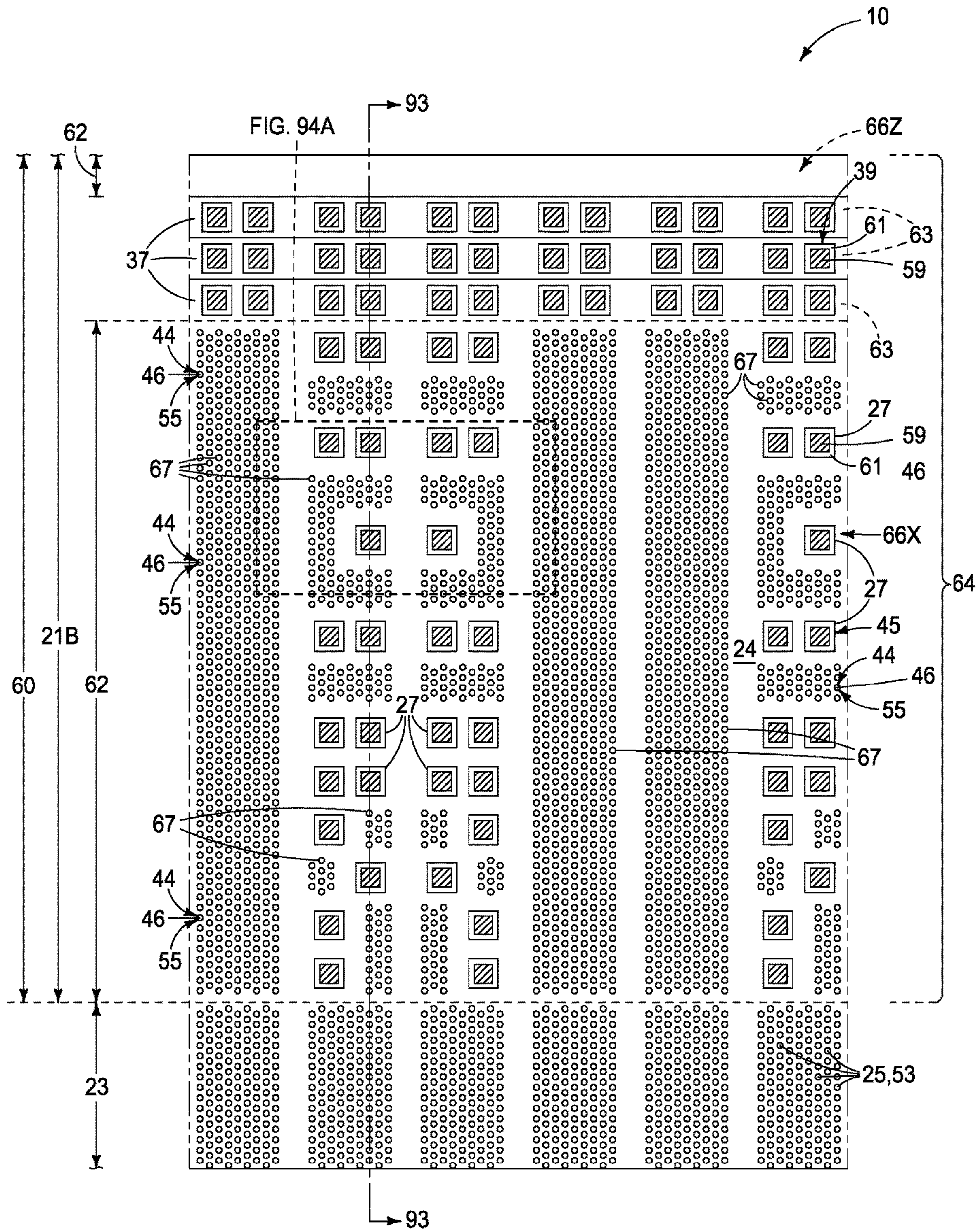
Figure 94A:
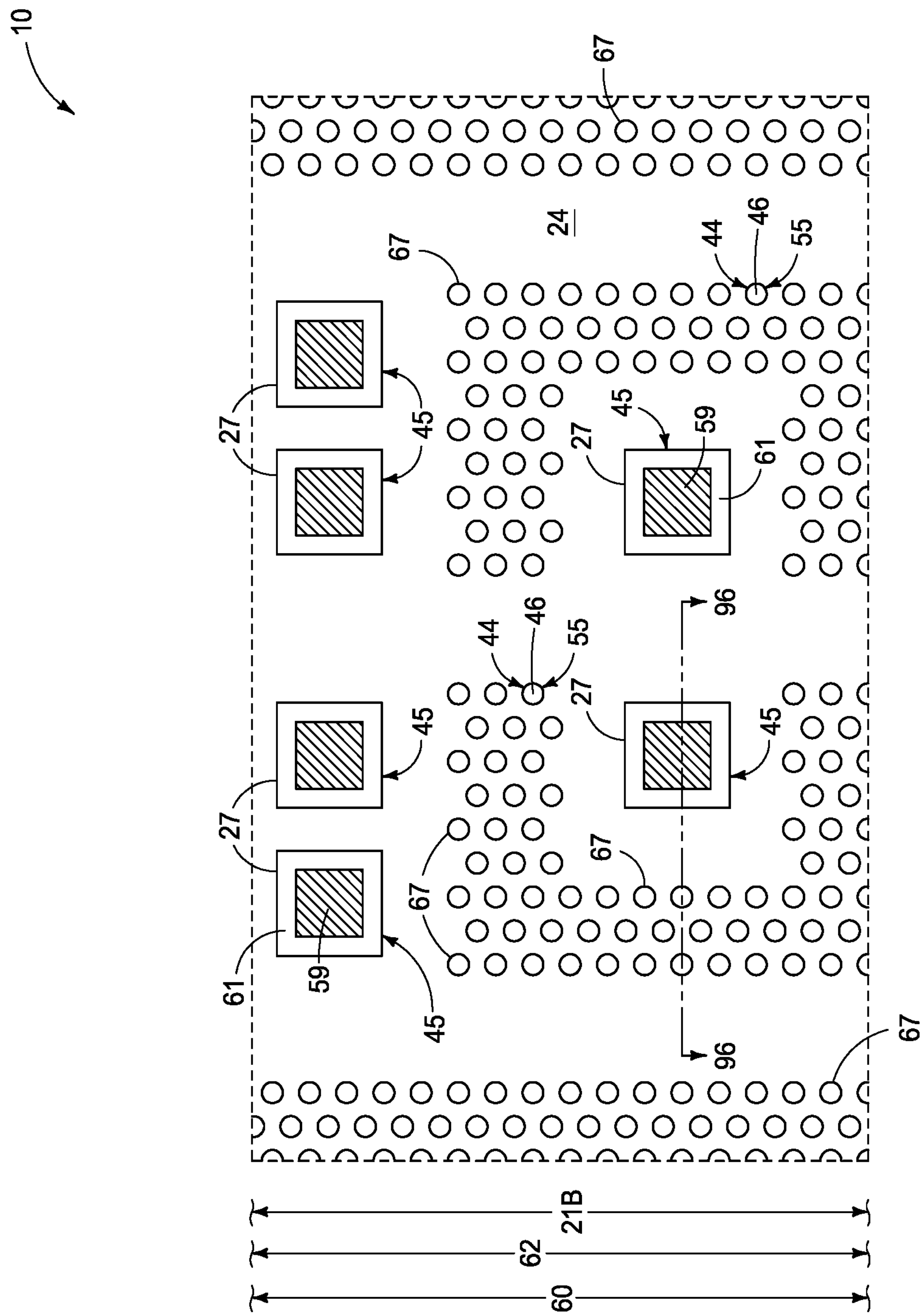
Figure 95:
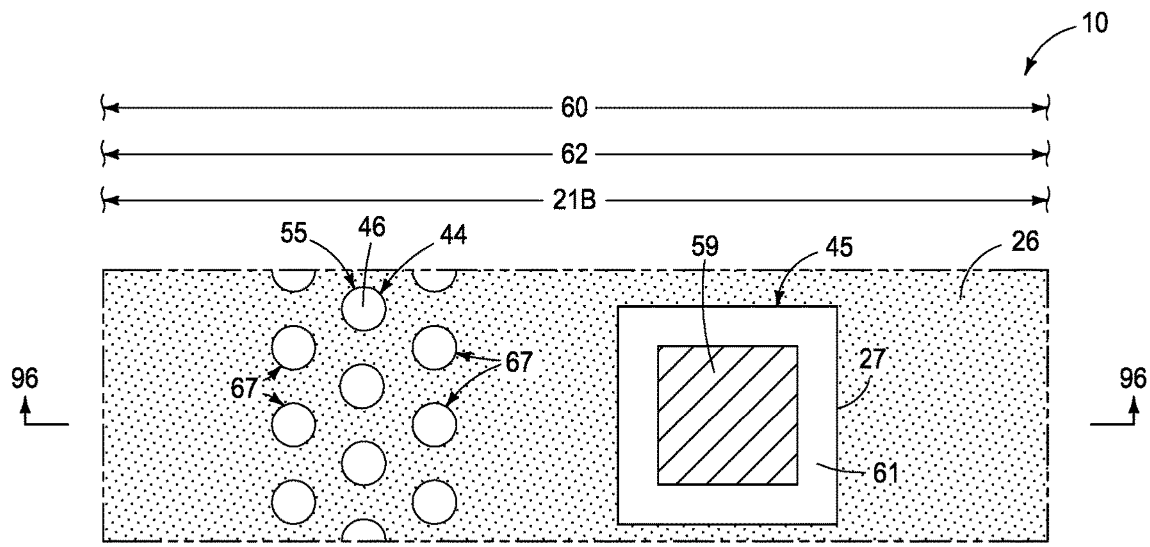
Figure 96:
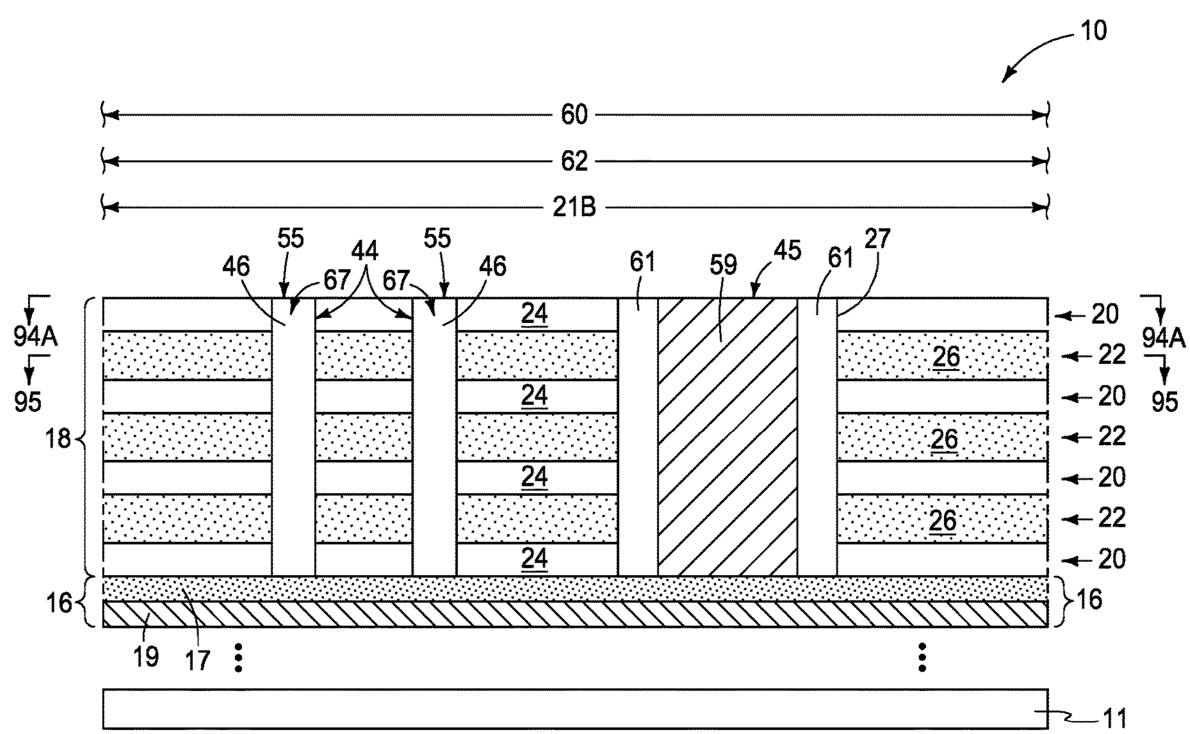
Figure 97:
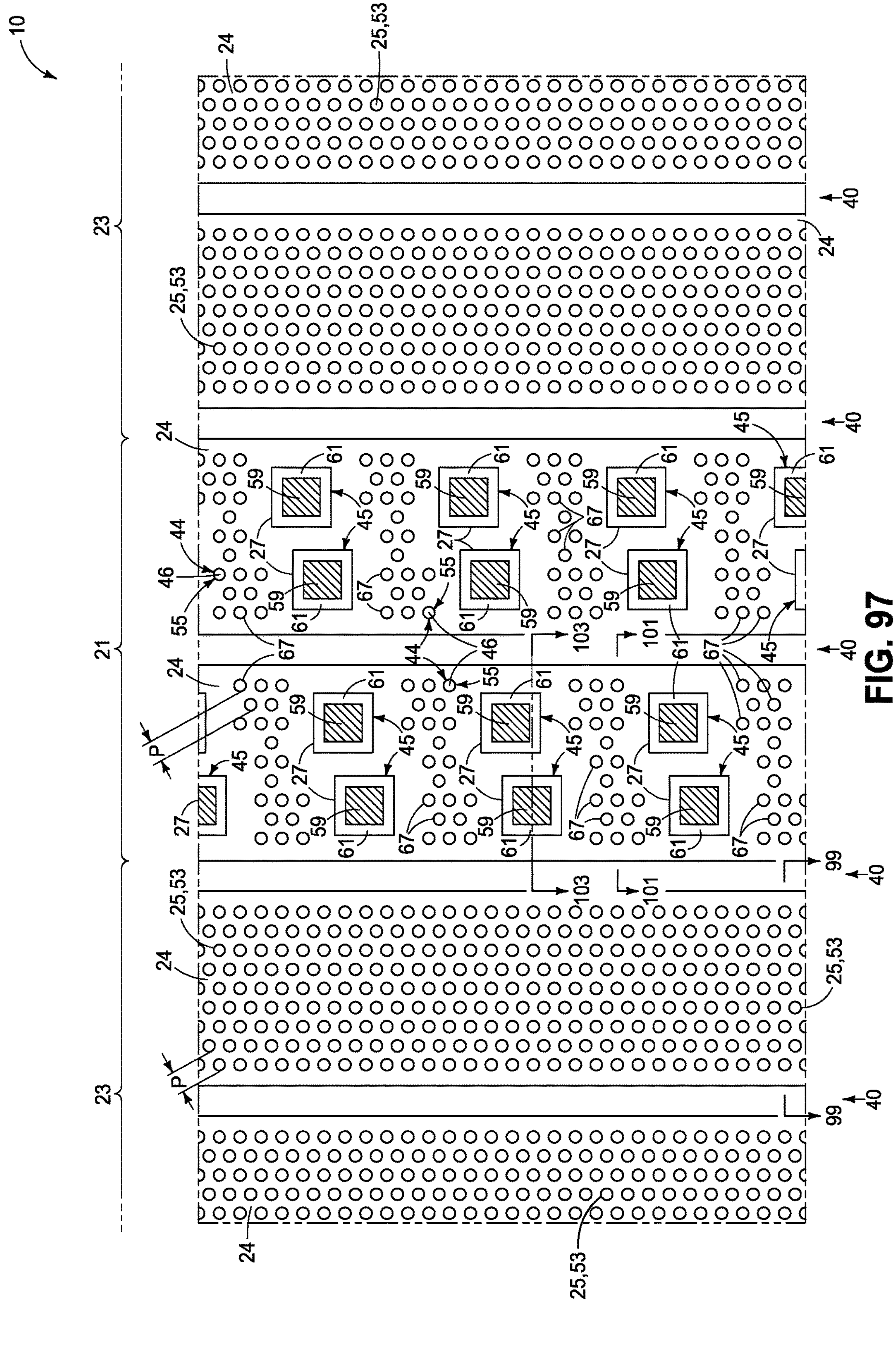
Figure 98:
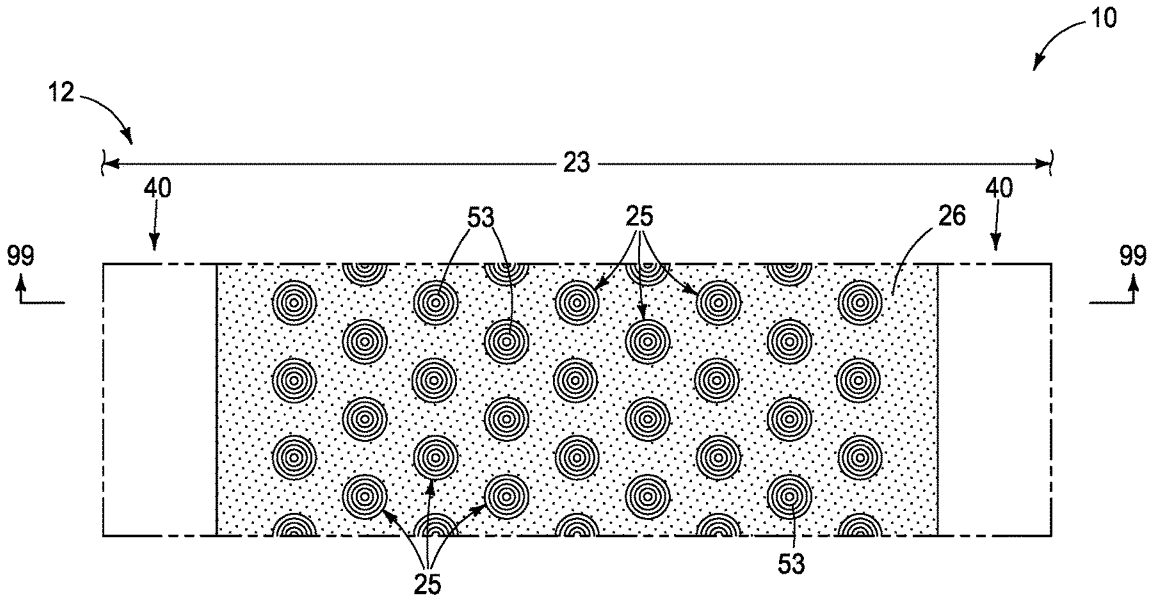
Figure 99:
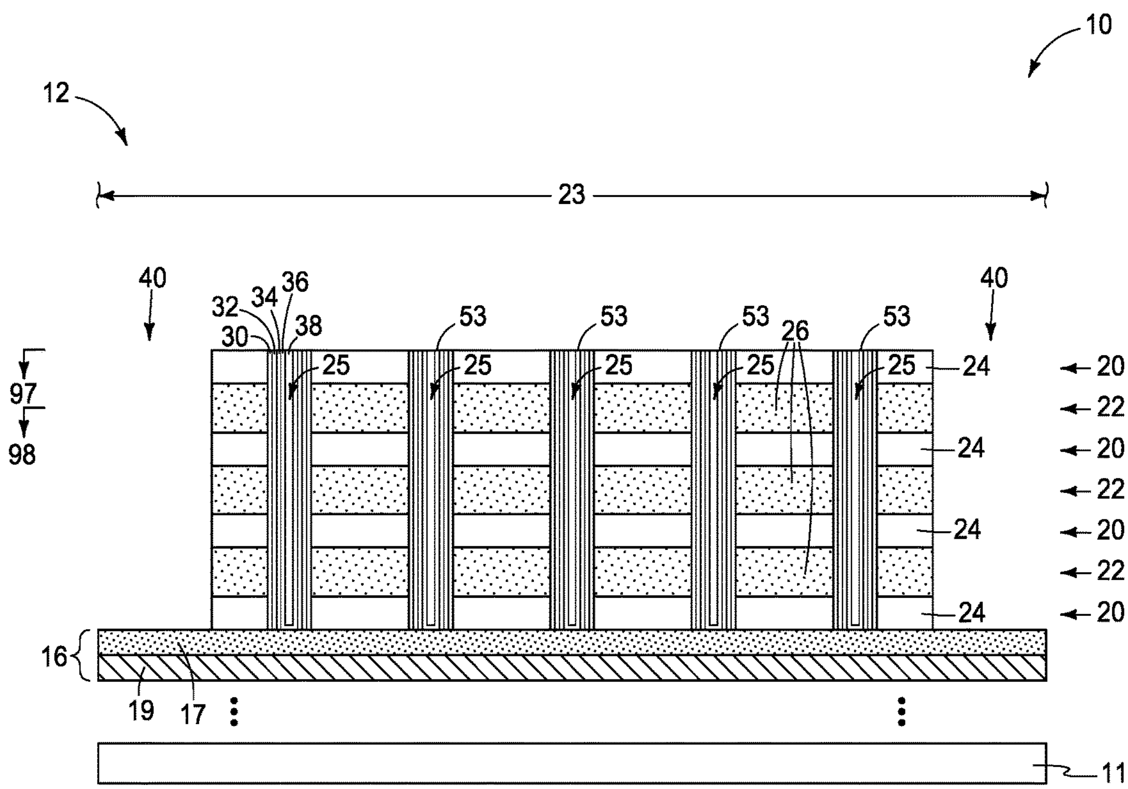
Figure 100:
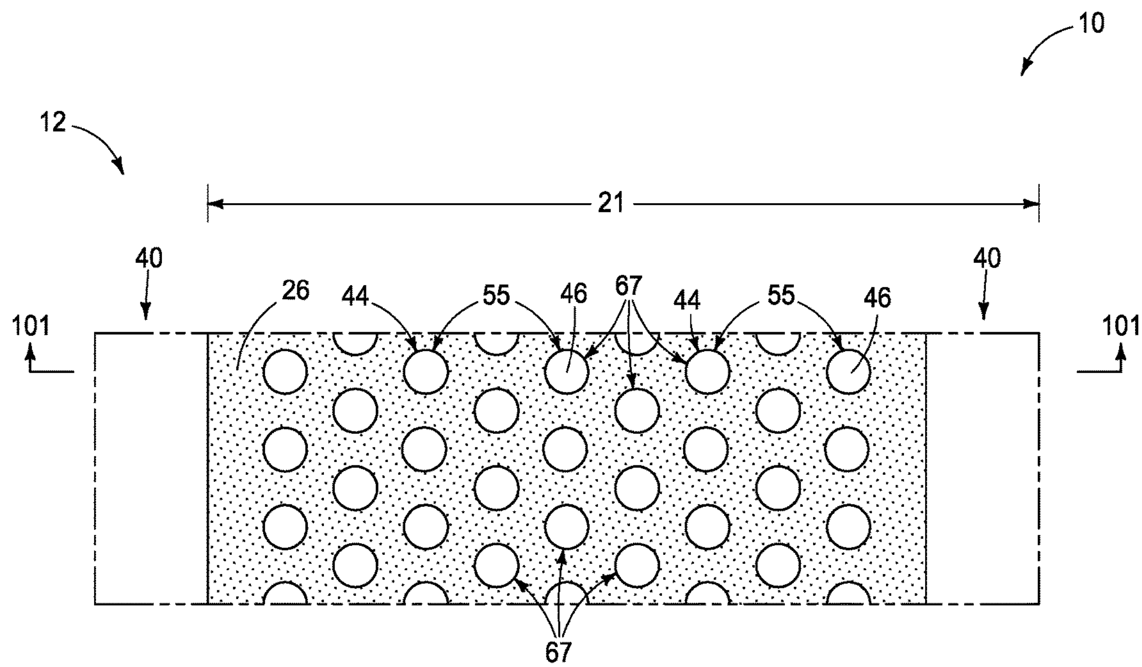
Figure 101:
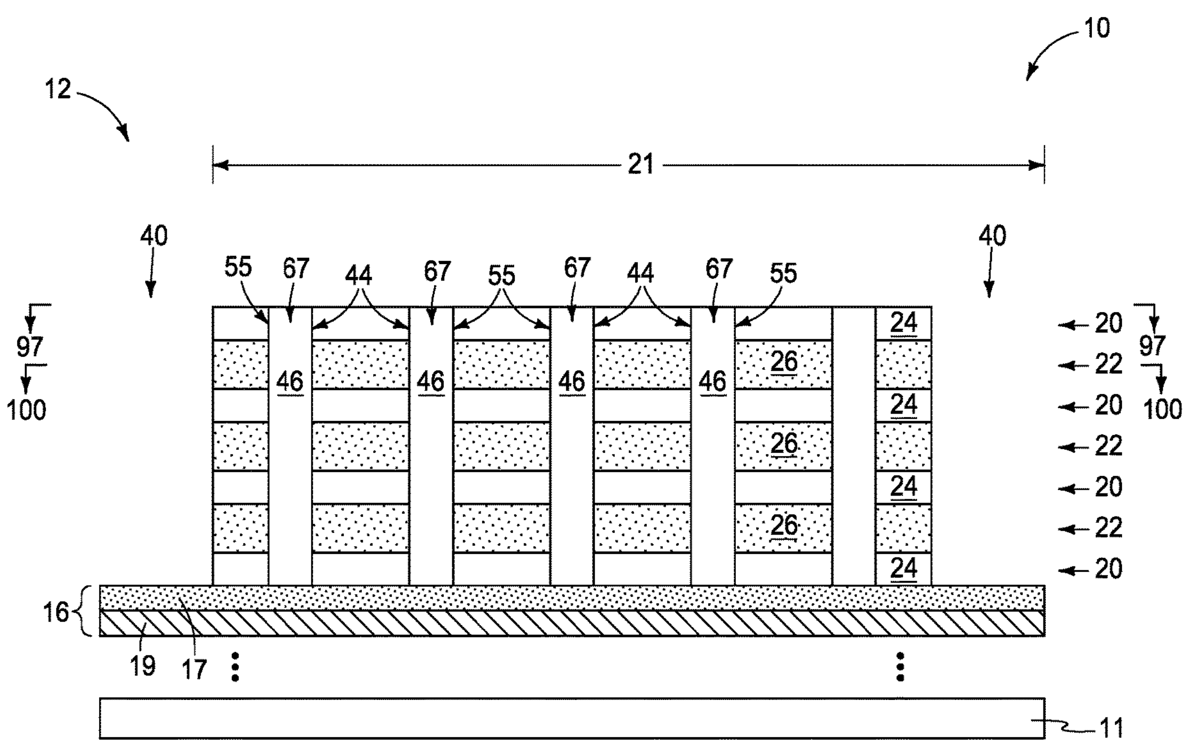
Figure 102:
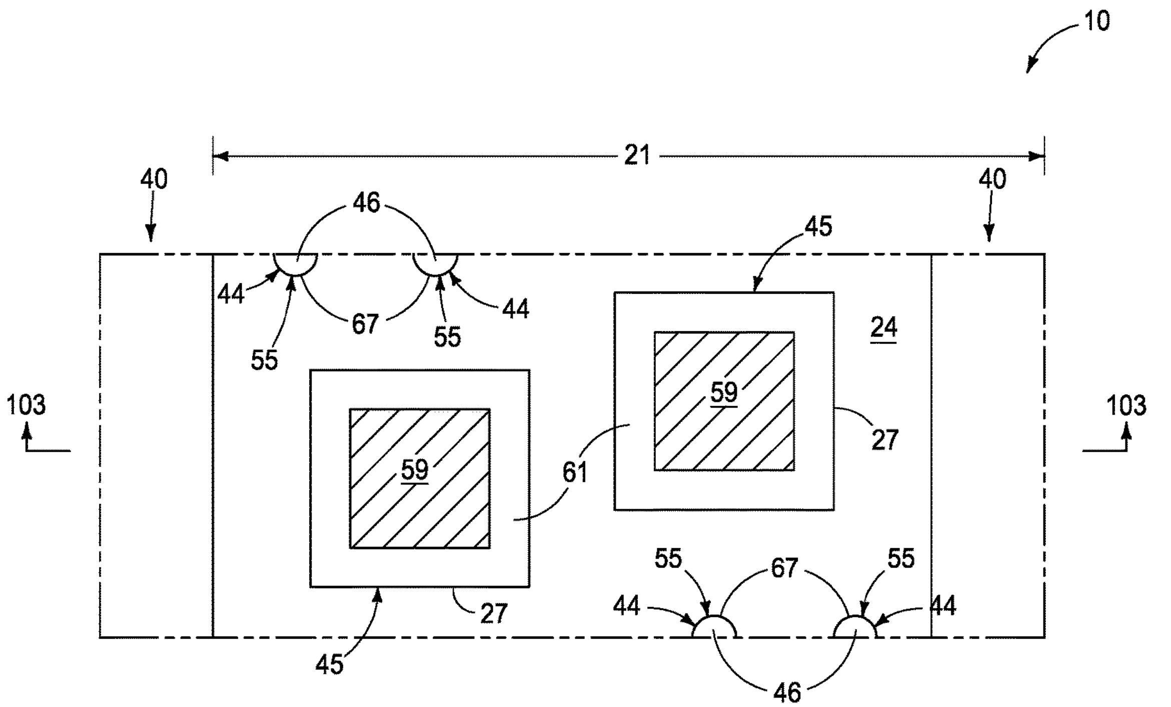
Figure 103:
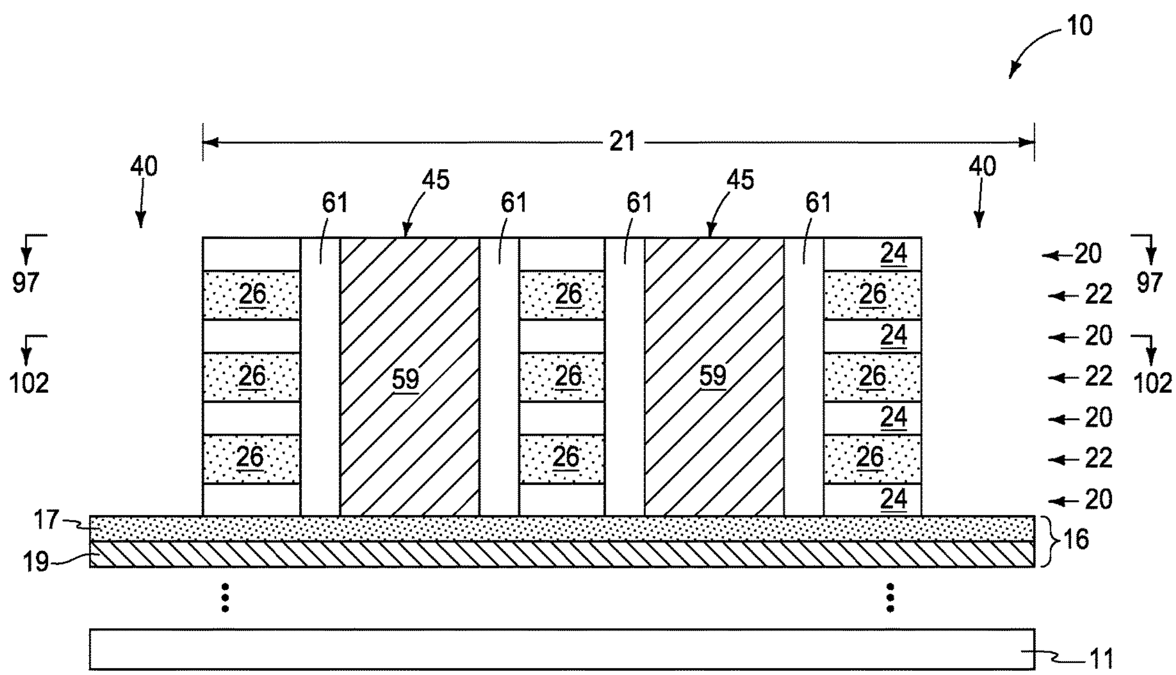
Figure 104:
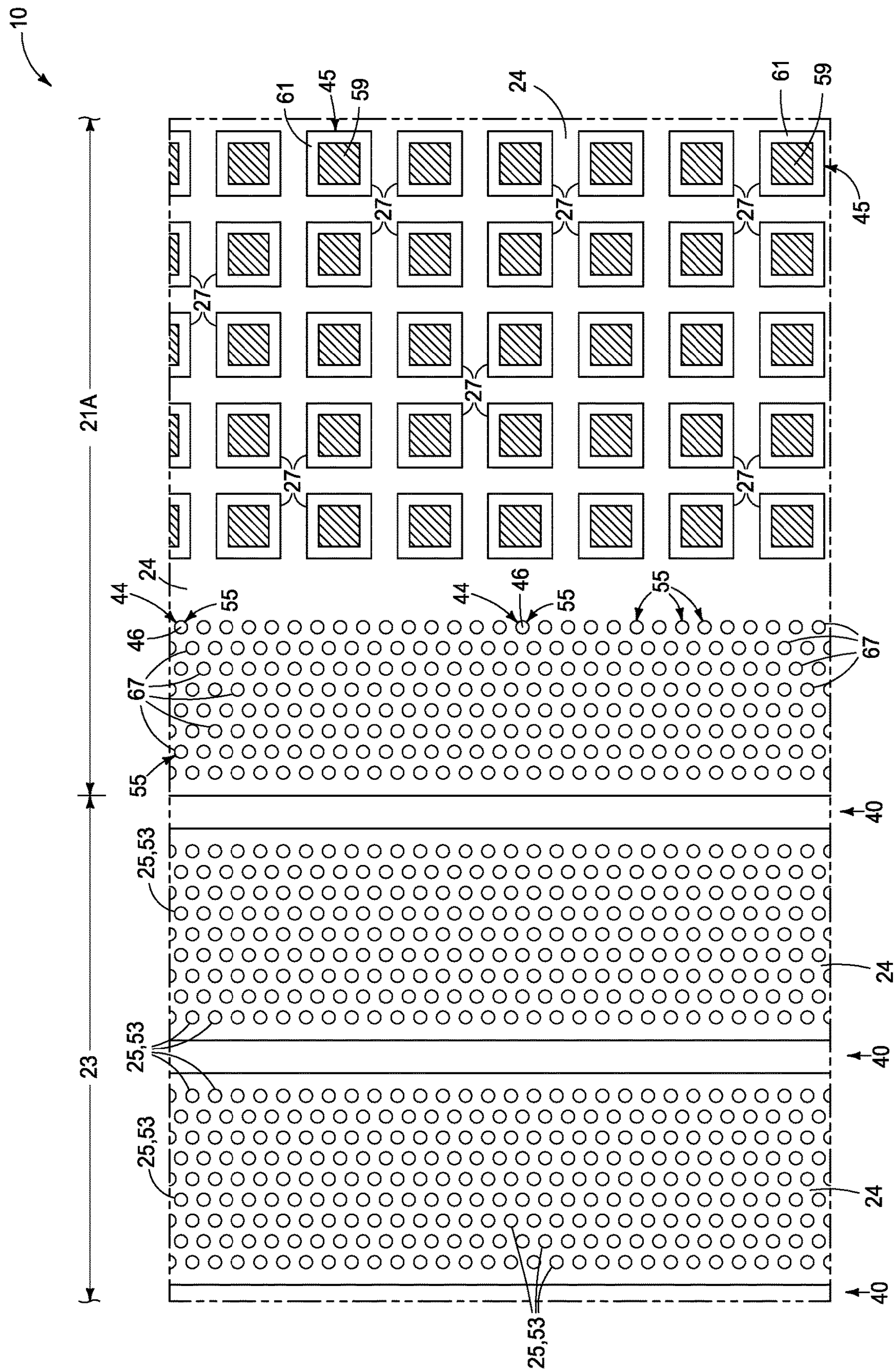
Figure 105:
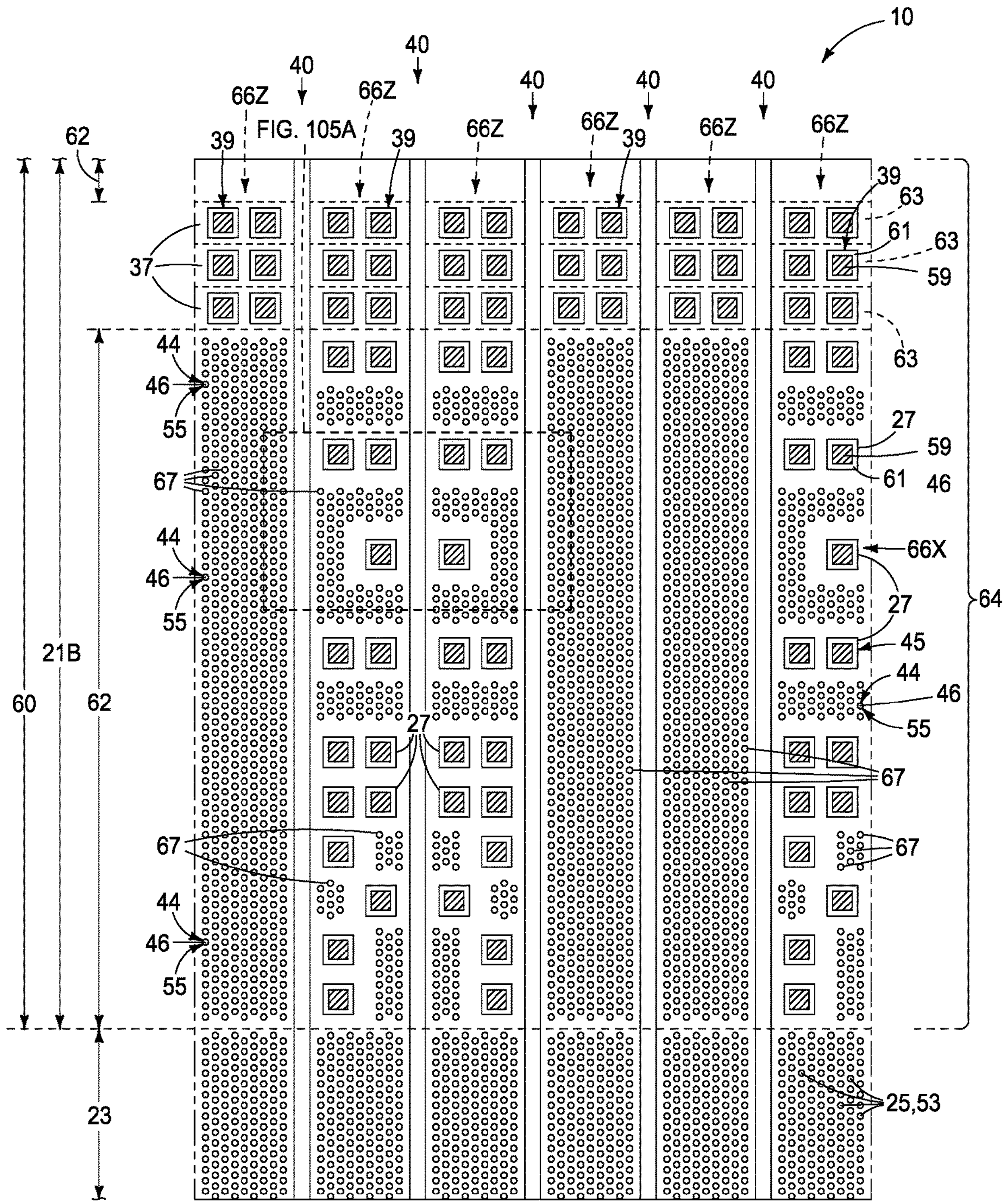
Figure 105A:
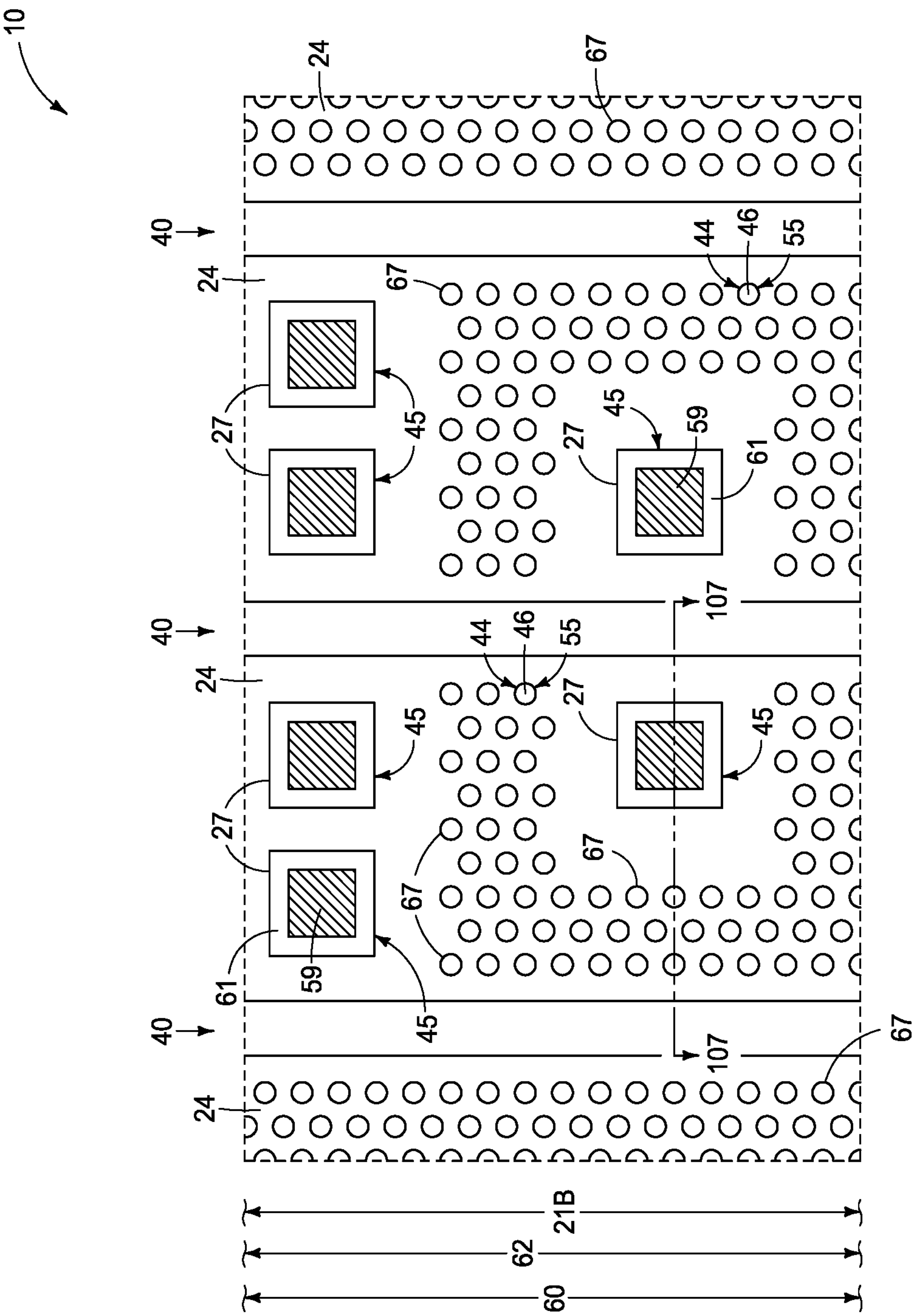
Figure 106:
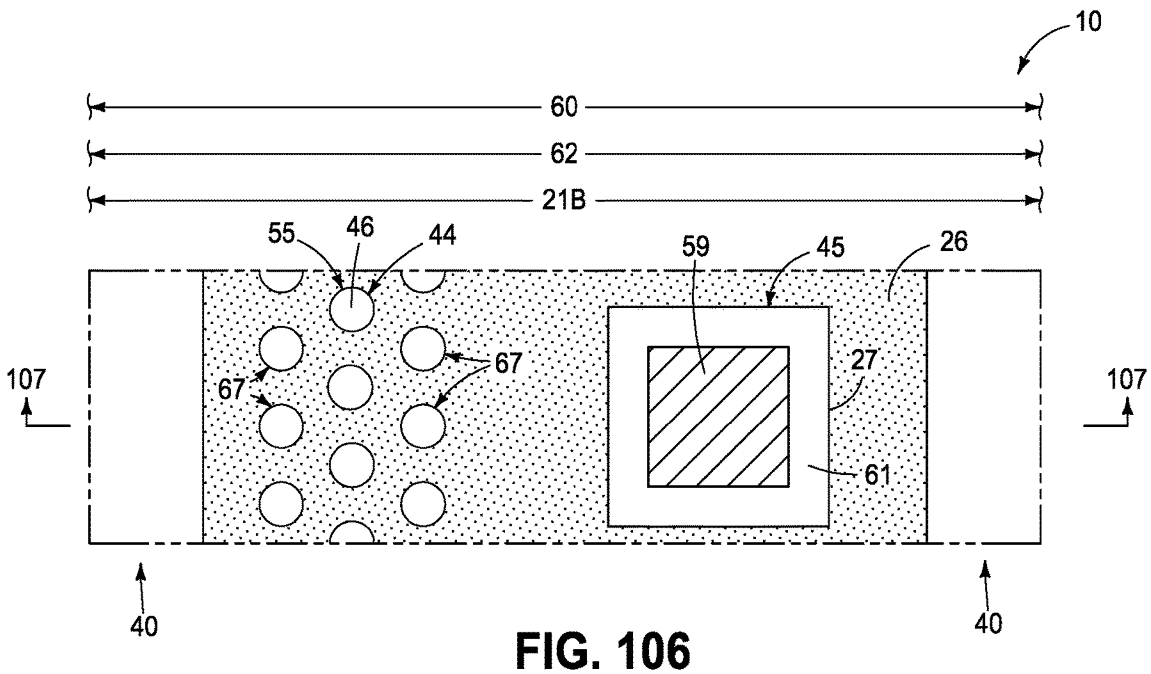
Figure 107:
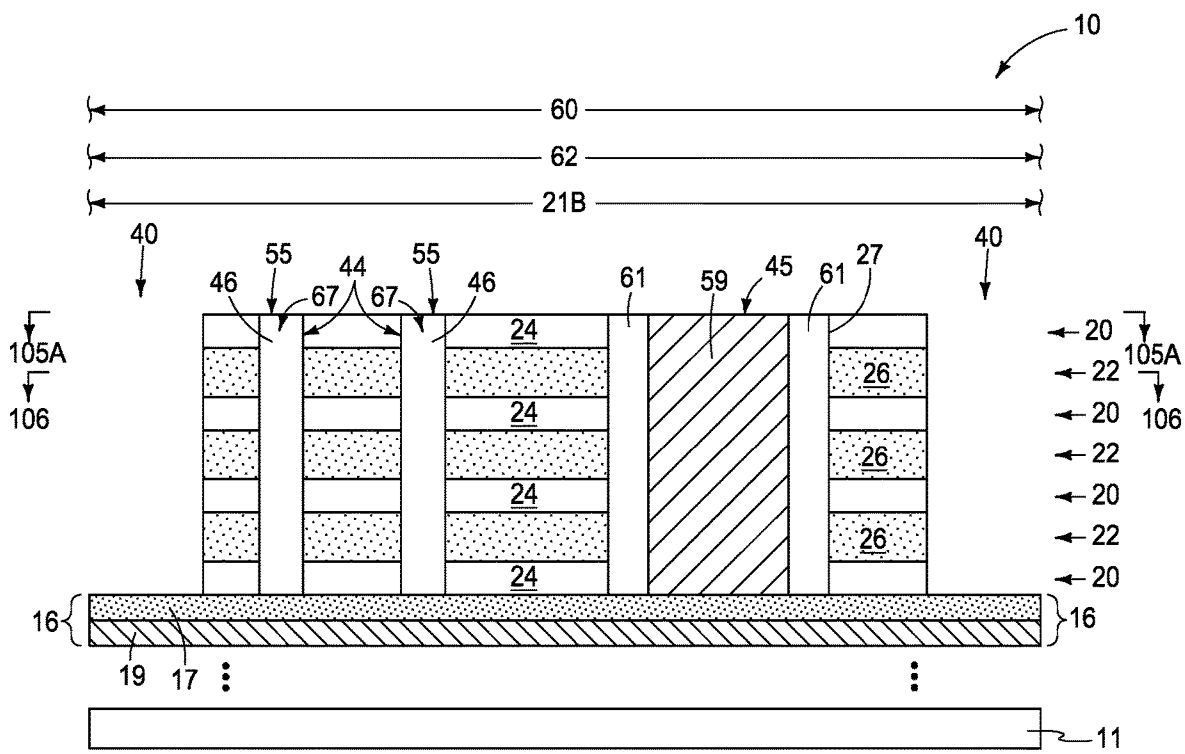
Figure 108:
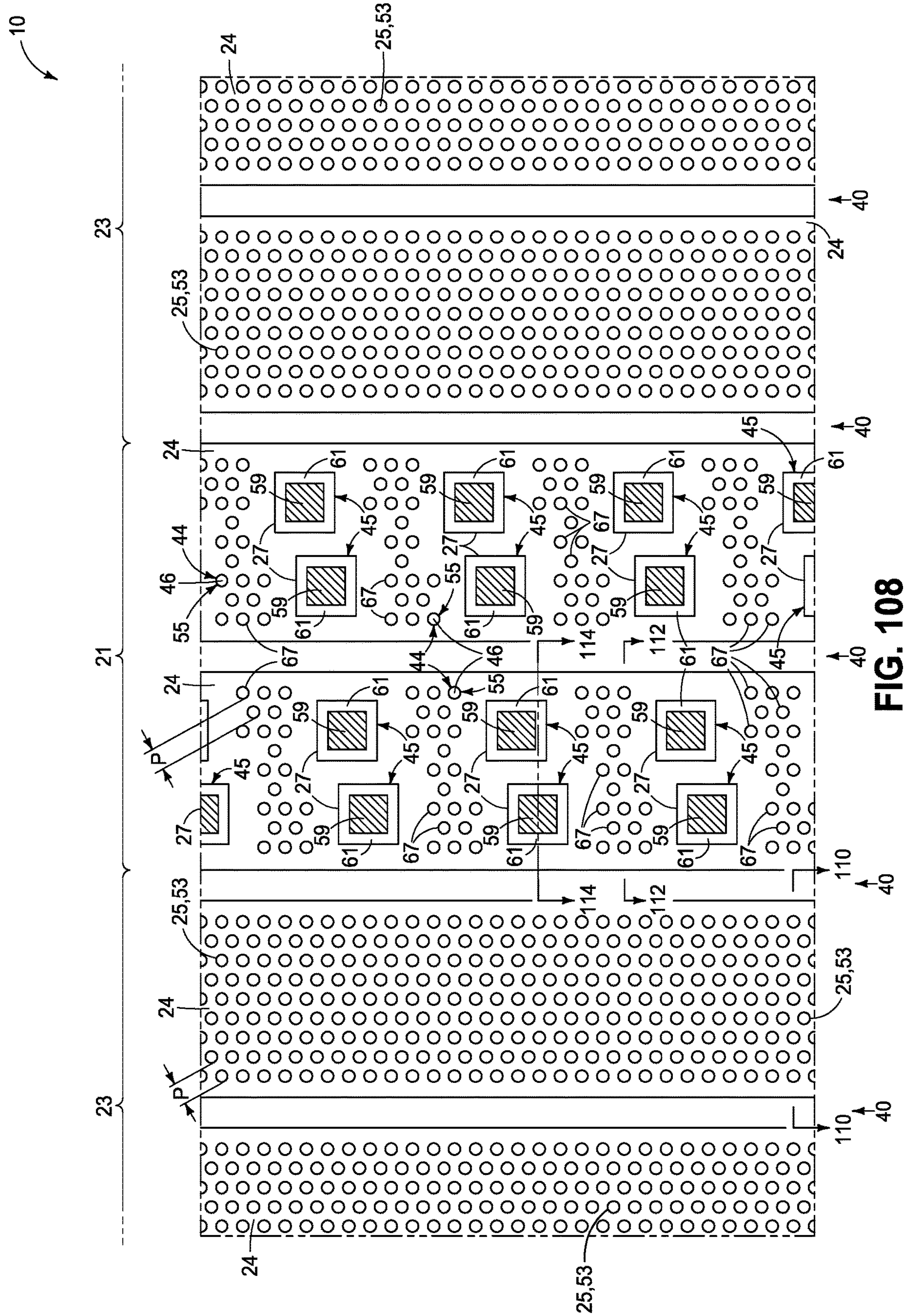
Figure 109:
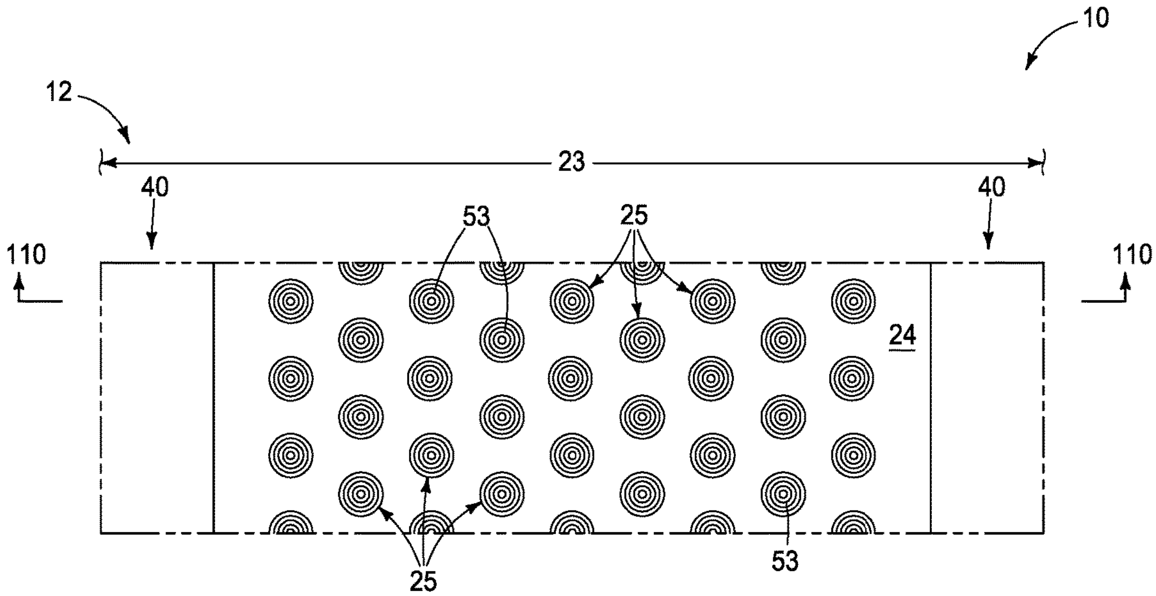
Figure 110:
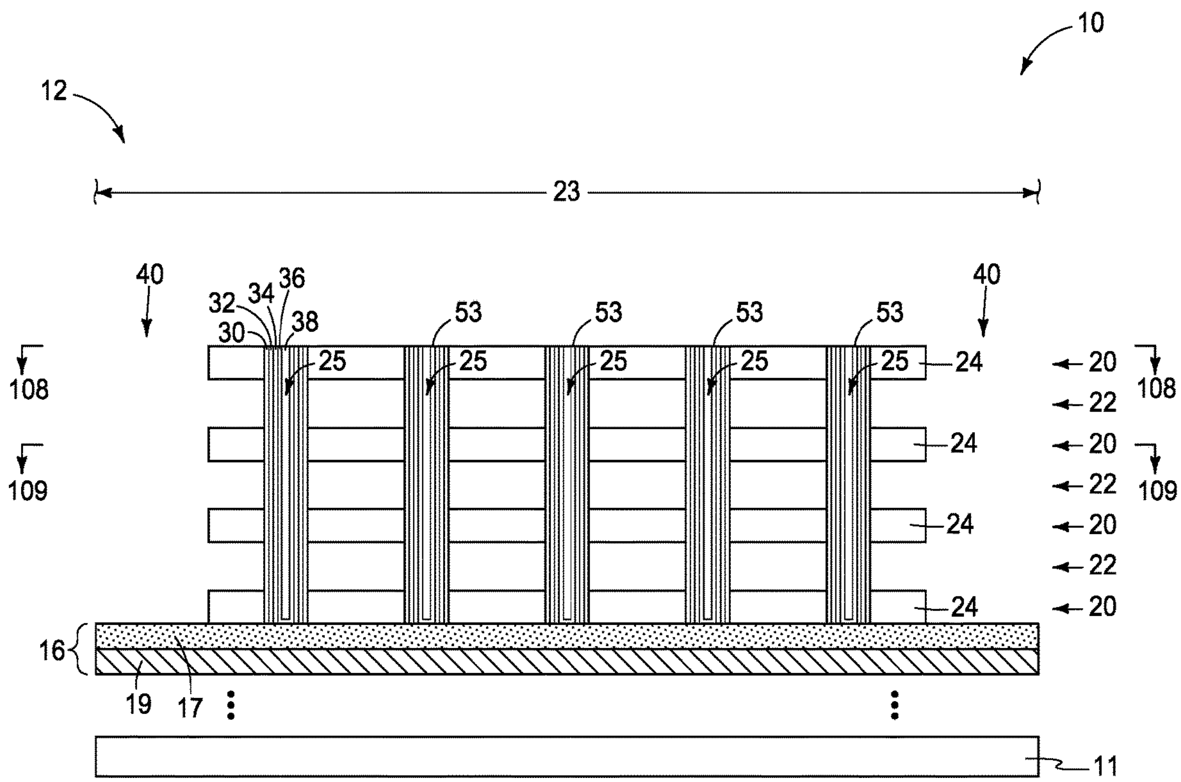
Figure 111:
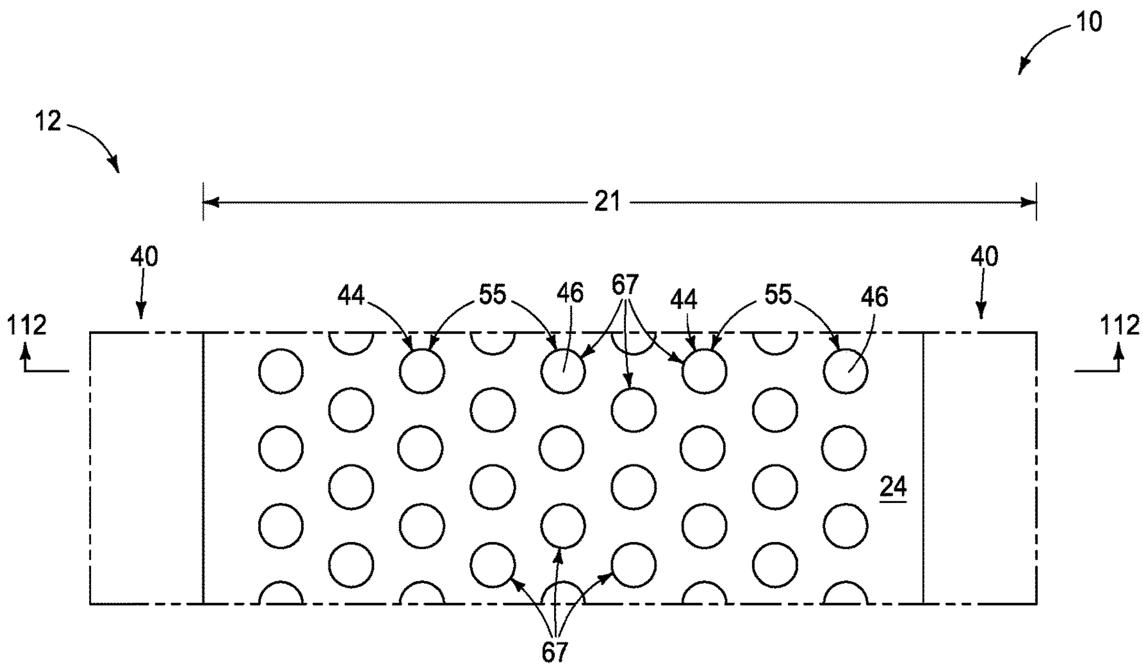
Figure 112:
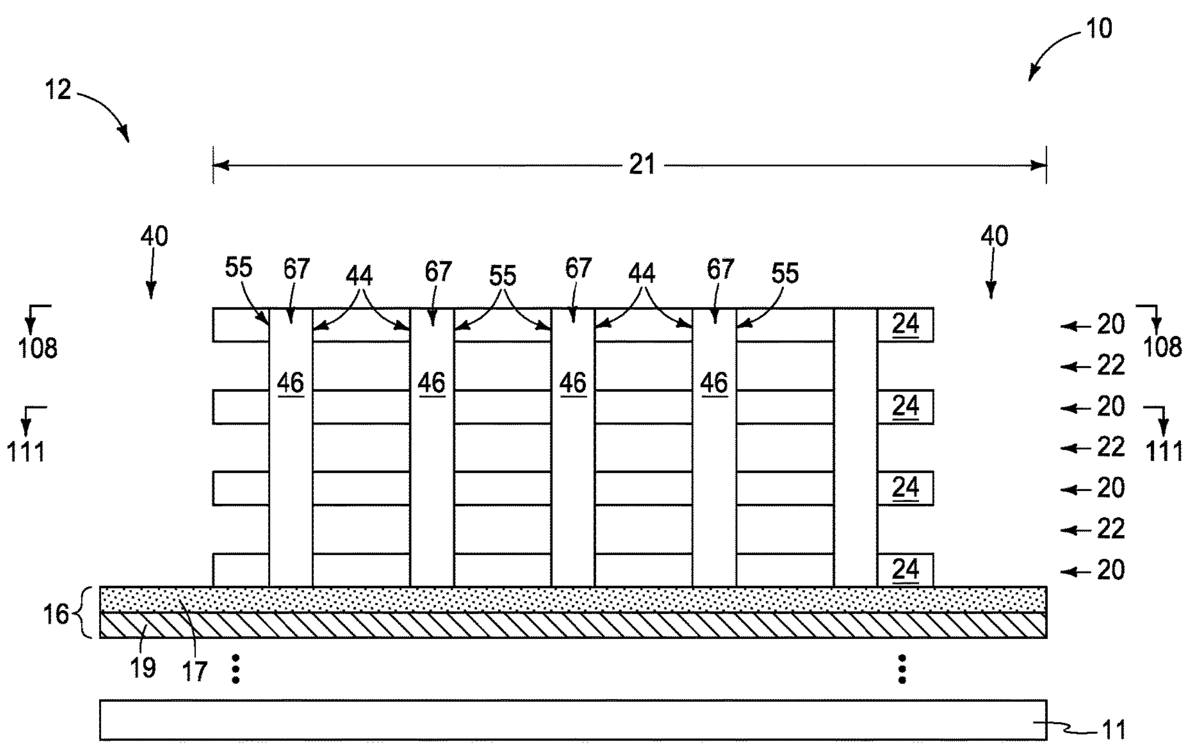
Figure 113:
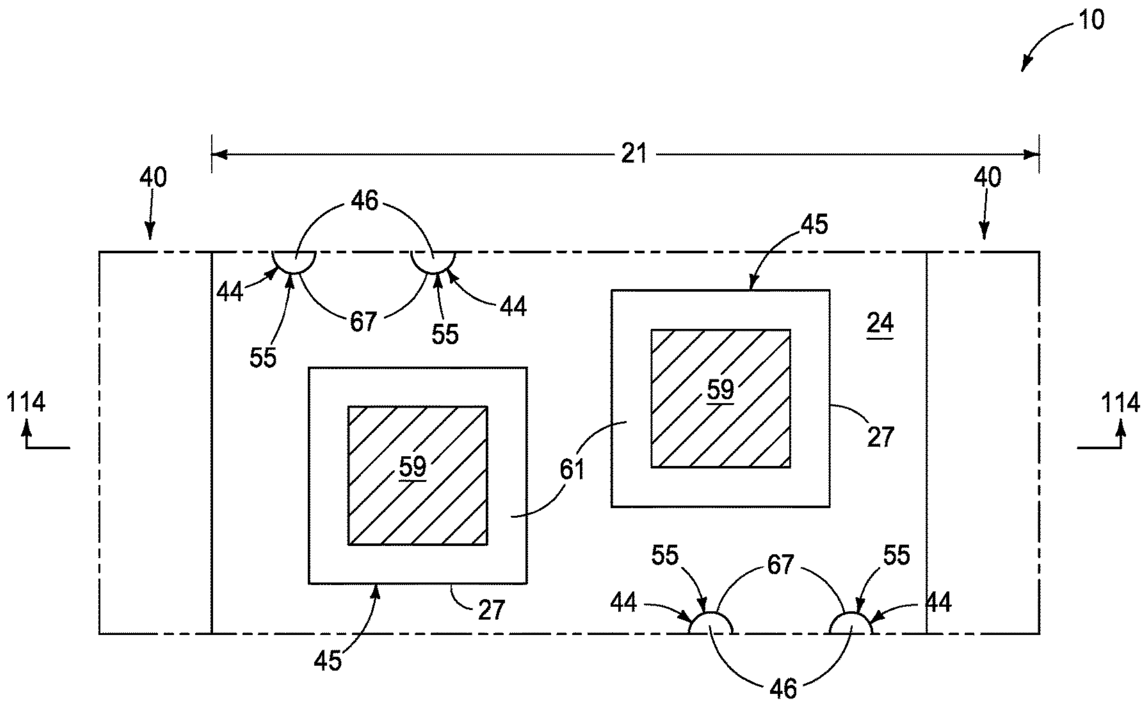
Figure 114:
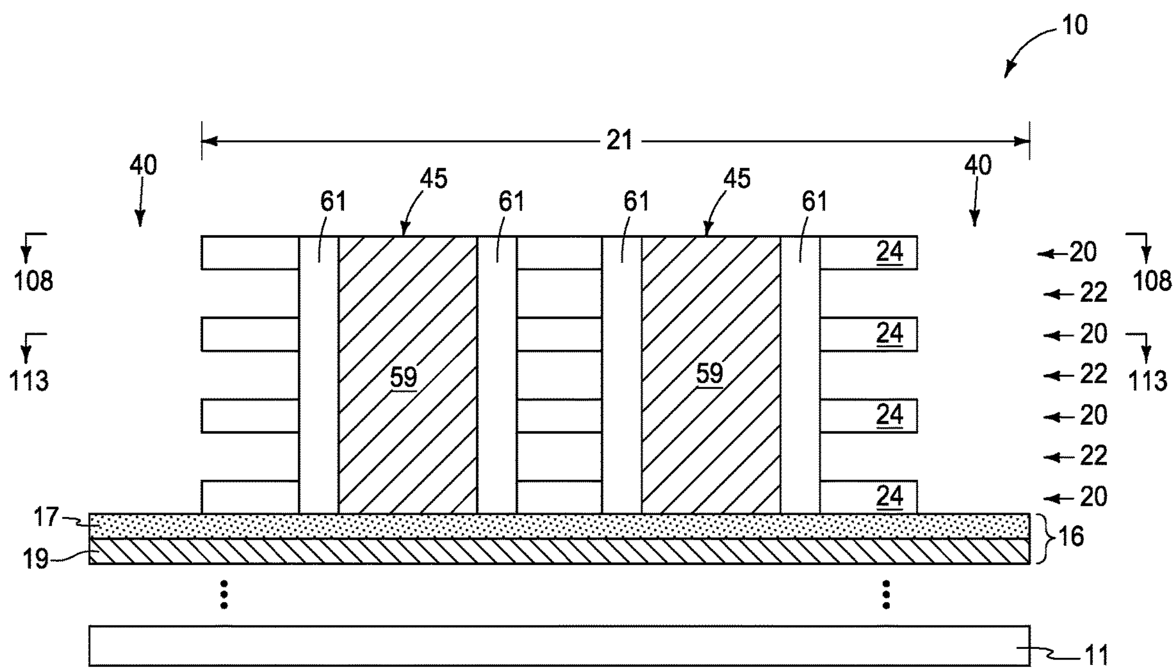
Figure 115:
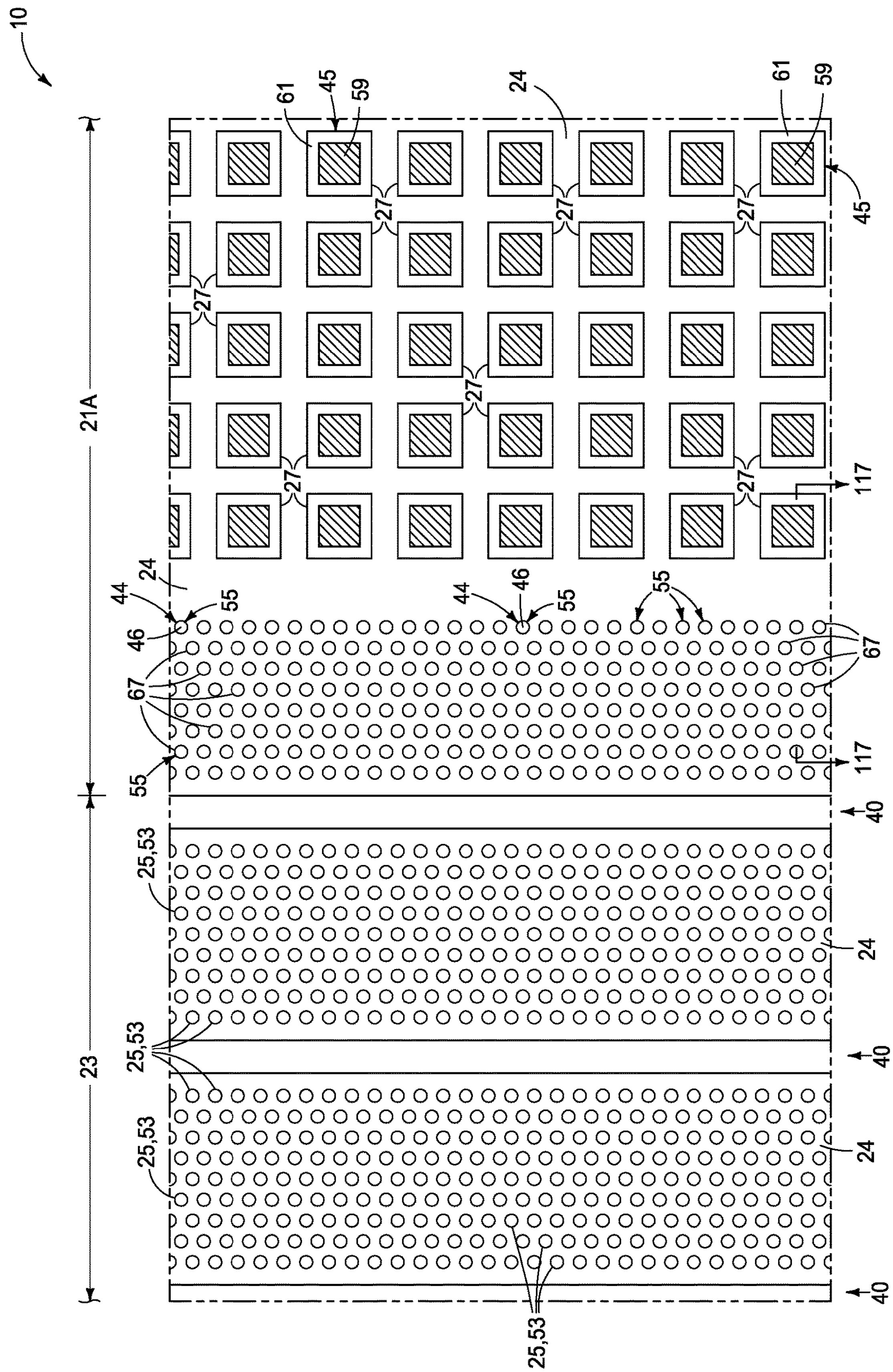
Figure 116:
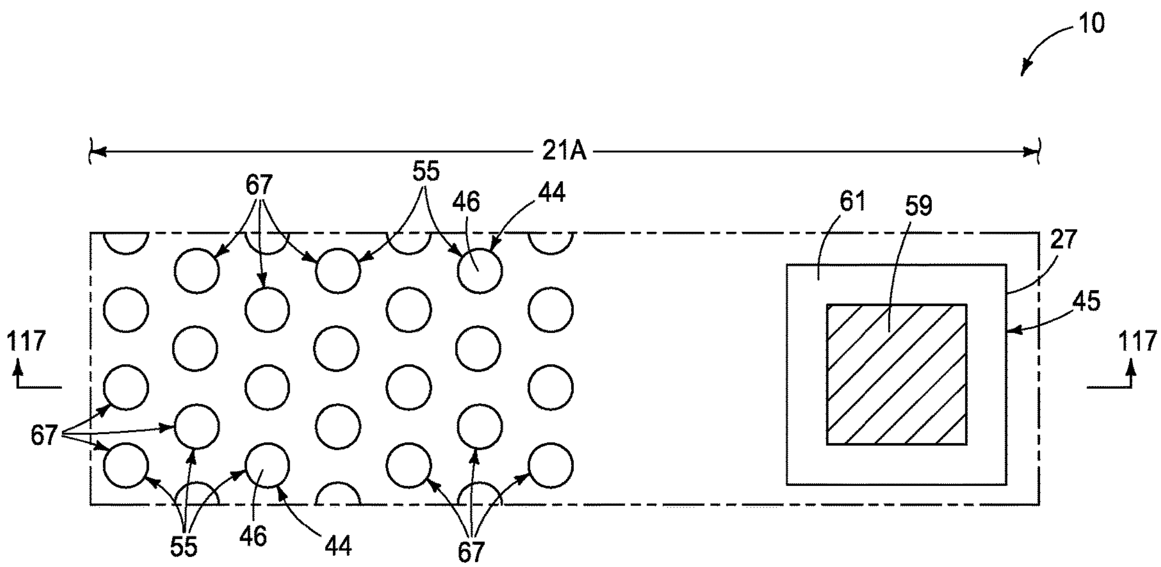
Figure 117:
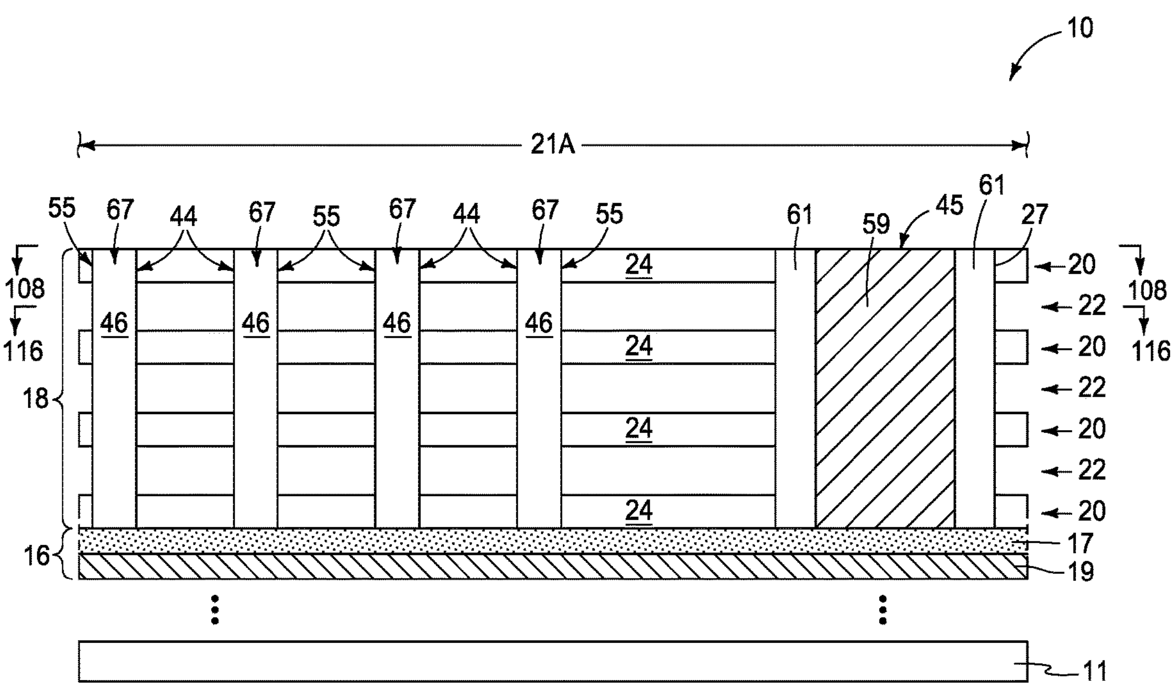
Figure 118:
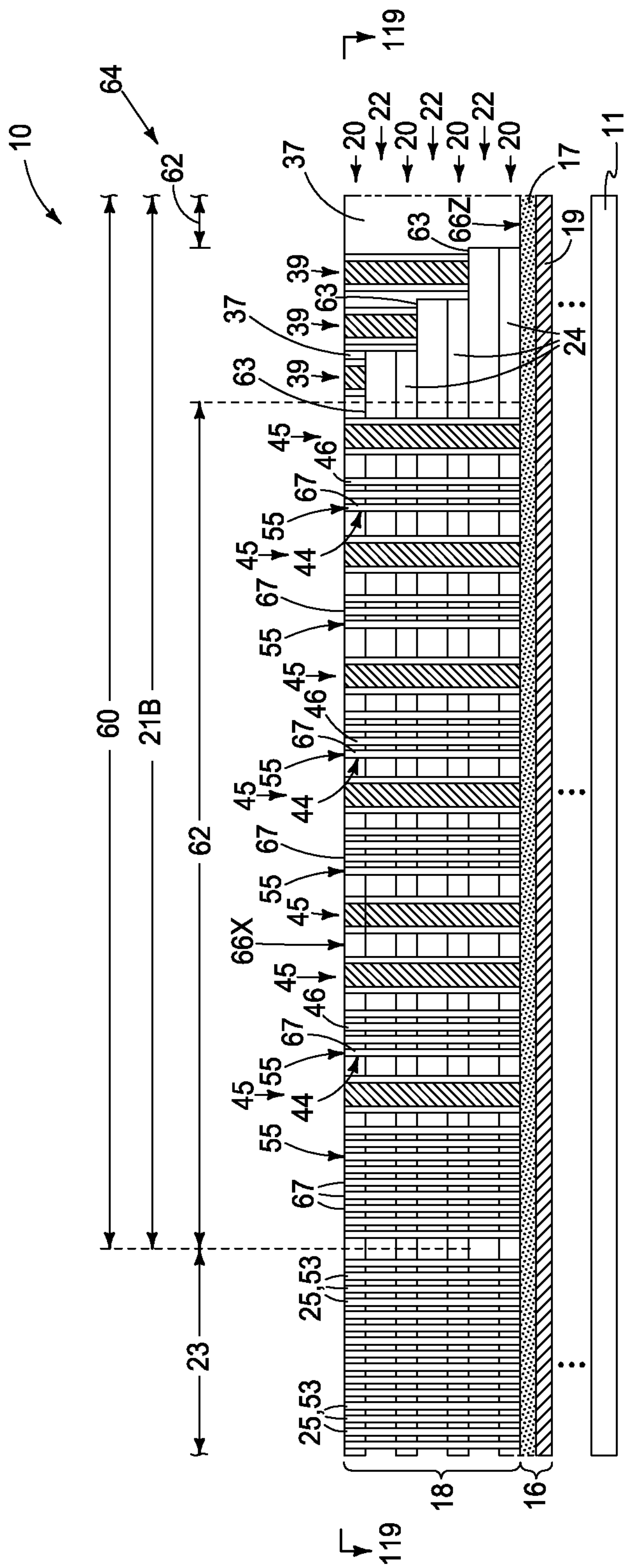
Figure 119:
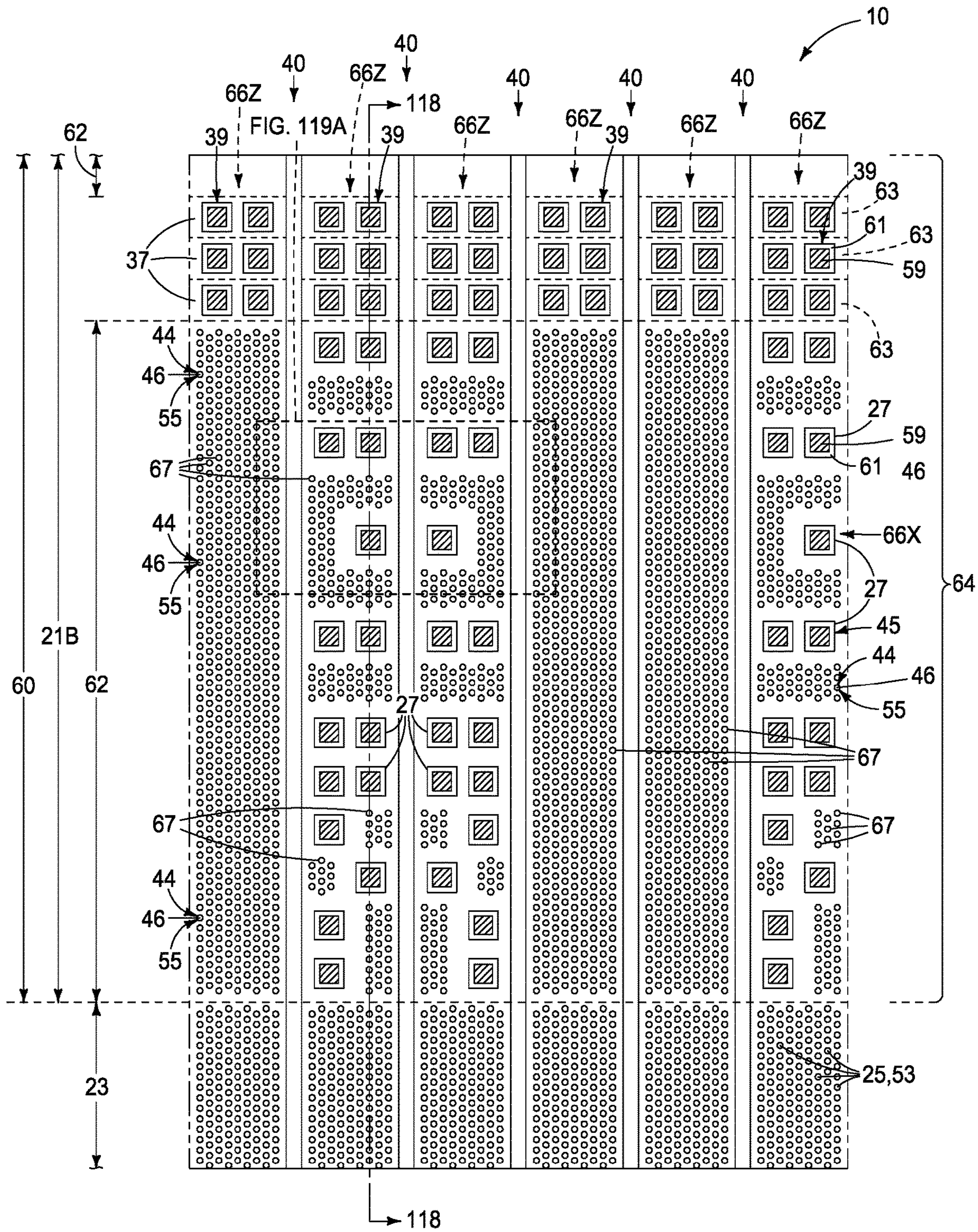
Figure 119A:
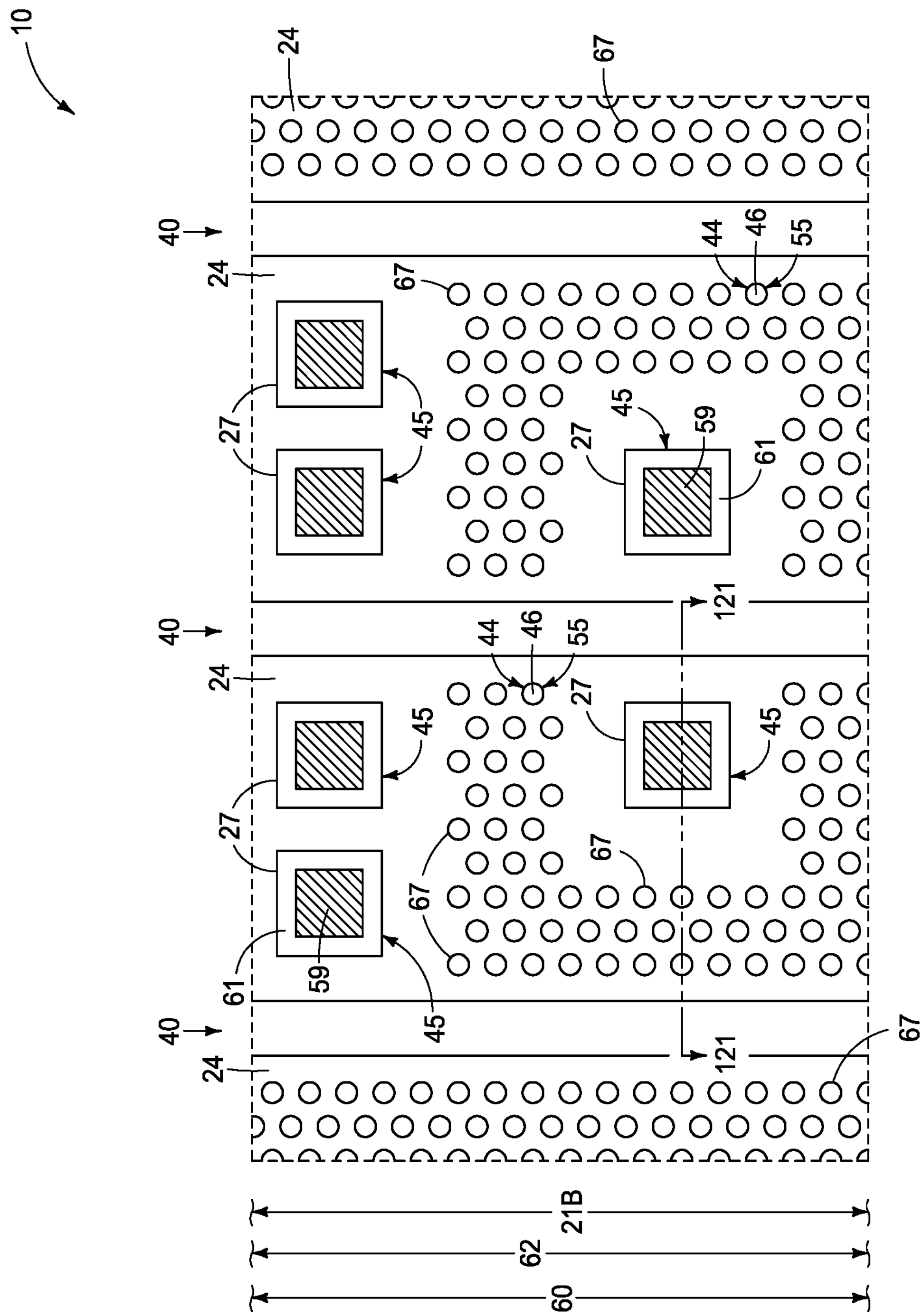
Figure 120:
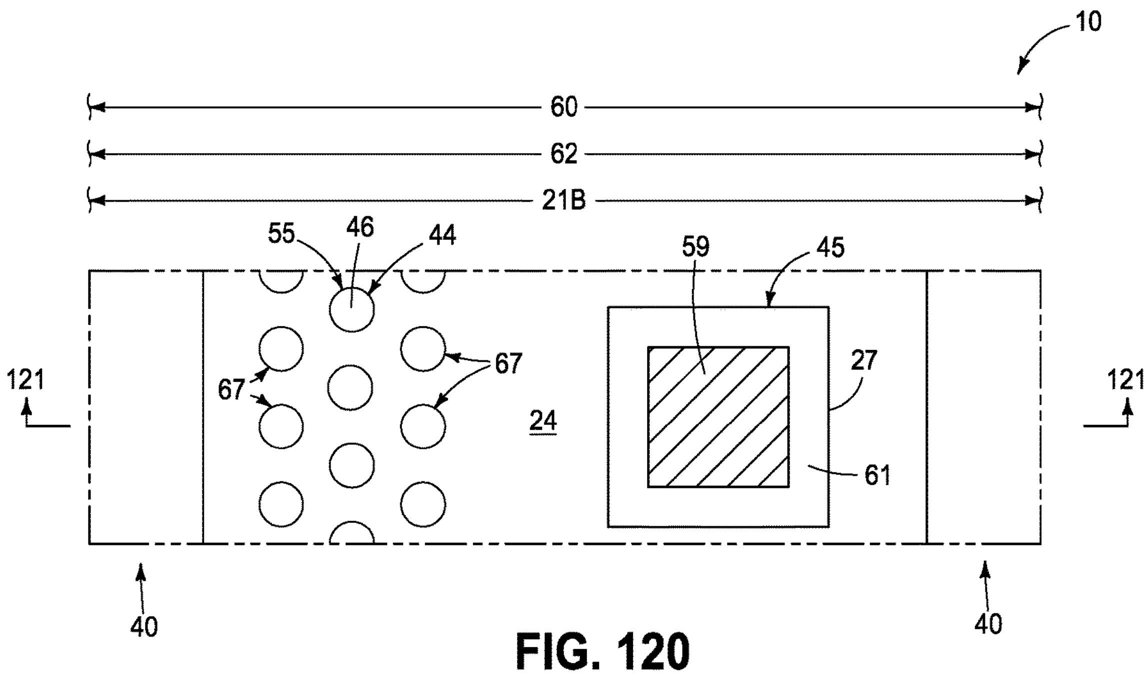
Figure 121:
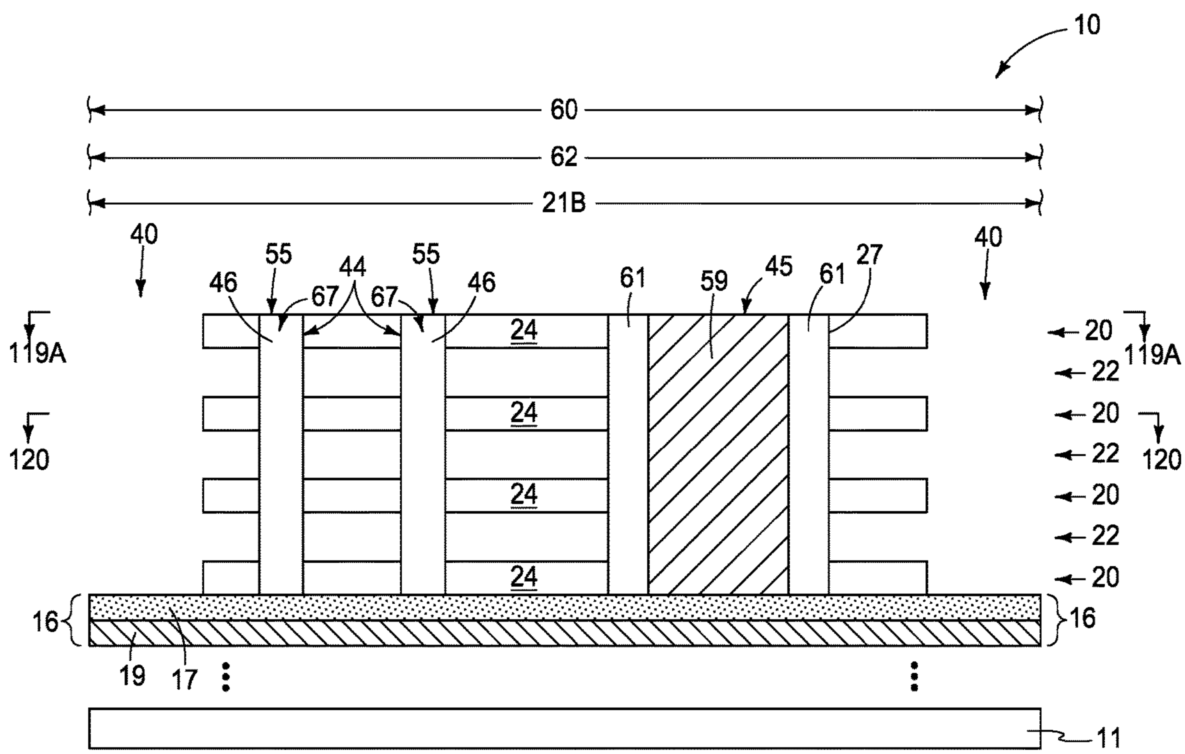
Figure 122:
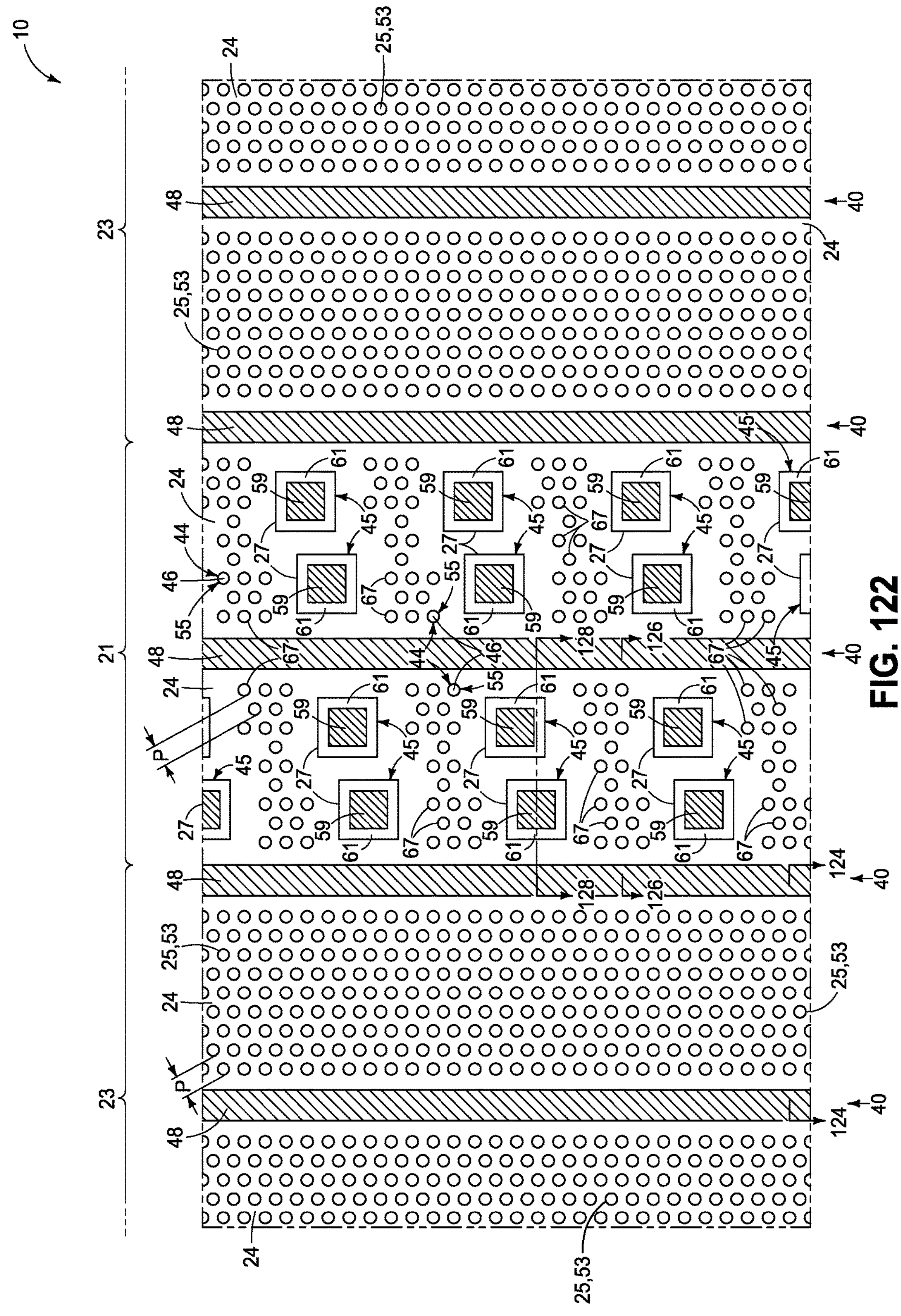
Figure 123:
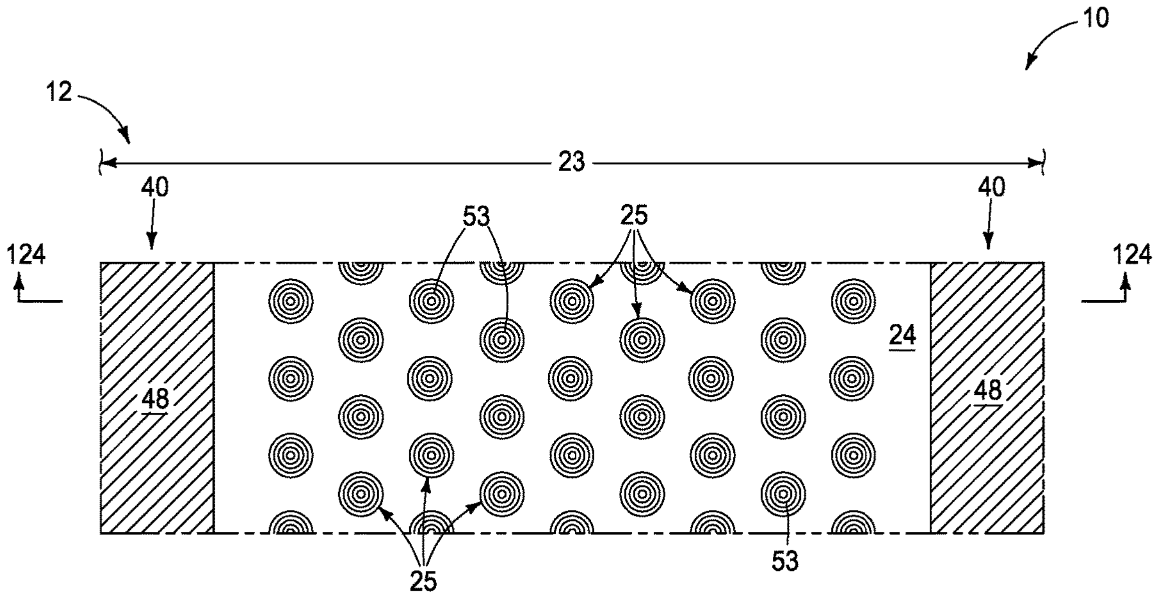
Figure 124:
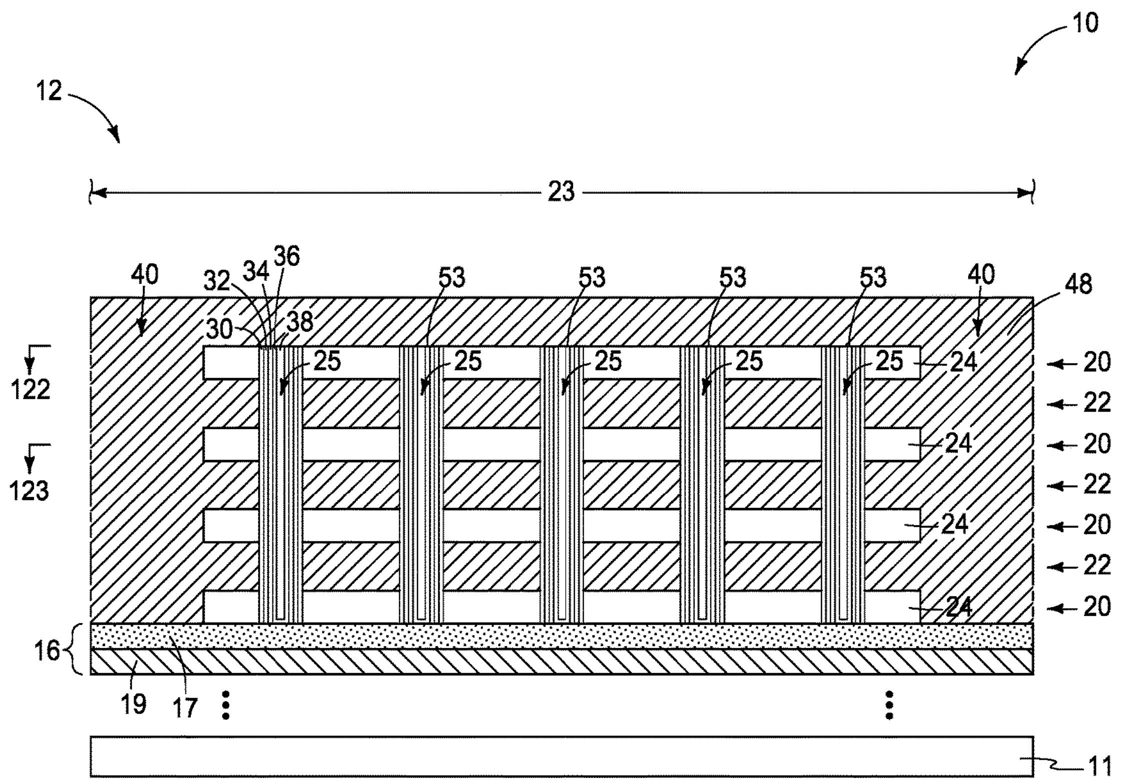
Figure 125:
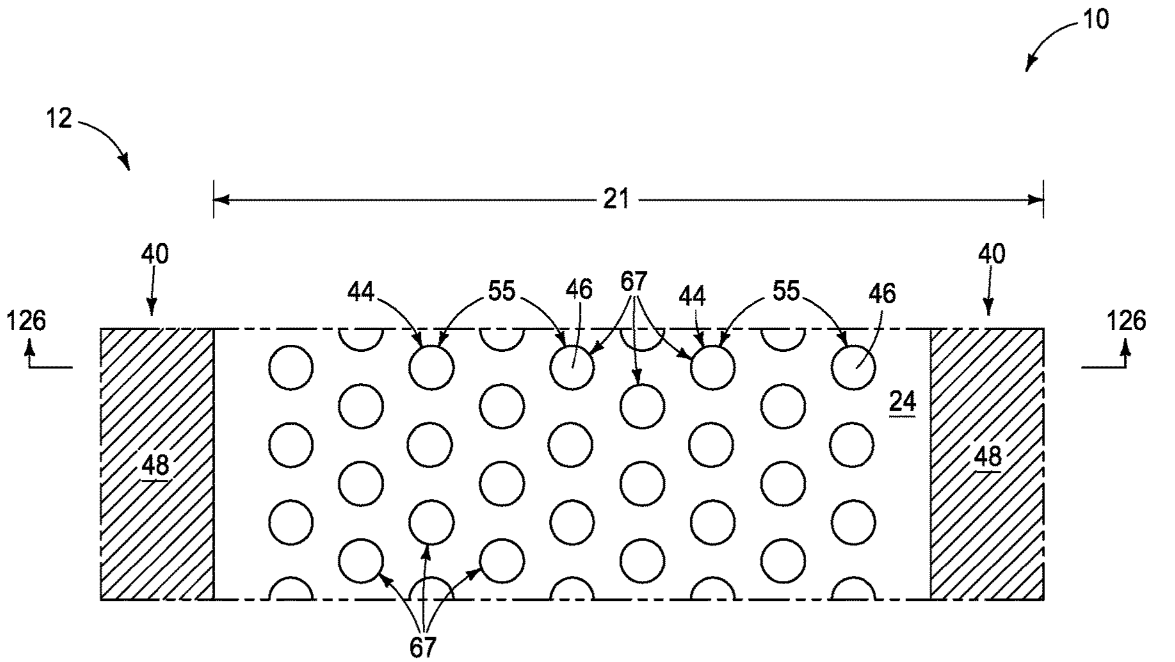
Figure 126:
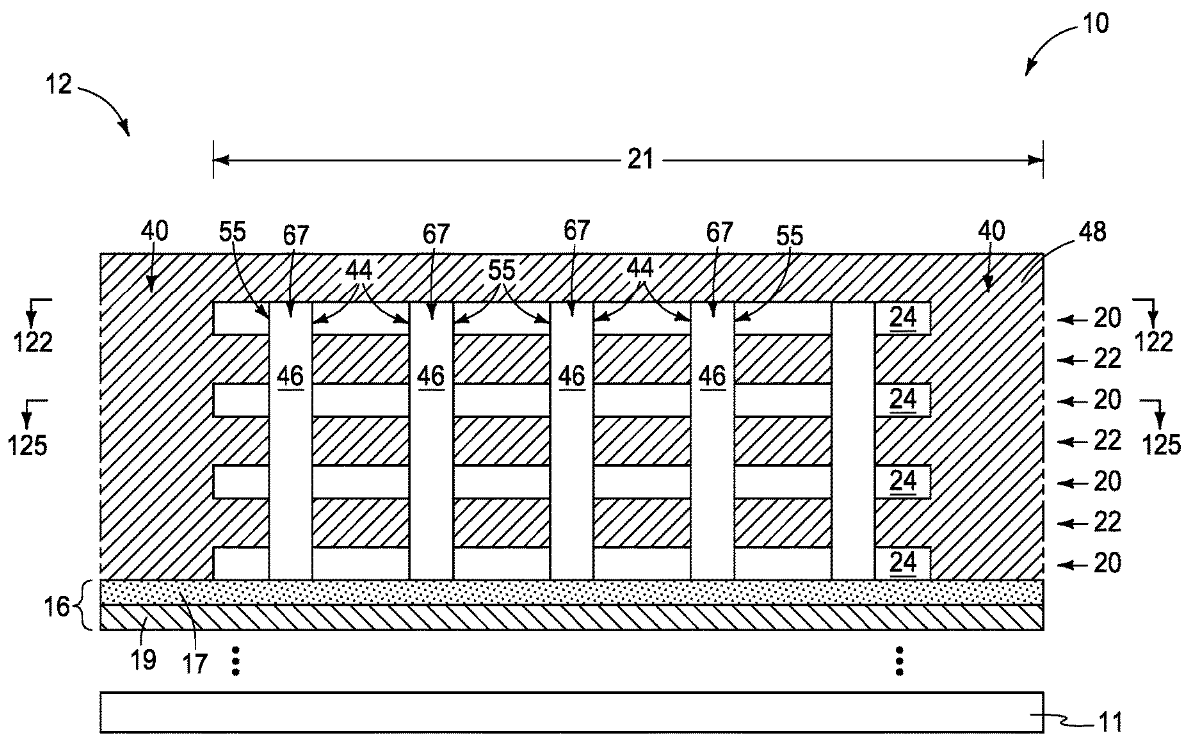
Figure 127:
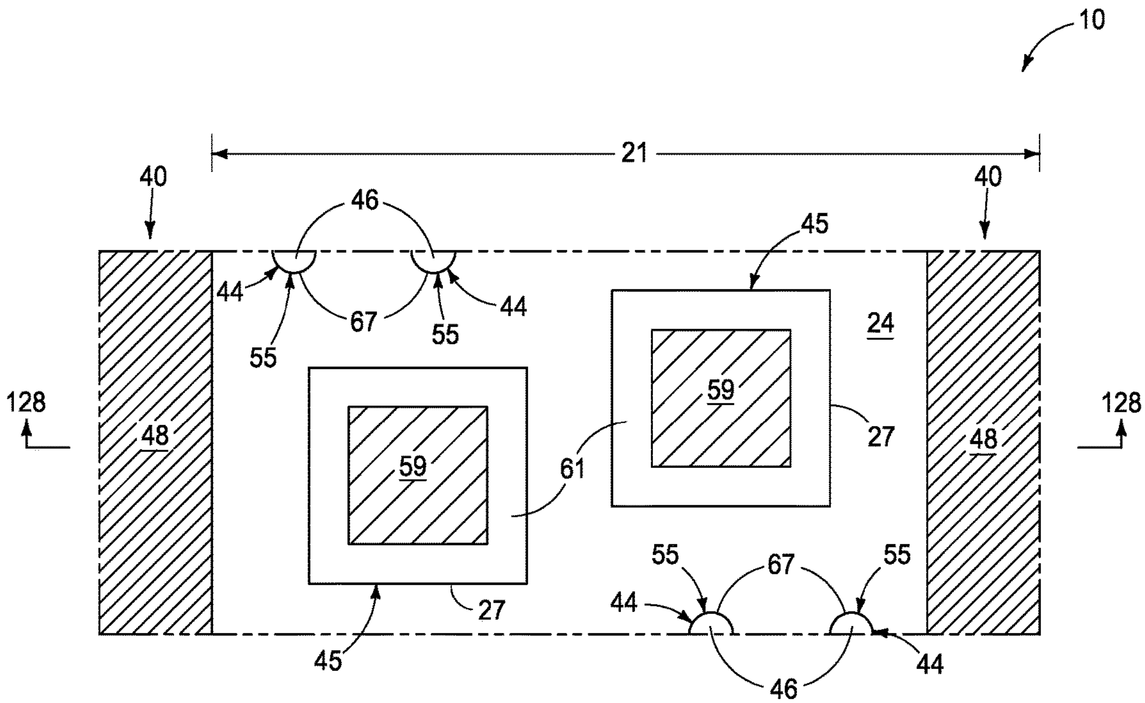
Figure 128:
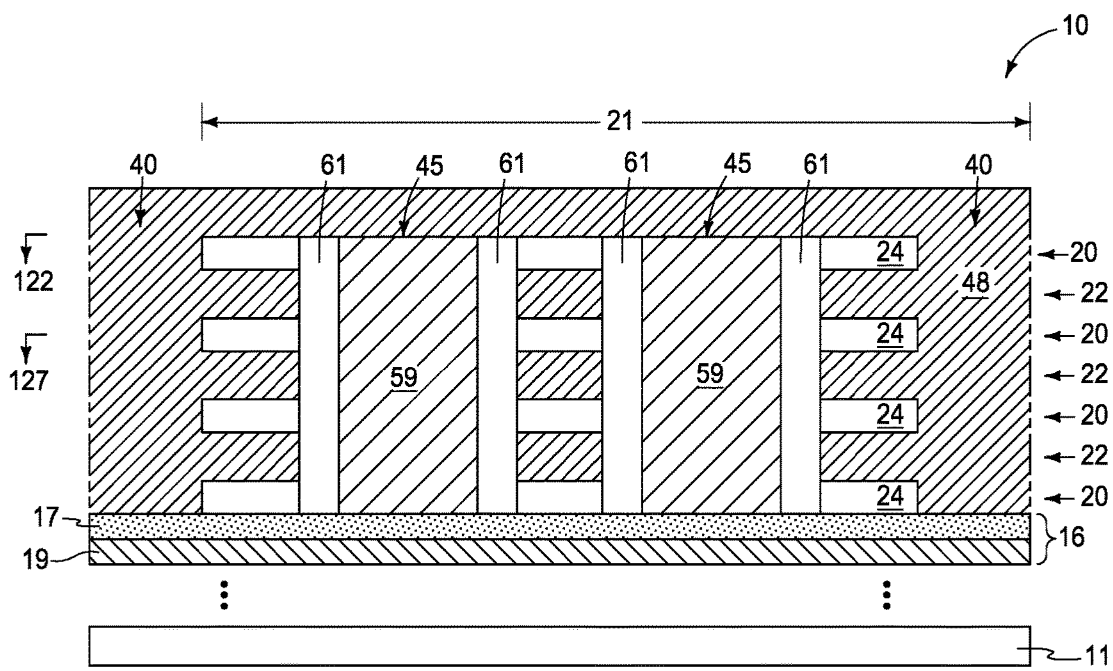
Figure 129:
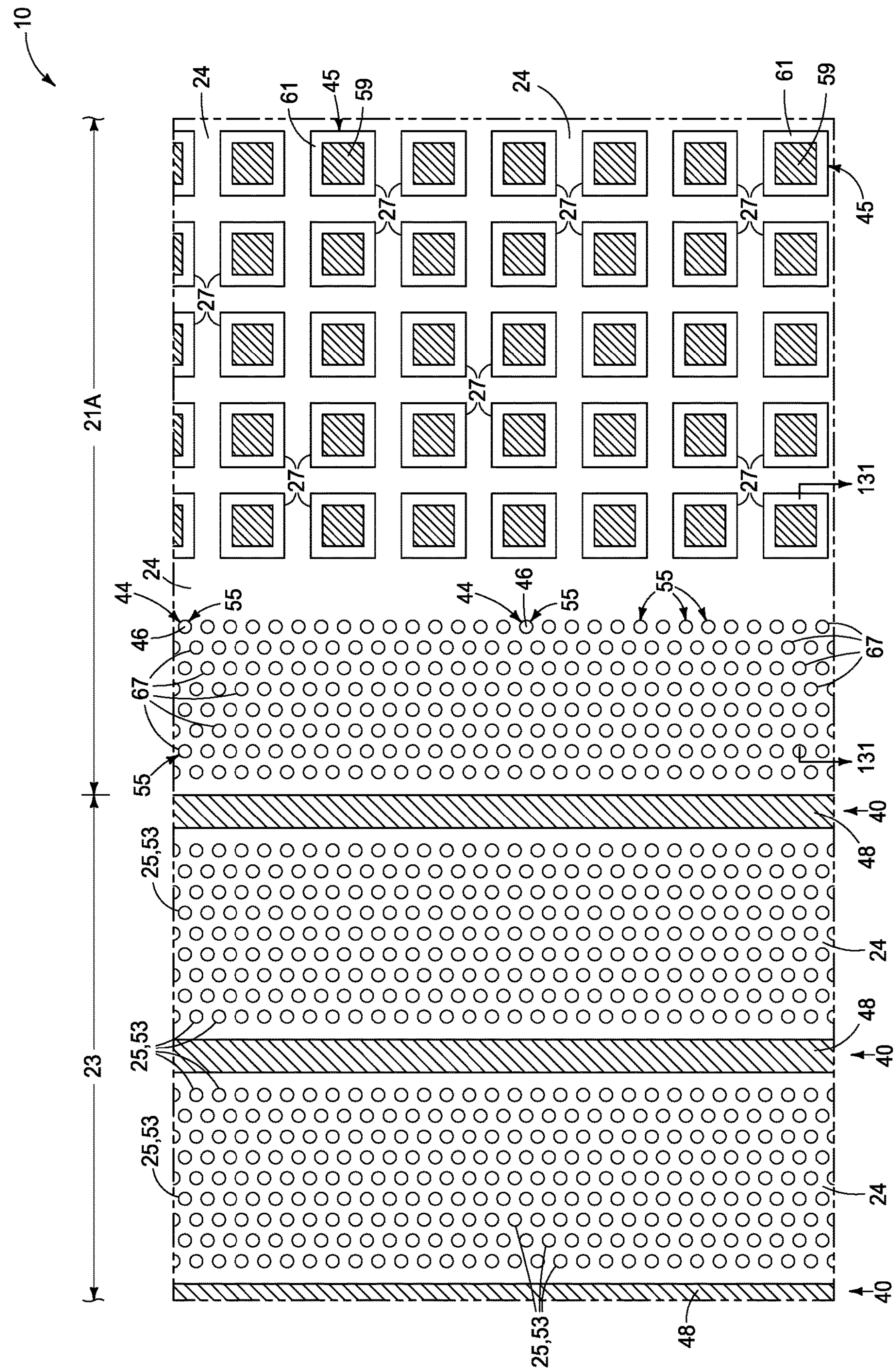
Figure 130:
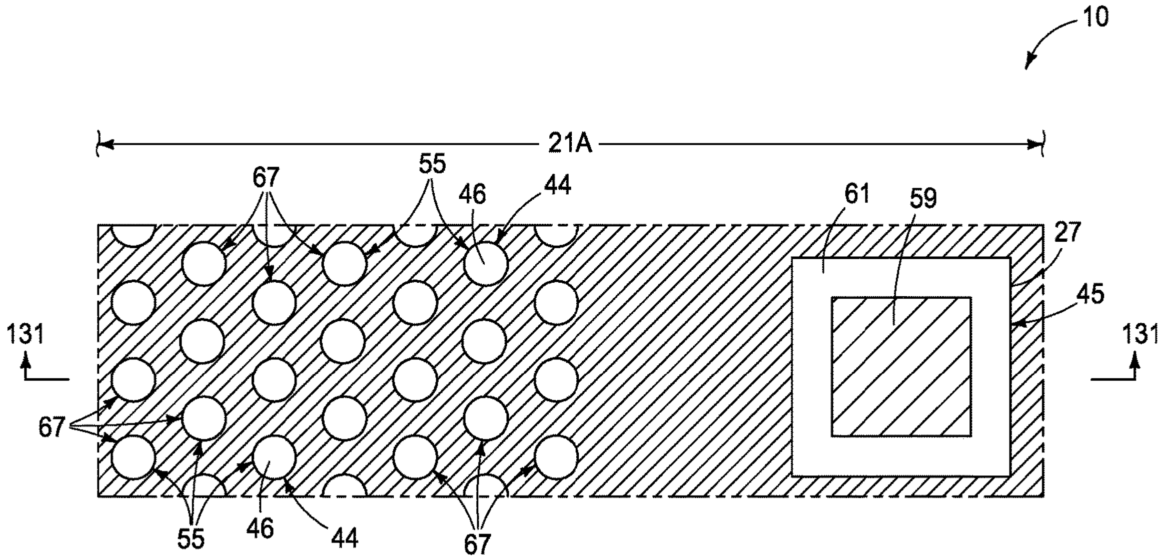
Figure 131:
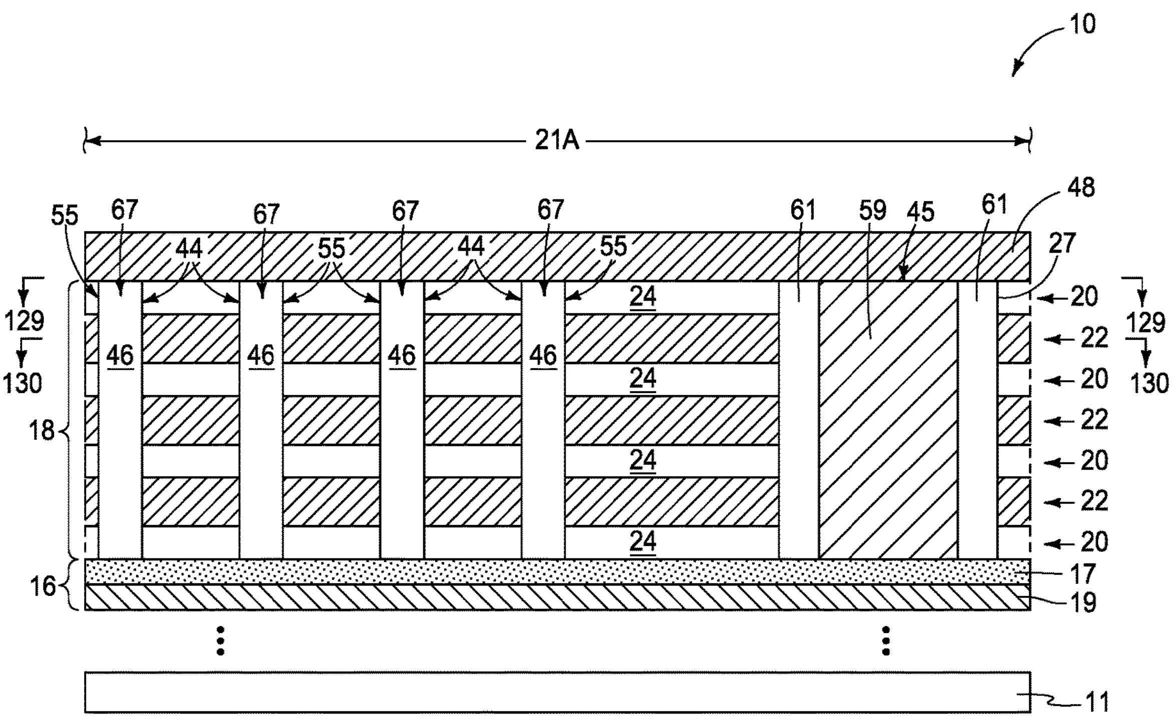
Figure 132:
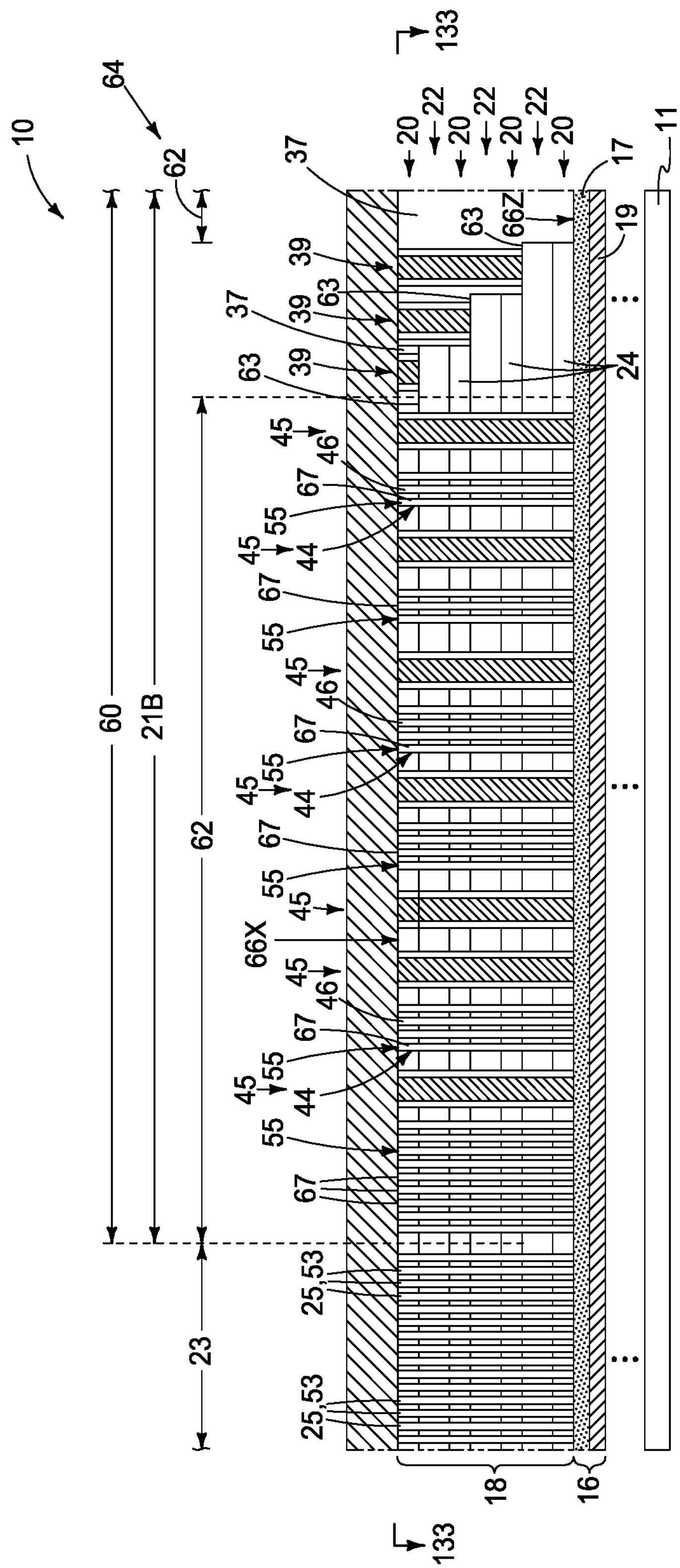
Figure 133:
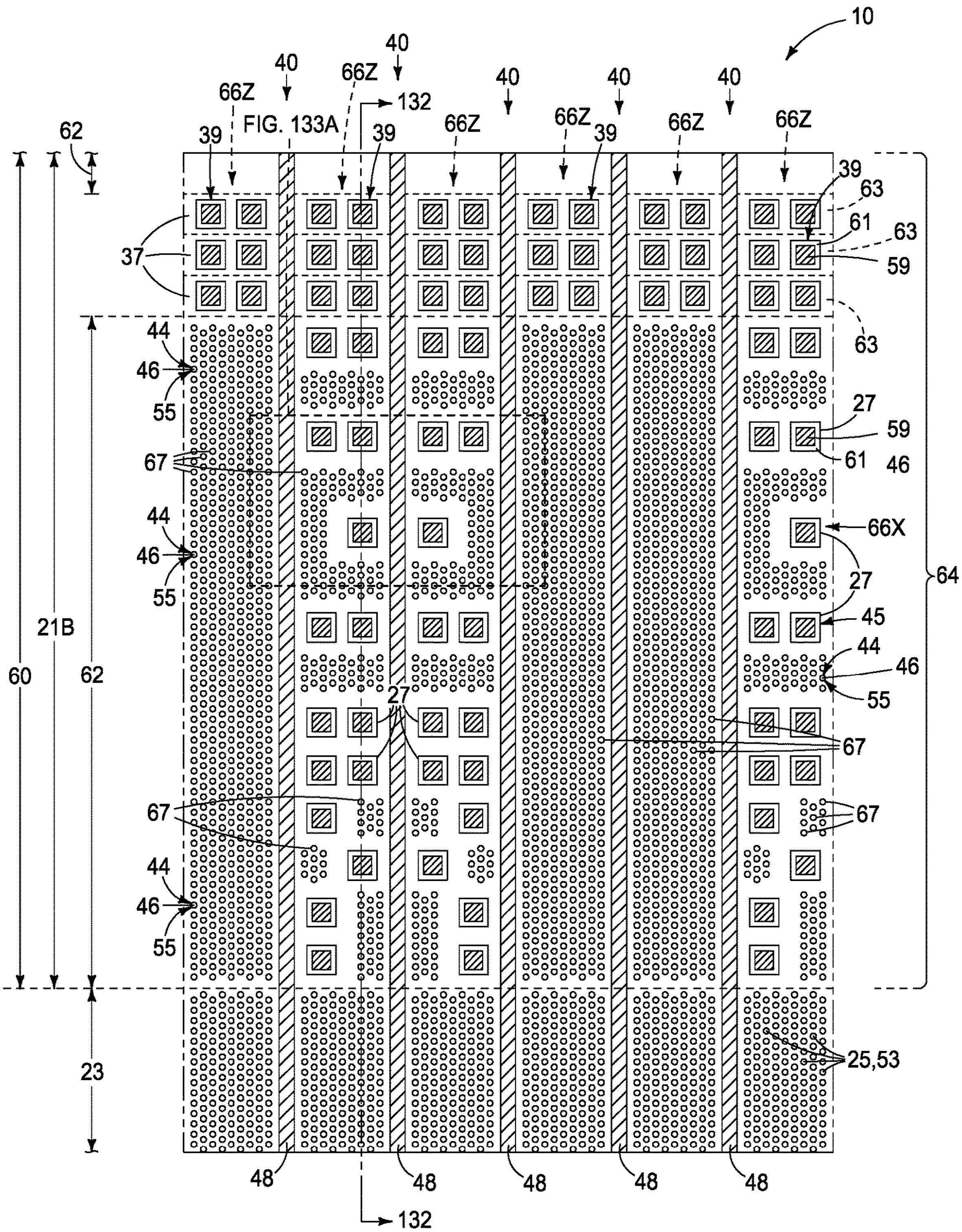
Figure 133A:
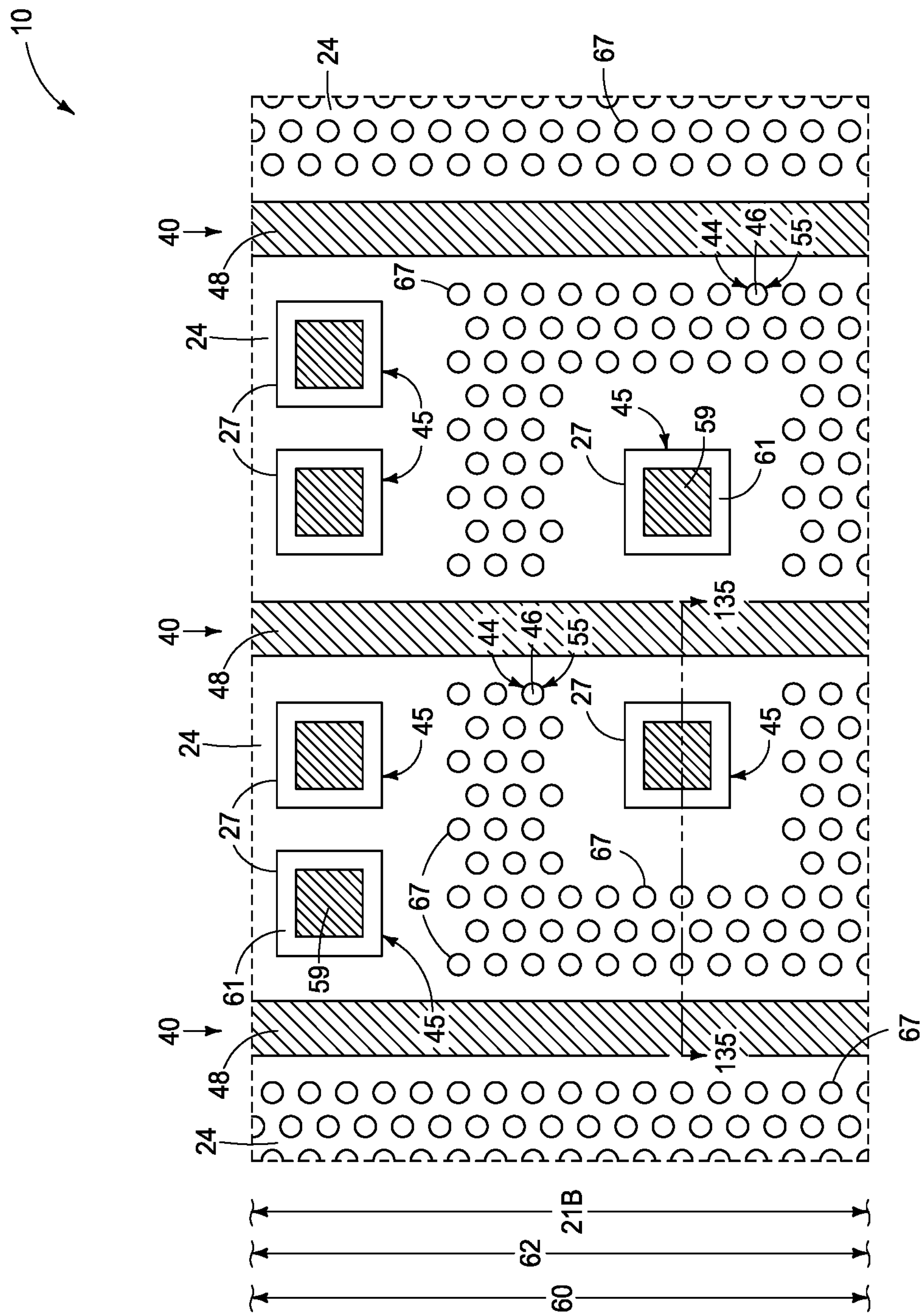
Figure 134:
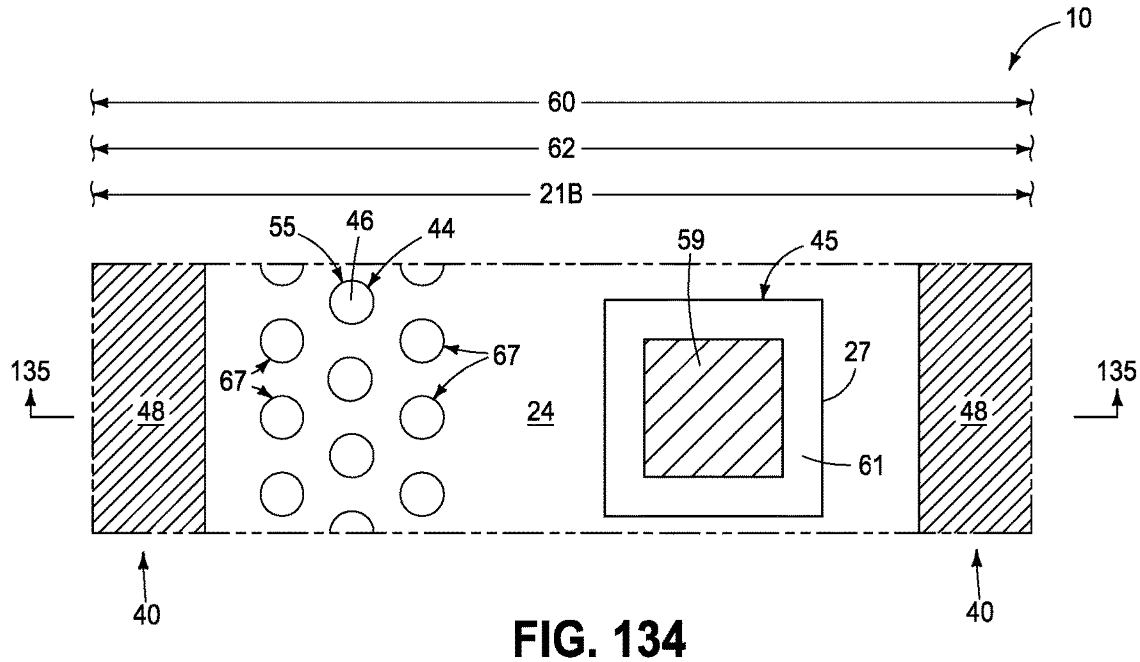
Figure 135:
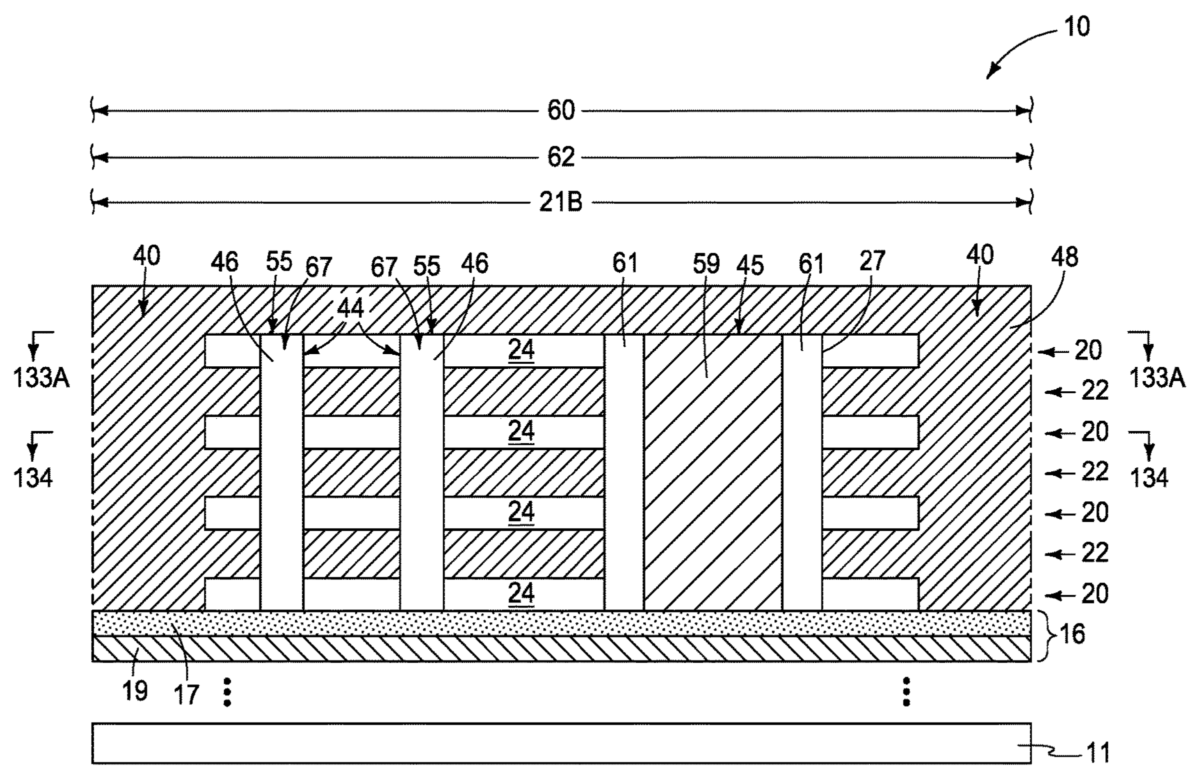
Figure 136:
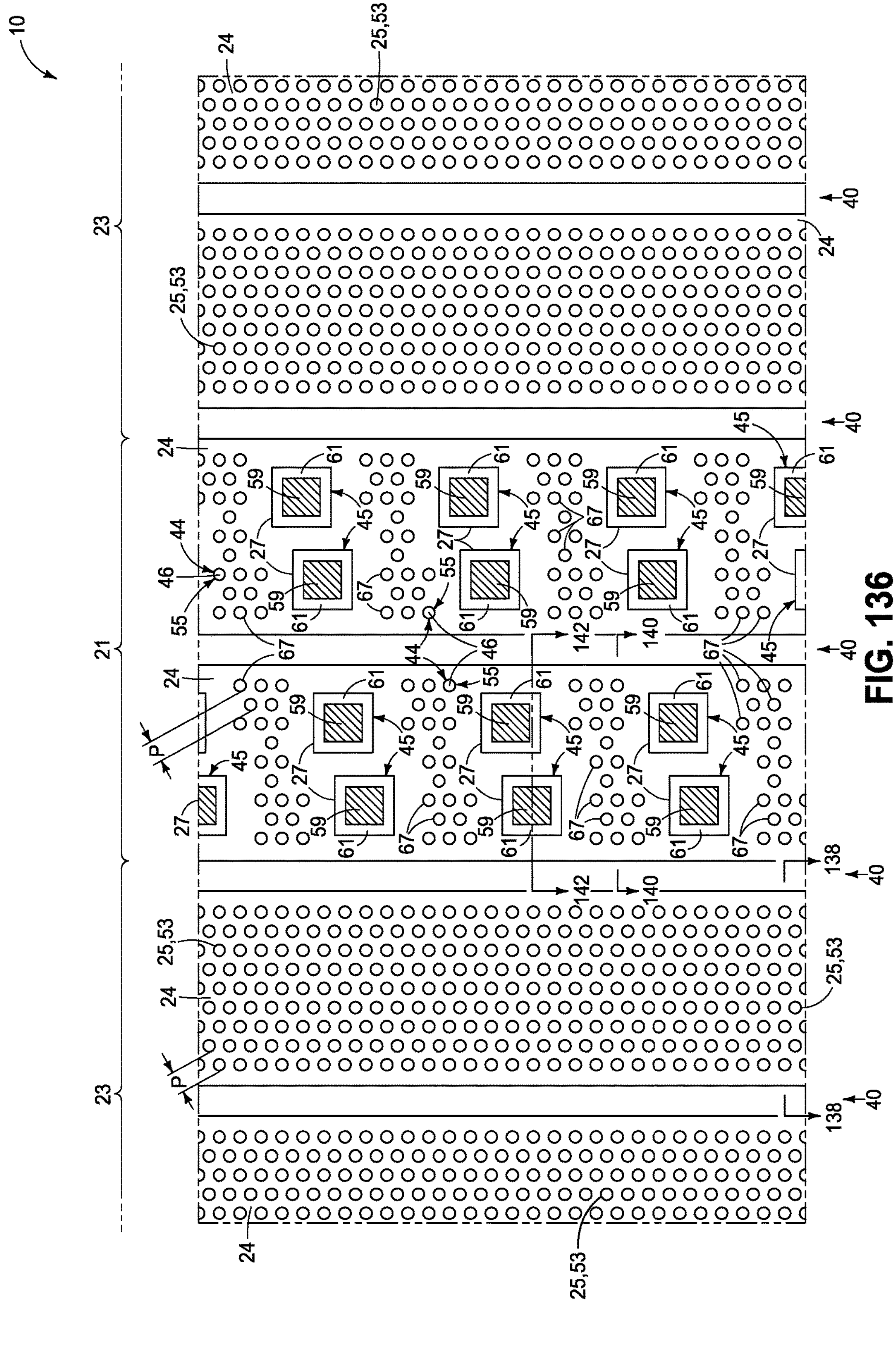
Figure 150:
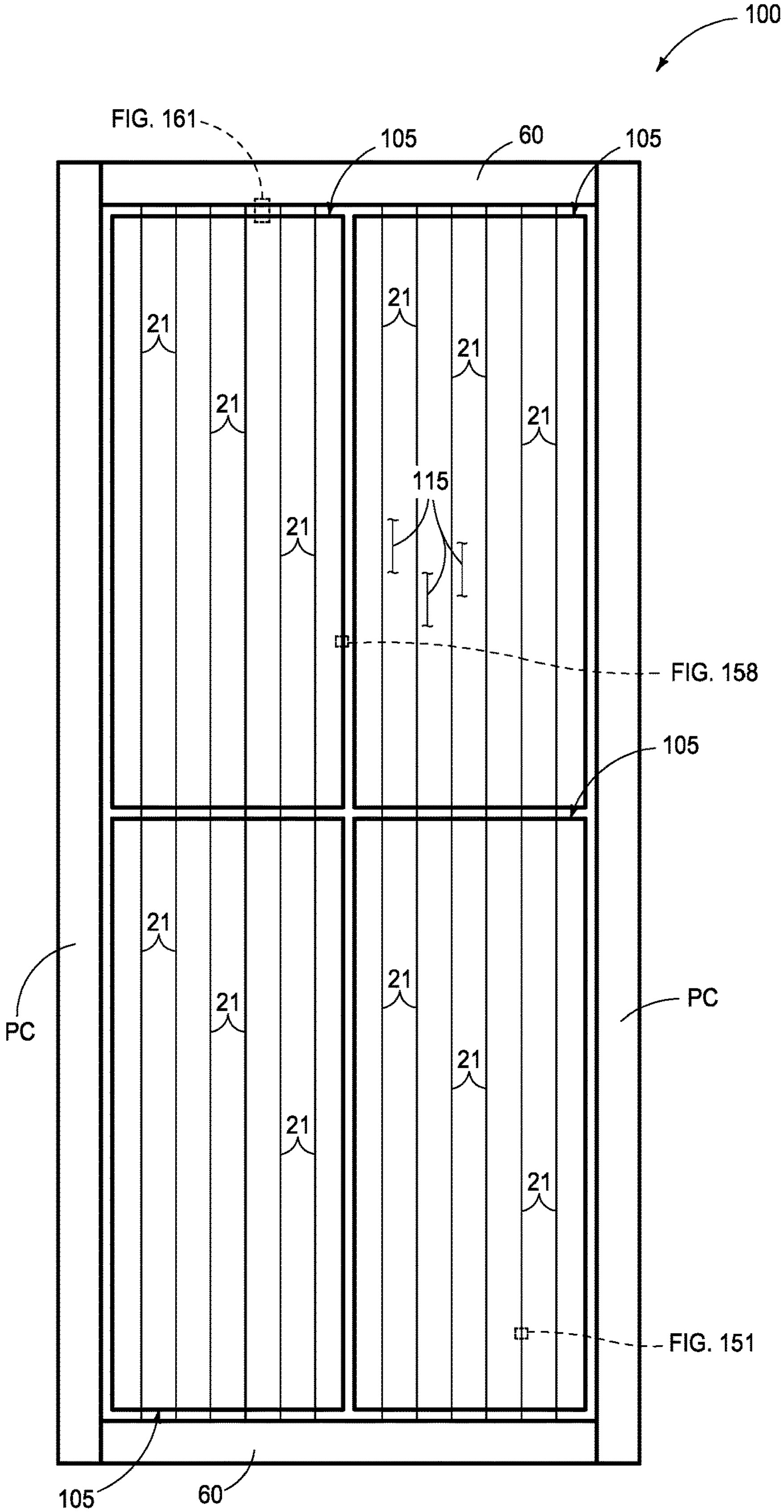
Figure 151:
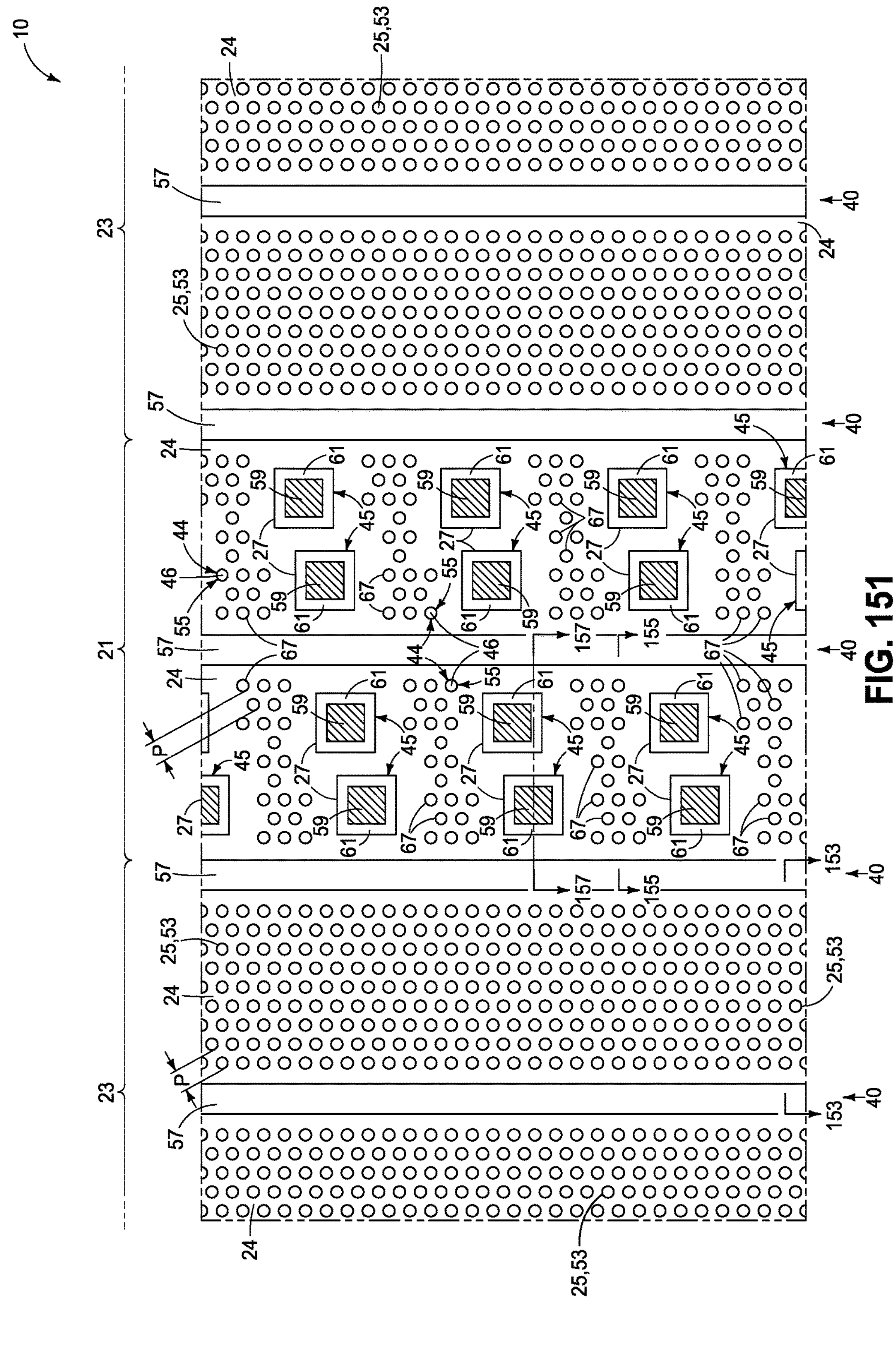
Figure 152:
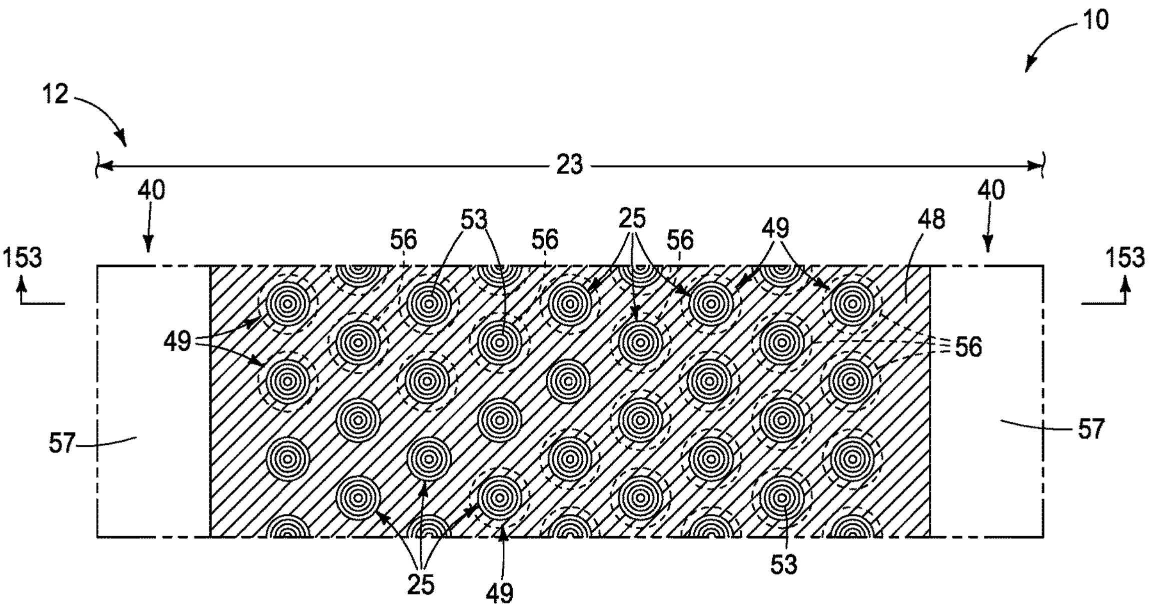
Figure 153:
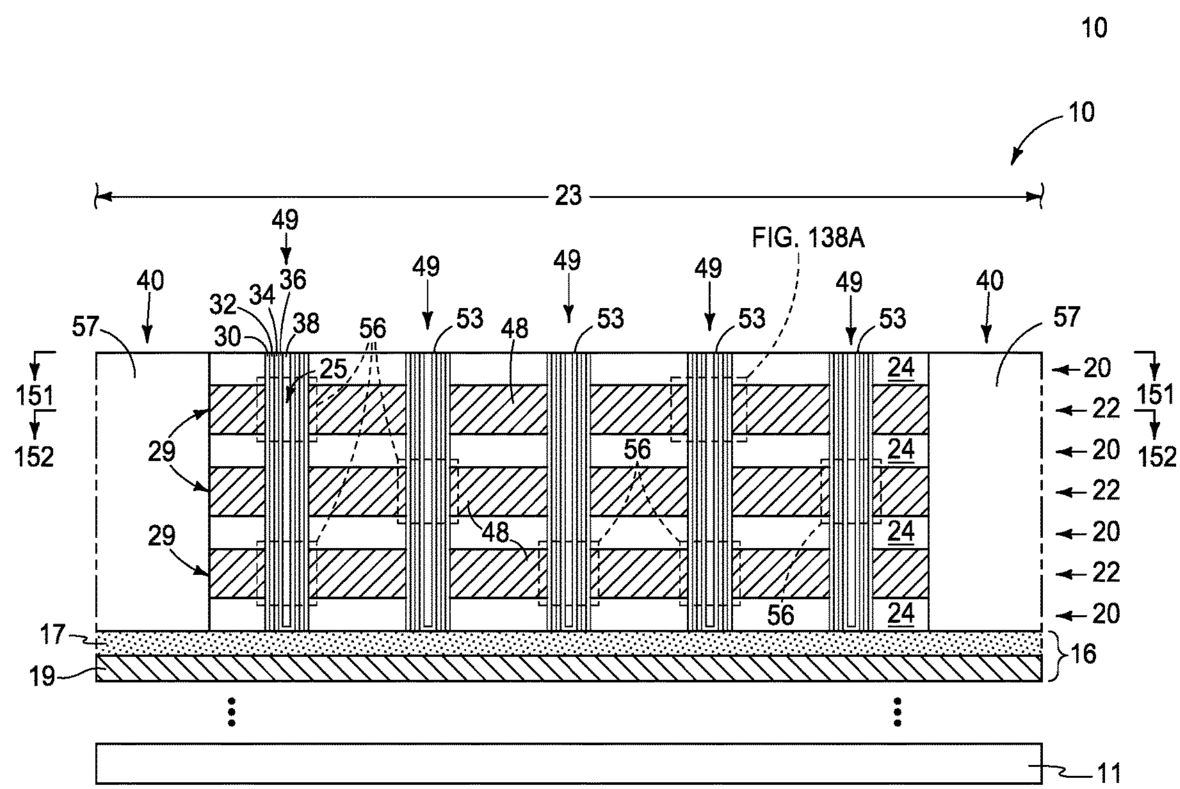
Figure 154:
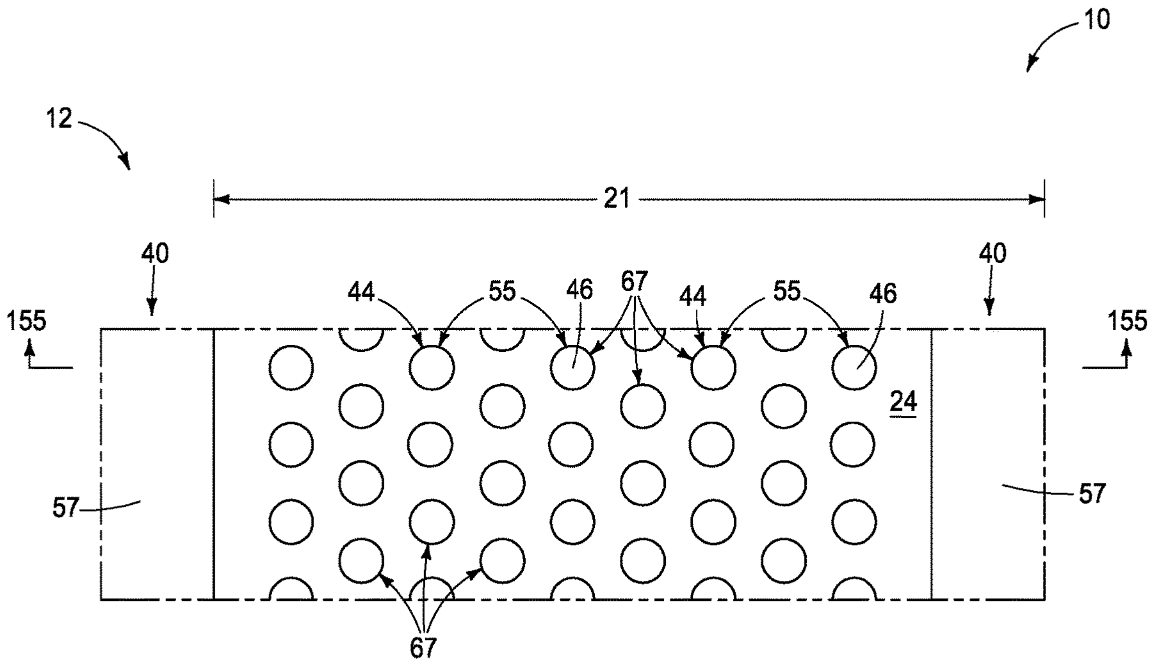
Figure 155:
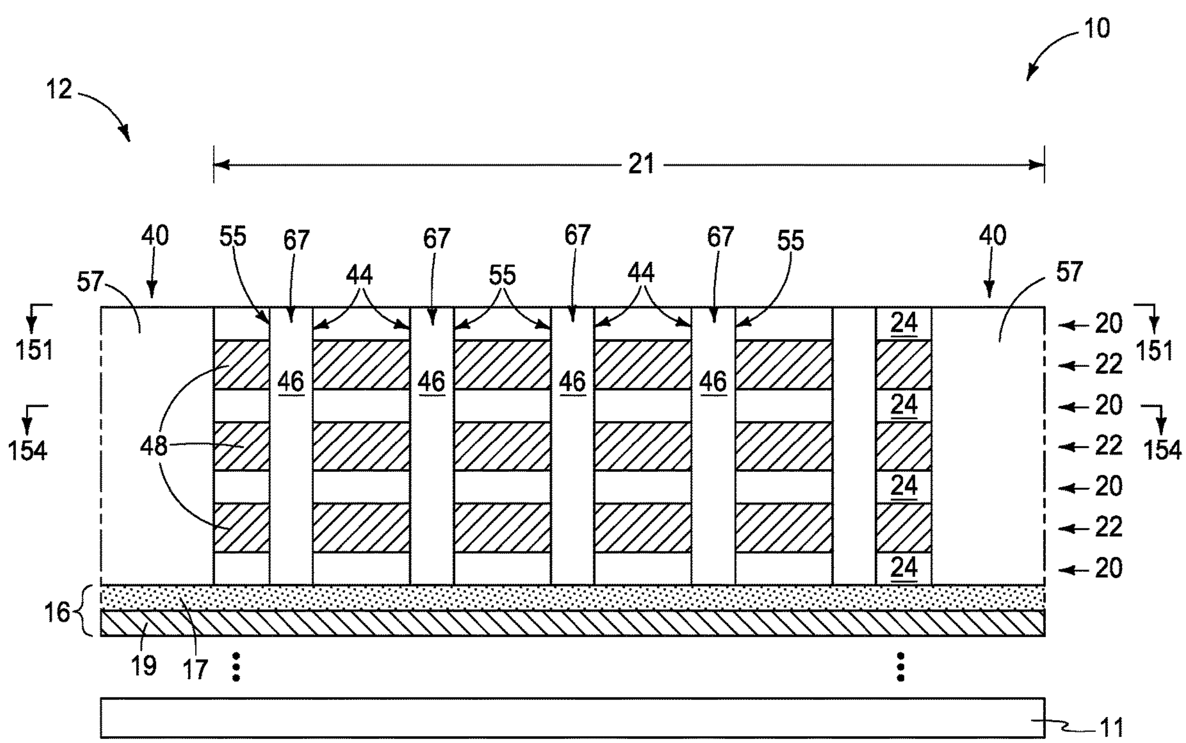
Figure 156:
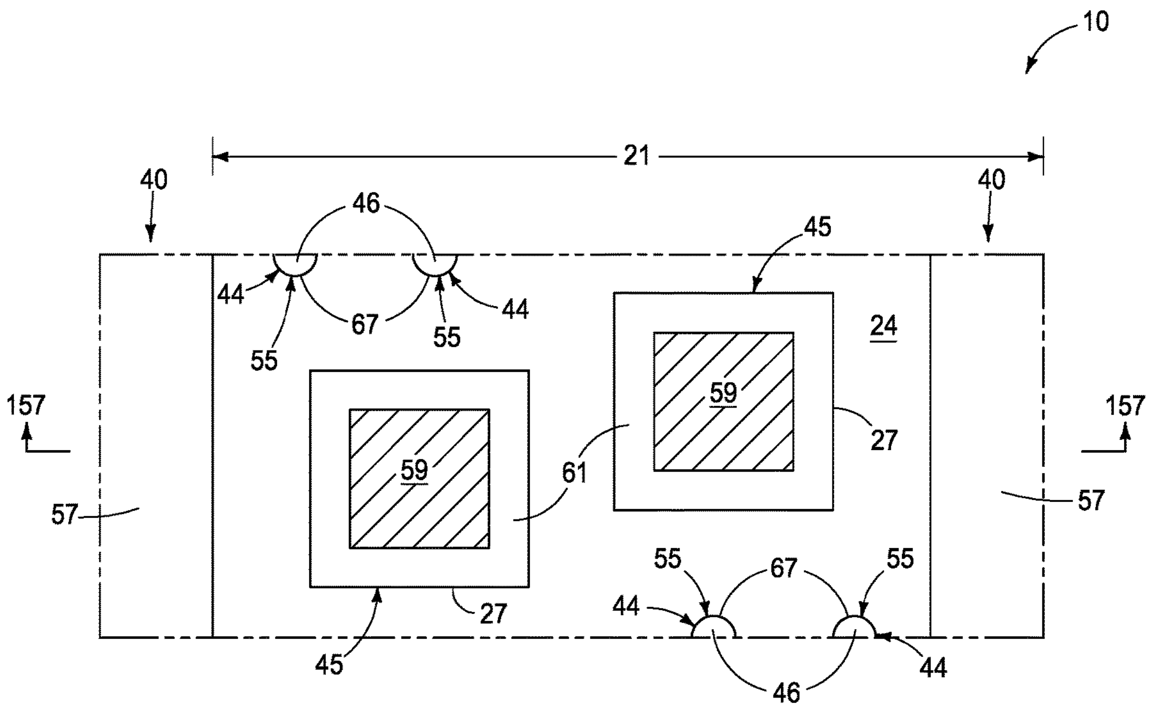
Figure 157:
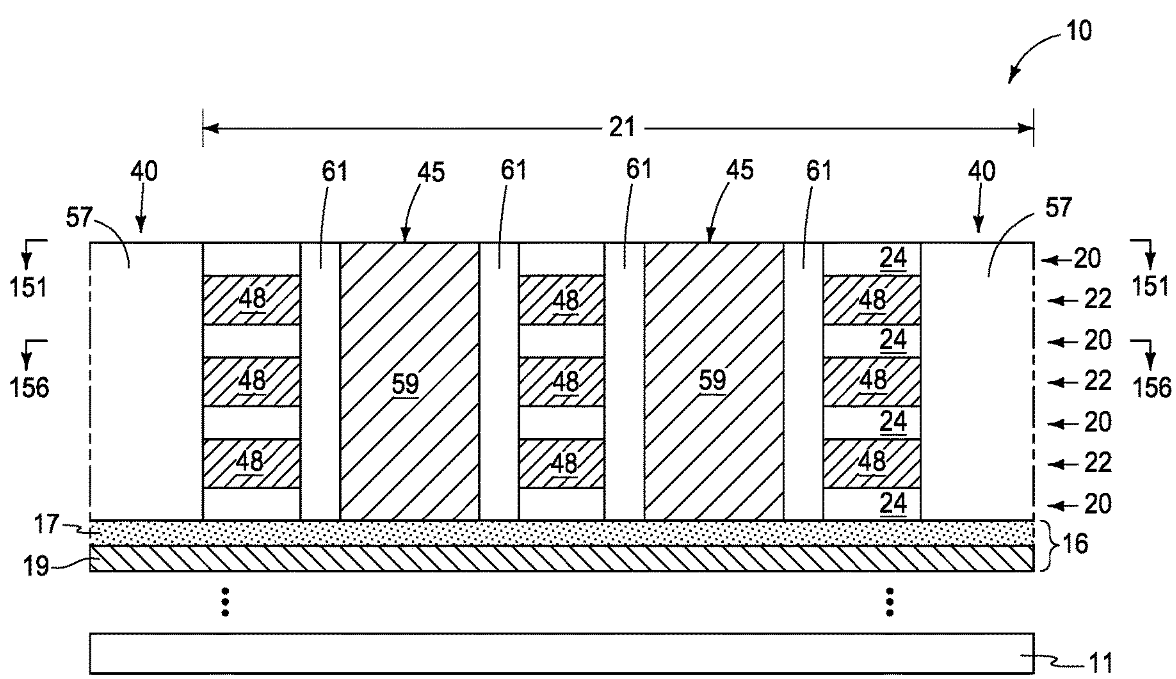
Figure 158:
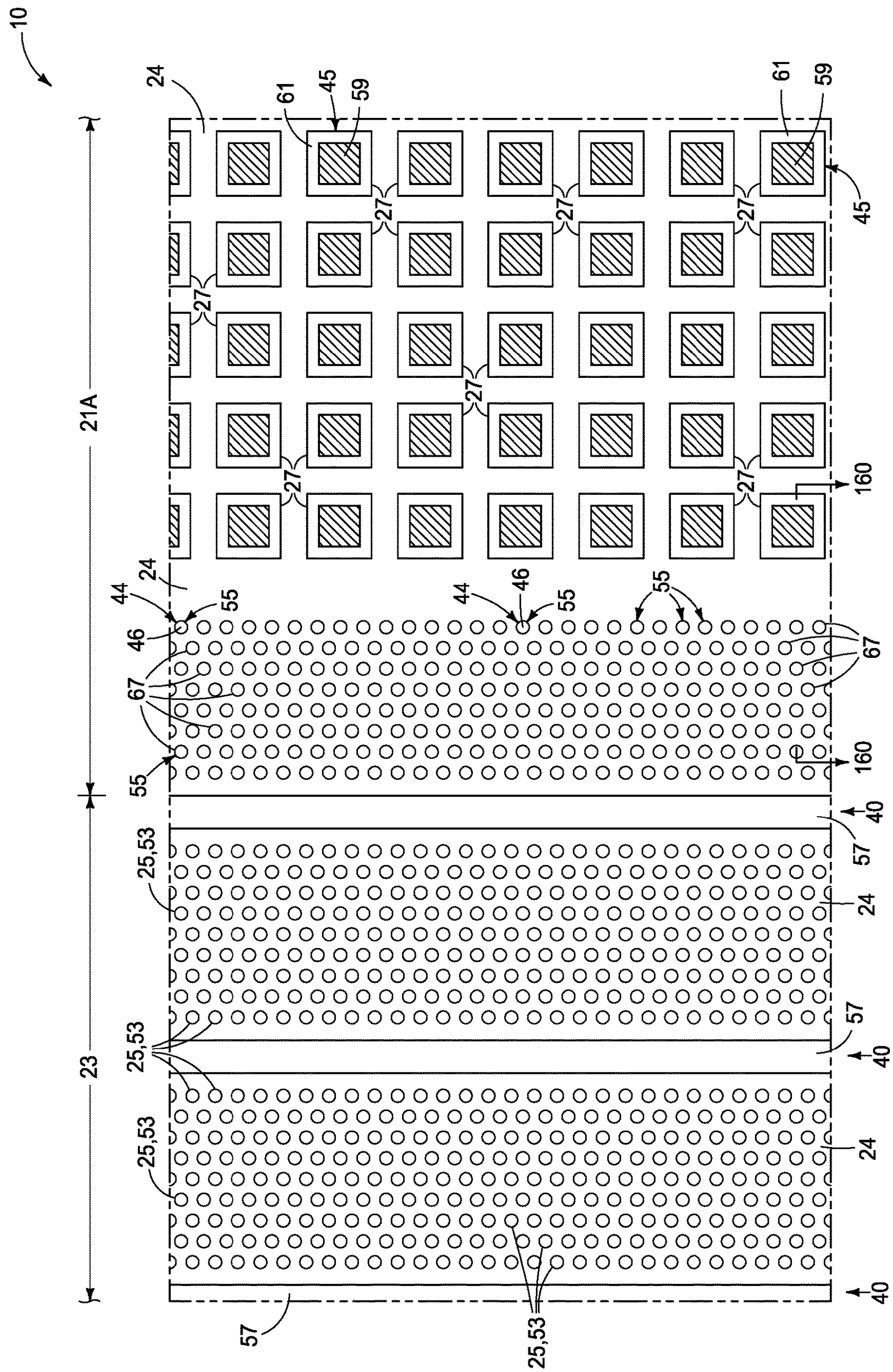
Figure 159:
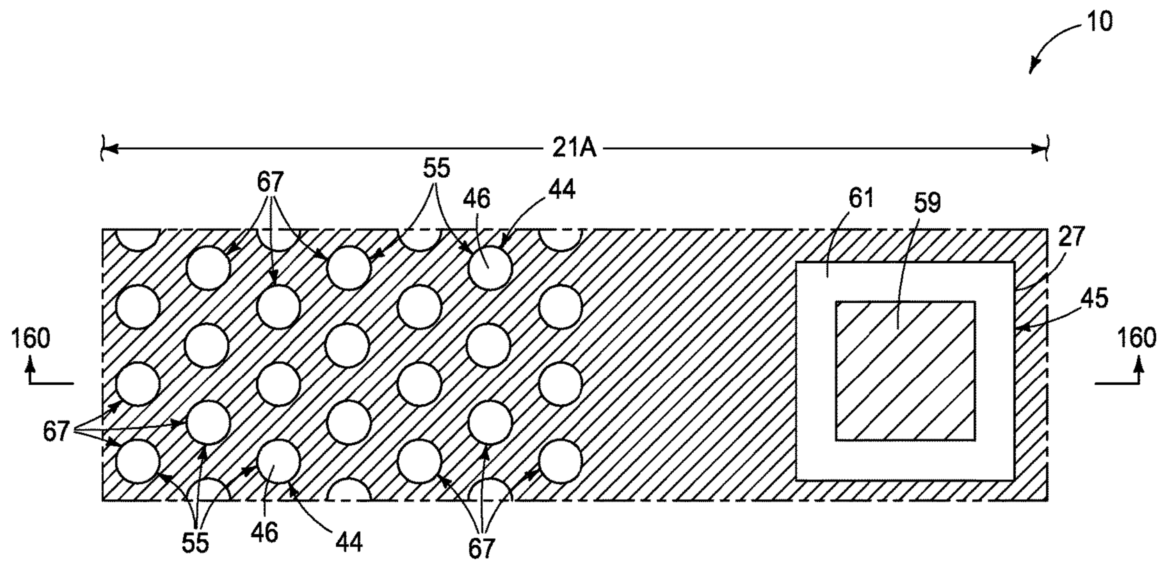
Figure 160:
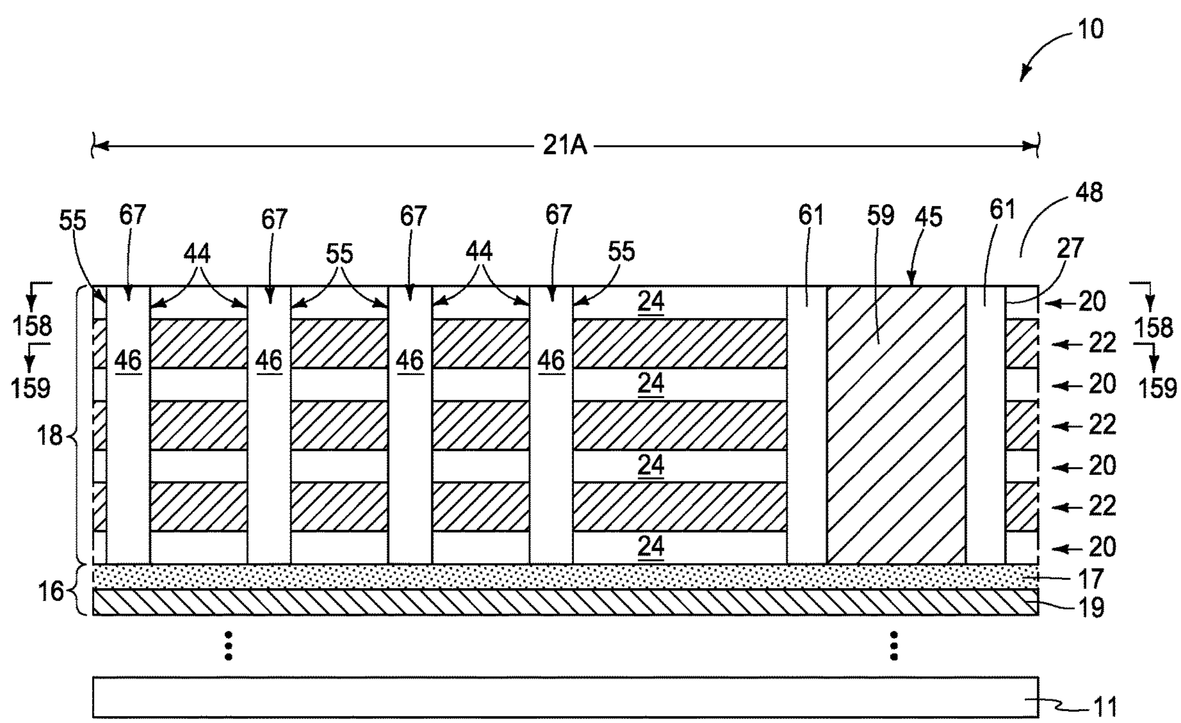
Figure 161:
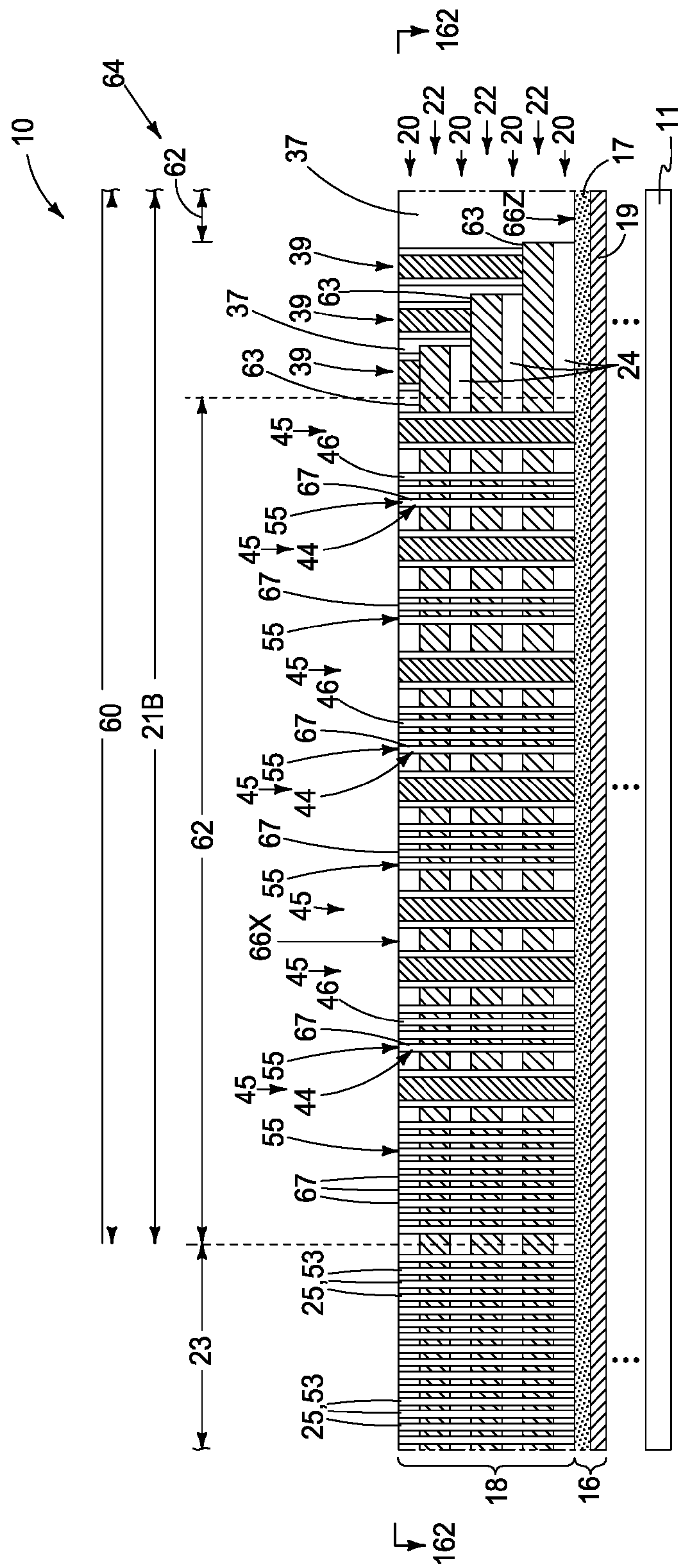
Figure 162:
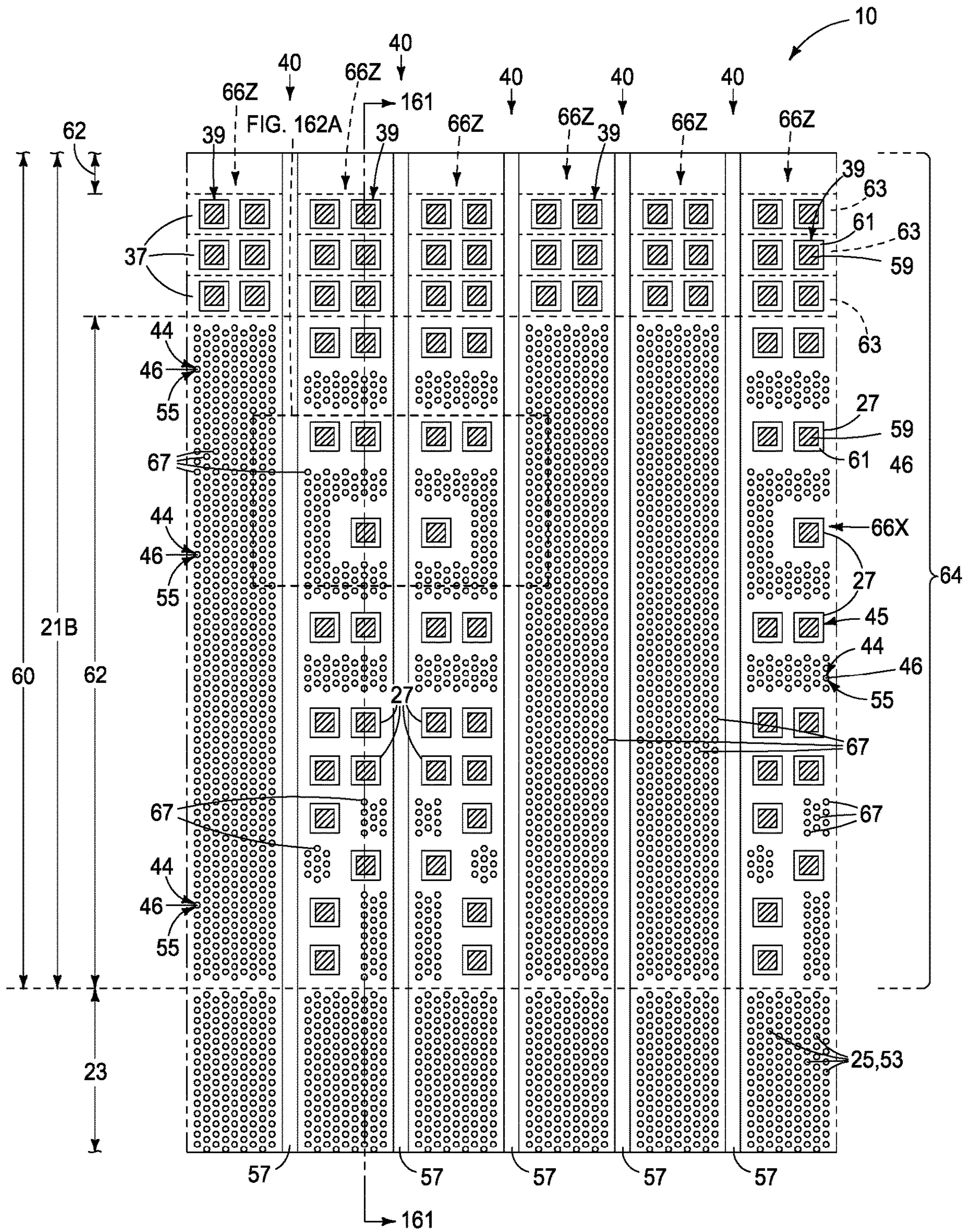
Figure 162A:
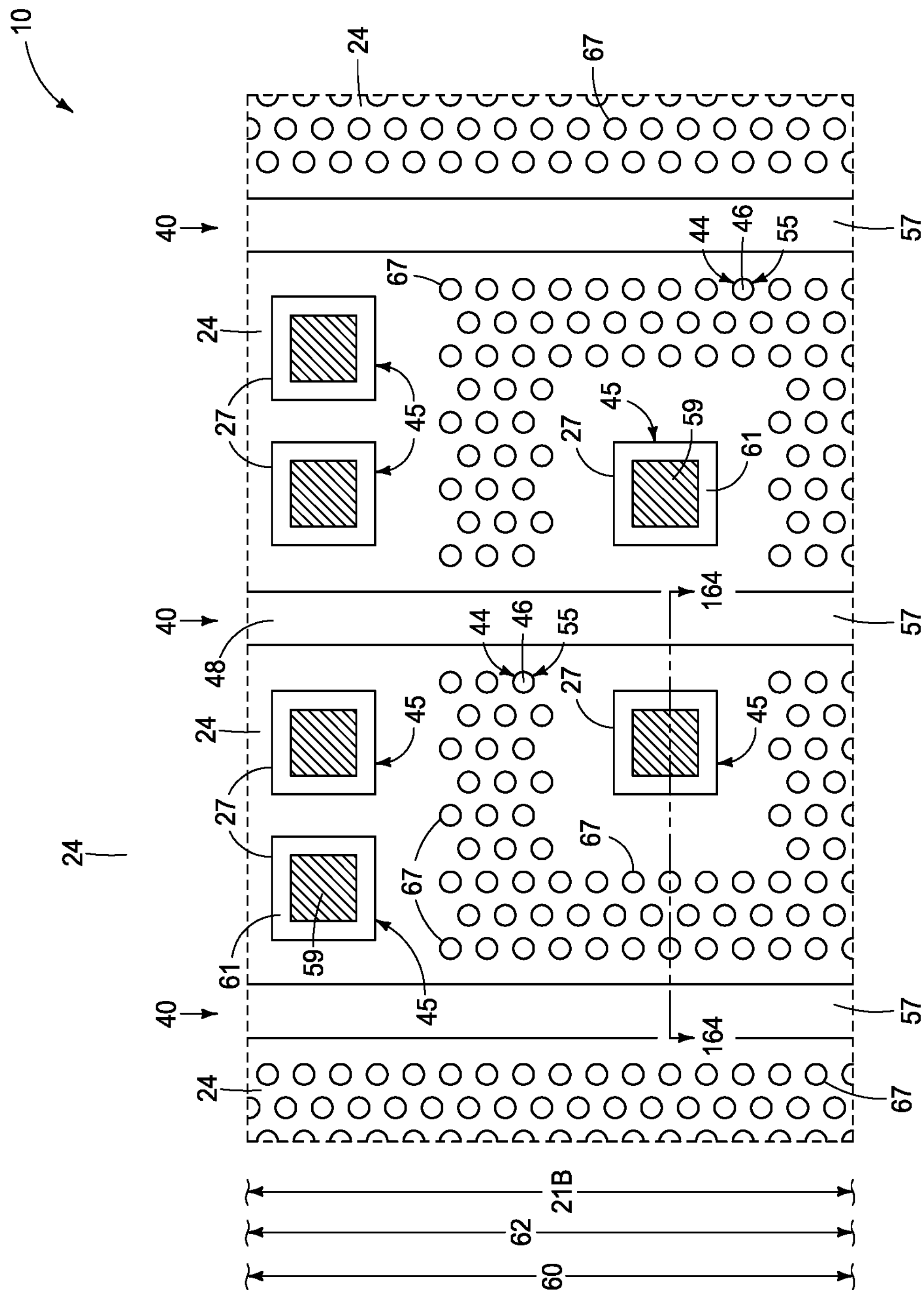
Figure 163:
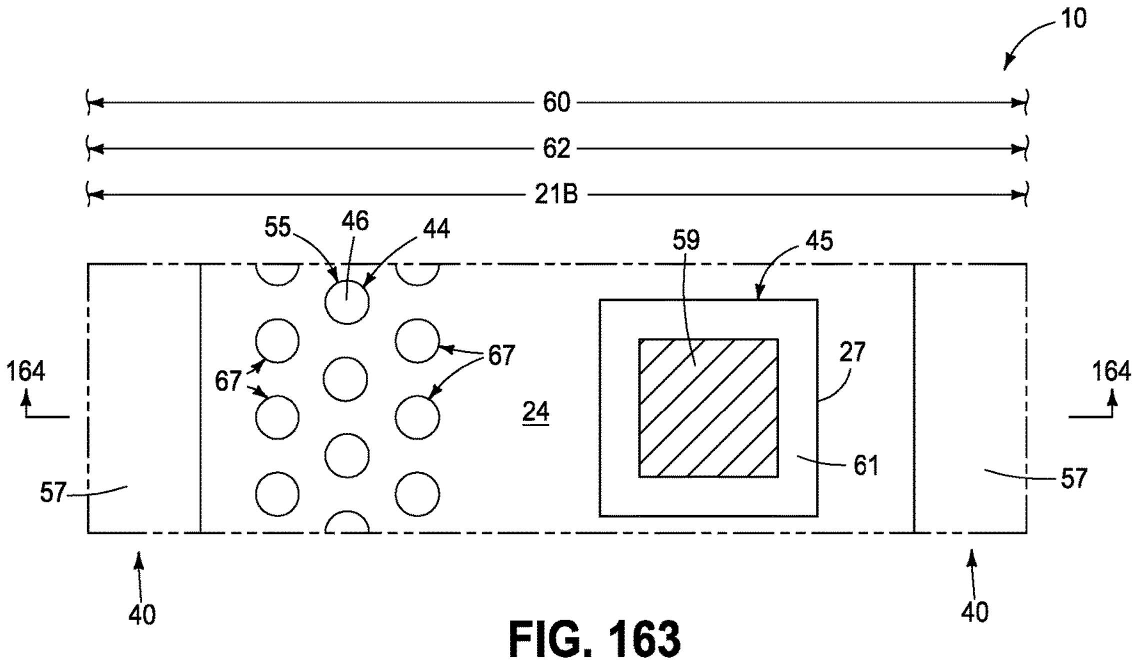

The above example processing shows forming the operative and dummy channel-material strings at the same time and forming the operative TAVs after the replacing of at least a majority of channel material of the dummy channel-material strings in the TAV region with insulator material. In one embodiment, the operative and dummy channel-material strings are formed to individually have the same horizontal shape relative one another and in one embodiment to have the same size and shape relative one another. In one embodiment and as shown, the operative channel-material strings and the dummy channel-material strings (and thereby dummy TAVs 55/55*a*) are formed to have the same pitch P relative one another (FIG. 87). In one embodiment and as shown, the operative and dummy channel-material strings are formed to individually be horizontally smaller than the operative TAVs. In one embodiment, operative channel-material strings 53 are within laterally-spaced memory blocks (e.g. memory blocks 115 in FIG. 150) that comprise part of an individual memory plane 105. In one such embodiment, dummy channel-material strings 35, TAV region 21, and operative TAVs 45 are within a memory plane 105. In another embodiment, dummy channel-material strings 35, TAV region 21A and/or 21B, and operative TAVs 45 are outside of a memory plane 105, with in one such embodiment being edge-of-plane (FIGS. 150, 158) and in another such embodiment being in a landing region 62 of a stair-step region 60 (FIG. 161). Regardless, and as referred to above, alternately the dummy TAVs may be of the same horizontal size and shape as and/or on pitch with operative TAVs 45 (not shown).

Referring to FIGS. 97-107, horizontally-elongated trenches 40 have been formed (e.g., by anisotropic etching) through stack 18 to conductor tier 16.

Referring to FIGS. 108-121, material 26 (not shown) of conductive tiers 22 has been etched selectively relative to materials 24, 30, 32, 34, 36, 38, and 44 (e.g., using liquid or vapor $H_3PO_4$ as a primary etchant where material 26 is silicon nitride and materials 24, 30, 32, 34, 36, 38, and 44 are polysilicon or other oxides).

Conducting material is ultimately formed into conductive tiers 22 to comprise conducting material of the individual conductive lines being formed. Referring to FIGS. 122-135, such show an example embodiment wherein conducting material 48 has been formed into conductive tiers 22 through trenches 40. Any suitable conducting material 48 may be used, for example one or both of metal material and/or conductively-doped semiconductor material. In but one example embodiment, conducting material 48 comprises a first-deposited conformal titanium nitride liner (not shown) followed by deposition of another composition metal material (e.g., elemental tungsten). A thin insulating material lining (e.g., at least one of $Al_2O_3$ and $HfO_x$ and not shown) may be formed into conductive tiers 22 through trenches 40 prior to forming conducting material 48.

Figure 137:
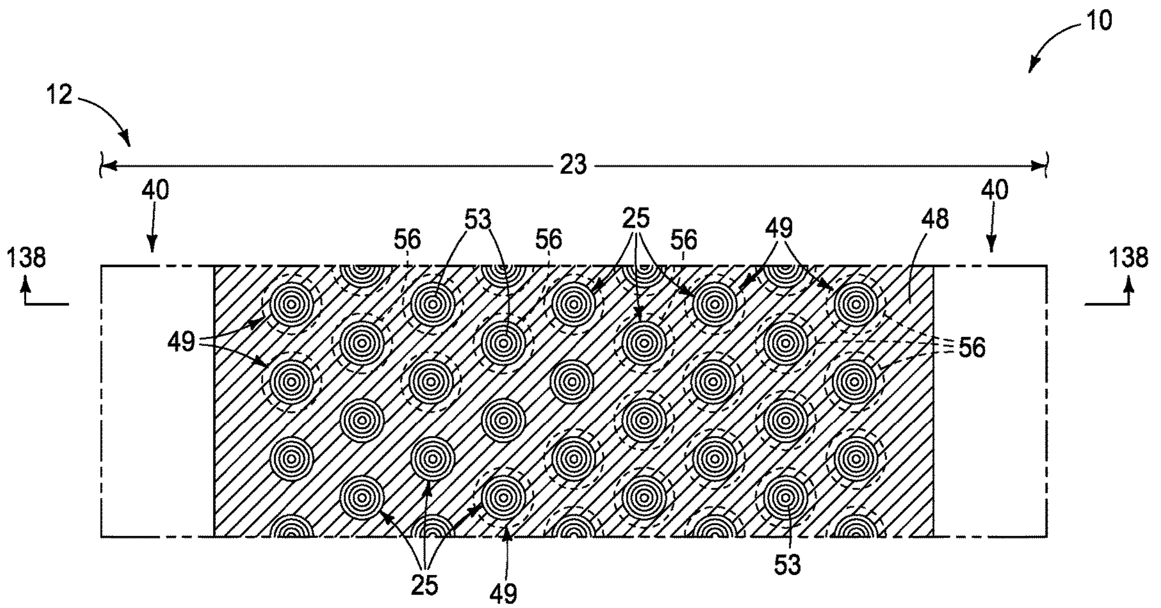
Figure 138:
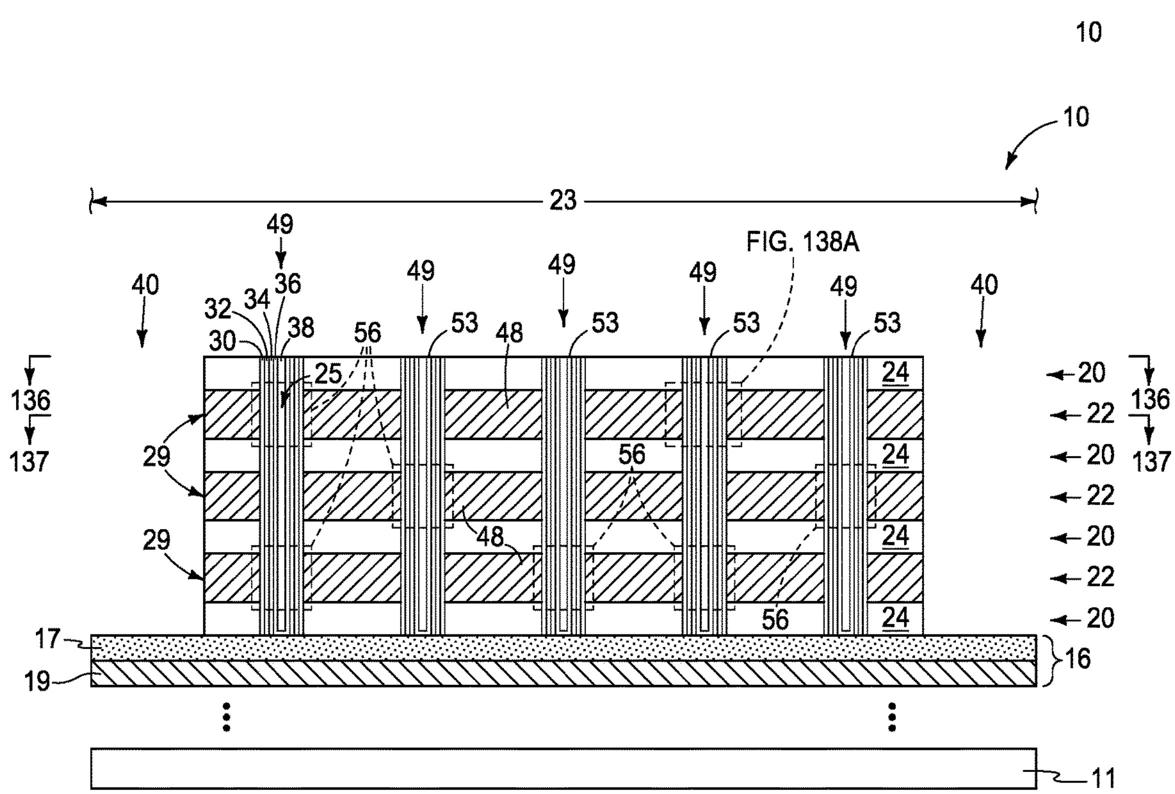
Figure 138A:
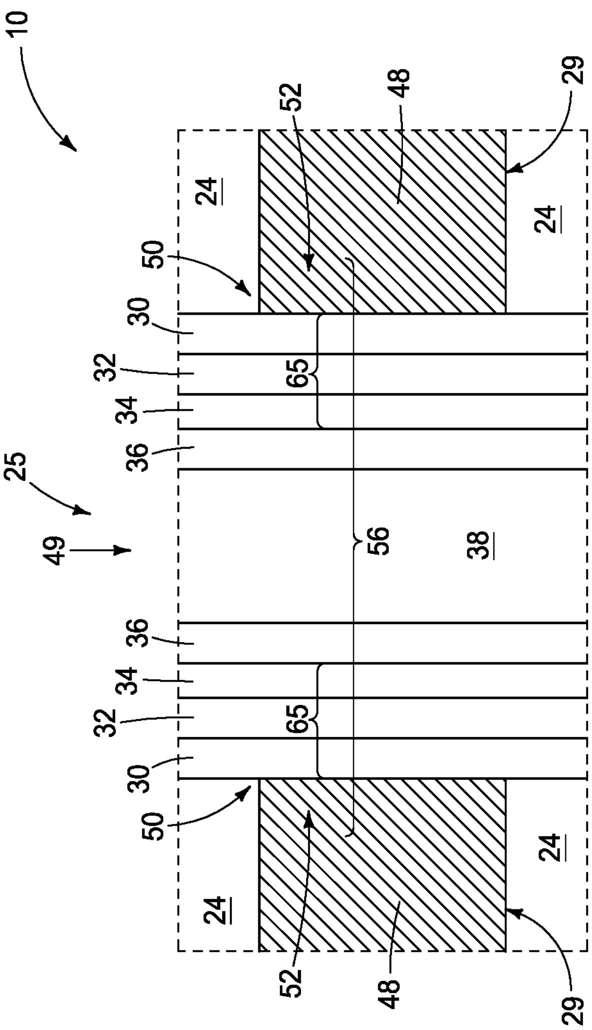
Figure 139:
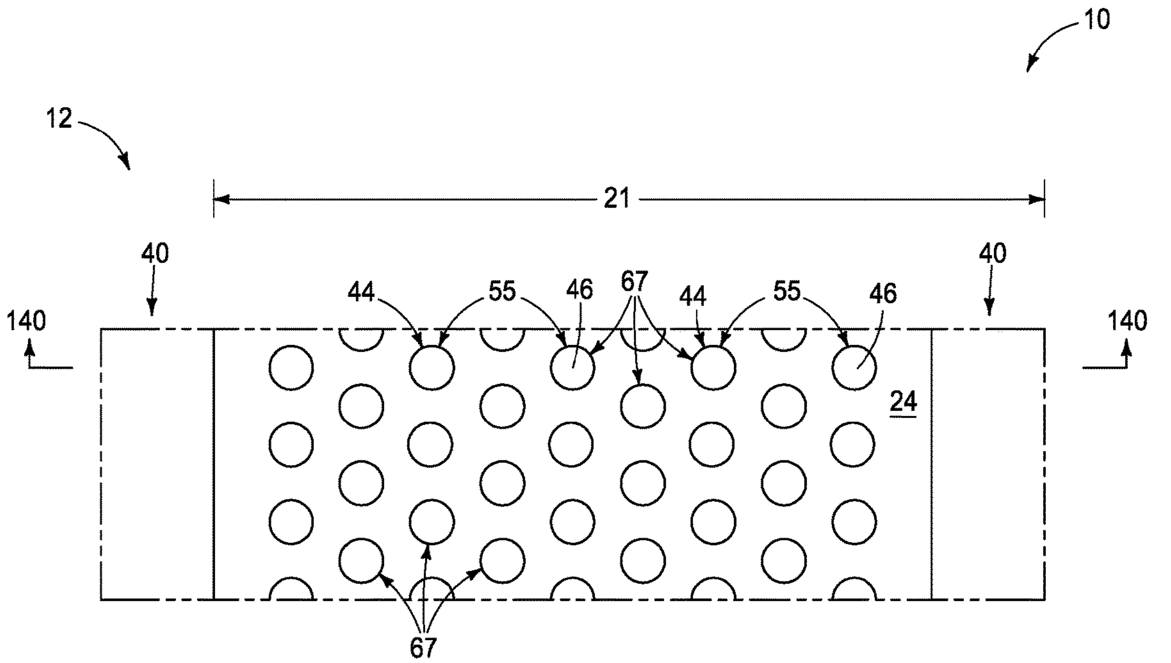
Figure 140:
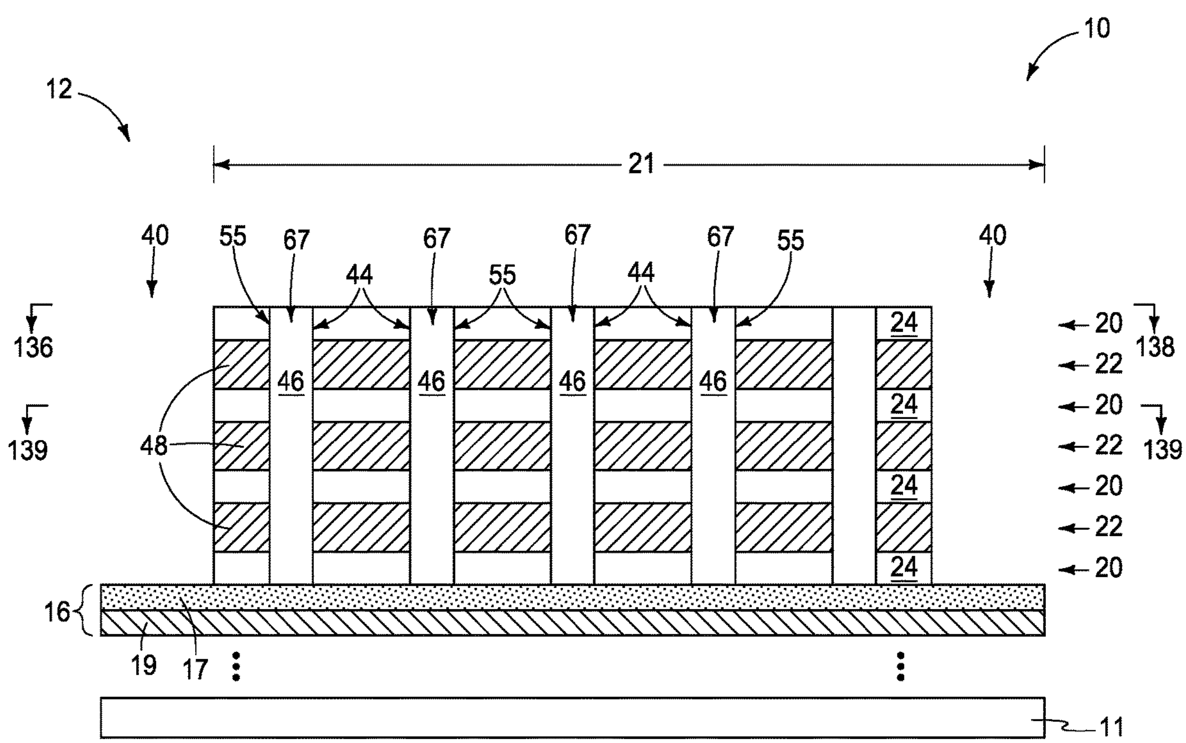
Figure 141:
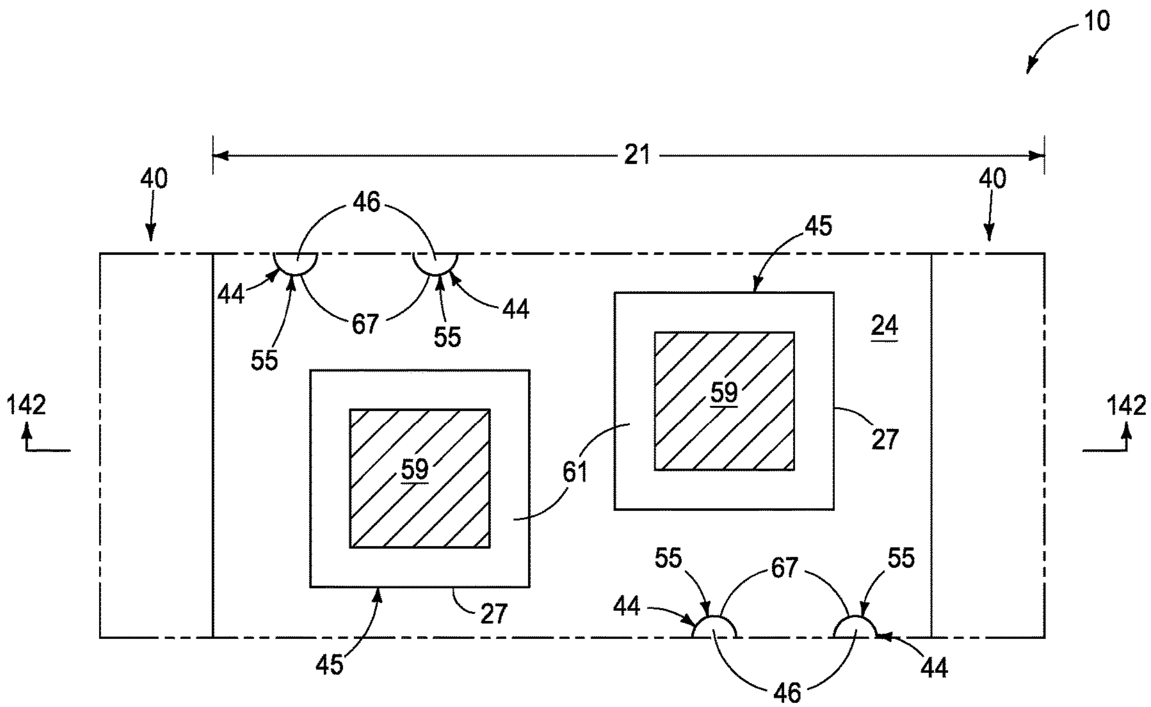
Figure 142:
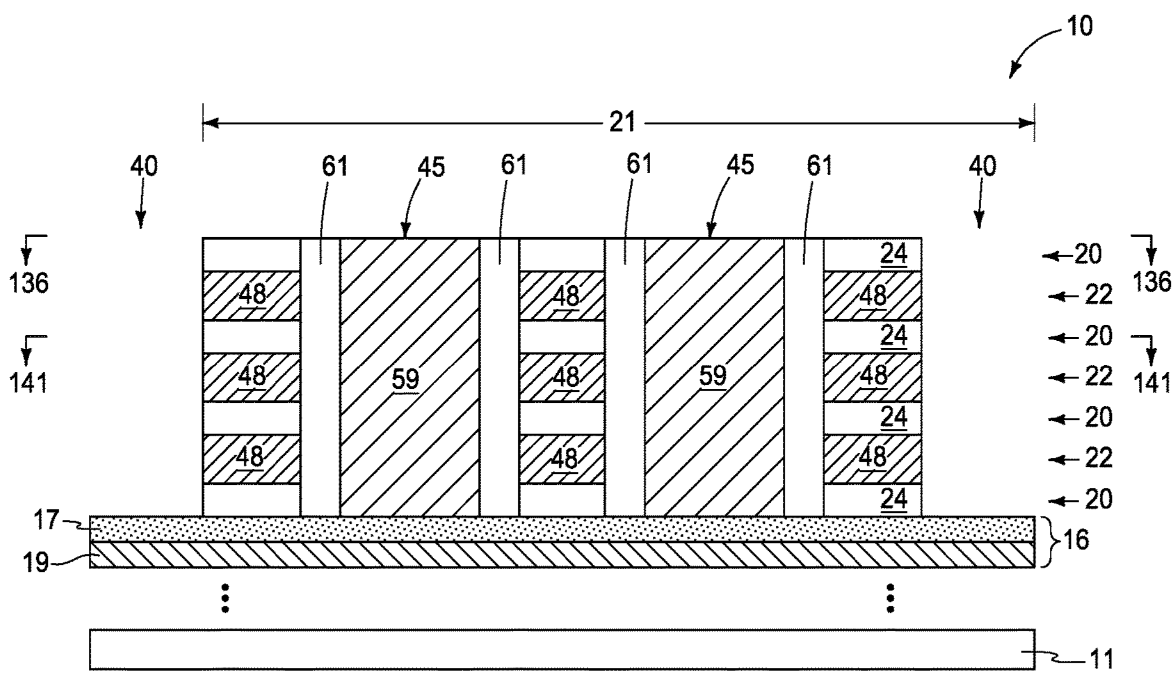
Figure 143:
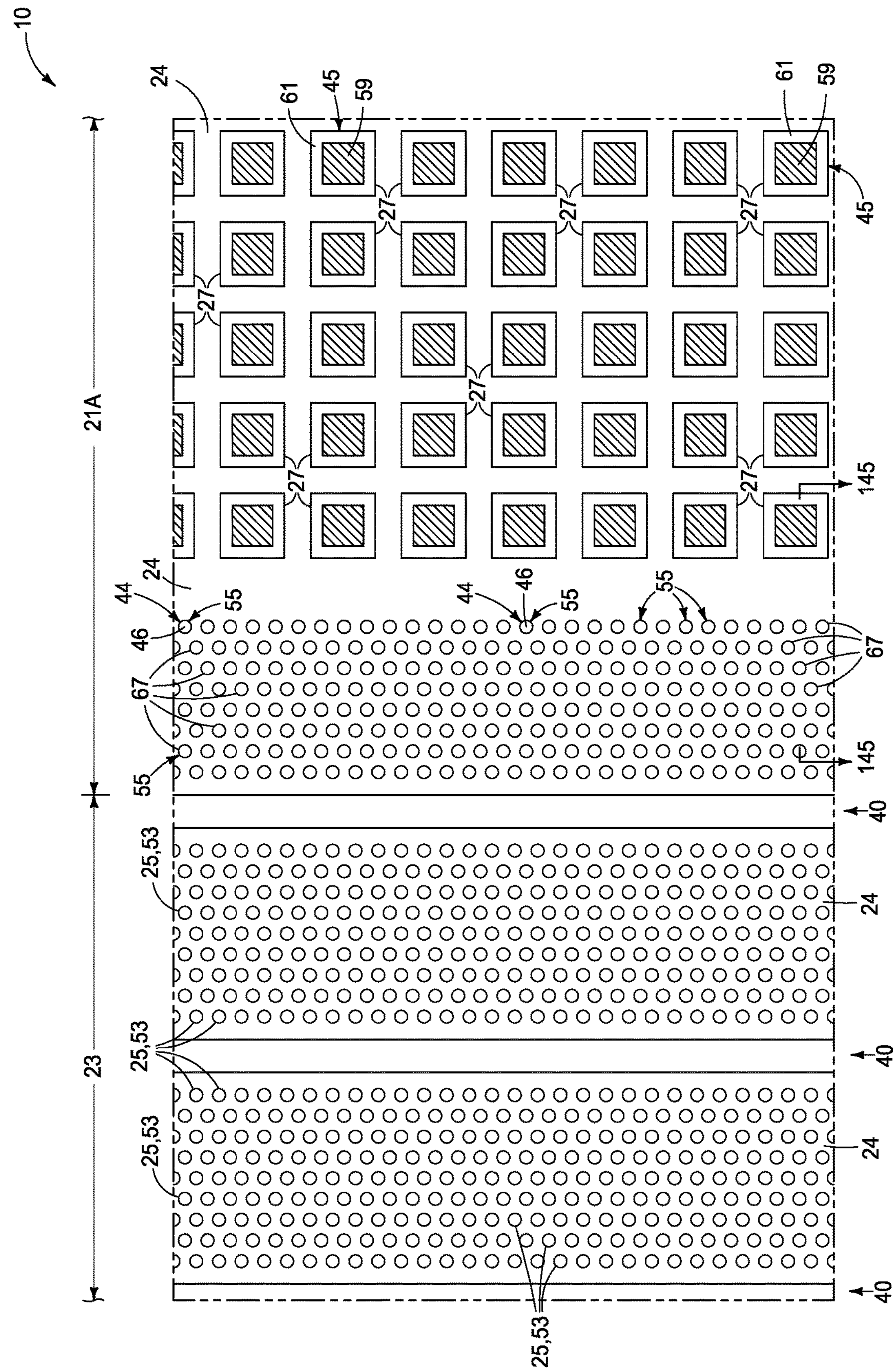
Figure 144:
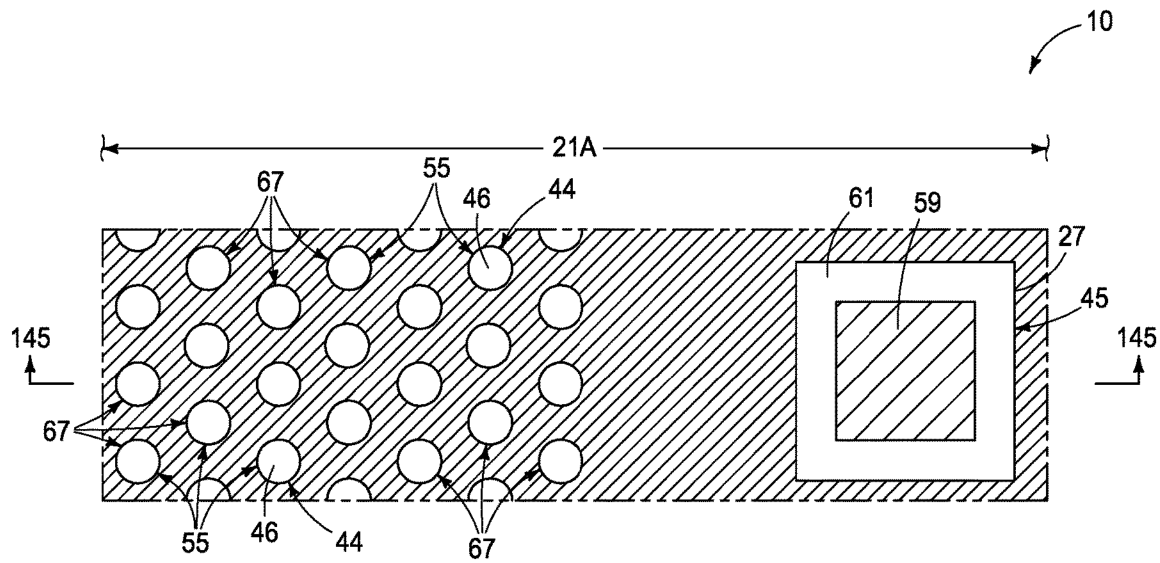
Figure 145:
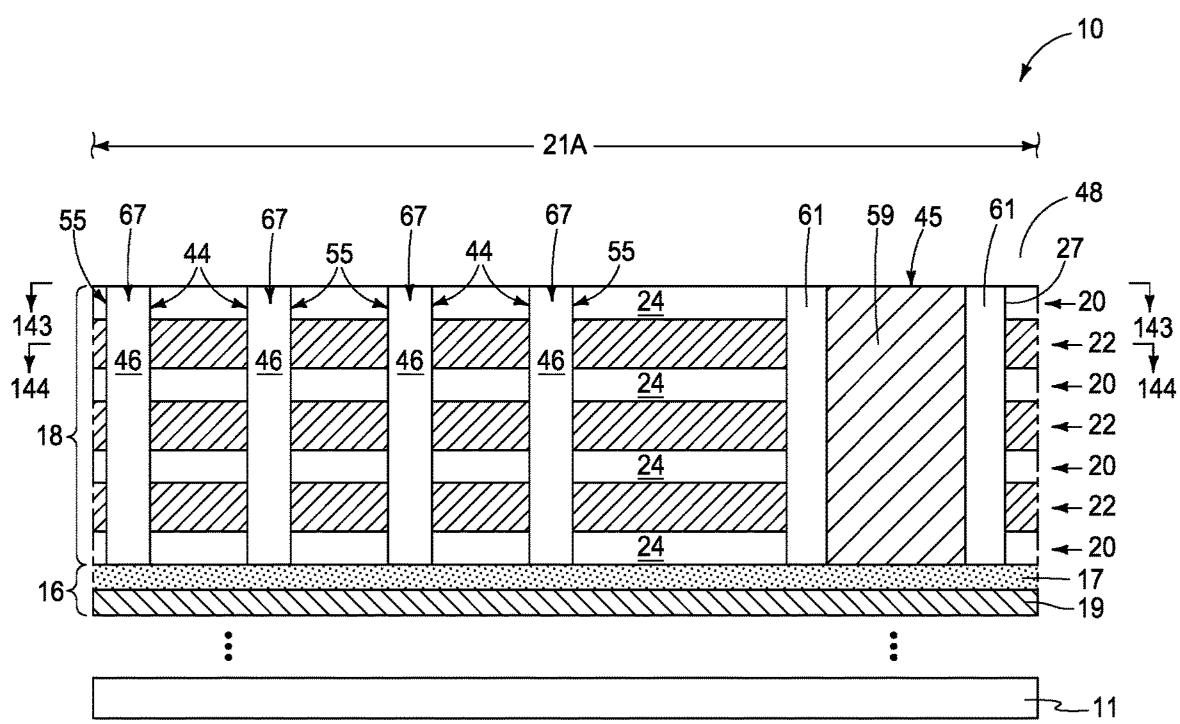
Figure 146:
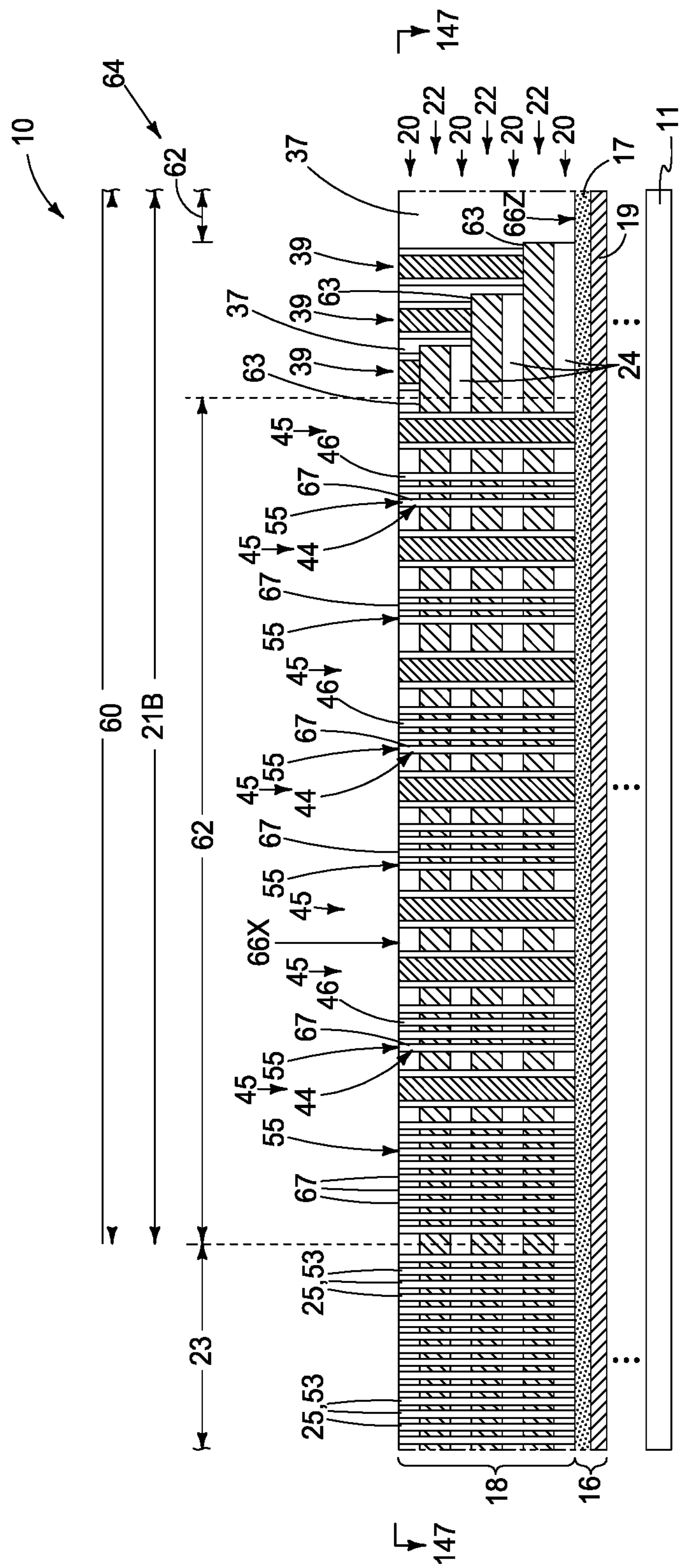
Figure 147:
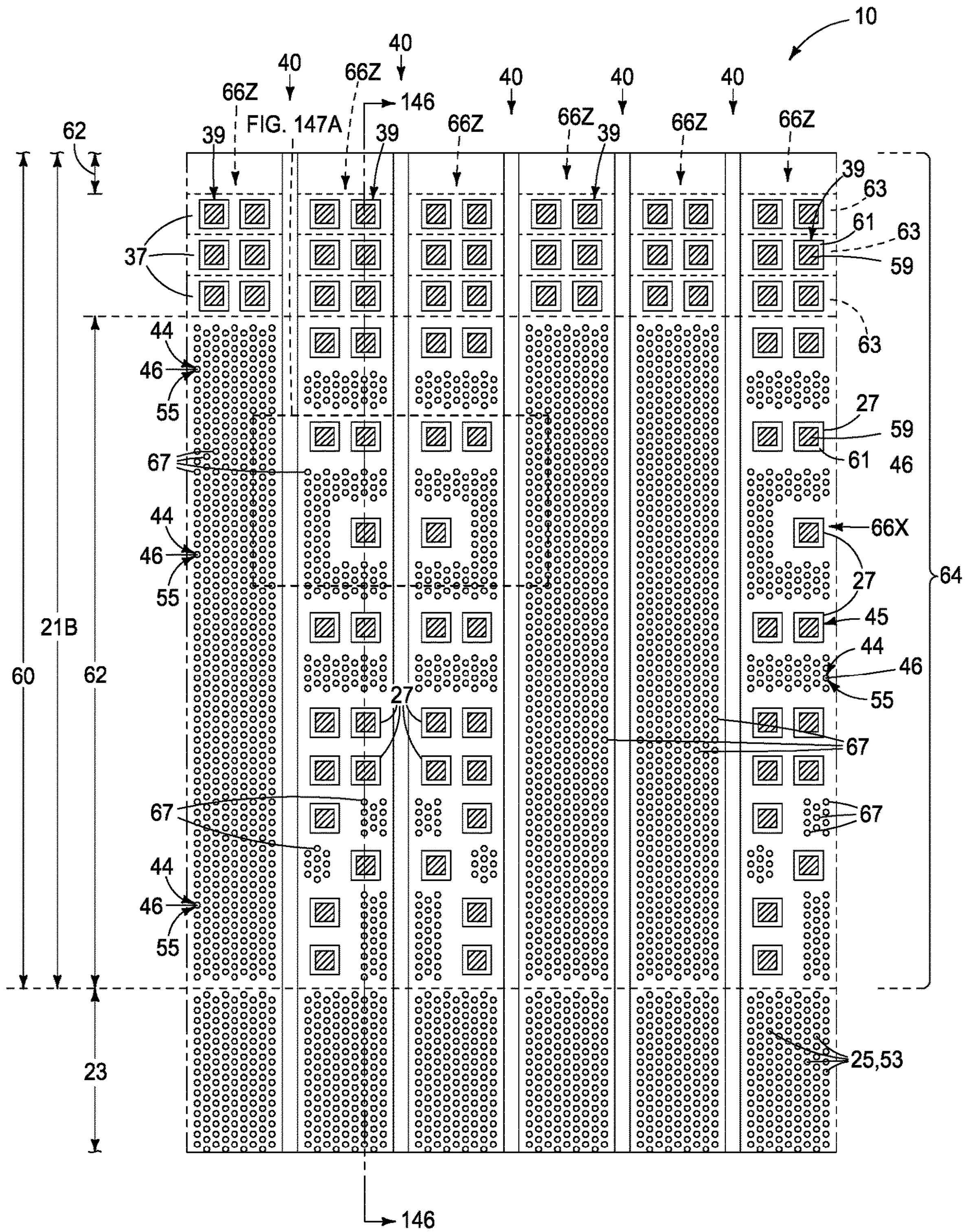
Figure 147A:
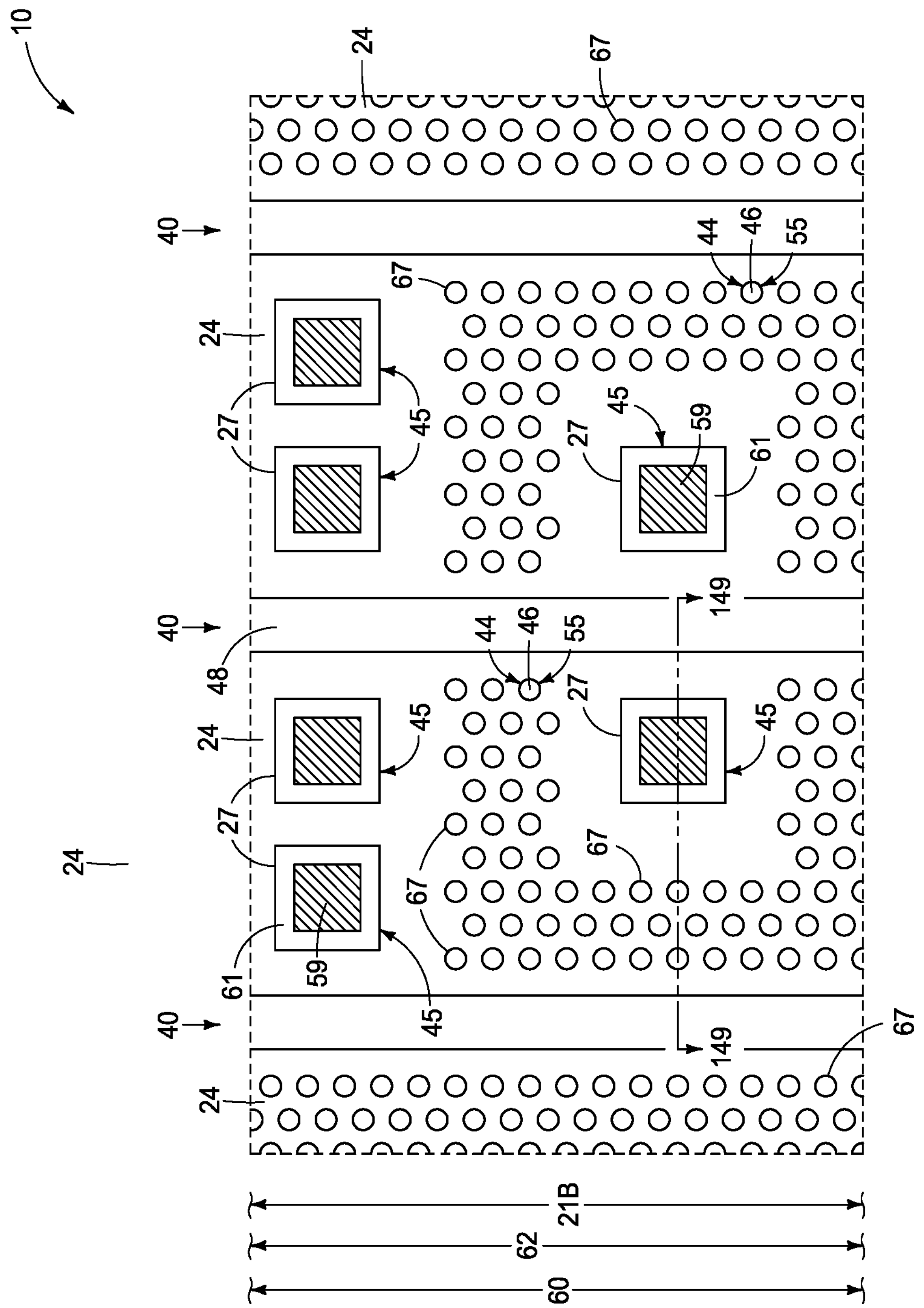
Figure 148:
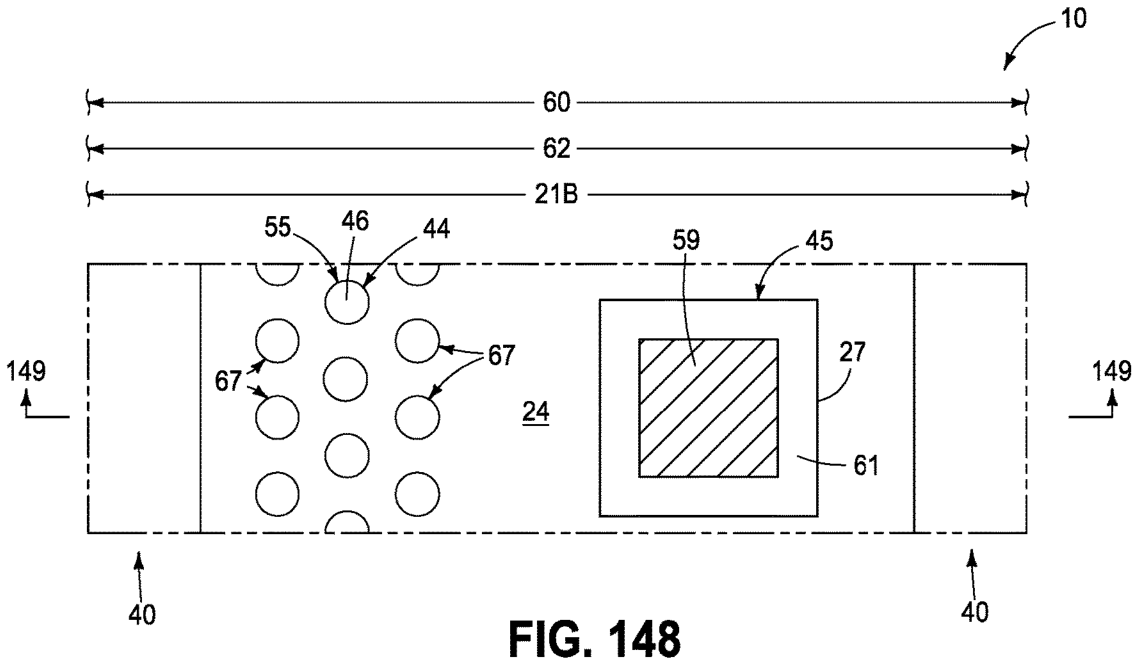
Figure 149:
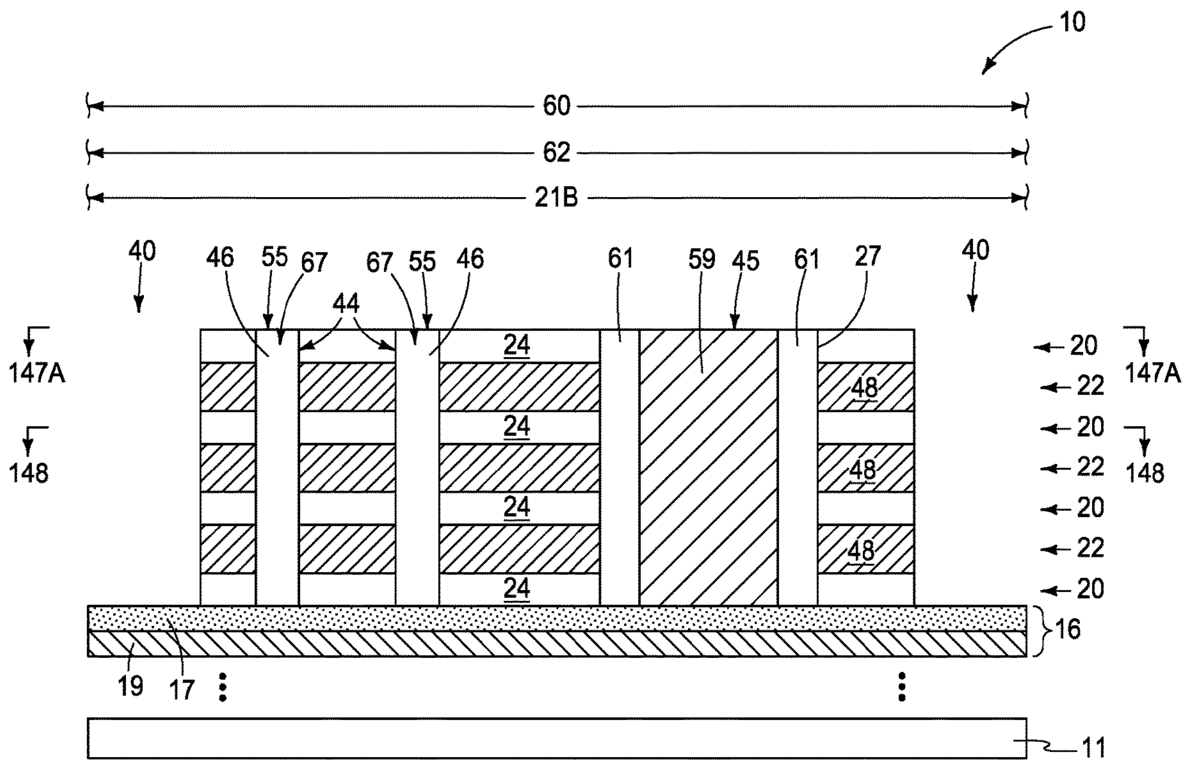

Referring to FIGS. 136-149, conducting material 48 has been removed from individual trenches 40. Such has resulted in formation of conductive lines 29 (e.g., wordlines) and elevationally-extending strings 49 of individual transistors and/or memory cells 56. Such removing may be conducted by etching, for example by one or both of anisotropic etching or isotropic etching. In one isotropic etching example, trenches 40 can be formed to be wider than the vertical depth of individual conductive tiers 22. Conducting material 48 can then be deposited to a thickness that less-than-fills trenches 40 (not shown), for example to leave a laterally-centered void space within trenches 40 (not shown). Thereafter, such conducting material can be isotropically etched within the void space to form conductive lines 29 that are separated as is shown by the FIGS. 94 and 95 cross-sections. Approximate locations of transistors and/or memory cells 56 are indicated with a bracket in FIG. 138A and some with dashed outlines in FIGS. 137 and 138, with transistors and/or memory cells 56 being essentially ring-like or annular in the depicted example. Conducting material 48 may be considered as having terminal ends 50 (FIG. 138A) corresponding to control-gate regions 52 of individual transistors and/or memory cells 56. Control-gate regions 52 in the depicted embodiment comprise individual portions of individual conductive lines 29. Materials 30, 32, and 34 may be considered as a memory structure 65 that is laterally between control-gate region 52 and channel material 36. A same structure can result with respect to dummy channel-material strings 35 and be dummy (meaning circuit inoperative).

A charge-blocking region (e.g., charge-blocking material 30) is between storage material 32 and individual control-gate regions 52. A charge block may have the following functions in a memory cell: In a program mode, the charge block may prevent charge carriers from passing out of the storage material (e.g., floating-gate material, charge-trapping material, etc.) toward the control gate, and in an erase mode the charge block may prevent charge carriers from flowing into the storage material from the control gate. Accordingly, a charge block may function to block charge migration between the control-gate region and the storage material of individual memory cells. An example charge-blocking region as shown comprises insulator material 30. By way of further examples, a charge-blocking region may comprise a laterally (e.g., radially) outer portion of the storage material (e.g., material 32) where such storage material is insulative (e.g., in the absence of any different-composition material between an insulative storage material 32 and conducting material 48). Regardless, as an additional example, an interface of a storage material and conductive material of a control gate may be sufficient to function as a charge-blocking region in the absence of any separate-composition-insulator material 30. Further, an interface of conducting material 48 with material 30 (when present) in combination with insulator material 30 may together function as a charge-blocking region, and as alternately or additionally may a laterally-outer region of an insulative storage material (e.g., a silicon nitride material 32). An example material 30 is one or more of silicon hafnium oxide and silicon dioxide.

Referring to FIGS. 150-164, a material 57 (dielectric and/or silicon-containing such as undoped polysilicon) has been formed in individual trenches 40. A conductive interconnect line (not shown) would operatively electrically couple individual operative TAVs 45, individual vias 39, and individual operative channel-material strings 53 to other circuitry (not shown) not particularly material to the inventions disclosed herein.

Any other attribute(s) or aspect(s) as shown and/or described herein with respect to other embodiments may be used with respect to the above-described embodiments.

In one embodiment and as shown in the drawings referred to above, conducting material of the conductive lines is formed after forming the operative and dummy channel-material strings (e.g., gate-last or replacement-gate processing). Alternately, conducting material of the conductive lines may be formed before forming the operative and dummy channel-material strings (e.g., gate-first processing).

Embodiments of the invention encompass memory arrays independent of method of manufacture. Nevertheless, such memory arrays may have any of the attributes as described herein in method embodiments. Likewise, the above-described method embodiments may incorporate and form any of the attributes described with respect to device embodiments.

In one embodiment, a memory array comprises a vertical stack (e.g., 18) comprising alternating insulative tiers (e.g., 20) and conductive tiers (e.g., 22). The conductive tiers comprise gate regions (e.g., 52) of individual memory cells (e.g., 56) the gate regions individually comprise part of a conductive line (e.g., 29) in individual of the conductive tiers. Operative channel-material strings (e.g., 53) extend through the insulative tiers and the conductive tiers. The individual memory cells comprise a memory structure (e.g., 65) laterally between individual of the gate regions and channel material (e.g., 36) of the operative channel-material strings. The vertical stack comprises a TAV region (e.g., any one or more of regions 21, 21A, 21B) comprising operative TAVs (e.g., 45) and dummy TAVs (e.g., 55, 55*a*), with the dummy TAVs being devoid of any conductive material and being devoid of any channel material. Any other attribute(s) or aspect(s) as shown and/or described herein with respect to other embodiments may be used.

In one embodiment, the operative channel-material strings and the dummy TAVs individually have the same horizontal shape relative one another. In one embodiment, the operative channel-material strings and the dummy TAVs individually have the same size and shape relative one another. In one embodiment, the operative channel-material strings and the dummy TAVs have the same pitch relative one another. In one embodiment, the operative channel-material strings and the dummy TAVs individually are horizontally smaller than the operative TAVs. Any other attribute(s) or aspect(s) as shown and/or described herein with respect to other embodiments may be used.

In one embodiment, a memory array comprises a vertical stack (e.g., 18) comprising alternating insulative tiers (e.g., 20) and conductive tiers (e.g., 22). The conductive tiers comprise gate regions (e.g., 52) of individual memory cells (e.g., 56) the gate regions individually comprise part of a conductive line (e.g., 29) in individual of the conductive tiers. Operative channel-material strings (e.g., 53) extend through the insulative tiers and the conductive tiers within a memory plane (e.g., 105). The individual memory cells within the memory plane comprise a memory structure (e.g., 65) laterally between individual of the gate regions and channel material (e.g., 36) of the operative channel-material strings. The vertical stack comprises a TAV region (e.g., in any one or more of regions 21, 21A, 21B) comprising operative TAVs (e.g., 45) and dummy TAVs (e.g., 55, 55*a*). The TAV region is one of within the memory plane or outside of the memory plane at an edge of the memory plane. The dummy TAVs are devoid of any conductive material and are devoid of any channel material. Any other attribute(s) or aspect(s) as shown and/or described herein with respect to other embodiments may be used.

In one embodiment, a memory array comprises a vertical stack (e.g., 18) comprising alternating insulative tiers (e.g., 20) and conductive tiers (e.g., 22). The conductive tiers comprise gate regions (e.g., 52) of individual memory cells (e.g., 56) the gate regions individually comprise part of a conductive line (e.g., 29) in individual of the conductive tiers. Operative channel-material strings (e.g., 53) extend through the insulative tiers and the conductive tiers within a memory plane (e.g., 105). The individual memory cells within the memory plane comprise a memory structure (e.g., 65) laterally between individual of the gate regions and channel material (e.g., 36) of the operative channel-material strings. An operative stair-step structure (e.g., 64) is outside of the memory plane and comprises the insulative tiers and the conductive tiers. A landing region (e.g., 62) is adjacent steps (e.g., 63) of the operative stair-step structure. The landing region comprises a landing (e.g., 66X and/or 66Z) and operative TAVs (e.g., 45) extending through the insulative tier and the conductive tiers. The landing region comprises dummy TAVs (e.g., 55, 55*a*) extending through the insulative tiers and the conductive tiers, with the dummy TAVs being devoid of any conductive material and being devoid of any channel material. Any other attribute(s) or aspect(s) as shown and/or described herein with respect to other embodiments may be used.

In the inventions disclosed above, other processing, and/or structure may be used as is disclosed in any of U.S. Patent Application Publication No. 2015/0001613; U.S. Pat. No. 9,589,978; U.S. Patent Application Publication No. 2017/0263556; U.S. Patent Application Publication No. 2017/0287833, and U.S. Patent Application Publication No. 2018/0082940. U.S. Patent Application Publication No. 2015/0001613; U.S. Pat. No. 9,589,978; U.S. Patent Application Publication No. 2017/0287833, and U.S. Patent Application Publication No. 2018/0082940 are herein and hereby incorporated by reference.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, "selective" as to etch, etching, removing, removal, depositing, forming, and/or formation is such an act of one stated material relative to another stated material(s) so acted upon at a rate of at least 2:1 by volume. Further, selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a method used in forming a memory array comprising strings of memory cells and operative through-array-vias (TAVs) comprises forming a stack comprising vertically-alternating insulative tiers and conductive tiers. The stack comprises a TAV region and an operative memory-cell-string region. Operative channel-material strings are formed in the stack in the operative memory-cell-string region and dummy channel-material strings are formed in the stack in the TAV region. At least a majority of channel material of the dummy channel-material strings is replaced in the TAV region with insulator material and operative TAVs are formed in the TAV region.

In some embodiments, a memory array comprises a vertical stack comprising alternating insulative tiers and conductive tiers. The conductive tiers comprise gate regions of individual memory cells. The gate regions individually comprise part of a conductive line in individual of the conductive tiers. Operative channel-material strings extend through the insulative tiers and the conductive tiers. The individual memory cells comprise a memory structure laterally between individual of the gate regions and channel material of the operative channel-material strings. The vertical stack comprises a through-array-via (TAV) region comprising operative TAVs and dummy TAVs. The dummy TAVs are devoid of any conductive material and are devoid of any channel material.

In some embodiments, a memory array comprises a vertical stack comprising alternating insulative tiers and conductive tiers. The conductive tiers comprise gate regions of individual memory cells. The gate regions individually comprise part of a conductive line in individual of the conductive tiers. Operative channel-material strings extend through the insulative tiers and the conductive tiers within a memory plane. The individual memory cells within the memory plane comprise a memory structure laterally between individual of the gate regions and channel material of the operative channel-material strings. The vertical stack comprises a through-array-via (TAV) region comprising operative TAVs and dummy TAVs. The TAV region is one of within the memory plane or outside of the memory plane at an edge of the memory plane. The dummy TAVs are devoid of any conductive material and are devoid of any channel material.

In some embodiments, a memory array comprises a vertical stack comprising alternating insulative tiers and conductive tiers. The conductive tiers comprise gate regions of individual memory cells. The gate regions individually comprise part of a conductive line in individual of the conductive tiers. Operative channel-material strings extend through the insulative tiers and the conductive tiers within a memory plane. The individual memory cells within the memory plane comprise a memory structure laterally between individual of the gate regions and channel material of the operative channel-material strings. An operative stair-step structure is outside of the memory plane and comprises the insulative tiers and the conductive tiers. A landing region is adjacent steps of the operative stair-step structure. The landing region comprises a landing and operative through-array-vias (TAVs) extending through the insulative tiers and the conductive tiers. The landing region comprises dummy TAVs extending through the insulative tiers and the conductive tiers. The dummy TAVs are devoid of any conductive material and are devoid of any channel material.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A memory array comprising:

a vertical stack comprising alternating insulative tiers and conductive tiers, the conductive tiers comprising gate regions of individual memory cells, the gate regions individually comprising part of a conductive line in individual of the conductive tiers; operative channel-material strings extending through the insulative tiers and the conductive tiers within a memory plane;

the individual memory cells comprising a memory structure laterally between individual of the gate regions and channel material of the operative channel-material strings; and the vertical stack comprising a through-array-via (TAV) region that is outside of the memory plane and comprising multiple operative TAVs and multiple dummy TAVs, the dummy TAVs being devoid of any conductive material and being devoid of any channel material.

2. The memory array of claim 1 wherein the operative channel-material strings and the dummy TAVs individually have the same horizontal shape relative one another.

3. The memory array of claim 1 wherein the operative channel-material strings and the dummy TAVs individually have the same size and shape relative one another.

4. The memory array of claim 1 wherein the operative channel-material strings and the dummy TAVs have the same pitch relative one another.

5. The memory array of claim 4 wherein the operative channel-material strings and the dummy TAVs individually have the same size and shape relative one another.

6. The memory array of claim 1 wherein the operative channel-material strings and the dummy TAVs individually are horizontally smaller than the operative TAVs.

7. The memory array of claim 1 comprising CMOS-under-array circuitry.

8. The memory array of claim 1 comprising NAND.

9. A memory array comprising:

a vertical stack comprising alternating insulative tiers and conductive tiers, the conductive tiers comprising gate regions of individual memory cells, the gate regions individually comprising part of a conductive line in individual of the conductive tiers; operative channel-material strings extending through the insulative tiers and the conductive tiers within a memory plane;

the individual memory cells within the memory plane comprising a memory structure laterally between individual of the gate regions and channel material of the operative channel-material strings; and the vertical stack comprising a through-array-via (TAV) region comprising multiple operative TAVs and multiple dummy TAVs, the TAV region being one outside of the memory plane at an edge of the memory plane, the dummy TAVs being devoid of any conductive material and being devoid of any channel material.

10. The memory array of claim 9 wherein the operative channel-material strings and the dummy TAVs have the same pitch relative to one another.

11. The memory array of claim 9 wherein the the operative channel-material strings and the dummy TAVs individually have the same size and shape relative to one another.

12. The memory array of claim 9 wherein the operative channel-material strings and the dummy TAVs individually are horizontally smaller than the operative TAVs.

13. The memory array of claim 9 wherein the dummy TAVs comprise insulator material.

14. The memory array of claim 13 wherein the insulator material comprises solid material and gaseous material.

15. The memory array of claim 14 wherein the insulator material comprises one and only one void space and in which the gaseous material is received.

16. The memory array of claim 9 wherein the dummy TAVs consist essentially of solid insulator material.

17. The memory array of claim 9 wherein the dummy TAVs consist of silicon nitride.

18. A memory array comprising:

a vertical stack comprising alternating insulative tiers and conductive tiers, the conductive tiers comprising gate regions of individual memory cells, the gate regions individually comprising part of a conductive line in individual of the conductive tiers; operative channel-material strings extending through the insulative tiers and the conductive tiers within a memory plane;

the individual memory cells within the memory plane comprising a memory structure laterally between individual of the gate regions and channel material of the operative channel-material strings;

an operative stair-step structure outside of the memory plane and comprising the insulative tiers and the conductive tiers; and a landing region adjacent steps of the operative stair-step structure, the landing region comprising a through-array-via (TAV) region that is outside the memory plane and operative TAVs that extend through the insulative tiers and the conductive tiers, the landing region further comprising dummy TAVs extending through the insulative tiers and the conductive tiers, the dummy TAVs being devoid of any conductive material and being devoid of any channel material.

* * * * *